(12) United States Patent
Lin et al.

(10) Patent No.: US 8,618,580 B2
(45) Date of Patent: Dec. 31, 2013

(54) INTEGRATED CIRCUIT CHIPS WITH FINE-LINE METAL AND OVER-PASSIVATION METAL

(71) Applicant: Megica Corporation, Longtan (TW)

(72) Inventors: Mou-Shiung Lin, Hsin-Chu (TW); Jin-Yuan Lee, Hsin-Chu (TW); Chien-Kang Chou, Tainan Hsien (TW)

(73) Assignee: Megit Acquisition Corp., San Diego, CA (US)

( * ) Notice: Subject to any disclaimer, the term of this patent is extended or adjusted under 35 U.S.C. 154(b) by 0 days.

(21) Appl. No.: 13/735,987

(22) Filed: Jan. 7, 2013

(65) Prior Publication Data

US 2013/0127024 A1 May 23, 2013

Related U.S. Application Data

(62) Division of application No. 11/864,931, filed on Sep. 29, 2007, now Pat. No. 8,373,202.

(30) Foreign Application Priority Data

Sep. 29, 2006 (TW) .............................. 95136115 A

(51) Int. Cl.
*H01L 23/52* (2006.01)
*H01L 23/528* (2006.01)
*H01L 21/70* (2006.01)

(52) U.S. Cl.
USPC ................... 257/211; 257/506; 257/E23.151

(58) Field of Classification Search
USPC .................. 257/211, 499, 503, 506, E23.151
See application file for complete search history.

(56) References Cited

U.S. PATENT DOCUMENTS

| | | | |
|---|---|---|---|
| 4,685,998 A | 8/1987 | Quinn et al. |
| 4,789,647 A | 12/1988 | Peters |
| 5,046,161 A | 9/1991 | Takada |
| 5,061,985 A | 10/1991 | Meguro et al. |
| 5,083,187 A | 1/1992 | Lamson et al. |
| 5,216,380 A | 6/1993 | Carbou |
| 5,226,232 A | 7/1993 | Boyd |
| 5,244,833 A | 9/1993 | Gansauge et al. |

(Continued)

FOREIGN PATENT DOCUMENTS

| | | |
|---|---|---|
| CN | 1855514 A | 11/2006 |
| CN | 101231998 A | 7/2008 |
| TW | 449882 | 8/2001 |

OTHER PUBLICATIONS

Bohr M., "The New Era of Scaling in an SoC World," International Solid-State Circuits Conference, 2009, pp. 23-28.

(Continued)

*Primary Examiner* — Calvin Choi
(74) *Attorney, Agent, or Firm* — Seyfarth Shaw LLP

(57) ABSTRACT

An integrated circuit chip includes a semiconductor substrate, a first circuit in or coupled to the semiconductor substrate, a second circuit device in or coupled the semiconductor substrate, a dielectric structure coupled the semiconductor substrate, a first interconnecting structure in the dielectric structure, a first pad connected to the first node of the voltage regulator through the first interconnecting structure, a second interconnecting structure in the dielectric structure, a second pad connected to the first node of the analog circuit through the second interconnecting structure, a passivation layer coupled the dielectric structure, wherein multiple openings in the passivation layer exposes the first and second pads, and a third interconnecting structure coupled the passivation layer and coupled the first and second pads.

11 Claims, 71 Drawing Sheets

(56) References Cited

U.S. PATENT DOCUMENTS

| | | |
|---|---|---|
| 5,291,066 A | 3/1994 | Neugebauer et al. |
| 5,384,488 A | 1/1995 | Golshan et al. |
| 5,416,661 A | 5/1995 | Furuta |
| 5,468,984 A | 11/1995 | Efland et al. |
| 5,532,512 A | 7/1996 | Fillion et al. |
| 5,659,201 A | 8/1997 | Wollesen |
| 5,665,989 A | 9/1997 | Dangelo |
| 5,691,248 A | 11/1997 | Cronin et al. |
| 5,767,010 A | 6/1998 | Mis et al. |
| 5,792,594 A | 8/1998 | Brown et al. |
| 5,834,844 A | 11/1998 | Akagawa et al. |
| 5,854,513 A | 12/1998 | Kim |
| 5,883,435 A | 3/1999 | Geffken et al. |
| 5,892,273 A | 4/1999 | Iwasaki et al. |
| 5,952,726 A | 9/1999 | Liang |
| 5,994,766 A | 11/1999 | Shenoy et al. |
| 6,011,314 A | 1/2000 | Leibovitz et al. |
| 6,022,792 A | 2/2000 | Ishii et al. |
| 6,075,290 A | 6/2000 | Schaefer et al. |
| 6,077,726 A | 6/2000 | Mistry et al. |
| 6,144,100 A | 11/2000 | Shen et al. |
| 6,184,143 B1 | 2/2001 | Ohashi et al. |
| 6,187,680 B1 | 2/2001 | Costrini et al. |
| 6,288,447 B1 | 9/2001 | Amishiro et al. |
| 6,348,681 B1 | 2/2002 | Kindt et al. |
| 6,359,328 B1 | 3/2002 | Dubin |
| 6,362,087 B1 | 3/2002 | Wang et al. |
| 6,383,916 B1 | 5/2002 | Lin |
| 6,399,975 B1 | 6/2002 | Cheong et al. |
| 6,429,120 B1 | 8/2002 | Ahn et al. |
| 6,472,745 B1 | 10/2002 | Iizuka |
| 6,495,442 B1 | 12/2002 | Lin et al. |
| 6,515,373 B2 | 2/2003 | Barth |
| 6,518,092 B2 | 2/2003 | Kikuchi |
| 6,578,754 B1 | 6/2003 | Tung |
| 6,605,528 B1 | 8/2003 | Lin et al. |
| 6,614,091 B1 | 9/2003 | Downey et al. |
| 6,639,299 B2 | 10/2003 | Aoki |
| RE38,296 E | 11/2003 | Moriuchi et al. |
| 6,646,347 B2 | 11/2003 | Mercado et al. |
| 6,649,509 B1 | 11/2003 | Lin et al. |
| 6,653,563 B2 | 11/2003 | Bohr |
| 6,680,544 B2 | 1/2004 | Lu et al. |
| 6,683,380 B2 | 1/2004 | Efland et al. |
| 6,693,020 B2 | 2/2004 | Mui et al. |
| 6,707,124 B2 | 3/2004 | Wachtler et al. |
| 6,756,295 B2 | 6/2004 | Lin et al. |
| 6,762,115 B2 | 7/2004 | Lin et al. |
| 6,780,748 B2 | 8/2004 | Yamaguchi et al. |
| 6,861,740 B2 | 3/2005 | Hsu |
| 6,927,156 B2 | 8/2005 | Mathew |
| 6,943,440 B2 | 9/2005 | Kim et al. |
| 6,963,136 B2 | 11/2005 | Shinozaki et al. |
| 7,084,507 B2 | 8/2006 | Awano |
| 7,230,340 B2 | 6/2007 | Lin |
| 7,239,028 B2 | 7/2007 | Anzai |
| 7,271,489 B2 | 9/2007 | Lin et al. |
| 7,319,277 B2 | 1/2008 | Lin |
| 7,372,161 B2 | 5/2008 | Lin et al. |
| 7,381,642 B2 | 6/2008 | Lin et al. |
| 7,388,240 B2 | 6/2008 | Kim |
| 7,397,121 B2 | 7/2008 | Chou et al. |
| 7,416,971 B2 | 8/2008 | Lin et al. |
| 7,420,276 B2 | 9/2008 | Lin et al. |
| 7,423,346 B2 | 9/2008 | Lin et al. |
| 7,427,560 B2 | 9/2008 | Lin et al. |
| 7,452,803 B2 | 11/2008 | Lin et al. |
| 7,465,654 B2 | 12/2008 | Chou et al. |
| 7,468,545 B2 | 12/2008 | Lin et al. |
| 7,470,997 B2 | 12/2008 | Lin et al. |
| 7,473,999 B2 | 1/2009 | Lin et al. |
| 7,511,376 B2 | 3/2009 | Lin et al. |
| 7,582,556 B2 | 9/2009 | Lin et al. |
| 7,969,006 B2 | 6/2011 | Lin et al. |
| 7,989,954 B2 | 8/2011 | Lin et al. |
| 8,004,083 B2 | 8/2011 | Lin et al. |
| 8,021,918 B2 | 9/2011 | Lin et al. |
| 2001/0000013 A1 | 3/2001 | Lin |
| 2001/0051426 A1 | 12/2001 | Pozder et al. |
| 2002/0158334 A1 | 10/2002 | Vu et al. |
| 2003/0200509 A1 | 10/2003 | Takabayashi et al. |
| 2003/0218246 A1 | 11/2003 | Abe et al. |
| 2004/0023450 A1 | 2/2004 | Katagiri et al. |
| 2004/0166659 A1 | 8/2004 | Lin et al. |
| 2004/0188841 A1 | 9/2004 | Chen et al. |
| 2004/0253804 A1 | 12/2004 | Beica et al. |
| 2005/0017361 A1 | 1/2005 | Lin et al. |
| 2005/0057963 A1 | 3/2005 | Ogura et al. |
| 2005/0104177 A1 | 5/2005 | Lin et al. |
| 2005/0280092 A1 | 12/2005 | Cheng et al. |
| 2006/0014376 A1 | 1/2006 | Agarwala et al. |
| 2006/0063378 A1 | 3/2006 | Lin et al. |
| 2006/0076687 A1 | 4/2006 | Lin et al. |
| 2006/0157856 A1 | 7/2006 | Ichikawa et al. |
| 2007/0082501 A1 | 4/2007 | Hurwitz et al. |
| 2007/0164279 A1 | 7/2007 | Lin et al. |
| 2007/0182521 A1 | 8/2007 | Lin |
| 2007/0205508 A1 | 9/2007 | Hsia et al. |
| 2007/0205520 A1 | 9/2007 | Chou et al. |
| 2007/0275503 A1 | 11/2007 | Lin et al. |
| 2008/0001290 A1 | 1/2008 | Chou et al. |
| 2008/0006945 A1 | 1/2008 | Lin et al. |
| 2008/0042280 A1 | 2/2008 | Lin et al. |
| 2008/0079461 A1 | 4/2008 | Lin et al. |
| 2008/0080111 A1 | 4/2008 | Lin et al. |
| 2008/0080112 A1 | 4/2008 | Lin et al. |
| 2008/0080113 A1 | 4/2008 | Lin et al. |
| 2008/0081457 A1 | 4/2008 | Lin et al. |
| 2008/0081458 A1 | 4/2008 | Lin et al. |
| 2008/0111242 A1 | 5/2008 | Lin et al. |
| 2008/0159042 A1 | 7/2008 | Bertin et al. |
| 2008/0246154 A1 | 10/2008 | Lin et al. |
| 2008/0251925 A1 | 10/2008 | Lin et al. |
| 2009/0057895 A1 | 3/2009 | Lin et al. |
| 2009/0065871 A1 | 3/2009 | Lin et al. |
| 2009/0146307 A1 | 6/2009 | Lin et al. |
| 2009/0309224 A1 | 12/2009 | Lin et al. |
| 2010/0117236 A1 | 5/2010 | Lin et al. |

OTHER PUBLICATIONS

Bohr M., "The New Era of Scaling in an SoC World," International Solid-State Circuits Conference (2009) Presentation Slides 1-66.

Taiwan Search Report for Taiwan Patent Application No. 095136115 dated Oct. 10, 2009 with English Translation Summary.

Definition for Over from Dictionary.com, accessed Aug. 31, 2011.

Edelstein D., et al., "Full Copper Wiring in a Sub-0.25 pm CMOS ULS Technology," Technical Digest IEEE International Electron Devices Meeting, 1997, pp. 773-776.

Edelstein D.C., "Advantages of Copper Interconnects," Proceedings of the 12th International IEEE VLSI Multilevel Interconnection Conference, 1995, pp. 301-307.

Gao X., et al., "An Improved Electrostatic Discharge Protection Structure for Reducing Triggering Voltage and Parasitic Capacitance," Solid-State Electronics, 2003, pp. 1105-1110.

Geffken R.M., "An Overview of Polyimide Use in Integrated Circuits and Packaging," Proceedings of the Third International Symposium on Ultra Large Scale Integration Science and Technology, 1991, pp. 667-677.

Groves R., et al., "High Q Inductors in a SiGe BiCMOS Process Utilizing Thick Metal Process Add-on Module," Proceedings of the Bipolar/BiCMOS Circuits and Technology Meeting, 1999, pp. 149-152.

Hu C.K., et al., "Copper-Polyimide Wiring Technology for VLSI Circuits," Materials Research Society Symposium Proceedings VLSI V, 1990, pp. 369-373.

Ingerly D., et al., "Low-K Interconnect Stack with Thick Metal 9 Redistribution Layer and Cu Die Bump for 45nm High Volume Manufacturing," International Interconnect Technology Conference, 2008, pp. 216-218.

Jenei S., et al., "High Q Inductor Add-on Module in Thick Cu/SiLK Single Damascene," Proceedings from the IEEE International Interconnect Technology Conference, 2001, pp. 107-109.

(56) References Cited

OTHER PUBLICATIONS

Kumar R., et al., "A Family of 45nm IA Processors," IEEE International Solid- State Circuits Conference, 2009, pp. 58-59, vol. 3 (2), Session 3, Microprocessor Technologies.

Kurd N., et al., "Next Generation Intel® Micro-architecture (Nehalem) Clocking Architecture," Symposium on VLSI Circuits Digest of Technical Papers, 2008, pp. 62-63.

Lee Y.H., et al., "Effect of ESD Layout on the Assembly Yield and Reliability," International Electron Devices Meeting, 2006, pp. 1-4.

Lin M.S., et al., "A New IC Interconnection Scheme and Design Architecture for High Performance ICs at Very Low Fabrication Cost—Post Passivation Interconnection," Proceedings of the IEEE Custom Integrated Circuits Conference, 2003, pp. 533-536.

Lin M.S., et al., "A New System-on-a-Chip (SOC) Technology High Q Post Passivation Inductors," Proceedings from the 53rd Electronic Components and Technology Conference (May 30, 2003), 2003, pp. 1503-1509.

Lin, M.S. "Post Passivation Technology—MEGIC Way to System Solutions", Presentation given at TSMC Technology Symposium, Japan (Oct. 1, 2003) pp. 1-32.

Luther B., et al., "Planar Copper-Polyimide Back End of the Line Interconnections for ULSI Devices," Proceedings of the 10th International IEEE VLSI Multilevel Interconnection Conference, 1993, pp. 15-21.

Maloney T., et al., "Novel Clamp Circuits for IC Power Supply Protection," IEEE Transactions on Components, Packaging, and Manufacturing Technology, Part C, 1996, pp. 150-161, vol. 19 (3).

Maloney T.J., et al., "Stacked PMOS Clamps for High Voltage Power Supply Protection," Electrical Overstress Electrostatic Discharge Symposium Proceedings, 1999, pp. 70-77.

Master R., et al., "Ceramic Mini-Ball Grid Array Package for High Speed Device," Proceedings from the 45th Electronic Components and Technology Conference, 1995, pp. 46-50.

Megic Corp., "Megic way to system solutions through bumping and redistribution", Brochure, Megic Corp, 2004, pp. 1-3.

Mistry K., et al., "A 45nm Logic Technology with High-k Metal Gate Transistors, Strained Silicon, 9 Cu Interconnect Layers, 193nm Dry Patterning, and 100% Pb-free Packaging," IEEE International Electron Devices Meeting, 2007, pp. 247-250.

Roesch W., et al., "Cycling Copper Flip Chip Interconnects," Microelectronics Reliability, 2004, pp. 1047-1054, vol. 44.

Sakran N., et al., "The Implementation of the 65nm Dual-Core 64b Merom Processor, Session 5, Microprocessors," IEEE International Solid-State Circuits Conference, 2007, pp. 106-107 and 590, vol. 5 (6).

Theng C., et al., "An Automated Tool Deployment for ESD (Electro-Static- Discharge) Correct-by-Construction Strategy in 90 nm Process," IEEE International Conference on Semiconductor Electronics, 2004, pp. 61-67.

Venkatesan S., et al., "A High Performance 1.8V, 0.20 pm CMOS Technology with Copper Metallization," Technical Digest IEEE International Electron Devices Meeting, 1997, pp. 769-772.

Yeoh A., et al., "Copper Die Bumps (First Level Interconnect) and Low-K Dielectrics in 65nm High Volume Manufacturing," Electronic Components and Technology Conference, 2006, pp. 1611-1615.

Yeoh T.S., "ESD Effects On Power Supply Clamps," Proceedings of the 6th International Symposium on Physical & Failure Analysis of Integrated Circuits, 1997, pp. 121-124.

INTEGRATED CIRCUIT CHIPS WITH FINE-LINE METAL AND OVER-PASSIVATION METAL

This application is a divisional of U.S. application Ser. No. 11/864,931, filed on Sep. 29, 2007, which claims foreign priority to TW Application No. 095136115, filed on Sep. 29, 2006, each of the foregoing of which is incorporated by reference herein in its entirety.

This application is related to U.S. application Ser. No. 11/864,917, filed on Sep. 29, 2007, U.S. application Ser. No. 11/864,926, filed on Sep. 29, 2007, U.S. application Ser. No. 11/864,927, filed on Sep. 29, 2007, U.S. application Ser. No. 11/864,935, filed on Sep. 29, 2007, U.S. application Ser. No. 11/864,938, filed on Sep. 29, 2007, and U.S. application Ser. No. 11/865,059, filed on Sep. 30, 2007, all assigned to a common assignee.

BACKGROUND OF THE INVENTION

1. Field of the Invention

The invention relates to an on-chip circuit unit to send electrical stimulus to other circuit units that are located on the same integrated circuit (IC) chip and a method for forming the same. More particularly, the invention relates to an on-chip voltage-regulating circuit or a voltage converter to send electrical power to other circuit units located on the same chip by way of a coarse conductor deposited over the passivation layer.

2. Brief Description of the Related Art

Today many electronic devices are required to run at high speed and/or low power consumption conditions. Moreover, a modern electronic system, module, or circuit board contains many different types of chips, such as Central Processing Units (CPUs), Digital Signal Processors (DSPs), analog chips, DRAMs, SRAMs, Flashs and etc. Each chip is fabricated using different types and/or different generations of IC manufacturing process technologies. For example, in a modern notebook personal computer, the CPU chip may be fabricated using an advanced 65 nm technology with power supply voltage at 1.2V. the analog chip fabricated using a 0.25 um IC process technology with power supply voltage at 3.3 V, and the DRAM chip using a 90 nm IC process technology at 1.5V, and the flash chip using a 0.18 um technology with power supply voltage at 2.5V. With varieties of supply voltages in a single system, the on-chip voltage converter and/or voltage regulator become desirable. The DRAM chip may require an on-chip voltage converter and/or voltage regulator to convert 3.3V to 1.5V and the flash chip may also require an on-chip voltage converter to convert 3.3V to 2.5V. Moreover, the on-chip voltage converter or regulator should provide a constant voltage for the semiconductor devices located at different locations on an IC chip through on-chip power/ground buses. In this regard, an on-chip voltage regulator or an on-chip voltage converter affiliated with low parasitic power/ground lines is desired. In addition to the minimized energy consumption, the rippling effect that may occur in accordance with fluctuation of load capacitance and resistance is also abated.

U.S. Pat. No. 6,495,442 B1 by Lin and et al. describes post-passivation schemes on top of IC chips. The post-passivaton scheme over the IC passivation layer is used as the global, power, ground, or signal distribution networks. The power/ground voltage is supplied from an external (outside of the chip) power supply source.

U.S. Pat. No. 6,649,509 B1 by Lin and et al. describes an embossing process to form post-passivation interconnection scheme over the IC passivation layer to be used as the global distribution network for power, ground, clock and/or signal.

SUMMARY OF THE INVENTION

An object of this invention is to provide an on-chip circuit unit to send electrical stimulus to several devices or circuit units that are located on the same IC chip.

An object of this invention is to provide an on-chip voltage-regulating device (voltage regulator) to send electrical power to several devices or circuit units that are located on the same IC chip.

An object of this invention is to provide an on-chip voltage converter to send electrical power to several devices or circuit units that are located on the same IC chip.

Another object of the invention is to deliver electrical stimulus to several devices or circuit units with little loss due to the parasitic effects.

Another object of the invention is to deliver electrical power to several devices or circuit units with little loss due to the parasitic effects.

A further object is to deliver electrical power to several devices or circuit units through the passivation opening and by way of a coarse conductor deposited over the passivation layer.

A still further object is to provide an over-passivation metal interconnection distributing signals, power, or ground outputs from at least one internal circuit or internal device to at least another internal circuit or internal device.

Another object of the invention is to provide an over-passivation metal interconnection distributing signals, power, or ground outputs from at least one internal circuit or internal device to at least another internal circuit or internal device without connection to ESD, driver or receiver circuitry.

Yet another object of the invention is to provide an over-passivation metal interconnection distributing signals, power, or ground outputs from at least one internal circuit or internal device to at least another internal circuit or device without connection to external (outside of the chip) circuitry.

Another object is to propagate a signal generated in the internal circuits or internal devices to the external circuitry through over-passivation metals and fine-line metals.

A further object of the invention is to provide an over-passivation metal interconnection distributing signals, power, or ground outputs from at least one internal circuit or internal device to at least another internal circuit or internal device wherein an over-passivation contacting structure can be connected with an off-chip circuit, and connected to external circuitry.

A still further object is to provide an over-passivation metal interconnection distributing an external power supply to internal circuits and a contacting structure to the external power supply.

In accordance with the objects of the invention, a chip structure is provided comprising an over-passivation metal interconnection distributing output voltage and/or current from a voltage regulator to internal circuits.

Also in accordance with the objects of the invention, another chip structure is provided comprising an over-passivation metal interconnection distributing signals, power or ground outputs from at least one internal circuit to at least another internal circuit.

Also in accordance with the objects of the invention, another chip structure is provided comprising an over-passivation metal interconnection distributing signals, power or ground outputs from at least one internal circuit to at least another internal circuit and an over-passivation metal contacting structure connecting an off-circuit chip to external circuitry.

Also in accordance with the objects of the invention, another chip structure is provided comprising an over-passivation metal interconnection distributing an external power supply to internal circuits and a contacting structure to the external power supply.

To enable the objectives, technical contents, characteristics and accomplishments of the present invention, the embodiments of the present invention are to be described in detail in cooperation with the attached drawings below.

BRIEF DESCRIPTION OF THE DRAWINGS

FIG. 15B differs from FIG. 15A in having an optional metal cap over a metal pad exposed by an opening in the passivation layer.

DETAILED DESCRIPTION OF THE INVENTION

Figure 1B:
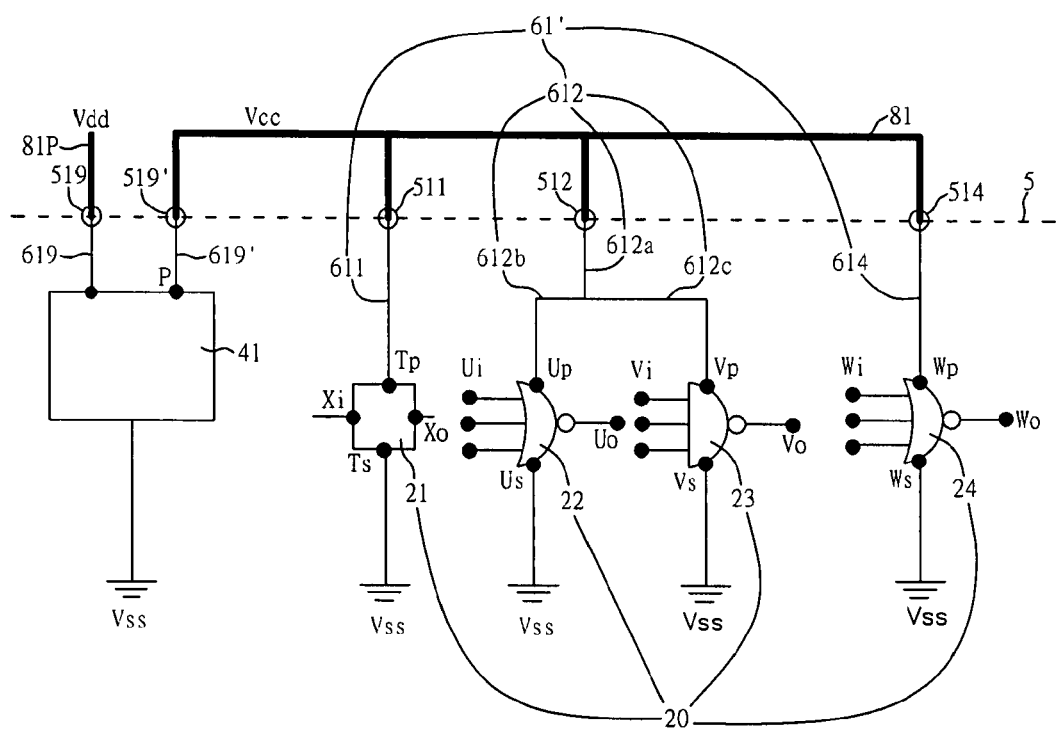
FIG. 1B is a schematic representation of a voltage regulator or a voltage converter connected to internal circuits through an over-passivation power bus (metal line, trace, or plane) in a first preferred embodiment of the present invention.
Figure 1C:
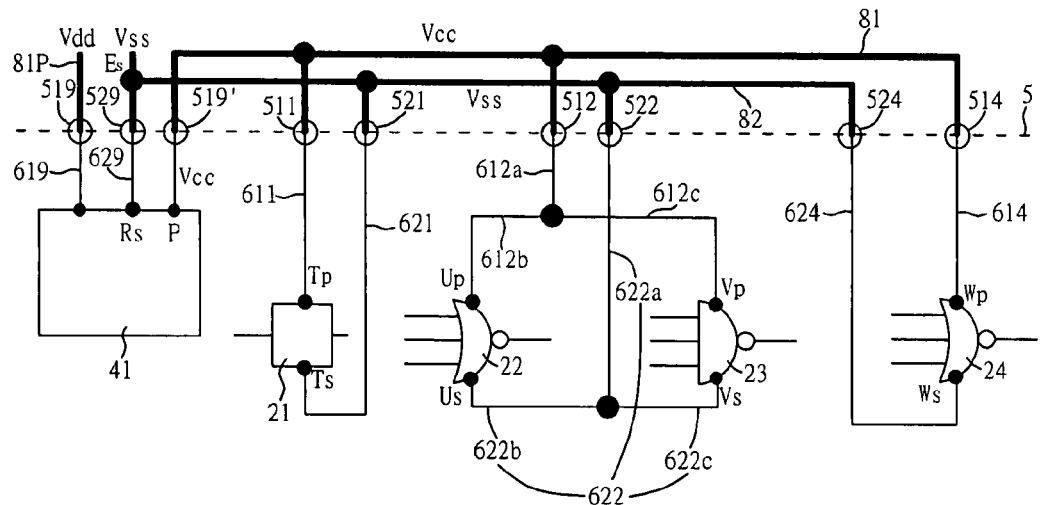
FIGS. 1C and 1D are schematic representation of a voltage regulator or a voltage converter connected to internal circuits through over-passivation power and ground buses (metal lines, traces, or planes) in a first preferred embodiment of the present invention.

First Embodiment: Over-Passivation Power/Ground Buses with a Voltage Regulator or a Voltage Converter FIGS. 1B, 1C, 2B, 2C, 3B, 3C, and 3D illustrate the first preferred embodiment of the present invention. FIGS. 1B and 1C show a simplified circuitry diagram where metal traces 81 and/or 82 over a passivation layer 5 connect a voltage regulator or voltage converter 41 and internal circuits 21, 22, 23 and 24 to distribute a power voltage or a ground reference voltage, wherein the passivation layer 5 is presented by a dotted line, coarse traces mean the traces formed over the passivation layer 5, and fine traces mean the traces formed under the passivation layer 5. FIGS. 2B and 2C show top views of semiconductor chips realizing the circuitry shown in FIGS. 1B and 1C, respectively, wherein coarse traces mean the traces formed over the passivation layer 5, and fine traces mean the traces formed under the passivation layer 5. FIGS. 3B and 3C show cross-sectional views of semiconductor chips realizing the circuitry shown in FIGS. 1B and 1C, respectively. FIGS. 2B and 2C show top views of the semiconductor chips shown in FIGS. 3B and 3C, respectively.

In this invention, an on-chip voltage regulator or voltage converter 41 sends electrical power to several internal devices 21, 22, 23 and 24 (or circuits), wherein the voltage regulator or voltage converter and the internal devices are formed in and on a silicon substrate 1 within a same IC chip. Through openings 511, 512 and 514 in a passivation layer 5, and by way of a coarse metal conductor 81 deposited over the passivation layer, electrical power output from the voltage regulator or voltage converter 41 is delivered to several devices or circuit units 21, 22, 23 and 24 with little loss or parasitic effects. The advantage of this design is that, affiliated with the regulated power source and with the coarse metal conductor, the voltage to the next level at the load of internal circuits can be controlled at a voltage level with high precision. When the reference number of 41 is a voltage regulator, the output voltage Vcc of the voltage regulator 41 is within +10% and −10% of the desired voltage level, and preferred within +5% and −5% of the desired voltage level, insensitive to voltage surge or large fluctuation at the input node connected with an external power supply Vdd input from the power metal trace 81P. Alternatively, the voltage regulator 41 may have an output node at a voltage level of Vcc output from the voltage regulator 41 and an input node at a voltage level of Vdd supplied from an external circuit, wherein a ratio of a difference of the voltage level of Vdd minus the voltage level of Vcc to the voltage level of Vdd is less than 10%.

Hence, circuit performance can be improved. The voltage regulator 41 may have an output of between 1 volt and 10 volts, and preferred between 1 volt and 5 volts.

In some applications, if the chip requires a voltage level Vcc different from the voltage level Vdd of the external power supply, a voltage converter may be installed in the chip. The reference number of 41 may indicate the voltage converter. The on-chip voltage converter 41, in addition to the voltage regulating circuit, is desirable in this case to convert the voltage level Vdd of the external power supply to the voltage level Vcc required in the chip. The converter may output a voltage level Vcc higher than the voltage Vdd at the input node. Alternatively, the converter may output a voltage level Vcc lower than the voltage Vdd at the input node. The voltage converter may have an output of between 1 volt and 10 volts, and preferred between 1 volt and 5 volts. When the voltage level of Vcc ranges from 0.6 volts to 3 volts, the voltage level of Vdd ranges from 3 volts to 5 volts. When the voltage level of Vcc ranges from 0.6 volts to 2 volts, the voltage level of Vdd ranges from 2 volts to 3 volts. For example, when the voltage level of Vcc is 2.5 volts, the voltage level of Vdd is 3.3 volts. When the voltage level of Vcc is 1.8 volts, the voltage level of Vdd is 3.3 volts. When the voltage level of Vcc is 1.8 volts, the voltage level of Vdd is 2.5 volts. When the voltage level of Vcc is 3.3 volts, the voltage level of Vdd is 5 volts.

Figure 1A:
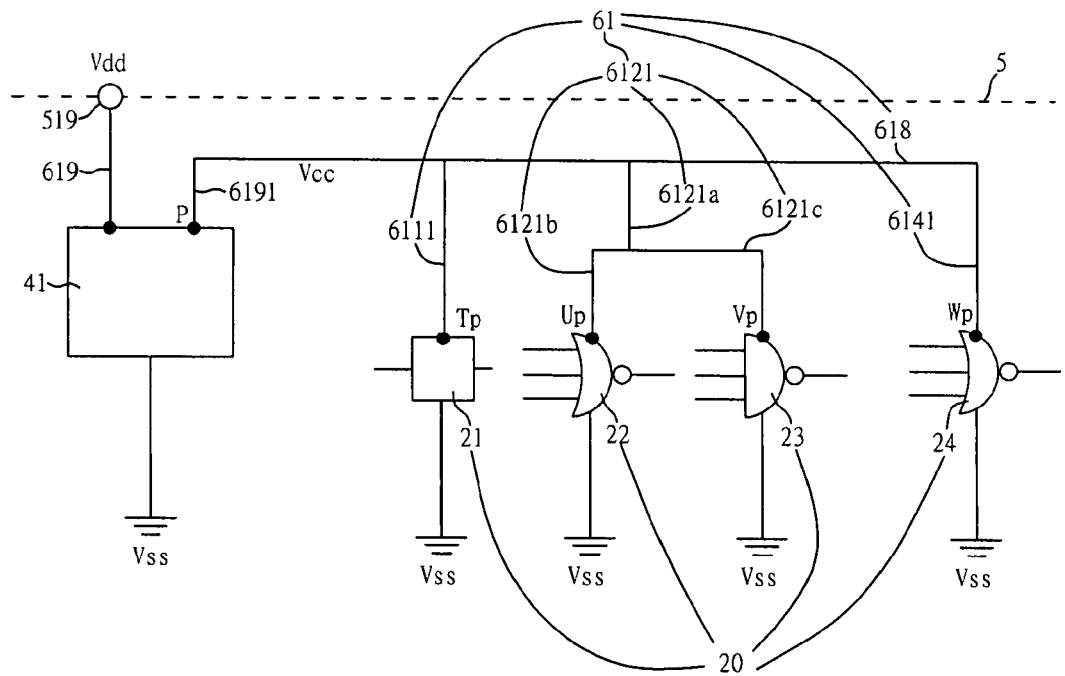
FIG. 1A is a schematic representation of a conventional voltage regulator or voltage converter connected to internal circuits through a fine-line metallization.
Figure 2A:
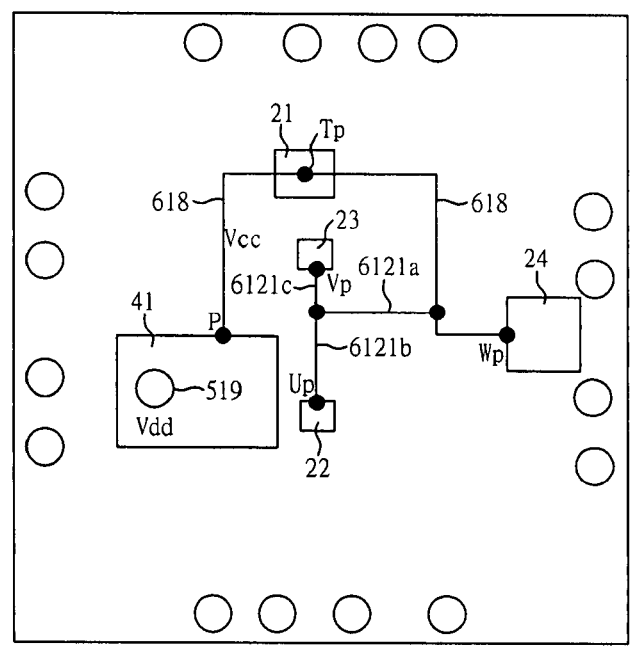
FIG. 2A is a top view layout of a conventional voltage regulator or voltage converter connected to internal circuits through a fine-line metallization.
Figure 2B:
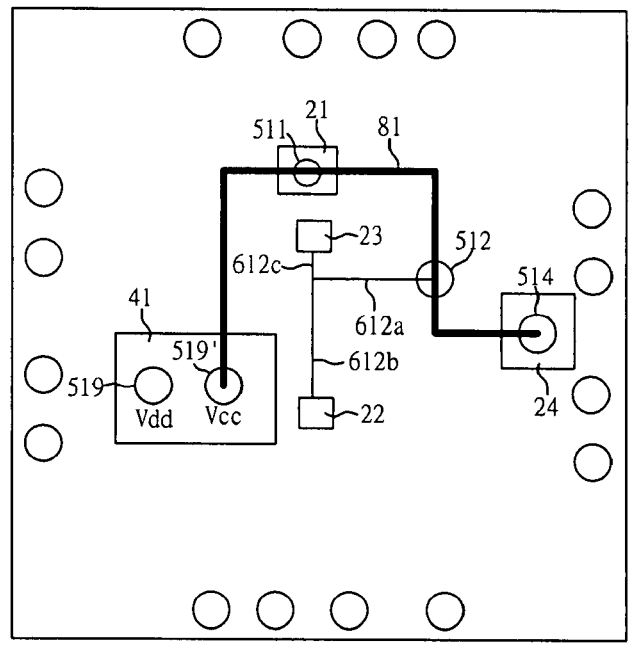
FIG. 2B is a top view layout of a voltage regulator or a voltage converter connected to internal circuits through an over-passivation power bus (metal line, trace or plane) in a first preferred embodiment of the present invention.
Figure 2C:
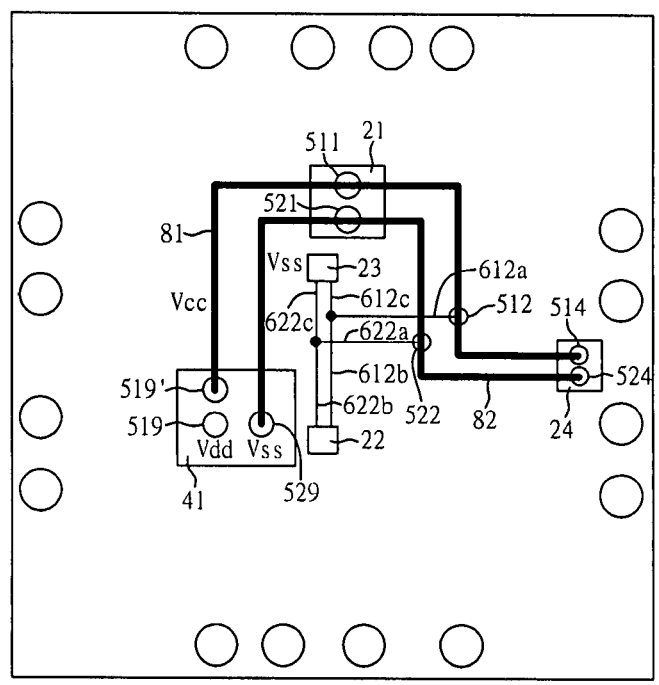
FIG. 2C is a top view layout of a voltage regulator or a voltage converter connected to internal circuits through over-passivation power and ground buses (metal lines, traces or planes) in a first preferred embodiment of the present invention.
Figure 3A:
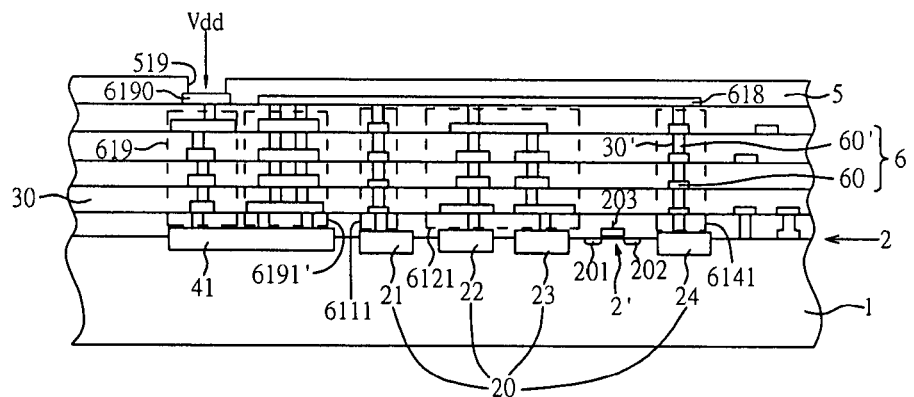
FIG. 3A is a cross-sectional representation of a conventional voltage regulator or voltage converter connected to internal circuits through a fine-line metallization.
Figure 3B:
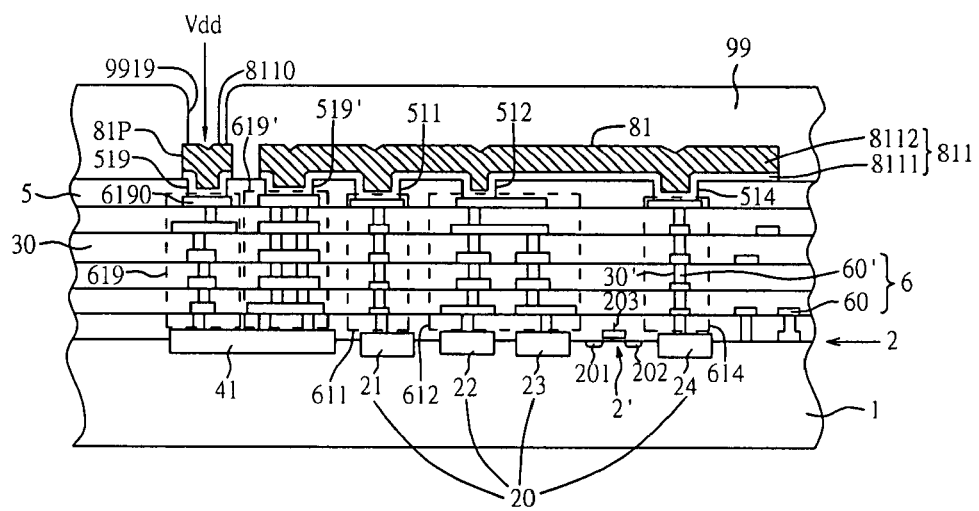
FIG. 3B is a cross-sectional representation of a voltage regulator or a voltage converter connected to internal circuits through an over-passivation power bus (metal line, trace or bus) in a first preferred embodiment of the present invention.
Figure 3C:
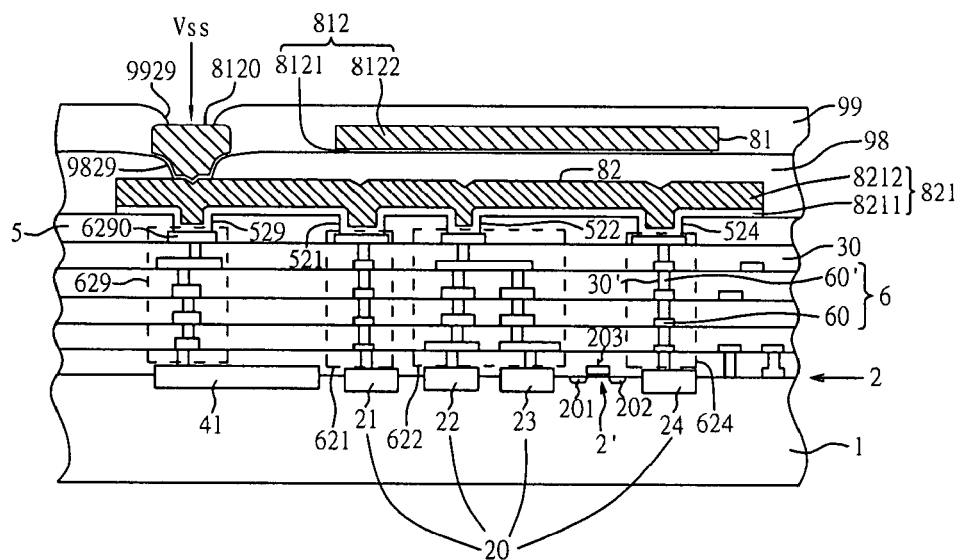
FIG. 3C is a cross-sectional representation of a voltage regulator or a voltage converter connected to internal circuits through over-passivation power and ground buses (metal lines, traces or planes in two patterned circuit metal layers) in a first preferred embodiment of the present invention.

FIGS. 1A, 2A, and 3A show a circuitry diagram, a top view and a cross-sectional view, respectively, according to the prior art of how a voltage regulator and/or a voltage converter 41 is connected to internal circuits 20, comprising 21, 22, 23 and 24. The voltage regulator and/or a voltage converter 41 receives an external power voltage Vdd, outputs a power voltage Vcc, and delivers the power Vcc to internal circuits 20, comprising 21, 22, 23 and 24, using IC fine-line metal traces 6191 and 61 under a passivation layer 5, the IC fine-line metal traces 61 comprising segments of 618, 6111, 6121a, 6121b, 6121c and 6141. The fine-lien metal traces 6191 and 61, located under the passivation layer 5 and fabricated using the conventional IC process and materials. However, thick metal layers (for example, as thick as 5 µm) or thick dielectric layers (for example, as thick as 5 µm) are not easily provided using the conventional IC process and materials. Thereby, the IC fine-line metal lines or traces 6191 and 61 have high resistance and capacitance per unit length, causing IR voltage drop, noises, signal distortion, propagation time delay, and high power consumption and heat generation.

FIG. 1B shows the circuit schematics of the present invention. In this invention, the voltage regulator and/or the voltage converter 41 receives a voltage Vdd from an external power supply, and outputs a voltage Vcc for the internal circuits 20, comprising 21, 22 23, and 24. The output voltage Vcc at node P is distributed to the power nodes Tp, Up, Vp and Wp of the internal circuits 21, 22, 23 and 24, respectively, first up through a passivation opening 519' in the passivation layer 5, then through a thick metal trace 81 over the passivation layer 5, then down through the passivation openings 511, 512, and 514 in the passivation layer 5, and then through the fine-line metal traces 61' to the internal circuits 20: particularly through the segment 611 of the fine-line metal traces 61' to the internal circuit 611; particularly through the segments 612a and 612b of the fine-line metal traces 61' to the internal circuit 22; particularly through the segments 612a and 612c of the fine-line metal traces 61' to the internal circuit 23; and through the segment 614 of the fine-line metal traces 61' to the internal circuit 24.

The internal circuits 20, comprising 21, 22, 23 and 24, each comprise at least a PMOS transistor having a source connected to the fine-line metal traces 61', for example. Each of the internal circuits 20, comprising 21, 22, 23 and 24, may include a NMOS transistor having a ratio of a physical channel width thereof to a physical channel length ranging from 0.1 and 20, ranging from 0.1 and 10 or preferably ranging from 0.2 and 2. Alternatively, each of the internal circuits 20, comprising 21, 22, 23 and 24, may include a PMOS transistor having a ratio of a physical channel width thereof to a physical channel length ranging from 0.2 and 40, ranging from 0.2 and 40 or preferably ranging from 0.4 and 4.

The invented chip structure in FIG. 1B uses a coarse metal conductor 81 as a carrier of the power/ground lines, traces, or planes. In this case, the voltage drop and noise is much reduced since the coarse metal conductor 81 has lower resistance and capacitance than the fine-line metal traces 618 shown in FIG. 1A of the prior art.

The internal circuits, or internal circuit units 20, shown in all of the embodiments, comprise two NOR gates 22 and 24, one NAND gate 23, and one internal circuit 21, for example. The internal circuits 20, 21, 22, 23, and 24 can be any type of IC circuits, such as NOR gate, NAND gate, AND gate, OR gate, operational amplifier, adder, multiplexer, diplexer, multiplier, A/D converter, D/A converter, CMOS transistor, bipolar CMOS transistor or bipolar circuit. Each of the internal circuit NOR gates 22 and 24 and NAND gate 23 has three input nodes Ui, Wi or Vi one output node Uo, Wo or Vo, one Vcc node Up, Wp or Vp, and one Vss node Us, Ws or Vs. The internal circuit 21 has one input node Xi, one output node Xo, one Vcc node Tp and one Vss node Ts. Each of the internal circuits or internal circuit units 20, comprising 21, 22, 23, and 24, usually has signal nodes, power nodes, and ground nodes.

FIGS. 2B and 3B provide the top view and cross-sectional view, respectively, of the circuitry diagram shown in FIG. 1B. It is noted that, in FIG. 3B, the fine-line metal structures 611, 612, 614, 619 and 619' can be composed of stacked fine-line metal pads 60 and via plugs 60' filled in the vias 30'. The upper vias 30' are substantially aligned with the lower ones; the upper fine-line metal pads 60 are substantially aligned with the lower ones; the upper via plugs 60 are substantially aligned with the lower ones. Referring to FIGS. 1B, 2B and 3B, the fine-line metal traces or plane 612 comprises multiple portions 612a, 612b and 612c, and is used for the local power distribution.

Figure 3D:
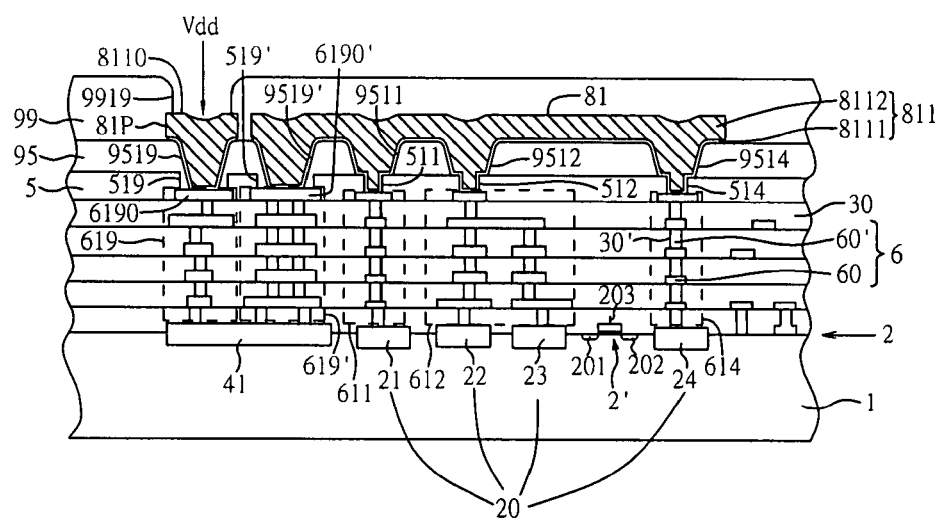
FIG. 3D is a cross-sectional representation of a voltage regulator or a voltage converter connected to internal circuits through an over-passivation power bus (metal line, trace or bus) in a first preferred embodiment of the present invention. This figure is similar to FIG. 3B except that an additional polymer layer is provided between the bottom-most over-passivation metal layer and the passivation layer.

The thick metal traces or plane 81 over the passivation layer 5 is used for global power distribution and connects the fine-line metal traces or plane 619', 611, 612 and 614. The thick metal trace or plane 81 over the passivation layer 5, shown in FIGS. 1B and 2B, may be composed of only one patterned circuit layer 811, as shown in FIG. 3B, or multiple patterned circuit layers, not shown. The patterned circuit layer 811, such as a power plane, bus, trace or line, to distribute a power voltage Vcc is realized from the concept of the coarse trace 81 shown in FIGS. 1B and 2B. When the thick metal traces or plane 81 over the passivation layer 5, shown in FIG. 2, is composed of multiple patterned circuit layers, a polymer layer, such as polyimide (PI), benzocyclobutene (BCB), parylene, epoxy-based material, photoepoxy SU-8, elastomer or silicone, may be between the neighboring patterned circuit layers, separating the patterned circuit layers. A polymer layer 99, such as polyimide (PI), benzocyclobutene (BCB), parylene, epoxy-based material, photoepoxy SU-8, elastomer or silicone, may be on the topmost one of the patterned circuit layers, separated by the above mentioned polymer layers, over the passivation layer, not shown, or on the only one patterned circuit layer 811, as shown in FIGS. 3B and 3D. Alternatively, A polymer layer 95, such as polyimide (PI), benzocyclobutene (BCB), parylene, epoxy-based material, photoepoxy SU-8, elastomer or silicone, may be between the passivation layer and the bottommost one of the patterned circuit layers, separated by the above mentioned polymer layers, not shown, or between the passivation layer 5 and the only one patterned circuit layer 811, as shown in FIG. 3D. The polymer layer 95 may have a thickness between 2 and 30 micrometers. Multiple openings 9519, 9519', 9511, 9512 and 9514 in the polymer layer 95 are substantially aligned with the openings 519, 519', 511, 512 and 514 in the passivation layer 5, respectively. The openings 9519, 9519', 9511, 9512 and 9514 in the polymer layer 95 expose the pads (including 6190 and 6190') exposed by the openings 519, 519', 511, 512 and 514 in the passivation layer 5, respectively.

Some openings 9519 and 9519' in the polymer layer 95 have lower portions having widths or transverse dimensions smaller than those of the openings 519 and 519' in the passivation layer 5 aligned with the openings 9519 and 9519', respectively. The polymer layer 95 covers a portion of the pads 6190 and 6190' exposed by the openings 519 and 519' in the passivation layer 5. The shape of the openings 519 and 519' from a top perspective view may be round, square, rectangular or polygon. If the openings 519 and 519' are round, the openings 519 and 519' may have a diameter of between 0.1 and 200 microns, between 1 and 100 microns, or, preferably, between 0.5 and 30 microns. If the openings 519 and 519' are square, the openings 519 and 519' may have a width of between 0.1 and 200 microns, between 1 and 100 microns, or, preferably, between 0.1 and 30 microns. If the openings 519 and 519' are rectangular, the openings 519 and 519' may have a width of between 0.1 and 200 microns, between 1 and 100 microns, or, preferably, between 0.1 and 30 microns, and a length of between 1 micron and 1 centimeter. If the openings 519 and 519' are polygon having more than five sides, the openings 519 and 519' have a greatest diagonal length of between 0.1 and 200 microns, between 0.5 and 100 microns, or, preferably, between 0.1 and 30 microns. Alternatively, the openings 519 and 519' have a greatest transverse dimension of between 0.1 and 200 microns, between 1 and 100 microns, or, preferably, between 0.1 and 30 microns. In a case, the openings 519 and 519' have a width of between 30 and 100 microns, with the lower portion of the openings 9519 and 9519' in the polymer layer 95 having a width of between 20 and 100 microns.

Some openings 9511, 9512 and 9514 in the polymer layer 95 have lower portions having widths or transverse dimensions greater than those of the openings 511, 512 and 514 in the passivation layer 5 aligned with the openings 9511, 9512 and 9514, respectively. The openings 9511, 9512 and 9514 in the polymer layer 95 further expose the passivation layer 5 close to the openings 511, 512 and 514. The shape of the openings 511, 512 and 514 from a top perspective view may be round, square, rectangular or polygon. If the openings 511, 512 and 514 are round, the openings 511, 512 and 514 may have a diameter of between 0.1 and 200 microns, between 1 and 100 microns, or, preferably, between 0.5 and 30 microns. If the openings 511, 512 and 514 are square, the openings 511, 512 and 514 may have a width of between 0.1 and 200 microns, between 1 and 100 microns, or, preferably, between 0.1 and 30 microns. If the openings 511, 512 and 514 are rectangular, the openings 511, 512 and 514 may have a width of between 0.1 and 200 microns, between 1 and 100 microns, or, preferably, between 0.1 and 30 microns, and a length of between 1 micron and 1 centimeter. If the openings 511, 512 and 514 are polygon having more than five sides, the openings 511, 512 and 514 have a greatest diagonal length of between 0.1 and 200 microns, between 1 and 100 microns, or, preferably, between 0.1 and 30 microns. Alternatively, the openings 511, 512 and 514 have a greatest transverse dimension of between 0.1 and 200 microns, between 1 and 100 microns, or, preferably, between 0.1 and 30 microns. In a case, the openings 511, 512 and 514 have a width of between 5 and 30 microns, with the lower portion of the openings 9511, 9512 and 9514 in the polymer layer 95 having a width of between 20 and 100 microns.

The above-mentioned description concerning the openings 519, 519', 511, 512 and 514 in the passivation layer 5 and the openings 9519, 9519', 9511, 9512 and 9514 in the polymer layer 95 can be applied to the embodiments shown in 15A-15L, 16A-16L, 17A-17J, 18A-18I and 19A-19I.

One of the patterned circuit layers, such as 811 shown in FIGS. 3B and 3D, composing the thick metal trace or plane 81 over the passivation layer 5 may comprise an adhesion/barrier/seed layer 8111, and a bulk conduction metal layer 8112. The methods to form the patterned circuit layer 811 and the specification thereof may follow the methods to form the patterned circuit layer 801, 802 or 803 and the specification thereof shown in FIGS. 15A-15L, 16A-16L, 17A-17J, 18A-18I and 19A-19I.

In FIGS. 1B, 2B and 3B, an external power supplies a voltage level Vdd at a metal pad 8110 connected to a metal pad 6190 of a topmost one of fine-line circuit metal layers 619 under the passivation layer 5 through an opening 519 in the passivation layer 5, and inputs to the regulator or the voltage converter 41. The regulator or the voltage converter 41 outputs a power voltage to supply the internal circuits 21, 22, 23 and 24 through the fine-line circuit metal layers 619', thick patterned trace or plane 811 and fine-line circuit metal layers 611, 612 and 614. The fine-line circuit layers 619, 619', 611, 612 and 614 are separated by thin-film insulating layers 30, such as silicon oxide.

Though FIG. 3B shows only one patterned circuit layer 81 for distributing a regulated or converted power voltage of Vcc, multiple patterned circuit layers with one or more polymer layers deposited therebetween can be formed over the passivation layer 5 and used to distribute a regulated or converted power voltage of Vcc. Metal traces or planes in different patterned circuit layers are connected through the openings in the polymer layer therebetween.

FIGS. 1A, 2A and 3A show the corresponding prior art. As figures reveal the external power supply at a voltage level Vdd inputs the regulator or the voltage converter 41 through the pad 6190 exposed by the opening 519 in the passivation layer 5 and through the fine-line circuit layers 619 (comprising stacked fine-line metal pads and vias). The output power at voltage level Vcc outputs from the regulator or the voltage converter 41 is distributed to supply the voltage of Vcc to the internal circuits 21, 22, 23 and 24 only through IC fine line interconnection 61 comprising segments 6191', 618, 6111, 6121 and 6141. Significant energy loss and speed reduction can be seen in the prior art.

In FIGS. 1B, 2B, 3B and 3D, the ground voltage is denoted as Vss without detailing the circuit schematics, layout and structure for distributing the ground voltage. FIGS. 1C, 2C and 3C describe the circuit schematics, top view and cross-sectional view, respectively, showing the thick metal traces or planes 81 and 82 over the passivation layer 5 for distributing both of the power supply voltage of Vcc and the ground reference voltage of Vss. The structure 82 of distributing the ground reference voltage of Vss is similar to the above mentioned structure 81 of distributing the power supply voltage of Vcc, except that a common ground voltage Vss is provided for the regulator or voltage converter 41 and the internal circuits 21, 22, 23 and 24 through the thick metal trace or plane 82. That means the external ground node Es may be connected to the ground node Rs of the regulator or voltage converter 41 and to the internal ground node Ts, Us, Vs, Ws of the internal circuits 21, 22, 23 and 24. In FIGS. 1C, 2C and 3C, the point Es connected to a ground source of an external circuitry at a voltage level Vss is connected to (1) the ground node Rs of the regulator or the converter 41 through an opening 529 in the passivation layer 5, and (2) the ground nodes Ts, Us, Vs and Ws of the internal circuits 21, 22, 23 and 24 through the thick metal lines, buses or traces 82 over the passivation layer 5, the openings, 521, 522 and 524 in the passivation layer 5, and fine-line metal structures 621, 622 (comprising 622a, 622b and 622c) and 624.

FIG. 3C shows two patterned circuit layers 812 and 821 over the passivation layer 5, used for distributing a power voltage Vcc and a ground reference voltage Vss, respectively. The bottom one 821 of the patterned circuit layers 812 and 821, such as a ground plane, bus, trace or line, to distribute a ground reference voltage Vss is realized from the concept of the coarse trace 82 shown in FIGS. 1C and 2C. The top one 812 of the patterned circuit layers 812 and 821, such as a power plane, bus, trace or line, to distribute a power voltage Vcc is realized from the concept of the coarse trace 81 shown in FIGS. 1C and 2C. A polymer layer 98, such as polyimide, benzocyclobutene (BCB), parylene, epoxy-based material, photoepoxy SU-8, elastomer or silicone, having a thickness of between 2 and 30 microns, separates the patterned circuit layers 821 and 812. Another polymer layer 99, such as polyimide, benzocyclobutene (BCB), parylene, epoxy-based material, photoepoxy SU-8, elastomer or silicone, having a thickness of between 2 and 30 microns, covers the top patterned circuit layer 812. Alternatively, another polymer layer, such as benzocyclobutene (BCB), polyimide, parylene, epoxy-based material, photoepoxy SU-8, elastomer or silicone, having a thickness of between 2 and 30 microns, may be provided between the bottom-most patterned circuit layer 821 and the passivation layer 5, described as the polymer layer 95 shown in FIG. 3D. In FIGS. 1C, 2C and 3C, the ground plane, trace or line 82 over the passivation layer 5, used to distribute a ground reference voltage of Vss, is connected to the ground nodes Ts, Us, Vs and Ws of the internal circuits 21, 22, 23 and 24 and the ground node Rs of the regulator or voltage converter 41 through the openings 521, 522, 524 and 529 in the passivation layer 5 and the fine-line metal structures 621, 622, 624 and 629, respectively. The power plane, trace or line 81 or 812 used to distribute a power voltage of Vcc is connected to the power nodes Tp, Up, Vp and Wp (not shown) of the internal circuits 21, 22, 23 and 24 and to the output nodes P of the regulator or voltage converter 41 through the openings (not shown) in the polymer layer 98 and in the passivation layer 5 and through the fine-line metal structures 611, 612, 614 and 619', respectively, as illustrated in FIG. 3B.

In FIG. 3B, there is only one patterned circuit layer 811, including a portion serving as the above-mentioned thick and wide metal trace 81P, power bus or plane delivering a power voltage input from an external circuit, over the passivation layer 5, and another portion serving as the above-mentioned thick and wide metal trace 81, power bus or plane delivering a power voltage output from the voltage regulator or voltage converter 41, over the passivation layer 5. The patterned circuit layer 811 may contain an adhesion/barrier layer, a seed layer on the adhesion/barrier layer, and an electroplated metal layer 8112 on the seed layer, the adhesion/barrier layer and the seed layer composing the bottom layer 8111.

Referring to FIG. 3B, regards to the process for forming the patterned circuit layer 811, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6490, principally made of aluminum or copper, exposed by multiple openings 549, 511, 512 and 514 in the passivation layer 5. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8112 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8112 is removed using a wet-etching process or using a dry-etching process. Thereafter, the adhesion/barrier layer not under the metal layer 8112 is removed using a wet-etching process or using a dry-etching process.

After the patterned circuit layer 811 is formed, a polymer layer 99 can be formed by spin-on coating a negative photosensitive polyimide layer, such as ester type, on the patterned circuit layer 811 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9949 may be formed in the polymer layer 99, exposing a contact pad 8110 of the patterned circuit layer 811.

Referring to FIG. 3B, for forming a metal bump over the contact pad 8110, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9919. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed.

Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball for a flip-chip assembly. The metal bump can be connected to a printed circuit board, ceramic substrate or another semiconductor chip.

Referring to FIG. 3B, for forming another kind of metal bump over the contact pad 8110, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9919. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 3B, a nickel layer having a thickness between 0.05 and 2 micrometers can be electroless plated on the contact pad 8110 exposed by the opening 9919, and a gold layer, platinum layer, palladium layer or ruthenium layer having a thickness between 0.05 and 2 micrometers can be electroless plated on the electroless plated nickel layer in the opening 9919 in the polymer layer 99. Thereafter, a gold wire can be bonded onto the electroless plated gold layer in the opening 9919 in the polymer layer 99 using a wirebonding process.

Alternatively, referring to FIG. 3B, a gold wire can be bonded onto a gold layer, platinum layer, palladium layer or ruthenium layer of the patterned circuit layer 811, exposed by the openings 9919 in the polymer layer 99 using a wirebonding process.

Referring to FIG. 3D, before the patterned circuit layer 811 is formed, a polymer layer 95 can be optionally formed by spin-on coating a negative photosensitive polyimide layer, such as ester type, on the nitride layer of the passivation layer 5 and on the contact pads 6490, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9519, 9519', 9511, 9512 and 9514 may be formed in the polymer layer 95, exposing multiple contact pads 6190 exposed by the openings 519, 519', 511, 512 and 514 in the passivation layer 5. After the polymer layer 95 is formed, the patterned circuit layer 811 can be formed on the polymer layer 95 and on the contact pads 6190 exposed by the openings 519, 519', 511, 512 and 514. The adhesion/barrier layer of any above-mentioned material may be sputtered on the polymer layer 95 and on the contact pads 6190 exposed by the openings 9519, 9511, 9512 and 9514 in the polymer layer 95.

One of the patterned circuit layers 812 and 821 shown in FIG. 3C, composing the thick metal traces or planes 81 and 82 over the passivation layer 5 may comprise an adhesion/barrier/seed layer 8111, and a bulk conduction metal layer 8112. The methods to form the patterned circuit layers 812 and 821 and the specification thereof may be based on the methods to form the patterned circuit layer 801, 802 or 803 and the specification thereof shown in FIGS. 15A-15L, 16A-16L, 17A-17J, 18A-18I and 19A-19I.

In FIG. 3C, the thick and wide metal trace, bus or plane 82, used to deliver a ground voltage, may have a lower patterned circuit layer under an upper patterned circuit layer of the thick and wide metal trace, bus or plane 81, used to deliver a power voltage Vcc output from the voltage regulator or voltage converter 41. Alternatively, the thick and wide metal trace, bus or plane 82, used to deliver a ground voltage, may have an upper patterned circuit layer over a lower patterned circuit layer of the thick and wide metal trace, bus or plane 81, used to deliver a power voltage Vcc output from the voltage regulator or voltage converter 41. A polymer layer having a thickness between 2 and 30 micrometers may be between the upper and lower patterned circuit layers. Each f the lower and upper patterned circuit layers may have an electroplated copper layer having a thickness between 2 and 30 micrometers.

Referring to FIG. 3C, there may be multiple patterned circuit layers 821 and 812, including the above-mentioned ground bus or plane 82 and the above-mentioned power bus or plane 81, used to deliver a power voltage output from the voltage regulator or voltage converter 41, over the ground bus or plane 82, over the passivation layer 5. The process for forming the patterned circuit layer 821 on the passivation layer 5 and on the contact pads 6290 exposed by the openings 529, 521, 522 and 524 can be referred to as the process for forming the patterned circuit layer 811 shown in FIG. 3B on the passivation layer 5 and on the contact pads 6190 exposed by the openings 519, 511, 512 and 514. The patterned circuit layer 821 may contain an adhesion/barrier layer, a seed layer on the adhesion/barrier layer, and an electroplated metal layer 8212 on the seed layer, the adhesion/barrier layer and the seed layer composing the bottom layer 8211. The patterned circuit layer 812 may contain an adhesion/barrier layer, a seed layer on the adhesion/barrier layer, and an electroplated metal layer 8122 on the seed layer, the adhesion/barrier layer and the seed layer composing the bottom layer 8121.

Referring to FIG. 3C, after the patterned circuit layer 821 is formed, a polymer layer 98 can be formed by spin-on coating a negative photosensitive polyimide layer, such as ester type, on the patterned circuit layer 821 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9829 may be formed in the polymer layer 98, exposing a contact pad of the patterned circuit layer 821.

Referring to FIG. 3C, regards to the process for forming the patterned circuit layer 812, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pad of the patterned circuit layer 821 exposed by the opening 9829 in the polymer layer 98. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8122 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8122 is removed using a wet-etching process or using a dry-etching process. Thereafter, the adhesion/barrier layer not under the metal layer 8122 is removed using a wet-etching process or using a dry-etching process.

After the patterned circuit layer 812 is formed, a polymer layer 99 can be formed by spin-on coating a negative photosensitive polyimide layer, such as ester type, on the patterned circuit layer 812 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9929 may be formed in the polymer layer 99, exposing a contact pad 8120 of the patterned circuit layer 812.

Referring to FIG. 3C, for forming a metal bump over the contact pad 8120, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9929. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball. The metal bump can be connected to a printed circuit board, ceramic substrate or another semiconductor chip.

Referring to FIG. 3C, for forming another kind of metal bump over the contact pad 8120, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9929. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 3C, a nickel layer having a thickness between 0.05 and 2 micrometers can be electroless plated on the contact pad 8120 exposed by the opening 9929 in layer polymer layer 99, and a gold layer, platinum layer, palladium layer or ruthenium layer having a thickness between 0.05 and 2 micrometers can be electroless plated on the electroless plated nickel layer in the opening 9929 in the polymer layer 99. Thereafter, a gold wire can be bonded onto the electroless plated gold layer in the opening 9929 in the polymer layer 99 using a wirebonding process.

Alternatively, referring to FIG. 3C, a gold wire can be bonded onto a gold layer, platinum layer, palladium layer or ruthenium layer of the patterned circuit layer 812, exposed by the openings 9929 in the polymer layer 99 using a wirebonding process.

Alternatively, before the patterned circuit layer 821 is formed, a polymer layer can be optionally formed by spin-on coating a negative photosensitive polyimide layer, such as ester type, on the nitride layer of the passivation layer 5 and on the contact pads 6290, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings may be formed in the polymer layer, exposing multiple contact pads 6290 exposed by the openings 529, 521, 522 and 524 in the passivation layer 5. After the polymer layer is formed, the patterned circuit layer 821 can be formed on the polymer layer and on the contact pads 6290 exposed by the openings 529, 521, 522 and 524. The adhesion/barrier layer of any above-mentioned material may be sputtered on the polymer layer and on the contact pads 6290 exposed by the openings in the polymer layer.

In some applications, some metal lines, traces or planes used to transmit a digital signal or analog signal can be provided on the polymer layer 98 and at the same level as the power traces, buses or planes 812. Alternatively, some metal lines, traces or planes used to transmit a digital signal or analog signal can be provided on the passivation layer 5 and at the same level as the ground traces, buses or planes 82. There are more other structures formed over the passivation layer 5, described as below: (1) in the first application for high performance circuits or high precision analog circuits, another patterned circuit layer, such as signal planes, buses, traces or lines, used to transmit a digital signal or an analog signal (not shown) may be added between the power lines, buses or planes 812 and the ground lines, buses or planes 821. Polymer layers, such as polyimide, benzocyclobutene (BCB), parylene, epoxy-based material, photoepoxy SU-8, elastomer or silicone, (not shown) over and under the signal planes, buses, traces or lines are provided to separate the signal planes, buses, traces or lines from the power traces, buses or planes 812 and to separate the signal planes, buses, traces or lines from the ground traces, buses or planes 821, respectively; (2) in the second application of the high current or the high precision circuit, another patterned circuit layer, such as ground planes, buses, traces or lines, (not shown) used to distribute a ground reference voltage may be added over the power traces, buses or planes 812. The power traces, buses or planes 812 are sandwiched by the ground traces, buses or planes 821 under the power traces, buses or planes 812 and the newly-added ground traces, buses or planes over the power traces, buses or planes 812, therefore, forming a Vss/Vcc/Vss structure (the stack is from the bottom to the top) over the passivation layer 5. A polymer layer, such as polyimide, benzocyclobutene (BCB), parylene, epoxy-based material, photoepoxy SU-8, elastomer or silicone, having a thickness of between 2 and 30 microns, is provided between the newly-added ground planes, buses, traces or lines and the power traces, buses or planes 812. A cap polymer layer, such as polyimide, benzocyclobutene (BCB), parylene, epoxy-based material, photoepoxy SU-8, elastomer or silicone, having a thickness of between 2 and 30 microns, covers the newly-added ground planes, buses, traces or lines; (3) in the third application of the high current or the high precision circuit, if required, based on the second application of the Vss/Vcc/Vss structure, another patterned circuit layer, such as power planes, buses, traces or lines, (not shown) used to distribute a power voltage can be further formed over the top ground planes, buses, traces or lines (not shown) over the power traces, buses or planes 812, creating a Vss/Vcc/Vss,/Vcc structure, (the stack is from the bottom to the top) over the passivation layer 5. A polymer layer, such as polyimide, benzocyclobutene (BCB), parylene, epoxy-based material, photoepoxy SU-8, elastomer or silicone, having a thickness of between 2 and 30 microns, is provided between the newly-added power planes, buses, traces or lines and the top ground traces, buses or planes 81. A cap polymer layer, such as polyimide, benzocyclobutene (BCB), parylene, epoxy-based material, photoepoxy SU-8, elastomer or silicone, having a thickness of between 2 and 30 microns, covers the newly-added power planes, buses, traces or lines. The above-mentioned structures provide a robust power supply for high current circuits, high precision analog circuits, high speed circuits, low power circuits, power management circuits, and high performance circuits.

Figure 4:
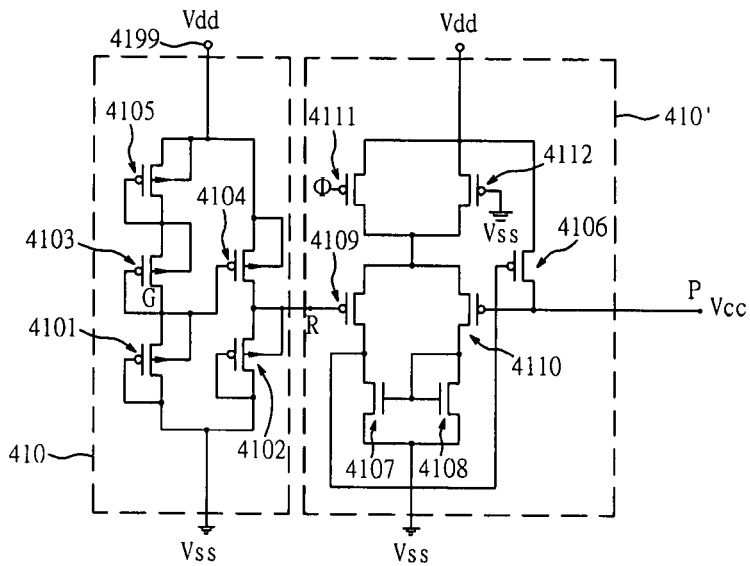
FIG. 4 is a schematic representation of an example of a CMOS voltage converter circuit in a preferred embodiment of the present invention.

FIG. 4 shows a circuit design for the regulator or voltage converter 41 in FIGS. 1B, 1C, 2B, 2C, 3B, 3C and 3D. This circuit design is for a voltage regulator or converter 41 usually used in the modern DRAM design as described in "Semiconductor Memories: A handbook of Design, Manufacture and Application" Second Edition, By B. Prince, published by John Wiley & Sons, 1991. The voltage regulator or converter 41 shown in FIG. 4 provides both voltage regulating function and voltage converting function. The external voltage Vdd can be converted to an output voltage Vcc varying at a desired voltage level Vcc0, and the ratio of the difference of between Vcc and Vcc0 to Vcc0 is less than 10%, and preferably less than 5%. As discussed in the section of "description of related arts", more modern IC chips require on-chip voltage converters to convert the external (system, board, module, or card level) power supply voltage to a voltage level required by the chip. Moreover, some chips, such as a DRAM chip, even require dual or even triple voltage levels on the same chip: for example, 3.3 V for peripheral control circuits, while 1.5 V for the memory cells in the cell array area.

The voltage regulator or converter 41 in FIG. 4 comprises two circuit blocks: a voltage reference generator 410 and a current mirror circuit 410'. The voltage reference generator 410 generates a reference voltage $V_R$ at the node R, insensitive to the voltage fluctuation of the external power supply voltage Vdd at node 4199. Vdd is also the input supply voltage of the reference voltage generator 410. The voltage reference generator 410 comprises two paths of voltage divider. One path comprises three p-channel MOS transistors, 4101, 4103 and 4105 connected in series, and the other path comprises two p-channel MOS transistors 4102 and 4104 connected in series. With the drain of the MOS transistor 4103 coupled to the gate of the MOS transistor 4104, the output reference voltage $V_R$ is regulated. When Vdd is fluctuated with a rise, the voltage level at node G will rise, resulting in a weaker turn-on of the MOS transistor 4104. When the MOS transistor 4104 is turned-on weaker, $V_R$ drops or rises with a smaller extent. Similarly, $V_R$ rises or drops with a smaller extent, when Vdd is fluctuated with a drop. This explains the voltage regulation behavior of the voltage reference generator 410. The output of the voltage reference generator 410 is used as a reference voltage of the current mirror circuit 410'. The current mirror circuit 410' provides a power supply with voltage at a desired constant level and with large current capability for an IC chip. The current mirror circuit 410' also eliminates possible huge power consumption or waste by avoiding a direct high current path from Vdd to Vss in the paths of voltage dividers. With the drain of the p-channel MOS transistor 4109 coupled to the gate of the output p-channel MOS transistor 4106, and with the output voltage node P coupled to the gate of the reference-voltage-mirror p-channel MOS transistor 4110, the output voltage Vcc is regulated, and thereby the output voltage level Vcc can be designed at a desired level. The conductance transistor 4112 is a small p-channel MOS transistor with a gate connected to Vss, hence the transistor 4112 is always turned on. The conductance transistor 4111 is a large p-channel MOS, and its gate is controlled by a signal Φ. The transistor 4111 is turned on when the internal circuits or internal circuit units are in an active cycle, resulting in a fast response of the current path provided by the p-channel MOS transistor 4109 and n-channel MOS transistor 4107, and of the current path provided by the p-channel MOS transistor 4110 and n-channel MOS transistor 4108. The turn-on of the transistor 4111 minimizes the output supply Vcc bounce caused by a large transient current demanded by the internal circuits, such as 21, 22, 23 and 24, shown in FIGS. 1B, 1C, 2B, 2C, 3B, 3C and 3D. When the internal circuits or internal circuit units are in idle cycle, the transistor 4111 is turned off to save power consumption.

Second Embodiment: Over-Passivation Interconnection for Internal Circuits

The coarse traces over the passivation layer 5 described in the first embodiment can be alternatively used as an interconnection of IC internal circuits to transmit a signal from an internal circuit to another one or other ones. In this application, the coarse metal conductor over a passivation layer is used to transmit a signal or data from an output node Xo of an internal circuit 21 to input nodes Ui, Vi and Wi of other internal circuits 22, 23 and 24, as shown in FIG. 5B. When designed as a bundle of metal lines or metal traces that connects a set of similar nodes for inputting or outputting data signals, bit signals or address signals, for example, between two internal functional circuits separated in a longer distance (for example, in the distance of 1 mm or more 500 microns), such as the 8-, 16-, 32-, 64-, 128-, 256-, 512-, or 1024-bits of data (or address) connection between a processor unit and a memory unit on the same chip, the lines or traces are often referred to as buses, such as word buses or bit buses used in a memory. For these applications, the invention provides a thick metal trace, bus or plane 83 over a passivation layer 5, far away from underlying MOS devices, to connect multiple internal circuits 21, 22, 23 and 24, as shown in FIG. 5B, and thereby allows the electrical signal to pass over MOS devices without perturbing the underlying MOS devices and without significant degradation of signal integrity. It is noted that the thick metal trace, bus or plane 83 over the passivation layer 5 connects the nodes of the internal circuits 21, 22, 23 and 24 not through any off-chip input/output circuit connected with an external circuit, and is not connected up to an external circuit. As the above-mentioned thick metal trace, bus or plane 83 over the passivation layer 5 may induce only very low parasitic capacitance, the signal passing through the thick metal trace, bus or plane 83 will not be dramatically degraded. It makes this invention very suitable for high-speed, low power, high current or low voltage applications. In most cases of this invention, no additional amplifier, driver/receiver or repeater is required to help sustain the integrity of the signal passing through the thick metal trace, bus or plane 83. In some cases of this invention, an internal driver, internal receiver, internal tri-state buffer, or repeater, comprising MOS transistors with a smaller size as compared to those of the off-chip circuits connected with an external circuit, is required to transmit a signal passing through a long path, such as the thick metal trace, bus or plane 83 having a length of greater than 500 microns or greater than 1000 microns.

Figure 5A:
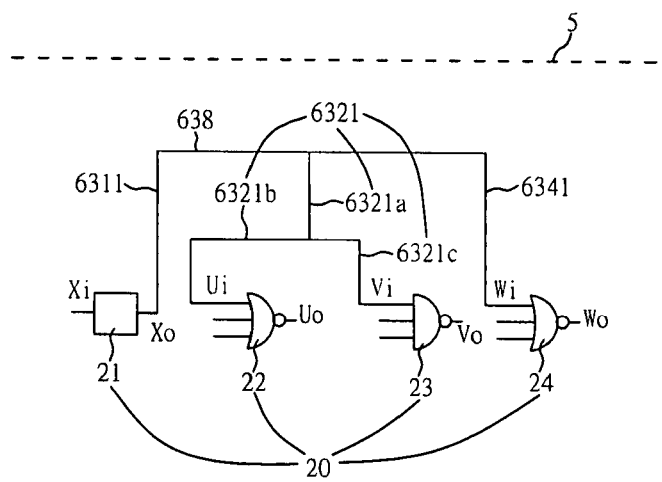
FIG. 5A is a schematic representation of multiple internal circuits connected through a fine-line metallization structure under a passivation layer.
Figure 5B:
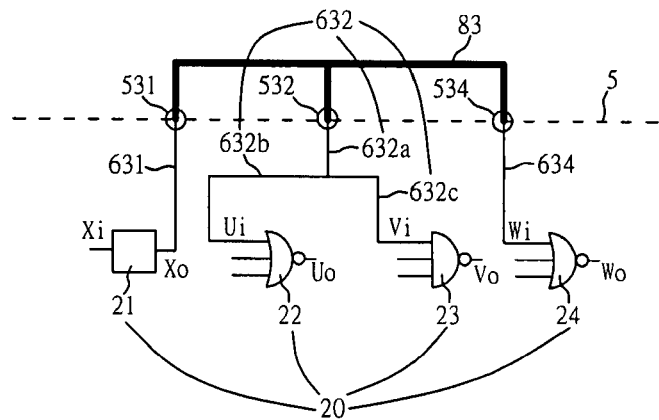
FIG. 5B is a schematic representation of multiple internal circuits connected through a thick and wide metal layer over a passivation layer to transmit a signal according to a second embodiment of the invention.
Figure 5C:
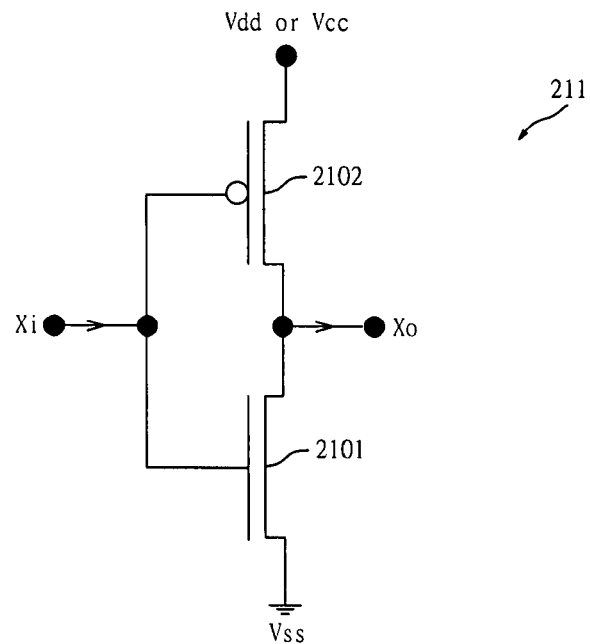
FIG. 5C shows a circuit diagram of an inverter, which can be applied to the internal circuit 21 shown in FIG. 5B.
Figure 5D:
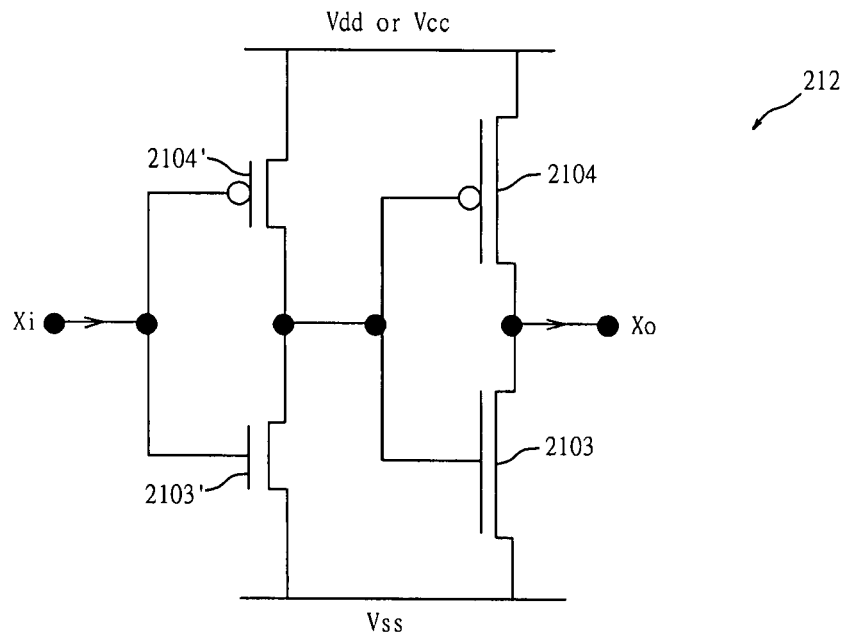
FIG. 5D shows a circuit diagram of an internal driver, which can be applied to the internal circuit 21 shown in FIG. 5B.
Figure 5E:
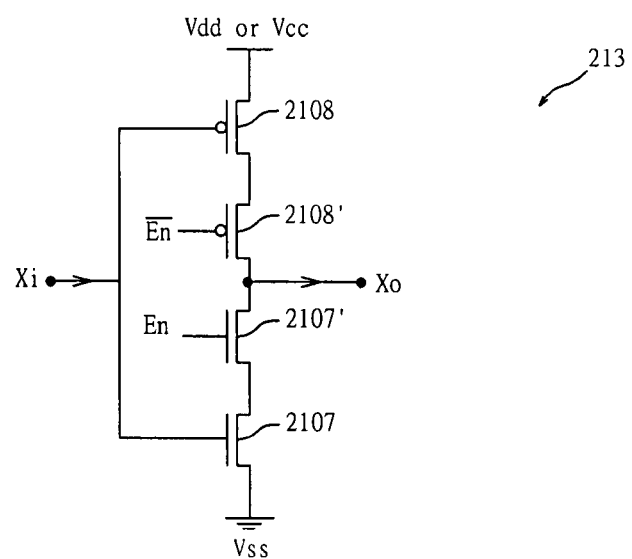
FIG. 5E shows a circuit diagram of a tri-state buffer, which can be applied to the internal circuit 21 shown in FIG. 5B.
Figure 6A:
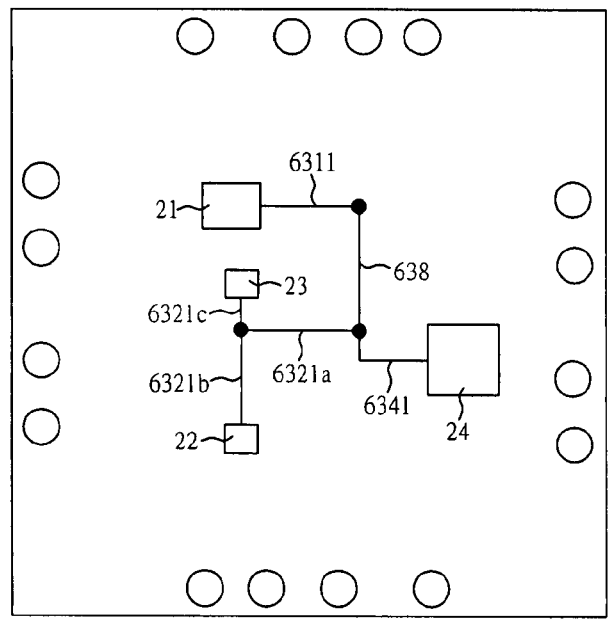
FIG. 6A is a top view layout of a conventional distribution of signals from an internal circuit to other internal circuits.
Figure 6B:
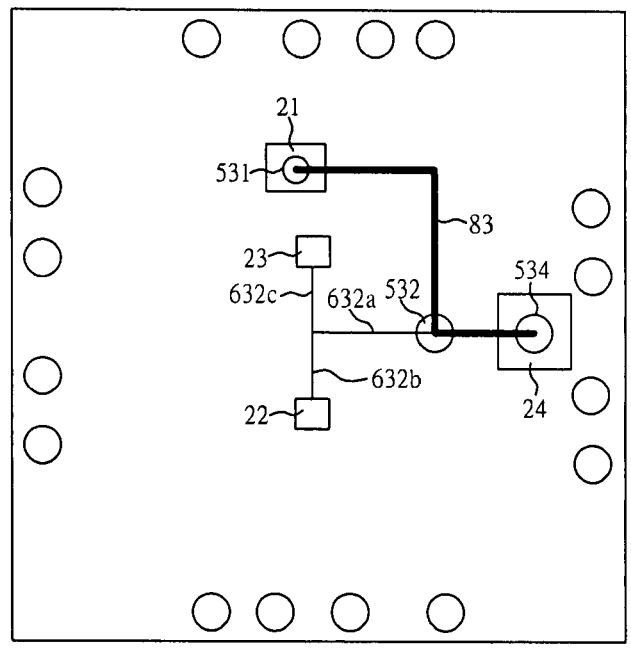
FIG. 6B is a top view layout of signal distribution, wherein an internal circuit sends signals to other internal circuits through an over-passivation interconnection scheme, requiring no solder bump and no off-chip circuits, in a second preferred embodiment of the present invention.
Figure 7A:
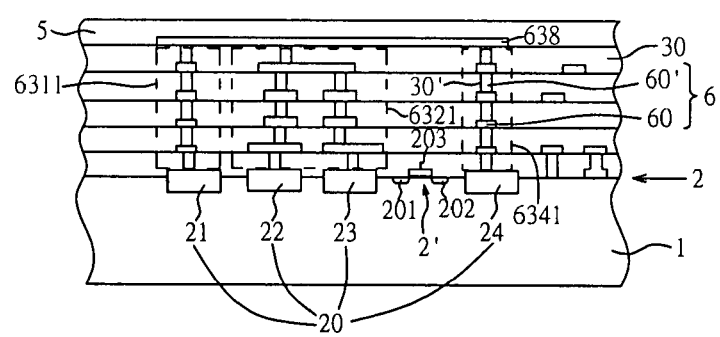
FIG. 7A is a cross-sectional representation of a conventional distribution of signals from an internal circuit to other internal circuits.
Figure 7B:
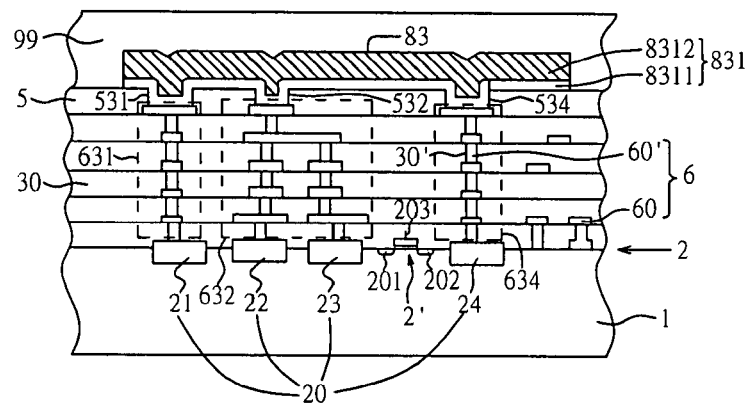
FIG. 7B is a cross-sectional representation of signal distribution, wherein an internal circuit sends signals to other internal circuits through an over-passivation interconnection scheme, requiring no solder bump and no off-chip circuits, in a second preferred embodiment of the present invention.

FIGS. 5B, 6B, and 7B show the second preferred embodiment of the invention. FIG. 5B shows a simplified circuitry diagram where a patterned metal trace, bus or plane 83 over a passivation layer 5 connects multiple internal circuits 21, 22, 23 and 24 to transmit a signal from an output node Xo of an internal circuit 21 to input nodes Ui, Vi and Wi of the internal circuits 22, 23 and 24. FIG. 6B shows a top view of the semiconductor chip realizing the circuitry shown in FIG. 5B, wherein coarse traces 83 shown in FIG. 6B indicate the traces formed over the passivation layer 5, and fine traces 632a, 632b and 632c shown in FIG. 6B indicate the traces formed under the passivation layer 5. FIG. 7B shows a cross-sectional view of the semiconductor chips realizing the circuitry shown in FIGS. 5B. FIG. 6B shows a top view of the semiconductor chip shown in FIG. 7B, wherein the patterned circuit layer 831, such as a signal plane, bus, trace or line, to transmit a signal from the internal circuit 21 to the internal circuits 22, 23 and 24 is realized from the concept of the coarse trace 83 shown in FIGS. 5B and 6B. As shown in FIGS. 5B, 6B and 7B, the internal circuit 21 includes an input node Xi to receive a signal and an output node Xo to output an electrical signal to the internal circuits 22, 23 and 24. The internal circuit 21 can be a logic gate, such as inverter, NOR gate, NAND gate, OR gate, AND gate, or an internal buffer (an inverter, an internal driver, or an internal tri-state buffer, shown in FIGS. 5C, 5D, and 5E, respectively). Through the coarse metal scheme 83 over the passivation layer 5, the input nodes Ui, Vi and Wi of the internal logic circuits 22, 23 and 24 (two NOR gates 22 and 24, and one NAND gate 23) are able to receive data or signal sent from the internal circuit 21. The voltage level at input nodest Ui, Vi and Wi are between Vdd and $V_{ss}$ with very minimal degradation and noise in that the interconnecting metal trace or bus 83 over the passivation layer 5 has low resistance and create low capacitance. It is noted that in this design the thick metal trace or bus 83 is not connected to off-chip circuits connected to an external circuit, such as ESD circuit, off-chip driver, off-chip receiver, or off-chip tri-state buffer circuit, resulting in speed improvement and power consumption reduction.

Referring to FIGS. 5A, 6A and 7A showing the prior art to illustrate how the internal circuits 21, 22, 23 and 24 are connected. The prior art relies on the fine-line metal traces 63, comprising segments of 6311, 6321, 6341 and 638, under the passivation layer 5 to pass data output from the internal circuit 21 to the internal circuits 22, 23 and 24, without relying on any patterned circuit layer over the passivation layer 5. The design of prior art results in signal degradation, performance reduction, high power consumption, and high heat generation because it is difficult to form a thick metal trace under the passivation layer 5.

FIGS. 5B and 6B reveal that the coarse metal scheme 83 is built over the passivation layer 5 of the IC chip, and is connected to the internal circuits 21, 22, 23 and 24. FIGS. 5A, 6A and 7A show that, in a prior art, the internal circuit 21 is connected to a NOR gate 22 through segments 6311, 638, 6321a and 6321b of the fine-line metal structures under the passivation layer 5, to a NAND gate 23 through segments 6311, 638, 6321a and 6321c of the fine-line metal structures under the passivation layer 5, and to another NOR gate 24 through segments 6311, 638 and 6341 of the fine-line metal structures under the passivation layer 5. In the present invention, the second segment 638 of the fine-line metal structure is replaced by a coarse metal conductor 83 over the passivation layer 5, as shown in FIGS. 5B and 6B. A signal output from an output node (usually the drain of a MOS transistor in the internal circuit 21) of the internal circuit 21 may pass through a segment 631 of the fine-line metal structure under the passivation layer 5, then through an opening 531 in the passivation layer 5, then through the interconnection scheme 83 over the passivation layer 5, then through an opening 534 in the passivation layer 5, then through a segment 634 of the fine-line metal structure under the passivation layer 5, and then to an input node (usually the gate of an MOS transistor in the NOR gate 24) of the NOR gate 24. A signal output from an output node (usually the drain of an MOS transistor in the internal circuit 21) of the internal circuit 21 may pass through a segment 631 of the fine-line metal structure under the passivation layer 5, then through the opening 531 in the passivation layer 5, then through the interconnection scheme 83 over the passivation layer 5, then through an opening 532 in the passivation layer 5, then through a segment 632a and a segment 632b or 632c of the fine-line metal interconnection scheme under the passivation layer 5, and then to the input nodes (usually the gates of MOS transistors in the NOR gate 22 and the NAND gate 23, respectively) of a NOR gate 22 and a NAND gate 23.

Alternatively, when the internal circuit 21 is a NOR gate, the internal circuits 22, 23 and 24 may be NOR gates, OR gates, NAND gate or AND gates. When the internal circuit 21 is an OR gate, the internal circuits 22, 23 and 24 may be NOR gates, OR gates, NAND gate or AND gates. When the internal circuit 21 is a NAND gate, the internal circuits 22, 23 and 24 may be NOR gates, OR gates, NAND gate or AND gates. When the internal circuit 21 is a AND gate, the internal circuits 22, 23 and 24 may be NOR gates, OR gates, NAND gate or AND gates. When a NMOS transistor in the internal circuit 21 having a drain as the output node Xo of the internal circuit 21 has a ratio of a physical channel width thereof to a physical channel length thereof ranging from 0.1 to 20, ranging from 0.1 to 10, or preferably ranging from 0.2 to 2, a NMOS transistor in the internal circuit 22, 23 or 24 having a gate as the input node Ui, Vi and Wi of the internal circuit 22, 23 or 24 has a ratio of a physical channel width thereof to a physical channel length thereof ranging from 0.1 to 20, ranging from 0.1 to 10 or preferably ranging from 0.2 to 2. When a NMOS transistor in the internal circuit 21 having a drain as the output node Xo of the internal circuit 21 has a ratio of a physical channel width thereof to a physical channel length thereof ranging from 0.1 to 20, ranging from 0.1 to 10, or preferably ranging from 0.2 to 2, a PMOS transistor in the internal circuit 22, 23 or 24 having a gate as the input node Ui, Vi and Wi of the internal circuit 22, 23 or 24 has a ratio of a physical channel width thereof to a physical channel length thereof ranging from 0.2 to 40, ranging from 0.2 to 20, or preferably ranging from 0.4 to 4. When a PMOS transistor in the internal circuit 21 having a drain as the output node Xo of the internal circuit 21 has a ratio of a physical channel width thereof to a physical channel length thereof ranging from 0.2 to 40, ranging from 0.2 to 20, or preferably ranging from 0.4 to 4, a NMOS transistor in the internal circuit 22, 23 or 24 having a gate as the input node Ui, Vi and Wi of the internal circuit 22, 23 or 24 has a ratio of a physical channel width thereof to a physical channel length thereof ranging from 0.1 to 20, ranging from 0.1 to 10, or preferably ranging from 0.2 to 2. When a PMOS transistor in the internal circuit 21 having a drain as the output node Xo of the internal circuit 21 has a ratio of a physical channel width thereof to a physical channel length thereof ranging from 0.2 to 40, ranging from 0.2 to 20, or preferably ranging from 0.4 to 4, a PMOS transistor in the internal circuit 22, 23 or 24 having a gate as the input node Ui, Vi and Wi of the internal circuit 22, 23 or 24 has a ratio of a physical channel width thereof to a physical channel length thereof ranging from 0.2 to 40, ranging from 0.2 to 20, or preferably ranging from 0.4 to 4. In the above-mentioned case, a signal output from the output node Xo of the internal circuit 21 may pass through the thick metal plane, bus, trace or line 83 to the internal circuits 22, 23 and 24, with a current, passing through the thick metal plane, bus, trace or line 83, ranging from 50 microamperes to 2 milliamperes, and preferably ranging from 100 microamperes to 1 milliampere. The fine line metal structures 634, 632 and 631 shown in 7B, 7C and 7D may be formed with multiple circuit layers 60 and multiple stacked plugs 60', upper plugs 60' being aligned with bottom plugs 60'. When the circuit layers 60 are formed with electroplated copper, the stacked plugs 60' may be formed with electroplated copper. When the circuit layers 60 are formed with sputtered aluminum, the stacked plugs 60' may be formed with chemical vapor deposited tungsten. There are multiple insulating layers 30 under the passivation layer 5, and each one is positioned between the neighboring two of the circuit layers 60. The insulating layers 30 made of one or more inorganic materials may include a layer of silicon oxide with a thickness of between 0.01 and 2 micrometers, may include a layer of fluorine doped silicate glass (FSG) with a thickness of between 0.01 and 2 micrometers, or may include a layer with a lower dielectric constant, such as between 1.5 and 3.5, having a thickness of between 0.01 and 2 micrometers, such as black diamond film or a material containing hydrogen, carbon, oxygen and silicon.

Figure 7C:
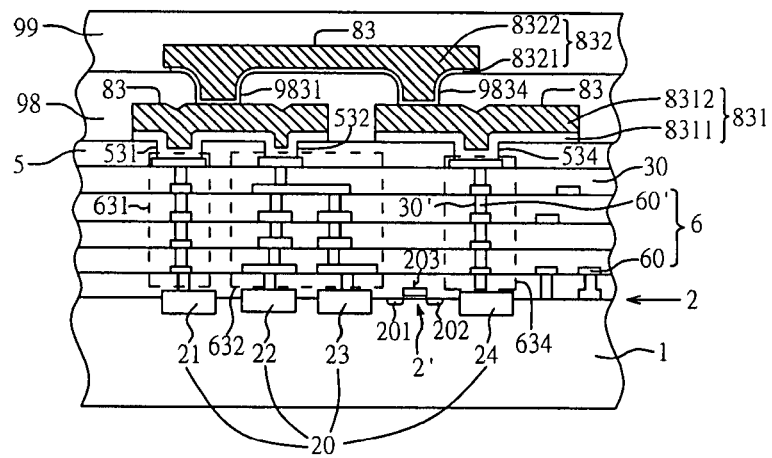
FIG. 7C is a cross-sectional representation of signal distribution, wherein an internal circuit sends signals to other internal circuits through an over-passivation scheme, requiring no solder bump and no off-chip circuits, in a second preferred embodiment of the present invention. Two over-passivation scheme comprises two metal layers.
Figure 7D:
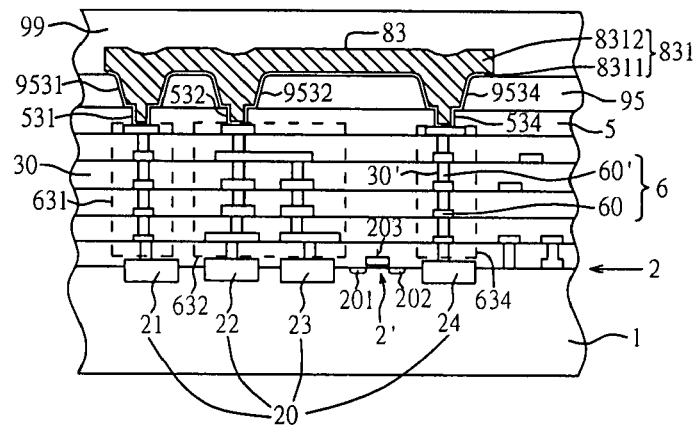
FIG. 7D is a cross-sectional representation of signal distribution, wherein an internal circuit sends signals to other internal circuits through an over-passivation interconnection scheme. This figure is similar to FIG. 7B except that an additional polymer layer is provided between the passivation layer and the bottom-most over-passivation metal layer.

The thick metal trace or plane 83 over the passivation layer 5, shown in FIGS. 5B and 6B, may be composed of only one patterned circuit layer 831, as shown in FIG. 7B, or multiple patterned circuit layers 831 and 832, as shown in FIG. 7C. In FIG. 7B, the patterned circuit layer 831, such as a signal plane, bus, trace or line, to transmit a signal is realized from the concept of the coarse trace 83 shown in FIGS. 5B and 6B. In FIG. 7C, the patterned circuit layers 831 and 832, such as signal planes, buses, traces or lines, to transmit a signal is realized from the concept of the coarse trace 83 shown in FIGS. 5B and 6B. When the thick metal traces or plane 83 over the passivation layer 5, shown in FIGS. 5B and 6B, is composed of multiple patterned circuit layers 831 and 832, as shown in FIG. 7C, a polymer layer 98, such as polyimide (PI), benzocyclobutene (BCB), parylene, photoepoxy SU-8, epoxy-based material, elastomer or silicone, may be between the neighboring patterned circuit layers 831 and 832, separating the patterned circuit layers 831 and 832. The polymer layer 98 may have a thickness between 2 and 30 micrometers. A polymer layer 99, such as polyimide (PI), benzocyclobutene (BCB), parylene, epoxy-based material, photoepoxy SU-8, elastomer or silicone, may be on the topmost one 832 of the patterned circuit layers 831 and 832, separated by the above mentioned polymer layers 98, over the passivation layer 5, as shown in FIG. 7C, or on the only one patterned circuit layer 831, as shown in FIGS. 7B and 7D. The polymer layer 99 may have a thickness between 2 and 30 micrometers. It is noted that no opening in the polymer layer 99 expose the patterned circuit layer 831 or 832, and the patterned circuit layer 831 or 832 has no pad connected up to an external circuit, as shown in FIGS. 7B, 7C and 7D. Alternatively, a polymer layer 95, such as polyimide (P1), benzocyclobutene (BCB), parylene, epoxy-based material, photoepoxy SU-8, elastomer or silicone, may be between the passivation layer 5 and the bottommost one 831 of the patterned circuit layers 831 and 832, separated by the above mentioned polymer layers 98, for the structure shown in FIG. 7C, or between the passivation layer 5 and the only one patterned circuit layer 831, as shown in FIG. 7D. The polymer layer 95 may have a thickness between 2 and 30 micrometers. Multiple openings 9519, 9519', 9511, 9512 and 9514 in the polymer layer 95 are substantially aligned with the openings 519, 519', 511, 512 and 514 in the passivation layer 5, respectively. The openings 9531, 9532 and 9534 in the polymer layer 95 expose the pads exposed by the openings 531, 532 and 534 in the passivation layer 5, respectively.

The openings 9531, 9532 and 9534 in the polymer layer 95 have lower portions having widths or transverse dimensions greater than those of the openings 531, 532 and 534 in the passivation layer 5 aligned with the openings 9531, 9532 and 9534, respectively. The openings 9531, 9532 and 9534 in the polymer layer 95 further expose the passivation layer 5 close to the openings 531, 532 and 534. The shape of the openings 531, 532 and 534 from a top perspective view may be round, square, rectangular or polygon. If the openings 531, 532 and 534 are round, the openings 531, 532 and 534 may have a diameter of between 0.1 and 200 microns, between 1 and 100 microns, or, preferably, between 0.1 and 30 microns. If the openings 531, 532 and 534 are square, the openings 531, 532 and 534 may have a width of between 0.1 and 200 microns, between 1 and 100 microns, or, preferably, between 0.1 and 30 microns. If the openings 531, 532 and 534 are rectangular, the openings 531, 532 and 534 may have a width of between 0.1 and 200 microns, between 1 and 100 microns, or, preferably, between 0.1 and 30 microns, and a length of between 1 micron and 1 centimeter. If the openings 531, 532 and 534 are polygon having more than five sides, the openings 531, 532 and 534 have a greatest diagonal length of between 0.1 and 200 microns, between 1 and 100 microns, or, preferably, between 0.1 and 30 microns. Alternatively, the openings 531, 532 and 534 have a greatest transverse dimension of between 0.1 and 200 microns, between 1 and 100 microns, or, preferably, between 0.1 and 30 microns. In a case, the openings 531, 532 and 534 have a width of between 0.1 and 30 microns, with the lower portion of the openings 9531, 9532 and 9514 in the polymer layer 95 having a width of between 20 and 100 microns.

Each of the patterned circuit layers 831 and 832 composing the thick metal trace or plane 83 over the passivation layer 5, shown in FIGS. 7B, 7C and 7D, may comprise an adhesion/barrier/seed layer 8311, 8311a, 8311b or 8321 and a bulk conduction metal layer 8112, 8312a, 8312b or 8322. The methods to form the patterned circuit layer 831 or 832 and the specification thereof may follow the methods to form the patterned circuit layer 801, 802 or 803 and the specification thereof shown in FIGS. 15A-15L, 16A-16L, 17A-17J, 18A-18I and 19A-19I.

In FIGS. 7B and 7D, there is only one patterned circuit layer 831, including a portion serving as the above-mentioned thick and wide metal trace 83 over the passivation layer 5. The patterned circuit layer 831 may contain an adhesion/barrier layer, a seed layer on the adhesion/barrier layer, and an electroplated metal layer 8312 on the seed layer, the adhesion/barrier layer and the seed layer composing the bottom layer 8311.

Referring to FIG. 7B, regards to the process for forming the patterned circuit layer 831, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6390, principally made of aluminum or copper, exposed by multiple openings 531, 532 and 534 in the passivation layer 5. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8312 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8312 is removed using a wet-etching process or using a dry-etching process. Thereafter, the adhesion/barrier layer not under the metal layer 8312 is removed using a wet-etching process or using a dry-etching process.

After the patterned circuit layer 831 is formed, a polymer layer 99 can be formed by spin-on coating a negative photosensitive polyimide layer, such as ester type, on the patterned circuit layer 831 and on the nitride layer of the passivation layer 5 and then curing the spin-on coated polyimide layer at the temperature between 265 and 285° C. for a time between 30 and 240 minutes in a nitrogen or oxygen-free ambient. No opening is formed in the polymer layer 99 to expose the thick and wide metal trace 83.

Referring to FIG. 7D, before the patterned circuit layer 831 is formed, a polymer layer 95 can be optionally formed by spin-on coating a negative photosensitive polyimide layer, such as ester type, on the nitride layer of the passivation layer 5 and on the contact pads exposed by the openings 531, 532 and 534 in the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9531, 9532 and 9534 may be formed in the polymer layer 95, exposing multiple contact pads exposed by the openings 531, 532 and 533 in the passivation layer 5. After the polymer layer 95 is formed, the patterned circuit layer 831 can be formed on the polymer layer 95 and on the contact pads exposed by the openings 531, 532 and 533. The adhesion/barrier layer of any above-mentioned material may be sputtered on the polymer layer 95 and on the contact pads exposed by the openings 9531, 9532 and 9534 in the polymer layer 95.

Alternatively, referring to FIG. 7C, there may be multiple patterned circuit layers 831 and 832, including a portion serving as the above-mentioned thick and wide metal trace 83, over the passivation layer 5. The process for forming the patterned circuit layer 831 shown in FIG. 7C can be referred to as the process for forming the patterned circuit layer 831 shown in FIG. 10B. The patterned circuit layer 832 may contain an adhesion/barrier layer, a seed layer on the adhesion/barrier layer, and an electroplated metal layer 8322 on the seed layer, the adhesion/barrier layer and the seed layer composing the bottom layer 8321.

Referring to FIG. 7C, after the patterned circuit layer 831 is formed, a polymer layer 98 can be formed by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9831 and 9834 may be formed in the polymer layer 98, exposing multiple contact pads of the patterned circuit layer 831.

Referring to FIG. 7C, regards to the process for forming the patterned circuit layer 832, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pads of the patterned circuit layer 831 exposed by multiple openings 9831 and 9834 in the polymer layer 98. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8322 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8322 is removed using a wet-etching process or using a dry-etching process. Thereafter, the adhesion/barrier layer not under the metal layer 8322 is removed using a wet-etching process or using a dry-Itching process.

After the patterned circuit layer 832 is formed, a polymer layer 99 can be formed by spin-on coating a negative photosensitive polyimide layer, such as ester type, on the patterned circuit layer 832 and on the polymer layer 98, and then curing the spin-on coated polyimide layer at the temperature between 265 and 285° C. for a time between 30 and 240 minutes in a nitrogen or oxygen-free ambient.

Alternatively, referring to FIG. 7C, before the patterned circuit layer 831 is formed, a polymer layer 95 as mentioned in FIG. 7D can be optionally formed by spin-on coating a negative photosensitive polyimide layer, such as ester type, on the nitride layer of the passivation layer 5 and on the contact pads exposed by the openings 531, 532 and 534 in the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9531, 9532 and 9534 may be formed in the polymer layer 95 as mentioned in FIG. 7D, exposing multiple contact pads exposed by the openings 531, 532 and 533 in the passivation layer 5. After the polymer layer 95 is formed, the patterned circuit layer 831 can be formed on the polymer layer 95 and on the contact pads exposed by the openings 531, 532 and 533. The adhesion/barrier layer of any above-mentioned material may be sputtered on the polymer layer 95 and on the contact pads exposed by the openings 9531, 9532 and 9534 in the polymer layer 95.

FIG. 7C is similar to FIG. 7B except the thick metal planes, buses or traces 83 are composed of two patterned circuit layers 831 and 832; the bottom one is composed of segments 831*a* and 831*b*. A polymer layer 98 separates the patterned circuit layer 831 from the patterned circuit layer 832. In FIG. 7C, the thick metal plane, trace or bus 831 in FIG. 7B is replaced by the thick metal plane, trace or bus 831*a*, 831*b* and 832. Referring to FIG. 7C, a signal output from the output node (usually the drain of an MOS transistor in the internal circuit 21) of the internal circuit 21 passes through the fine-line metal buses or traces 631 under the passivation layer 5, then through the opening 531 in the passivation layer 5, then through the metal trace or bus 831*b* over the passivation layer 5, (1) in a first path, then up through an opening 9831 in the polymer layer 98, then through the metal bus or trace 832 on the polymer layer 98, then down through an opening 9834 in the polymer layer 98, then through the metal trace or bus 831*a* over the passivation layer 831*a*, then through an opening 534 in the passivation layer 5, then through the fine-line metal structure 634 under the passivation layer 5, and to the input node (usually the gate of an MOS transistor in the NOR gate 24) of the NOR gate 24; (2) in a second path, then down through an opening 532 in the passivation layer 5, then through the fine-line metal interconnection scheme 632 under the passivation layer 5, and then to the input nodes (usually the gates of MOS transistors in the NOR gate 24 and the NAND gate 23, respectively) of the NOR gate 22 and the NAND gate 23.

Referring to 5B, 6B, 7B, 7C and 7D, the thick metal trace or bus 83, 831 or 832 over the passivation layer 5 is be connected to an off-chip I/O circuit connected to an external circuit, and thereby the thick metal trace or bus 83, 831 or 832 has no significant voltage drop or signal degradation.

Now refer to FIGS. 5C-5E showing internal buffer circuits applied to the internal circuit 21. The internal circuit 21 shown in FIG. 5B, 6B, 7B, 7C and 7D may be an internal inverter shown in FIG. 5C. In a first application, the size of the n-channel MOS 2101 and p-channel MOS 2102 can be designed in a size often employed in the internal circuits 22, 23 and 24. The size of an MOS transistor is defined as a ratio of a physical channel width thereof to a physical channel length thereof. The n-channel MOS transistor 2101 may have a ratio of a physical channel width thereof to a physical channel length thereof ranging from 0.1 to 20, ranging from 0.1 to 10, or preferably ranging from 0.2 to 2. The p-channel MOS transistor 2102 may have a ratio of a physical channel width thereof to a physical channel length thereof ranging from 0.2 to 40, ranging from 0.2 to 20, or preferably ranging from 0.4 to 4. In the first application, a current passing through the thick metal trace 83 over the passivation layer 5 and outputting from the node Xo of the internal circuit 21 may be in a range of between 50 μA and 2 mA, and preferably of between 100 µA and 1 mA. In a second application, a greater drive current is required for the output of the inverter 211, for example, when a heavy load is demanded by the load internal circuits 22, 23 and 24, or when the internal circuits 22, 23 and 24 are located far away from the internal circuit 21, requiring interconnection metal lines or traces connecting the internal circuit 21 and the internal circuits 22, 23 and 24 in a distance of greater than 1 mm or of greater than 3 mm, for example. In the second application, the current output from the inverter 211 is higher than that output from the regular internal circuit, and is, for example, at 1 mA or 5 mA, or in a range of between 500 µA and 10 mA, and preferably of between 700 µA and 2 mA. Hence, in the second application, the n-channel MOS transistor 2101 may have a ratio of a physical channel width thereof to a physical channel length thereof ranging from 1.5 to 30, and preferably ranging from 2.5 to 10. The p-channel MOS transistor 2102 may have a ratio of a physical channel width thereof to a physical channel length thereof ranging from 3 to 60, and preferably ranging from 5 to 20.

When the inverter 211 shown in FIG. 5C is applied to the internal circuit 21 as shown in FIGS. 5B, 6B, 7B, 7C and 7D, the drains of the n-channel MOS transistor 2101 and p-channel MOS transistor 2102, serving as the output node Xo of the internal circuit 21, are connected to the thick metal traces or buses 83, 831 or 832 over the passivation layer 5 as shown in FIGS. 5B, 6B, 7B, 7C and 7D. The gates of the n-channel MOS transistor 2101 and p-channel MOS transistor 2102 serve as the input node Xi of the internal circuit 21.

Referring to FIG. 5C, the above-mentioned power plane, bus or trace 81, 811 or 812, as shown in FIGS. 1B, 1C, 2B, 2C, 3B, 3C and 3D, over the passivation layer 5 may connect the node P of the regulator or converter 41 and the source of the p-channel MOS device 2102. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The above-mentioned ground plane, bus or trace 82 or 821, as shown in FIGS. 1C, 2C and 3C, over the passivation layer 5 may connect the node Rs of the regulator or converter 41 and the source of the n-channel MOS device 2101. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

FIGS. 5D and 5E show an internal driver 212 and internal tri-state output buffer 213, respectively. When the internal driver 212 shown in FIG. 5D is applied to the internal circuit 21 as shown in FIGS. 5B, 6B, 7B, 7C and 7D, the drains of a n-channel MOS transistor 2103 and p-channel MOS transistor 2104, serving as the output node Xo of the internal circuit 21, are connected to the thick metal traces or buses 83, 831 or 832 over the passivation layer 5. The gates of a n-channel MOS transistor 2103' and p-channel MOS transistor 2104' serve as the input node Xi of the internal circuit 21. The drains of the n-channel MOS transistor 2103' and p-channel MOS transistor 2104' are connected to the gates of the n-channel MOS transistor 2103 and p-channel MOS transistor 2104.

When the internal tri-state output buffer 213 shown in FIG. 5E is applied to the internal circuit 21 as shown in FIGS. 5B, 6B, 7B, 7C and 7D, the drains of a n-channel MOS transistor 2107' and p-channel MOS transistor 2108' with a switch function controlled by an Enable signal transmitted to the gate of the n-channel MOS transistor 2107' and Enable(bar) signal transmitted to the gate of the p-channel MOS transistor 2108', serving as the output node Xo of the internal circuit 21, are connected to the thick metal traces or buses 83, 831 or 832 over the passivation layer 5 as shown in FIGS. 5B, 6B, 7B, 7C and 7D. The gates of a n-channel MOS transistor 2107 and p-channel MOS transistor 2108 serve as the input node Xi of the internal circuit 21. The drains of a n-channel MOS transistor 2107 and p-channel MOS transistor 2108 are connected to the sources of the n-channel MOS transistor 2107' and p-channel MOS transistor 2108', respectively.

The internal driver 212 or internal tri-state output buffer 213, used to drive a signal through the post-passivation metal traces 83 and to the internal circuits 22, 23 and 24, as shown in FIG. 5D or 5E, is similar to the off-chip driver or off-chip tri-state output buffer used to drive an external circuitry, to be discussed in the following FIG. 11A or 11D, respectively, except that (1) the output node Xo of the internal driver 212 or internal tri-state output buffer 213 is not connected to an external circuit; (2) the greatest one of p-MOS transistors in the internal driver 212 or internal tri-state output buffer 213 has a ratio of a physical channel width thereof to a physical channel length thereof smaller than that of the greatest one of p-MOS transistors in the off-chip driver or off-chip tri-state output buffer connected to an external circuit. The internal tri-state output buffer 213 provides drive capability and switch capability, and is particularly useful to transmit a data signal or an address signal in a memory chip through the thick metal lines or traces 83 over the passivation layer 5 acting as data or address buses.

In FIG. 5B, a relatively great drive current is required at the output node Xo of the internal circuit 21 when a heavy load is demanded by the internal circuits 22, 23 and 24, or when the internal circuits 22, 23 and 24 are far away from the internal circuit 21 in a distance of greater than 1 mm or of greater than 3 mm. To provide a relatively great drive current, the internal circuit 21 can be designed as an internal driver 212 shown in FIG. 5D or an internal tri-state output buffer 213 shown in FIG. 5E.

In FIGS. 5D and 5E, the n-channel MOS transistors 2103, 2107 and 2107' may have a ratio of a physical channel width thereof to a physical channel length thereof ranging from 1.5 to 30, and preferably ranging from 2.5 to 10. The p-channel MOS transistors 2104, 2108 and 2108' may have a ratio of a physical channel width thereof to a physical channel length thereof ranging from 3 to 60, and preferably ranging from 5 to 20. In FIG. 5D, the n-channel MOS transistor 2103' may have a ratio of a physical channel width thereof to a physical channel length thereof ranging from 0.1 to 20, ranging from 0.1 to 10, or preferably ranging from 0.2 to 2, and the p-channel MOS transistor 2104' may have a ratio of a physical channel width thereof to a physical channel length thereof ranging from 0.2 to 40, ranging from 0.2 to 20, or preferably ranging from 0.4 to 4. Referring to FIGS. 5B, 5D and 5E, the internal driver 212 or internal tri-state buffer 213 may drive a signal output from the output node Xo thereof through the thick metal trace or bus 83 over the passivation layer 5 to the input nodes Ui, Vi and Wi of the internal circuits 22, 23 and 24 but not to an external circuit. A current passing through the thick metal trace or line 83 over the passivation layer 5 and outputting from the node Xo of the internal circuit 21, provided by the internal driver 212 or internal tri-state buffer 213, may be between 500 µA and 10 mA, and preferably between 700 µA and 2 mA.

Referring to FIG. 5D, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the sources of the p-channel MOS devices 2104 and 2104'. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the sources of the n-channel MOS devices 2103 and 2103'. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Referring to FIG. 5E, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the source of the p-channel MOS device 2108. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the source of the n-channel MOS device 2107. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Alternatively, when a NMOS transistor in the internal circuit 21 having a drain as the output node Xo of the internal circuit 21 has a ratio of a physical channel width to a physical channel length ranging from 1.5 to 30, and preferably ranging from 2.5 to 10, a NMOS transistor in the internal circuit 22, 23 or 24 having a gate as the input node Ui, Vi and Wi of the internal circuit 22, 23 or 24 has a ratio of physical channel width to physical channel length ranging from 0.1 to 20, ranging from 0.1 to 10, or preferably ranging from 0.2 to 2. When a NMOS transistor in the internal circuit 21 having a drain as the output node Xo of the internal circuit 21 has a ratio of a physical channel width to a physical channel length ranging from 1.5 to 30, and preferably ranging from 2.5 to 10, a PMOS transistor in the internal circuit 22, 23 or 24 having a gate as the input node Ui, Vi and Wi of the internal circuit 22, 23 or 24 has a ratio of a physical channel width to a physical channel length ranging from 0.2 to 40, ranging from 0.2 to 20, or preferably ranging from 0.4 to 4. When a PMOS transistor in the internal circuit 21 having a drain as the output node Xo of the internal circuit 21 has a ratio of a physical channel width to a physical channel length ranging from 3 to 60, and preferably ranging from 5 to 20, a NMOS transistor in the internal circuit 22, 23 or 24 having a gate as the input node Ui, Vi and Wi of the internal circuit 22, 23 or 24 has a ratio of a physical channel width to a physical channel length ranging from 0.1 to 20, ranging from 0.1 to 10, or preferably ranging from 0.2 to 2. When a PMOS transistor in the internal circuit 21 having a drain as the output node Xo of the internal circuit 21 has a ratio of a physical channel width to a physical channel length ranging from 3 to 60, and preferably ranging from 5 to 20, a PMOS transistor in the internal circuit 22, 23 or 24 having a gate as the input node Ui, Vi and Wi of the internal circuit 22, 23 or 24 has a ratio of a physical channel width to a physical channel length ranging from 0.2 to 40, ranging from 0.2 to 20, or preferably ranging from 0.4 to 4. In the above-mentioned case, a signal output from the output node Xo of the internal circuit 21 may pass through the thick metal plane, bus, trace or line 83 to the internal circuits 22, 23 and 24, with a current, passing through the thick metal plane, bus, trace or line 83, ranging from 500 microamperes to 10 milliamperes, and preferably ranging from 700 microamperes to 2 milliamperes.

The concept shown in FIG. 5B can be applied to a memory chip, as illustrated in FIGS. 5F-5J.

Figure 5F:
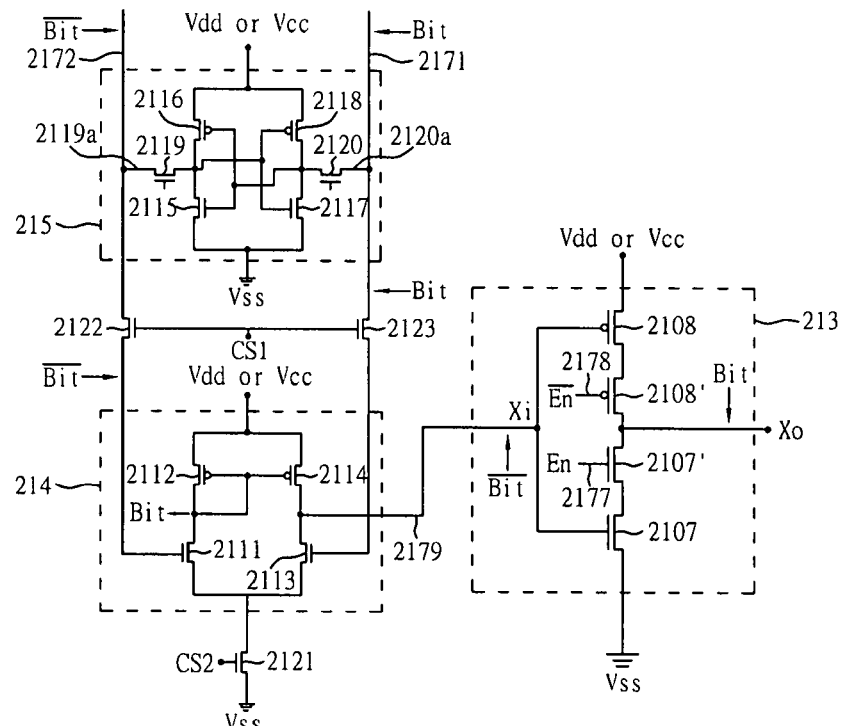
FIG. 5F shows a circuit diagram of a tri-state buffer, which can be applied to the internal circuit 21 shown in FIG. 5B, connected to a sense amplifier connected to a memory cell.

Referring to FIG. 5F, the above-mentioned tri-state output buffer 213 is employed to be the internal circuit 21 shown in FIGS. 5B, 6B, 7B, 7C and 7D and has an input node Xi connected to an output node of an amplifier 214 and an output node Xo connected to the internal circuits 22, 23 and 24, such as logic gates, through the above mentioned thick metal plane, bus or trace 83, 831 or 832 over the passivation layer 5, as shown in FIGS. 5B, 6B, 7B, 7C and 7D, wherein the internal circuits 22, 23 and 24 may alternatively be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The semiconductor chip may include a memory array comprising multiple memory cells connected to word lines, bit lines and bit (bar) lines. Each pair of bit line, such as 2171, and bit (bar) line, such as 2172, is connected to one of the amplifiers, such as 214, through the channel of the n-channel MOS transistors 2123 and 2122 controlled by CS1 node. When the n-channel MOS transistors 2122 and 2123 are turned off in an inactive cycle, the noise on the bit line 2171 or on the bit (bar) line 2172 can not be transmitted to the sense amplifier 214 nor has a negative impact on the sense amplifier 214.

In this case, the memory cell 215 is a static random access memory (SRAM) cell. Alternatively, the memory cell 215 may be a dynamic random access memory (DRAM) cell, an erasable programmable read only memory (EPROM) cell, an electronic erasable programmable read only memory (EEPROM) cell, a flash memory cell, a read only memory (ROM) cell, or a magnetic random access memory (MRAM) cell, which is connected to one or more logic gates 22, 23 and 24 through a thick metal traces 83, 831 or 832 over the passivation layer 5, as shown in FIGS. 5B, 6B, 7B, 7C and 7D. A sense amplifier 214, tri-state buffer 213, pass gate 216, latch memory 217 or internal driver 212, as shown in FIGS. 5F-5J, may be optionally set on the path between any kind of the exampled memory cell 215 and the thick metal traces 83, 831 or 832 over the passivation layer 5.

In case of SDRAM cell acting as the memory cell 215, a plurality of the memory cell 215 may be arranged in an array. A plurality of bit line 2171 and bit (bar) line 2172 arranged in parallel are connected to the sources or drains of NMOS transistors 2120 and 2119 of the memory cells 215 arranged in a column, respectively. A plurality of word line arranged in parallel and in vertical to the bit line 2171 and bit (bar) line 2172 is connected to the gate of NMOS transistors 2120 and 2119 of the memory cells 215 arranged in a row. The memory cell 215 further comprises two PMOS transistors 2116 and 2118 and two NMOS transistors 2115 and 2117, wherein the gates of the PMOS transistor 2116 and the NMOS transistor 2115 and the drains of the PMOS transistor 2118 and the NMOS transistor 2117 are connected to the bit line 2171 through the channel of the NMOS transistor 2120, and wherein the gates of the PMOS transistor 2118 and the NMOS transistor 2117 and the drains of the PMOS transistor 2116 and the NMOS transistor 2115 are connected to the bit (bar) line 2172 through the channel of the NMOS transistor 2119.

The sense amplifier 214, such as differential amplifier, can be coupled to multiple memory cells 215 arranged in a column through the bit line 2171 and the bit (bar) line 2172. The sense amplifier 214 comprises two PMOS transistors 2112 and 2114 and two NMOS transistors 2111 and 2113, wherein the gates of the PMOS transistors 2112 and 2114 are connected to the drains of the NMOS transistor 2111 and the PMOS transistor 2112, and wherein the drains of the PMOS transistor 2114 and the NMOS transistor 2113 serving as an output node of the sense amplifier 214 are connected to the gates of the PMOS transistor 2108 and the NMOS transistor 2107 in the above-mentioned tri-state buffer 213. The gate of the NMOS transistor 2113 is connected to the bit line 2171. The gate of the NMOS transistor 2111 is connected to the bit (bar) line 2172. The description and specification of the tri-state buffer 213 may be referred to the above illustration shown in FIG. 5E.

Referring to FIG. 5F, the node P of the regulator or converter 41 can be connected to the sources of the PMOS transistors 2116 and 2118 of the memory cell 215, the sources of the PMOS transistors 2112 and 2114 of the sense amplifier 214 and the source of the PMOS transistor 2108 of the tri-state output buffer 213 through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the source of the NMOS transistor 2107 of the tri-state output buffer 213 through the above-mentioned ground plane, bus or trace 82 or 821, as shown in FIGS. 1C, 2C and 3C, over the passivation layer 5. The differential sense amplifier 214 is isolated from Vss by a transistor 2121, and controlled by a column selection signal (CS2) to save power consumption. The transistor 2121 is turned off when the memory cell 215 is not read. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

When the memory cell 215 is in a "READ" operation with the NMOS transistors 2120 and 2119 being turned on, the state latched in the memory cell 215, such as bit data and bit (bar) data, may be output to the bit line 2171 and bit (bar) line 2172 through the channels of the NMOS transistors 2120 and 2119, respectively. The bit data and bit (bar) data may be transmitted to the sense amplifier 214 through the bit line 2171 and bit (bar) line 2172, respectively, to initially amplify the bit data and the bit (bar) data, leading the bit data and the bit (bar) data to have a desirable waveform or voltage level. The initially amplified bit data or bit (bar) data output from the amplifier 214 may be transmitted to a tri-state output buffer 213 to further amplify the initially amplified bit data or bit (bar) data, but FIG. 5F only show the initially amplified bit (bar) data output from the amplifier 214 is transmitted to the input node Xi of the tri-state output buffer 213. Further amplified bit (bar) data or bit data output from a tri-state buffer can be transmitted to the internal circuits 22, 23 and 24 through the thick metal planes or buses 83, 831 or 832, as shown in FIGS. 5B, 6B, 7B, 7C and 7D, but FIG. 5F only show the further amplified bit data is output from the tri-state output buffer 213.

The bit line 2171 and bit (bar) line 2172 may be provided by fine-line metal layers, made of sputtered aluminum or damascene copper, only under the passivation layer 5. Alternatively, the bit line 2171 and bit (bar) line 2172 may be provided by the interconnecting structure over the passivation layer 5 and under the passivation layer 5, wherein the portion under the passivation layer 5 may comprise sputtered aluminum layer or damascene copper layer having a thickness of between 0.01 and 2 microns, and the portion over the passivation layer 5 may comprise electroplated copper or electroplated gold having a thickness of between 2 and 20 microns.

In this case, the thick metal buses or traces 83, 831 or 832 shown in FIGS. 5B, 6B, 7B, 7C and 7D may be called as bit buses to transmit further amplified bit data or bit (bar) data with 4 bits width, 8 bits width, 16 bits width, 32 bits width, 64 bits width, 128 bits width, 256 bits width, 512 bits width, 1024 bits width, 2048 bits width or 4096 bits width, output from the tri-state buffers 213. Accordingly, 4, 8, 16, 32, 64, 128, 256, 512, 1024, 2048 or 4098 bit buses arranged in parallel and over the passivation layer 5, may connect the output nodes Xo of multiple internal circuits 21, the tri-state buffers 213 in this case, to multiple internal circuits 22, 23 and 24, such as NOR gates, NAND gates, AND gates, OR gates, operational amplifiers, adders, multiplexers, diplexers, multipliers, A/D converters, D/A converters, CMOS transistors, bipolar CMOS transistors or bipolar circuits.

Figure 5G:
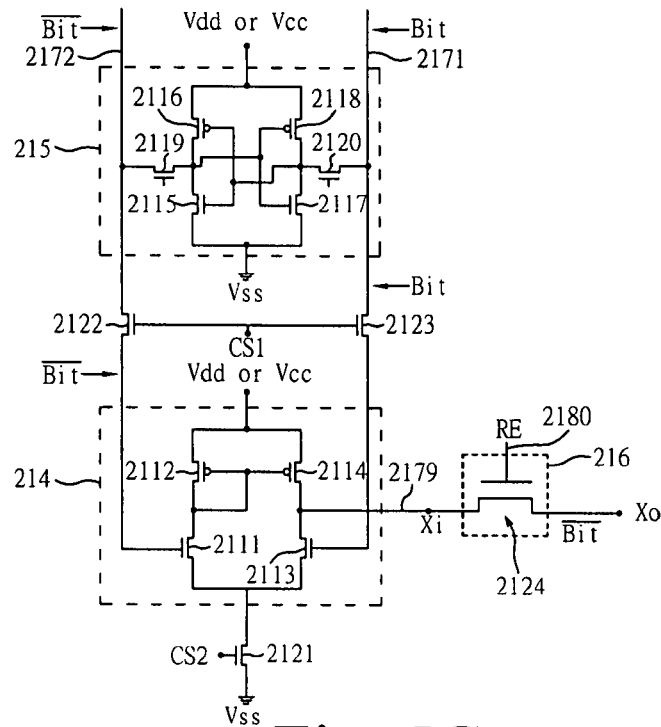
FIG. 5G shows a circuit diagram of a gate switch, which can be applied to the internal circuit 21 shown in FIG. 5B, connected to a sense amplifier connected to a memory cell.
Figure 5H:
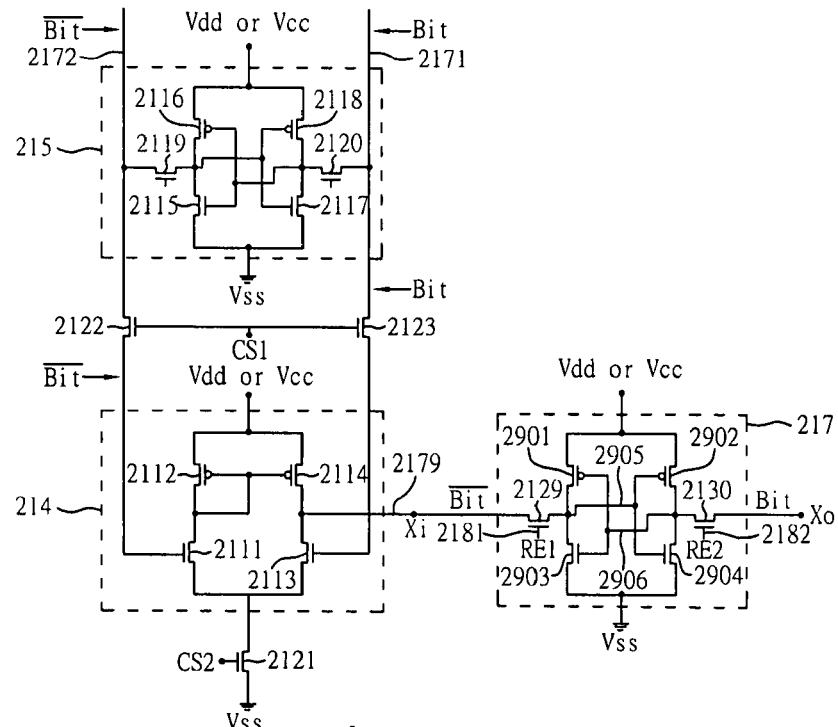
FIG. 5H shows a circuit diagram of a latch circuit, which can be applied to the internal circuit 21 shown in FIG. 5B, connected to a sense amplifier connected to a memory cell.
Figure 5I:
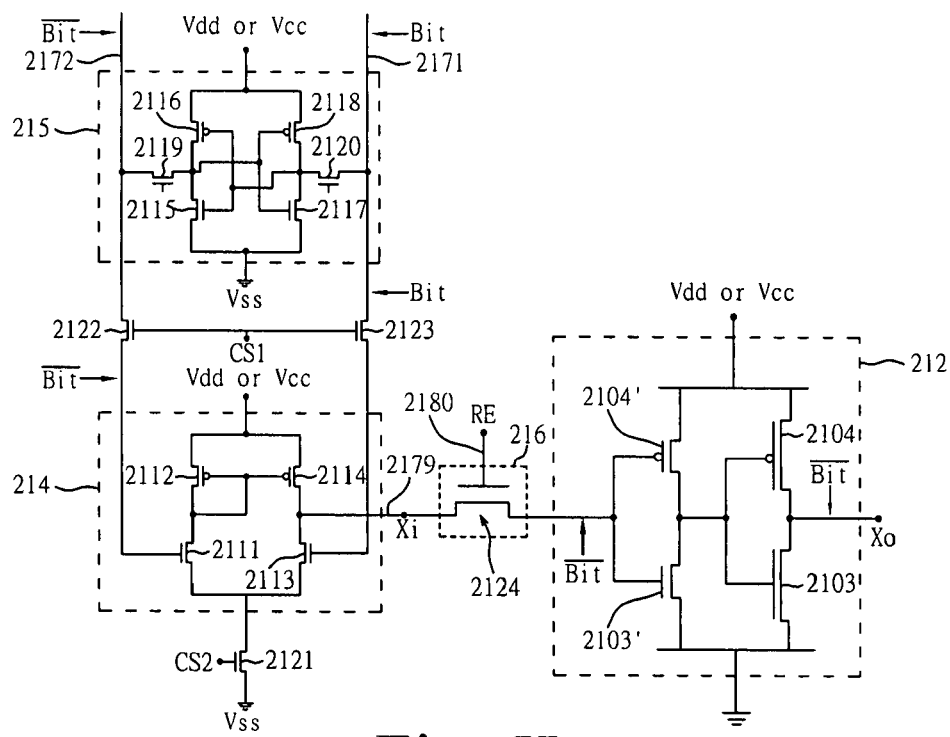
FIG. 5I shows a circuit diagram of a gate switch and internal driver, which can be applied to the internal circuit 21 shown in FIG. 5B, connected to a sense amplifier connected to a memory cell.
Figure 5J:
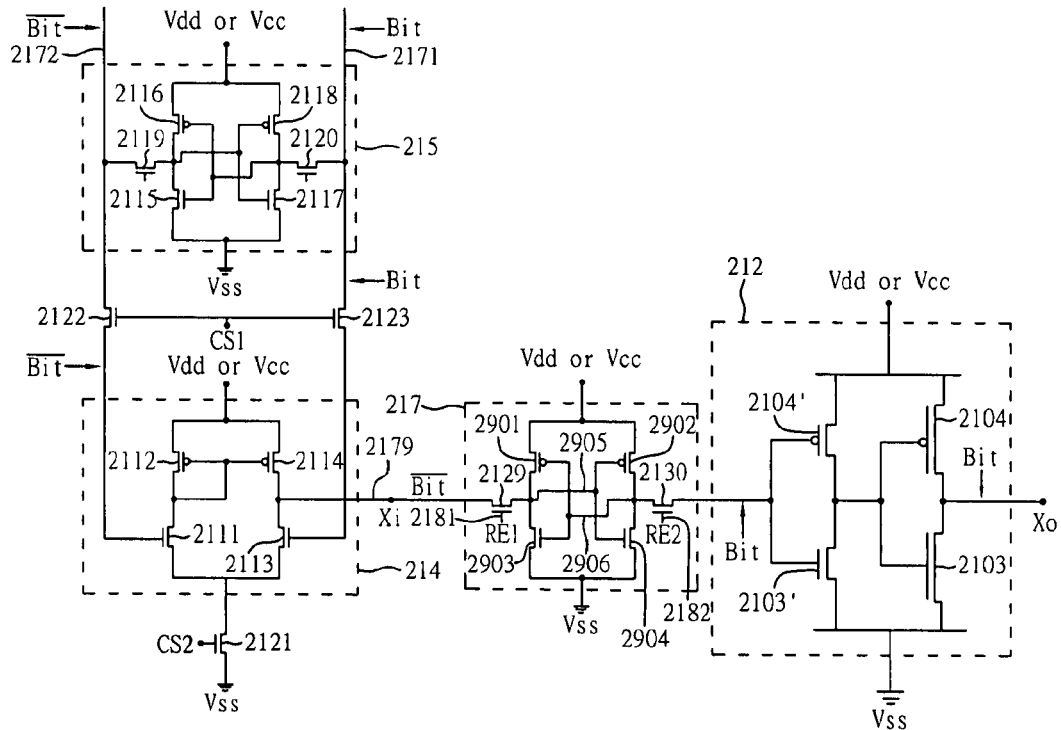
FIG. 5J shows a circuit diagram of a latch circuit and internal driver, which can be applied to the internal circuit 21 shown in FIG. 5B, connected to a sense amplifier connected to a memory cell.
Figure 5K:
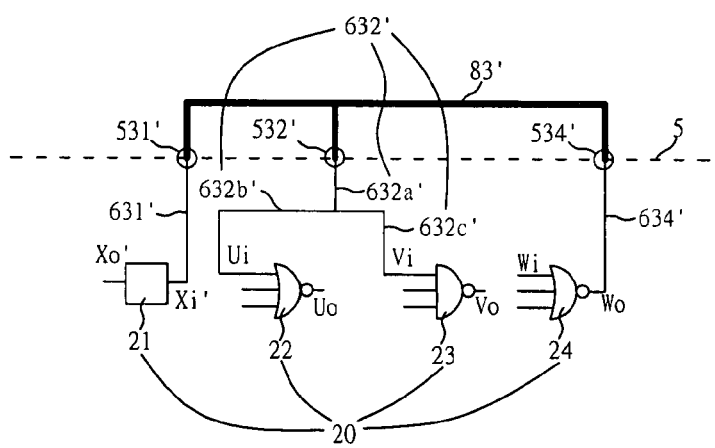
FIG. 5K is a schematic representation of multiple internal circuits connected through a thick and wide metal layer over a passivation layer to transmit a signal according to a second embodiment of the invention.
Figure 5L:
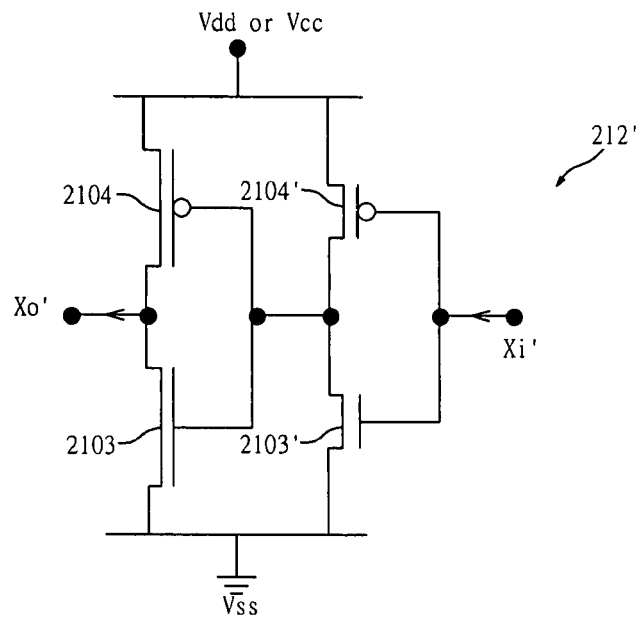
FIG. 5L shows a circuit diagram of an internal receiver, which can be applied to the internal circuit 21 shown in FIG. 5K.
Figure 5M:
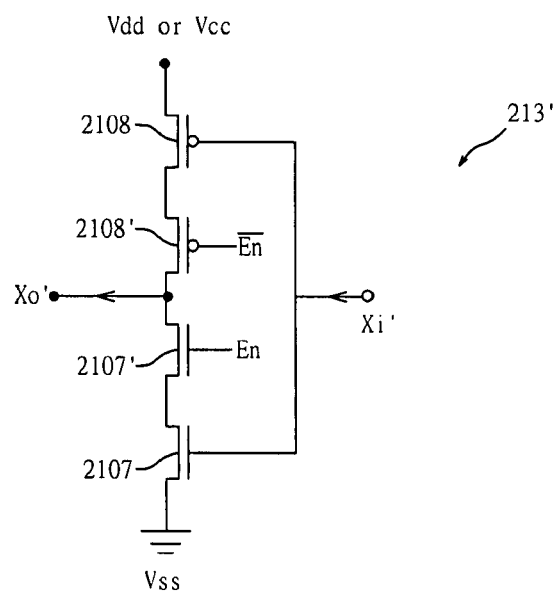
FIG. 5M shows a circuit diagram of a tri-state buffer, which can be applied to the internal circuit 21 shown in FIG. 5K.
Figure 5N:
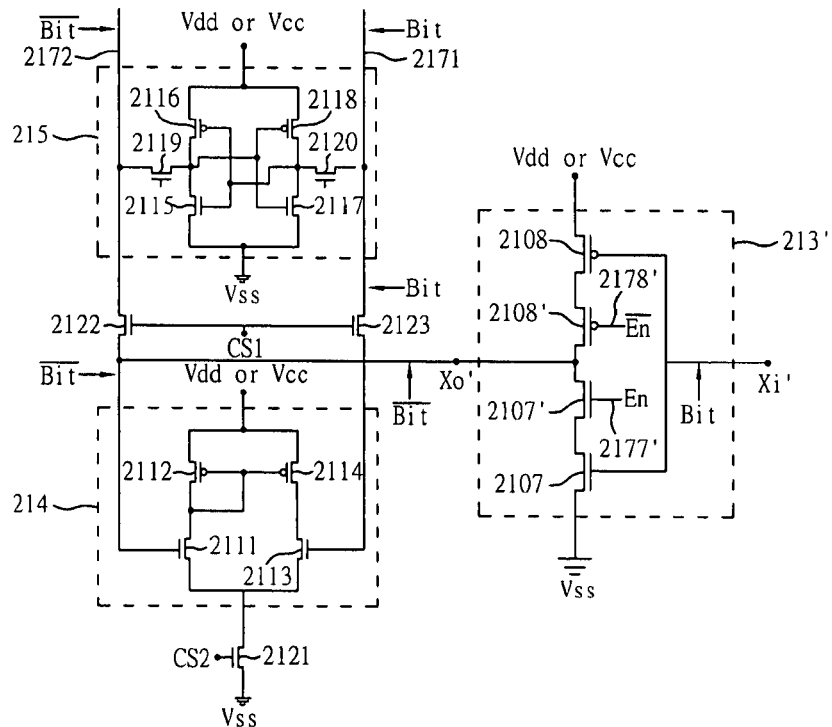
FIG. 5N shows a circuit diagram of a tri-state buffer, which can be applied to the internal circuit 21 shown in FIG. 5K, connected to a sense amplifier connected to a memory cell.
Figure 5O:
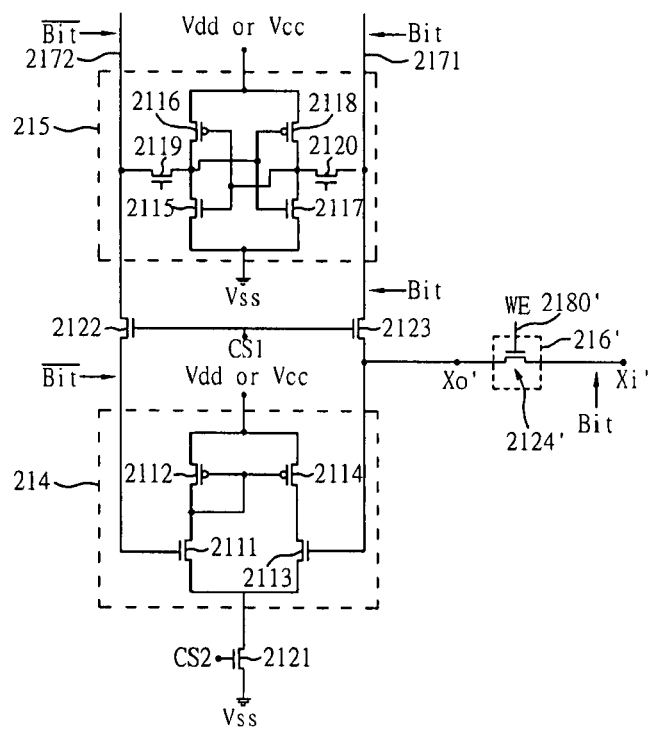
FIG. 5O shows a circuit diagram of a gate switch, which can be applied to the internal circuit 21 shown in FIG. 5K, connected to a sense amplifier connected to a memory cell.
Figure 5P:
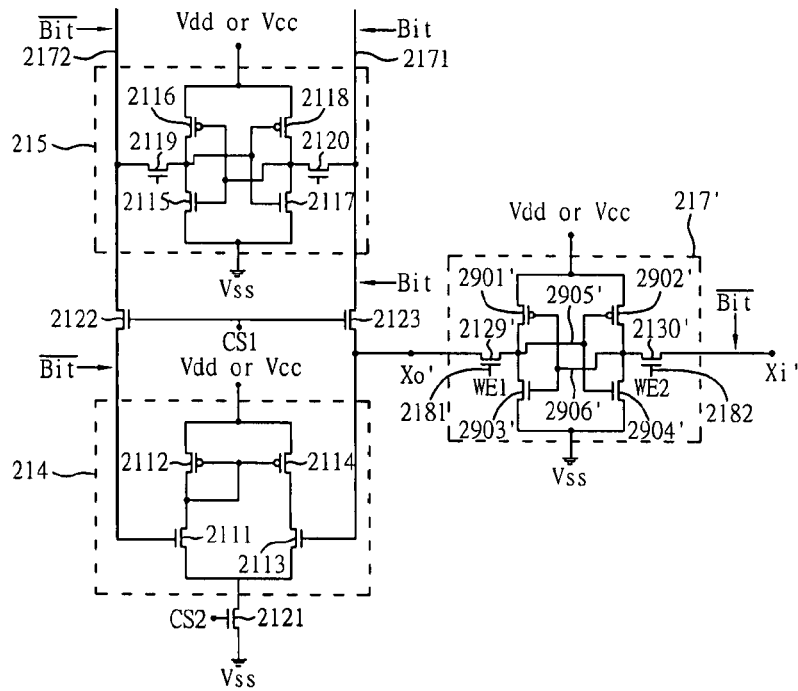
FIG. 5P shows a circuit diagram of a latch circuit, which can be applied to the internal circuit 21 shown in FIG. 5K, connected to a sense amplifier connected to a memory cell.
Figure 5Q:
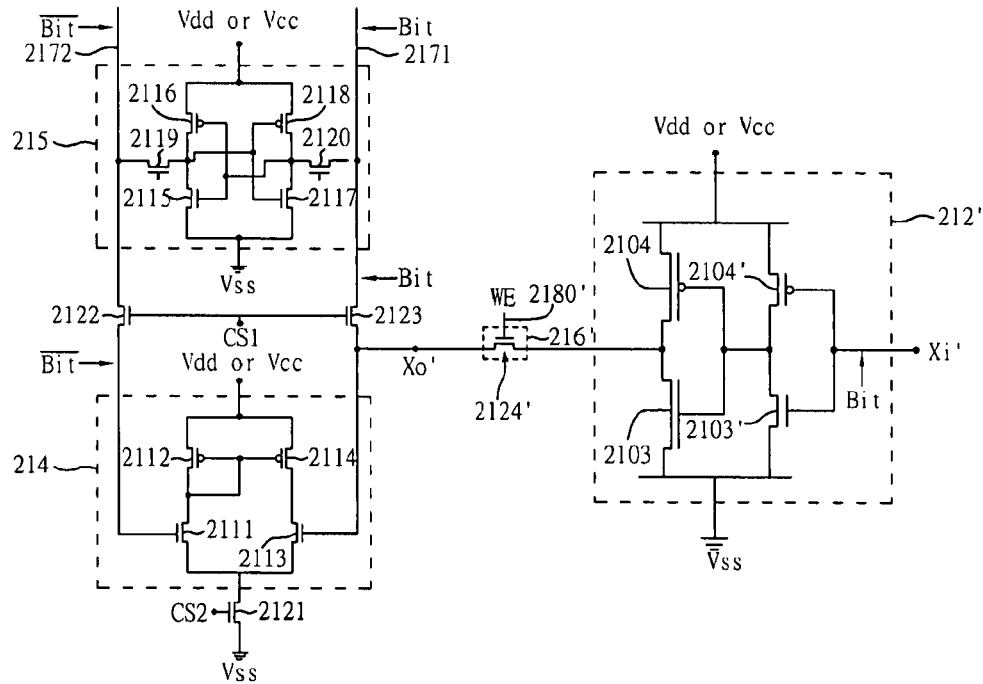
FIG. 5Q shows a circuit diagram of a gate switch and internal receiver, which can be applied to the internal circuit 21 shown in FIG. 5K, connected to a sense amplifier connected to a memory cell.
Figure 5R:
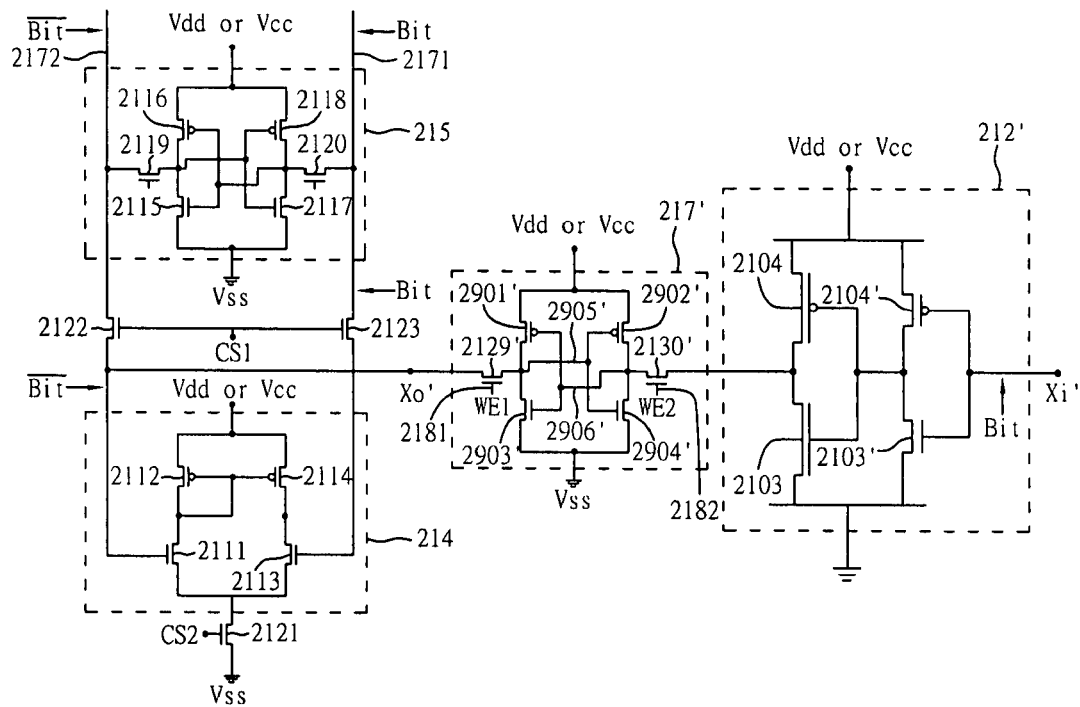
FIG. 5R shows a circuit diagram of a latch circuit and internal receiver, which can be applied to the internal circuit 21 shown in FIG. 5K, connected to a sense amplifier connected to a memory cell.
Figure 5S:
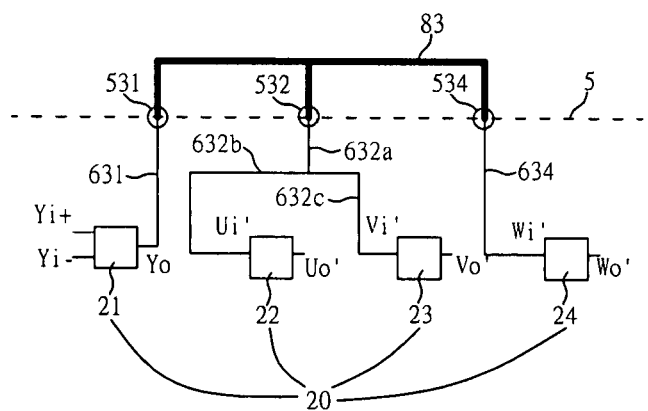
FIG. 5S is a schematic representation of multiple internal circuits connected through a thick and wide metal layer over a passivation layer to transmit an analog signal according to a second embodiment of the invention.
Figure 5T:
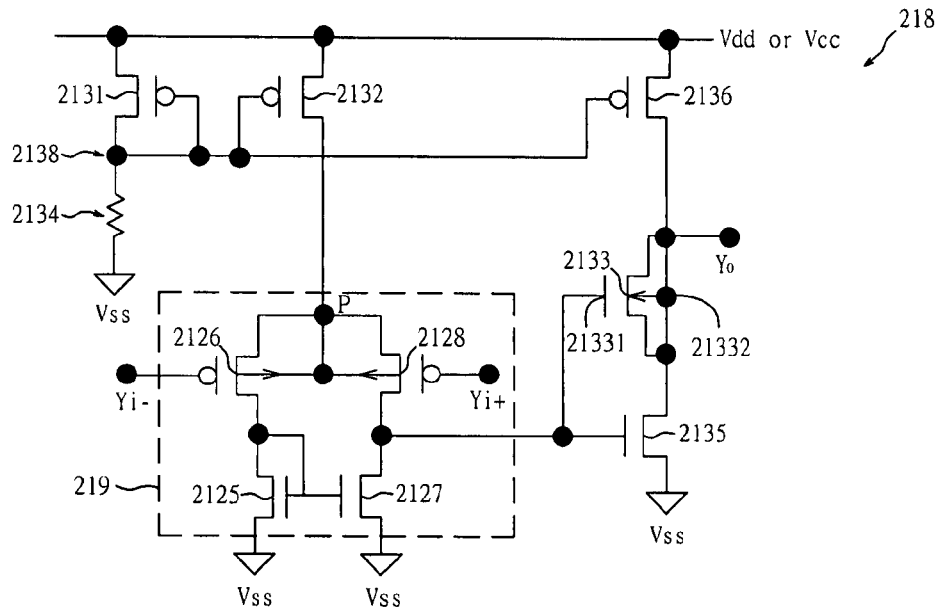
FIG. 5T shows a circuit diagram of a differential amplifier, which can be applied to the internal circuit 21 shown in FIG. 5S.
Figure 5U:
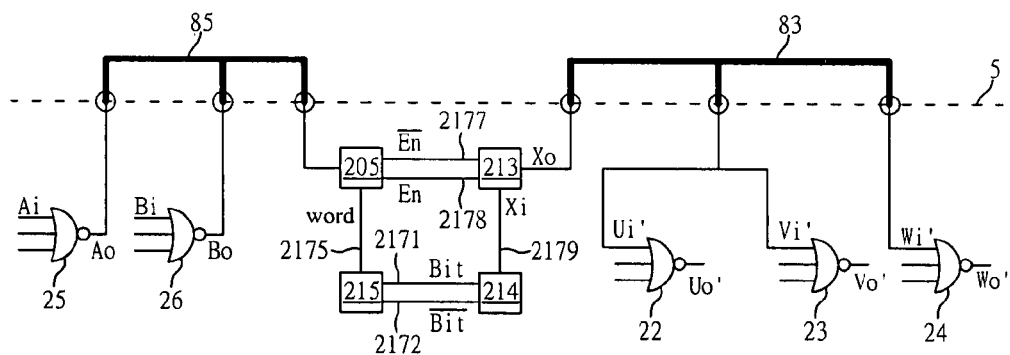
FIGS. 5U-5Z show a schematic representation of a memory chip with an address bus and a data bus over a passivation layer.

Alternatively, multiple address buses 85 connecting an address decoder 205 and the outputs of multiple internal circuits 25 and 26 can be formed over the passivation layer 5, as shown in FIG. 5U, to transmit an address data from one of the internal circuits 25 and 26 to the address decoder 205 during a "READ" operation, wherein the internal circuits 25 and 26 may be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The address decoder 205 is connected to multiple word lines coupled with multiple memory cells in a memory array. Referring to FIGS. 5F and 5U, one of the word lines 2175 is connected to the gates of the NMOS transistors 2120 and 2119 of the memory cell 115, transmitting a signal from the address decoder 205 to the memory cell to control whether the logic level of bit data saved in the trace connecting the drains of the PMOS transistor 2118 and NMOS transistor 2117 and the gates of the PMOS transistor 2116 and NMOS transistor 2115 and the logic level of bit (bar) data saved in the trace connecting the drains of the PMOS transistor 2116 and NMOS transistor 2115 and the gates of the PMOS transistor 2118 and NMOS transistor 2117 are transmitted to the bit line 2171 and the bit (bar) line 2172 through the channels of the NMOS transistors 2120 and 2119, respectively. The sense amplifier 214 receives the bit data and bit (bar) data and initially amplifies the bit (bar) data. The initially amplified the bit (bar) data output from the sense amplifier 214 may be transmitted to the gates of the PMOS transistor 2108 and NMOS transistor 2107 of the tri-state buffer 213 through the trace 2179 under the passivation layer 5. Two traces 2177 and 2178 connect the address decoder 205 and the tri-state buffer 213, transmitting an ENABLE signal and an ENABLE (bar) signal from the address decoder 205 to the tri-state buffer 213 to control whether the above-mentioned further amplified bit signal is output from the tri-state buffer 213 to the data bus 83 over the passivation layer 5.

Other embodiments as described below can be alternatively attained. Same reference numbers in this patent application indicate same or similar elements.

Figure 5V:
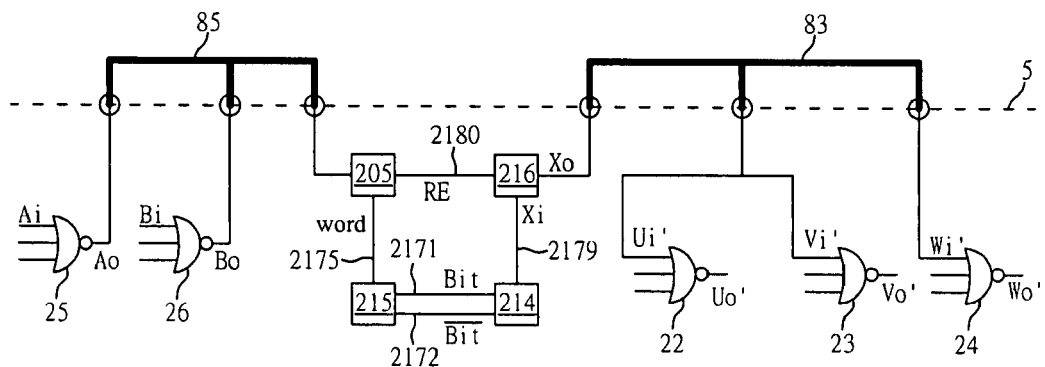

Referring to FIGS. 5B, 6B, 7B, 7C and 7D, the internal circuit 21 may be a pass gate 216 as shown in FIG. 5G. The pass gate 216 may comprise an NMOS transistor 2124 having a gate connected to an address decoder 205 through a trace 2180 under the passivation layer 5, as shown in FIG. 5V. In a "READ" operation, the address decoder 205 receives an address data through multiple address buses 85 over the passivation layer 5. The address decoder 205 output a READ ENABLE data to the gate of the NMOS transistor 2124 through the trace 2180 to control whether the NMOS transistor 2124 is turned on or off. When the NMOS transistor 2124 of the pass gate 216 is turned on, the initially amplified bit (bar) data output from the sense amplifier 214 can be transmitted to the data bus 83, 831 or 832 over the passivation layer 5 through the channel of the NMOS transistor 2124.

Figure 5W:
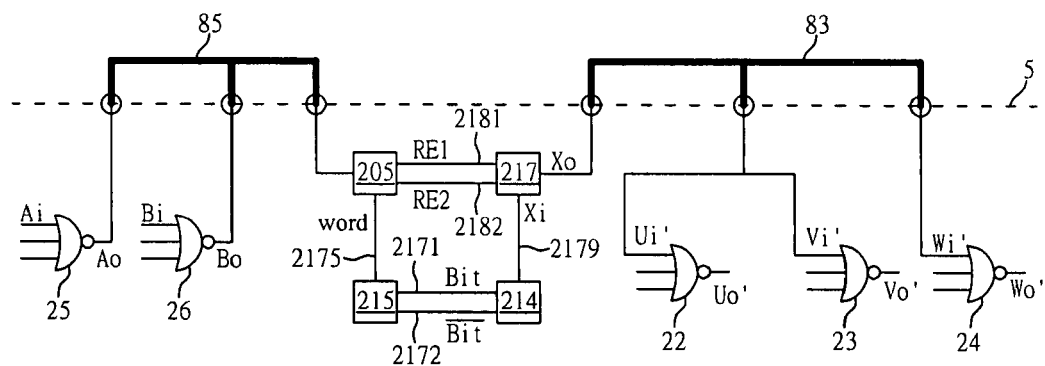

Referring to FIGS. 5B, 6B, 7B, 7C and 7D, the internal circuit 21 may be a latch circuit 217 as shown in FIG. 5H. The latch circuit 217 may temporally store the data output from the sense amplifier 214. The latch circuit 217 comprises two PMOS transistors 2901 and 2902 and two NMOS transistors 2903 and 2904. A trace 2905 connects the gates of the PMOS transistor 2902 and NMOS transistor 2904 and the drains of the PMOS transistor 2901 and NMOS transistor 2903. A trace 2906 connects the gates of the PMOS transistor 2901 and NMOS transistor 2903 and the drains of the PMOS transistor 2902 and NMOS transistor 2904. The latch circuit 217 may further comprise two NMOS transistors 2129 and 2130 having the gates connected to an address decoder 205 through metal traces 2181 and 2182 under the passivation layer 5, as shown in FIG. 5W. In a "READ" operation, the address decoder 205 receives an address data through multiple address buses 85 over the passivation layer 5. The address decoder 205 output READ ENABLE data (RE1 and RE2) to the gates of the NMOS transistors 2129 and 2130 through the traces 2181 and 2182 to control whether the NMOS transistors 2129 and 2130 are turned on or off, respectively. When the NMOS transistor 2129 is turned on, the initially amplified bit (bar) data output from the sense amplifier 214 can be transmitted to the trace 2905 through the channel of the NMOS transistor 2129. The trace 2905 latches the bit (bar) data and the trace 2906 latches the bit data. When the NMOS transistor 2130 is turned on, the bit data output from the trace 2906 of the latch circuit 217 can be transmitted to the data bus 83, 831 or 832 through the channel of the NMOS transistor 2130.

Referring to FIG. 5H, the node P of the regulator or converter 41 can be connected to the sources of the PMOS transistors 2116 and 2118 of the memory cell 215, the sources of the PMOS transistors 2112 and 2114 of the sense amplifier 214 and the sources of the PMOS transistors 2901 and 2902 of the latch circuit 217 through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the sources of the NMOS transistors 2903 and 2904 of the latch circuit 217 through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

However, the pass gate 216 in FIG. 5G or the latch circuit 217 in FIG. 5H does not provide great drive capability. To drive heavy load of the logic circuits 22, 23 and 24, or to transmit bit (bar) data output from the pass circuit 216 or bit data output from the latch circuit 217 to the logic circuits 22, 23 and 24 in a long distance, the internal circuit 21 may comprise the above-mentioned internal driver 212 connected to the output node of the pass gate 216, as shown in FIG. 5I, or connected to the output node of the latch circuit 217, as shown in FIG. 5J, to amplify bit (bar) data output from the pass gate 216 or bit data output from the latch circuit 217. Referring to FIG. 5I, the amplified bit (bar) data output from the internal driver 212 may be transmitted to the internal circuits 22, 23 and 24 through the data bus 83, 831 or 832 over the passivation layer 5, as shown in FIGS. 5B, 6B, 7B, 7C and 7D. Referring to FIG. 5J, the amplified bit data output from the internal driver 212 may be transmitted to the internal circuits 22, 23 and 24 through the data bus 83, 831 or 832 over the passivation layer 5, as shown in FIGS. 5B, 6B, 7B, 7C and 7D.

Referring to FIG. 5I, the node P of the regulator or converter 41 can be connected to the sources of the PMOS transistors 2116 and 2118 of the memory cell 215, the sources of the PMOS transistors 2112 and 2114 of the sense amplifier 214 and the sources of the PMOS transistors 2104' and 2104 of the internal driver 212 through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the sources of the NMOS transistors 2103' and 2103 of the driver circuit 212 through the above-mentioned ground plane, bus or trace 82 or

821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Referring to FIG. 5J, the node P of the regulator or converter 41 can be connected to the sources of the PMOS transistors 2116 and 2118 of the memory cell 215, the sources of the PMOS transistors 2112 and 2114 of the sense amplifier 214, the sources of the PMOS transistors 2901 and 2902 of the latch circuit 217 and the sources of the PMOS transistors 2104' and 2104 of the internal driver 212 through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214, the sources of the NMOS transistors 2903 and 2904 of the latch circuit 217 and the sources of the NMOS transistors 2103' and 2103 of the internal driver 212 through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Alternatively, referring to FIG. 5K, the output node Wo of the internal circuit 24 is connected to the input nodes Xi, Ui and Vi of the internal circuits 21, 22 and 23 through the thick metal plane, bus, trace or line 83' over the passivation layer 5. The internal circuit 24, such as NOR gate, may send a signal or data from the output node Wo thereof to the input node Xi' of the internal circuit 21, such as a receiver 212' shown in FIG. 5L, a tri-state input buffer 213' shown in FIG. 5M or other internal circuits, through a fine-line metal structure 634' under the passivation layer 5, then through an opening 534' in the passivation layer 5, then through the thick metal plane, line or trace 83' over the passivation layer 5, then through another opening 531' in the passivation layer 5, and then through a fine-line metal structure 631' under the passivation layer 5. Besides, a signal or data output from the output node Wo of the internal circuit 24 may be also transmitted to the input node Ui of the internal circuit 22, such as NOR gate, through the fine-line metal structure 634' under the passivation layer 5, then through the opening 534' in the passivation layer 5, then through the thick metal plane, line or trace 83' over the passivation layer 5, then through another opening 532' in the passivation layer 5, then through the fine-line metal structures 632a' and 632b' under the passivation layer 5. Besides, a signal or data output from the output node Wo of the NOR gate 24 may be also transmitted to the input node Vi of the internal circuit 23, such as NAND gate, through the fine-line metal structure 634' under the passivation layer 5, then through the opening 534' in the passivation layer 5, then through the thick metal plane, line or trace 83' over the passivation layer 5, then through another opening 532' in the passivation layer 5, then through the fine-line metal structures 632a' and 632c' under the passivation layer 5.

The fine-line metal structures 634', 632' and 631' can be formed with stacked metal plugs, having a similar structure of the fine line metal structures 634, 632 and 631, respectively, as shown in 7B, 7C and 7D. The internal circuits 21, 22 and 23 may receive a signal output from the output node Wo of the internal circuit 24 at the input node Xi', Ui and Vi thereof, and may output a signal from the output node Xo', Uo and Vo thereof to other internal circuits through metal traces under the passivation layer 5.

The structure over the passivation layer 5 shown in FIGS. 7B-7D, providing the above-mentioned thick metal trace, line or plane 83, can also be applied to forming the thick metal trace, line or plane 83' illustrated in FIG. 5K. All combinations for the polymer layers 99, 98 and 95 and the circuit metal layers 831 and 832 illustrated in FIGS. 7B-7D can be applied to the combinations for one or more polymer layers and one or more circuit metal layers over the passivation layer 5, illustrated in FIG. 5K.

In a case, the internal circuit 21 may be an internal receiver 212' as shown in FIG. 5L, or an internal input tri-state buffer 213' as shown in FIG. 5M. Referring to FIGS. 5K and 5L, the internal receiver 212' may receive a signal passing through the thick metal trace or bus 83 over the passivation layer 5 and then may output an amplified signal from the output node Xo' thereof to other internal circuits but not to an external circuit through a metal trace under the passivation layer 5. Referring to FIGS. 5K and 5M, the internal input tri-state buffer 213' may receive a signal passing through the thick metal trace or bus 83 over the passivation layer 5 and then may output an amplified signal from the output node Xo' thereof to other internal circuits but not to an external circuit through a metal trace under the passivation layer 5.

The internal receiver 212' in FIG. 5L has a similar circuit design to the internal driver 212 in FIG. 5D. In FIGS. 5D and 5L, same reference numbers indicate same elements with same characteristics. The internal input tri-state buffer 213' in FIG. 5M has a similar circuit design to the internal output tri-state buffer 213 in FIG. 5E. In FIGS. 5E and 5M, same reference numbers indicate same elements with same characteristics.

The output node Xo' of the internal receiver 212' or internal tri-state input buffer 213' is not connected to an external circuit but connected to an internal circuit under the passivation layer 5. The internal tri-state input buffer 213' provides amplifying capability and switch capability, and is particularly useful to amplify a data signal or an address signal having passed through the thick metal lines or traces 83' over the passivation layer 5 acting as data or address buses.

In FIG. 5K, a relatively great output current is required at the output node Xo' of the internal circuit 21 when a heavy load is demanded by an internal circuit connected to the output node Xo' of the internal circuit 21, or when the internal circuit 24 is far away from the internal circuit 21 in a distance of greater than 1 mm or of greater than 3 mm. To provide a relatively great output current, the internal circuit 21 can be designed as an internal receiver 212' shown in FIG. 5L or an internal tri-state input buffer 213' shown in FIG. 5M.

Referring to FIG. 5K, a signal output from the internal circuit 24 can be transmitted to an n-channel MOS transistor of the internal circuit 21, wherein the n-channel MOS transistor may have a ratio of a physical channel width thereof to a physical channel length thereof ranging from 0.1 to 20, ranging from 0.1 to 10, or preferably ranging from 0.2 to 2. Alternatively, a signal output from the internal circuit 24 can be transmitted to a p-channel MOS transistor of the internal circuit 21, wherein the p-channel MOS transistor 2102 may have a ratio of a physical channel width thereof to a physical channel length thereof ranging from 0.2 to 40, ranging from 0.2 to 20, or preferably ranging from 0.4 to 4. In this application, the current level output from the internal circuit 24 and transmitted through the thick metal trace 83' over the passivation layer 5 is, for example, in a range of between 50 µA and 2 mA, and preferably of between 100 µA and 1 mA.

In FIGS. 5L and 5M, the n-channel MOS transistors 2103, 2107 and 2107' may have a ratio of a physical channel width thereof to a physical channel length thereof ranging from 1.5 to 30, and preferably ranging from 2.5 to 10. The p-channel MOS transistors 2104, 2108 and 2108' may have a ratio of a physical channel width thereof to a physical channel length thereof ranging from 3 to 60, and preferably ranging from 5 to 20. In FIG. 5L, the n-channel MOS transistor 2103' may have a ratio of a physical channel width thereof to a physical channel length thereof ranging from 0.1 to 20, ranging from 0.1 to 10, or preferably ranging from 0.2 to 2, and the p-channel MOS transistor 2104' may have a ratio of a physical channel width thereof to a physical channel length thereof ranging from 0.2 to 40, ranging from 0.2 to 20, or preferably ranging from 0.4 to 4. Referring to FIGS. 5K, 5L and 5M, the internal receiver 212 or internal tri-state input buffer 213 may receive a signal output from the output node Wo of the internal circuit 24 and transmitted through the thick metal trace or bus 83' over the passivation layer 5 but not to an external circuit. A current passing through the thick metal trace or line 83' over the passivation layer 5 and inputting the node Xi' of the internal circuit 21, provided by the internal driver 212 or internal tri-state buffer 213, may be between 500 µA and 10 mA, and preferably between 700 µA and 2 mA.

The concept shown in FIG. 5K can be applied to a memory chip, as illustrated in FIGS. 5N-5R. The memory chip includes memory cells 215 and sense amplifiers 214 that can be referred to those illustrated in FIG. 5F. In FIGS. 5F and 5N-5R, same reference numbers indicate same elements.

Referring to FIG. 5N, the above-mentioned tri-state input buffer 213' is employed to be the internal circuit 21 shown in FIG. 5K and has an output node Xo' connected to the bit (bar) line 2172 and an input node Xi' connected to the internal circuits 22, 23 and 24, such as logic gates, through the above mentioned thick metal plane, bus or trace 83' over the passivation layer 5, wherein the internal circuit 24 may alternatively be NOR gate, NAND gate, AND gate, OR gate, operational amplifier, adder, multiplexer, diplexer, multiplier, A/D converter, D/A converter, CMOS transistor, bipolar CMOS transistor or bipolar circuit.

In this case, the memory cell 215 is a static random access memory (SRAM) cell. Alternatively, the memory cell 215 may be a dynamic random access memory (DRAM) cell, an erasable programmable read only memory (EPROM) cell, an electronic erasable programmable read only memory (EEPROM) cell, a flash memory cell, a read only memory (ROM) cell, or a magnetic random access memory (MRAM) cell, which is connected to the output node Wo of the logic gate 24 through a thick metal traces 83' over the passivation layer 5. A tri-state input buffer 213', pass gate 216', latch memory 217' or internal receiver 212', as shown in FIGS. 5N-5R, may be optionally set on the path between any kind of the exampled memory cell 215 and the thick metal traces 83' over the passivation layer 5.

Referring to FIG. 5N, the node P of the regulator or converter 41 can be connected to the sources of the PMOS transistors 2116 and 2118 of the memory cell 215, the sources of the PMOS transistors 2112 and 2114 of the sense amplifier 214 and the source of the PMOS transistor 2108 of the tri-state input buffer 213' through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the source of the NMOS transistor 2107 of the tri-state input buffer 213' through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Referring to FIG. 5N, when the memory cell 215 is in a "WRITE" operation, a bit signal can be transmitted to the input node Xi' of the tri-state input buffer 213', that is, the gates of the PMOS transistors 2108 and the NMOS transistor 2107, through the thick metal line, trace or plane 83' over the passivation layer 5, from the output node Wo of the internal circuit 24. An amplified bit (bar) signal having a desirable waveform or voltage level can be output from the output node Xo' of the tri-state input buffer 213', that is, the source of the PMOS transistor 2108' or the source of the NMOS transistor 2107', to the bit (bar) line 2172. With the NMOS transistors 2122 and 2119 being turned on, the bit (bar) signal on the bit (bar) line can be saved on the trace connecting the gates of the PMOS transistor 2118 and NMOS transistor 2117 and the sources of the PMOS transistor 2116 and NMOS transistor 2115, and the bit signal can be saved on the trace connecting the gates of the PMOS transistor 2116 and NMOS transistor 2115 and the sources of the PMOS transistor 2118 and NMOS transistor 2117.

In this case, the thick metal buses or traces 83' may be called as bit buses to transmit to-be-written bit data or bit (bar) data with 4 bits width, 8 bits width, 16 bits width, 32 bits width, 64 bits width, 128 bits width, 256 bits width, 512 bits width, 1024 bits width, 2048 bits width or 4096 bits width, output from the tri-state buffers 213. Accordingly, 4, 8, 16, 32, 64, 128, 256, 512, 1024, 2048 or 4098 bit buses arranged in parallel and over the passivation layer 5, may connect the input nodes Xi' of multiple internal circuits 21, the tri-state input buffers 213' in this case, to multiple output nodes of multiple internal circuits 24, such as NOR gates, NAND gates, AND gates, OR gates, operational amplifiers, adders, multiplexers, diplexers, multipliers, A/D converters, D/A converters, CMOS transistors, bipolar CMOS transistors or bipolar circuits.

Figure 5X:
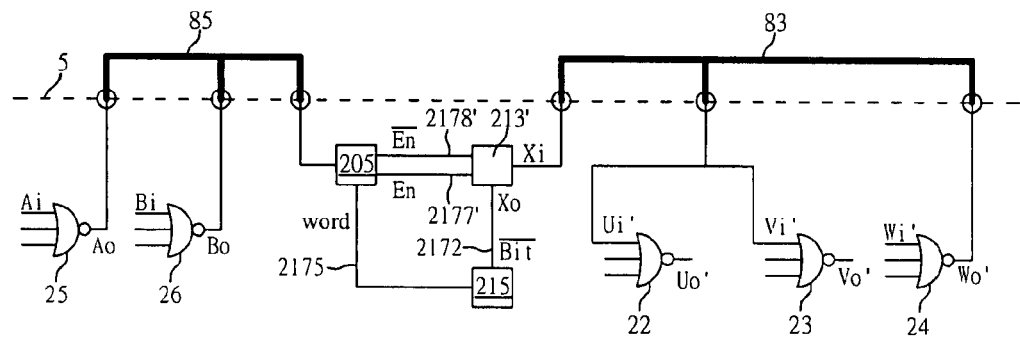

Alternatively, multiple address buses 85 connecting an address decoder 205 and the outputs of multiple internal circuits 25 and 26 can be formed over the passivation layer 5, as shown in FIG. 5X, to transmit an address data from one of the internal circuits 25 and 26 to the address decoder 205 during a "WRITE" operation, wherein the internal circuits 25 and 26 may be NOR gate, NAND gate, AND gate, OR gate, operational amplifier, adder, multiplexer, diplexer, multiplier, A/D converter, D/A converter, CMOS transistor, bipolar CMOS transistor or bipolar circuit. The address decoder 205 is connected to multiple word lines coupled with multiple memory cells in a memory array. Referring to FIGS. 5N and 5X, one of the word lines 2175 is connected to the gates of the NMOS transistors 2120 and 2119 of the memory cell 115, transmitting a signal from the address decoder 205 to the memory cell to control whether the logic level of bit data on the bit line 2171 is saved in the trace connecting the drains of the PMOS transistor 2118 and NMOS transistor 2117 and the gates of the PMOS transistor 2116 and NMOS transistor 2115 through the channel of the NMOS transistor 2120 and whether the logic level of bit (bar) data on the bit (bar) line 2172 is saved in the trace connecting the drains of the PMOS transistor 2116 and NMOS transistor 2115 and the gates of the PMOS transistor 2118 and NMOS transistor 2117 are transmitted to the bit line 2171 and the bit (bar) line 2172 through the channel of the NMOS transistor 2119. Two traces 2177' and 2178' connect the address decoder 205 and the tri-state input buffer 213', transmitting an ENABLE signal and an ENABLE (bar) signal from the address decoder 205 to the tri-state input buffer 213' to control whether the amplified bit (bar) signal is output from the tri-state input buffer 213' to the bit (bar) line 2172.

Other embodiments as described below can be alternatively attained. Same reference numbers in this patent application indicate same or similar elements.

Figure 5Y:
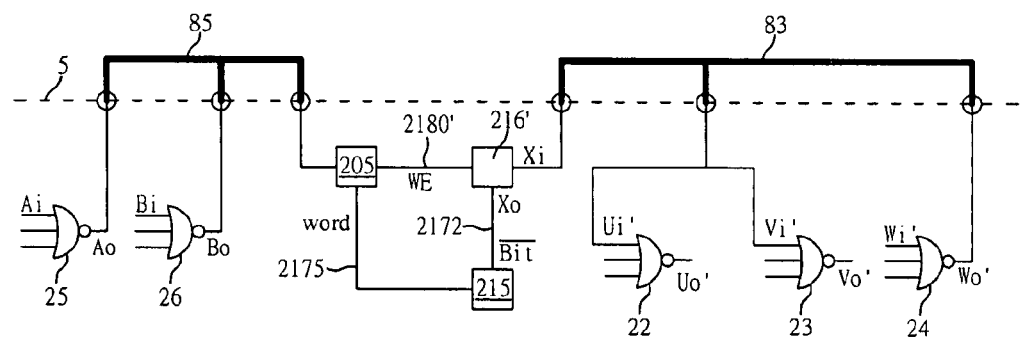

Referring to FIG. 5K, the internal circuit 21 may be a pass gate 216' as shown in FIG. 5O. The pass gate 216' may comprise an NMOS transistor 2124' having a gate connected to an address decoder 205 through a trace 2180' under the passivation layer 5, as shown in FIG. 5Y. In a "WRITE" operation, the address decoder 205 receives an address data through multiple address buses 85 over the passivation layer 5. The address decoder 205 output a WRITE ENABLE data to the gate of the NMOS transistor 2124' through the trace 2180' to control whether the NMOS transistor 2124' is turned on or off. When the NMOS transistor 2124' of the pass gate 216' is turned on, the bit data transmitted through the thick metal line, trace or plane 83' can be output from the pass gate 216' to the bit line 2171 through the channel of the NMOS transistor 2124'.

Figure 5Z:
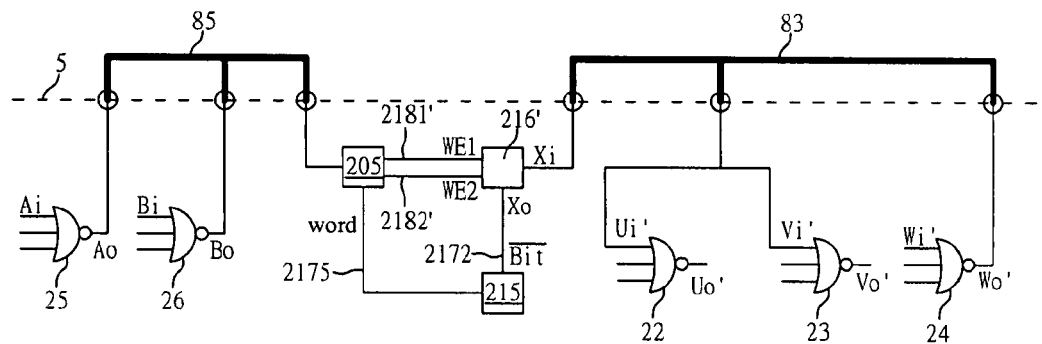

Referring to FIG. 5K, the internal circuit 21 may be a latch circuit 217' as shown in FIG. 5P. The latch circuit 217' may temporally store the data transmitted through the thick metal line, trace or plane 83'. The latch circuit 217' comprises two PMOS transistors 2901' and 2902' and two NMOS transistors 2903' and 2904'. A trace 2905' connects the gates of the PMOS transistor 2902' and NMOS transistor 2904' and the drains of the PMOS transistor 2901' and NMOS transistor 2903'. A trace 2906' connects the gates of the PMOS transistor 2901' and NMOS transistor 2903' and the drains of the PMOS transistor 2902' and NMOS transistor 2904'. The latch circuit 217' may further comprise two NMOS transistors 2129' and 2130' having the gates connected to an address decoder 205 through metal traces 2181' and 2182' under the passivation layer 5, as shown in FIG. 5Z. In a "WRITE" operation, the address decoder 205 receives an address data output from the output nodes Ao or Bo of the internal circuit 25 or 26 through multiple address buses 85 over the passivation layer 5. The address decoder 205 output WRITE ENABLE data (WE1 and WE2) to the gates of the NMOS transistors 2129' and 2130' through the traces 2181' and 2182' to control whether the NMOS transistors 2129' and 2130' are turned on or off, respectively. When the NMOS transistor 2130' is turned on, the bit (bar) data output from the internal circuit 24 through the thick metal line, trace or plane 83', data bus, over the passivation layer 5 can be latched in the trace 2906' through the channel of NMOS transistor 2130', and the bit data is latched in the trace 2905'. When the NMOS transistor 2129' is turned on, the bit data latched in the trace 2905' can be output to the bit line 2171 through the channel of the NMOS transistor 2129'.

Referring to FIG. 5P, the node P of the regulator or converter 41 can be connected to the sources of the PMOS transistors 2116 and 2118 of the memory cell 215, the sources of the PMOS transistors 2112 and 2114 of the sense amplifier 214 and the sources of the PMOS transistors 2901' and 2902' of the latch circuit 217 through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the sources of the NMOS transistors 2903' and 2904' of the latch circuit 217 through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

However, the pass gate 216' in FIG. 5O or the latch circuit 217' in FIG. 5P may not provide the enough sensitivity to detect a weak voltage variation at the input node of the pass gate 216' or the latch circuit 217' in a "WRITE" operation. To amplify the voltage level of a signal transmitted through the thick metal line, trace or plane 83' in a long distance and output from the logic circuit 24, the internal circuit 21 may comprise the above-mentioned internal receiver 212' connected to the input node of the pass gate 216', as shown in FIG. 5Q, or connected to the input node of the latch circuit 217', as shown in FIG. 5R, to amplify bit data inputting to the pass gate 216' or to the latch circuit 217'. Referring to FIGS. 5Q and 5R, the input node of the internal receiver 212' is connected to the output node Wo of the internal circuit 24 through the thick metal line, trace or plane 83' as shown in FIG. 5K.

Referring to FIG. 5Q, the node P of the regulator or converter 41 can be connected to the sources of the PMOS transistors 2116 and 2118 of the memory cell 215, the sources of the PMOS transistors 2112 and 2114 of the sense amplifier 214 and the sources of the PMOS transistors 2104' and 2104 of the internal receiver 212' through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214 and the sources of the NMOS transistors 2103' and 2103 of the receiver circuit 212' through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Referring to FIG. 5R, the node P of the regulator or converter 41 can be connected to the sources of the PMOS transistors 2116 and 2118 of the memory cell 215, the sources of the PMOS transistors 2112 and 2114 of the sense amplifier 214, the sources of the PMOS transistors 2901' and 2902' of the latch circuit 217' and the sources of the PMOS transistors 2104' and 2104 of the internal receiver 212' through the above-mentioned power plane, bus or trace 81, 811 or 812, as shown in FIGS. 1B, 1C, 2B, 2C, 3B, 3C and 3D, over the passivation layer 5. The above-mentioned power plane, bus or trace 81, 811 or 812 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned power plane, bus or trace 81. The node Rs of the regulator or converter 41 can be connected to the sources of the NMOS transistors 2115 and 2117 of the memory cell 215, the sources of the NMOS transistors 2111 and 2113 of the sense amplifier 214, the sources of the NMOS transistors 2903' and 2904' of the latch circuit 217' and the sources of the NMOS transistors 2103' and 2103 of the internal receiver 212' through the above-mentioned ground plane, bus or trace 82 or 821, as shown in FIGS. 1C, 2C and 3C, over the passivation layer 5. The above-mentioned ground plane, bus or trace 82 or 821 may contain a patterned circuit layer over the patterned circuit layers 831 and/or 832 of the thick and wide signal trace, bus or plane 83 as shown in FIGS. 7B-7D. Alternatively, the thick and wide signal trace, bus or plane 83 as shown in FIGS. 7B-7D may contain a patterned circuit layer over that of the above-mentioned ground plane, bus or trace 82.

Referring to FIG. 5S, another important application of the thick metal line, trace or plane 83 over the passivation layer 5 may be used to transport a precise analog signal. The thick metal line, trace or plane 83 has low resistance and capacitance per unit length characteristics and thereby offers a low signal distortion of analog signals. FIG. 5S shows a circuit design with an over-passivation metal bus, trace or line 83 connecting multiple analog circuits 21, 22, 23 and 24. The design is similar to FIG. 5B except that the internal circuits 21, 22, 23 and 24 are analog circuits, or mixed-mode circuits comprising an analog circuit and a digital circuit. The thick metal bus, trace or line 83 over the passivation layer 5 connects the analog circuits 21, 22, 23 and 24. An analog signal output from the output node Yo of the analog circuit 21 can be transmitted to the input node Ui' of the internal circuit 22 through the fine-line metal structure 631 under the passivation layer 5, then through the thick metal bus, trace or plane 83 over the passivation layer 5, and then through the fine-line metal structures 632a and 632b under the passivation layer 5. An analog signal output from the output node Yo of the analog circuit 21 can be transmitted to the input node Vi' of the internal circuit 23 through the fine-line metal structure 631 under the passivation layer 5, then through the thick metal bus, trace or plane 83 over the passivation layer 5, and then through the fine-line metal structures 632a and 632c under the passivation layer 5. An analog signal output from the output node Yo of the analog circuit 21 can be transmitted to the input node Wi' of the internal circuit 24 through the fine-line metal structure 631 under the passivation layer 5, then through the thick metal bus, trace or plane 83 over the passivation layer 5, and then through the fine-line metal structure 634 under the passivation layer 5.

The analog circuits 21, 22, 23 and 24 can be an operational amplifier, amplifier, pre-amplifier, a power amplifier, an analog to digital (A/D) converter, a digital to analog (D/A) converter, a pulse reshaping circuit, a switched capacitor filter, a RC filter, or other kind of analog circuits. FIG. 5T shows a case where the internal circuit 21 in FIG. 5S is an operational amplifier 218 with an output node Yo connected to the metal interconnection lines or traces 83 over the passivation layer 5. The operational amplifier 218 is designed based on a CMOS technology, referring to "CMOS Digital Circuit Technology" by M. Shoji, published by Prentice-Hall, Inc, New Jersey in 1987. Differential analog signals can be input into two input nodes Yi+ and Yi− of a differential circuit 219 provided in the operational amplifier 218 and with two n-MOS transistors 2125 and 2127 and two p-MOS transistors 2126 and 2128, wherein the input nodes Yi+ and Yi− are connected to the gates of the p-MOS transistors 2128 and 2126, respectively. The sources of the p-MOS transistors 2126 and 2128 are connected to a drain of a p-MOS transistor 2132 that is controlled by a voltage at the node 2138 determined by resistance of a resistor 2134. The output of the differential circuit 219 at the drains of the n-channel MOS transistor 2127 and the p-channel MOS transistor 2128 is connected to a gate of an n-channel MOS transistor 2135 and to a top electrode 21331 of the capacitor 2133. An output node Yo is at a bottom electrode 21332 of the capacitor 2133, at the drain of the n-channel MOS transistor 2135, and at a drain of the p-channel MOS transistor 2136. The p-MOS transistor 2136 is controlled by a voltage at the node 2138 determined by resistance of a resistor 2134. Thereby, the voltage at the output node Yo is controlled by what degree the n-MOS transistor 2135 is turned on and by the output of the differential circuit 219. The capacitor 2133 are often used for an analog circuit, and are usually formed by a MOS capacitor (using the poly gate and the silicon substrate as two electrodes of the capacitor 2133), or a poly-to-poly capacitor (using a first poly silicon and a second poly silicon as two electrodes of the capacitor 2133). The capacitor 2133 may have a function to reduce a noise input from the input nodes Yi+ and Yi−. The resistor 2134 is also often used for an analog circuit, and is usually provided by an impurity-doped diffusion area with doping density of $10^{15}$-$10^{17}$/cm$^3$, such as n well or p well, or of $10^{19}$-$10^{21}$/cm$^3$, such as N$^+$ diffusion or P$^+$ diffusion, in the silicon substrate, and/or an impurity-doped poly silicon. The circuit shown in FIG. 5T can output a voltage Yo proportionally amplifying the differential value of the input voltages Yi+ and Yi−.

The thick metal bus, trace or plane 83 and 83' illustrated in FIGS. 5B-5Z can be realized by forming the circuit metal layers 831 and/or 832 and the polymer layers 95, 98 and/or 99 shown in FIGS. 7B-7D, or by forming the circuit metal layers 801 and/or 802 and the polymer layers 95, 97, 98 and/or 99 shown in FIGS. 15A-21K.

Third Embodiment: Complete Architecture of the Invention

The technology of forming the coarse metal conductor provides other advantages for the IC chip. The technology of manufacturing the coarse trace, bus or plane 83 or 83' over the passivation layer 5 may comprises gold, copper, silver, palladium, rhodium, platinum, ruthenium, or nickel. Various kinds of contacting structures such as solder bumps, solder pads, solder balls, Au bumps, gold pads, Pd pads, Al pads, or wire bonding pads can be formed on the coarse trace, bus or plane 83 to connect the IC chip to an external circuitry easily. In FIGS. 5B, 5K, 5S, 7B, 7C and 7D, the thick metal trace, bus or plane 83 over the passivation layer 5 are used to transport signals input to or output from the internal circuits 21, 22, 23 or 24. The internal circuits 21, 22, 23 or 24 are not connected to an external circuit through the thick metal trace, bus or plane 83 over the passivation layer 5. Yet, an IC chip may be connected to and communicated with an external circuit. When a signal is transmitted to external circuits or components, some off-chip circuitry is required to (1) drive the large current load of external circuits, parasitics or components, (2) detect noisy signals from the external circuits or components, and (3) prevent the internal circuits from being damaged by the surge electrical stimulus from external circuits or components.

Figure 8A:
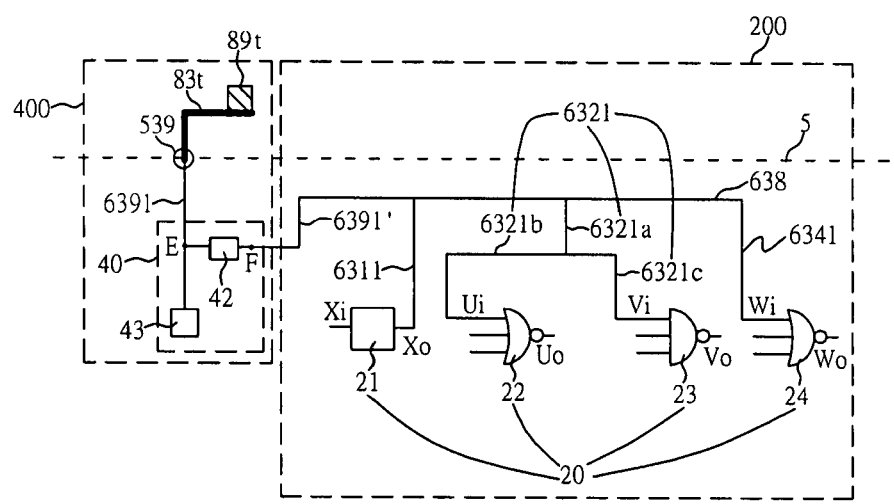
FIG. 8A is a schematic representation of a conventional distribution of signals from internal circuits to the external circuits through off-chip circuits using fine-line scheme.
Figure 8B:
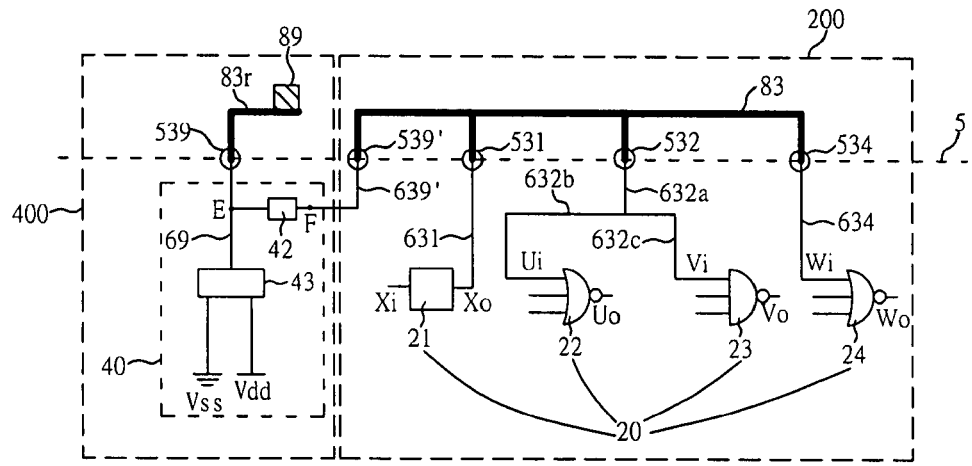
FIGS. 8B, 8D, 8E and 8F are schematic representations of a signal generated in the internal circuits propagated to an external circuitry through over-passivation metals and fine-line metals in a third preferred embodiment of the present invention, and through off-chip circuits.
Figure 9A:
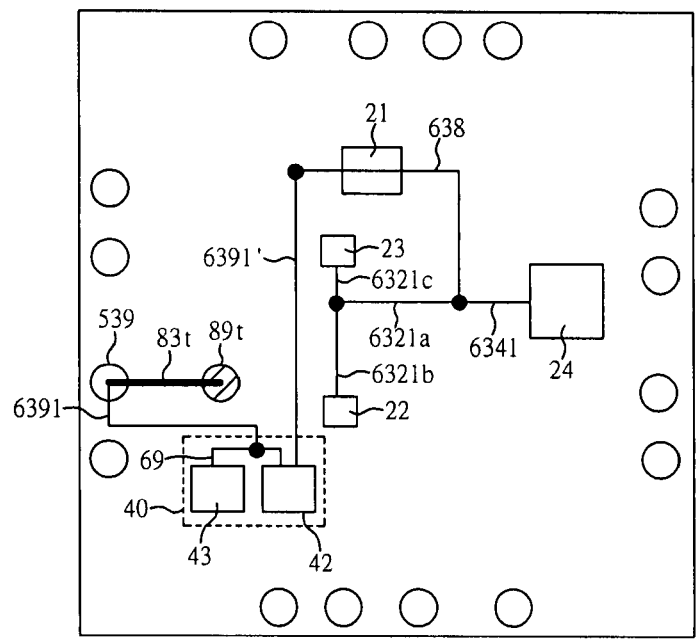
FIG. 9A is a top view layout of a conventional distribution of signals from internal circuits to the external circuits through off-chip circuits using a fine-line scheme.
Figure 9B:
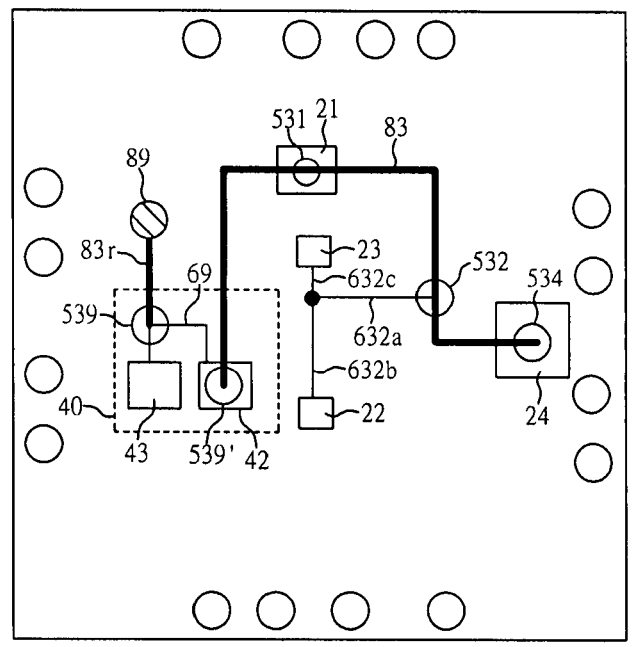
FIG. 9B is a top view layout of multiple internal circuits connected to an off-chip circuit through a thick and wide metal trace, bus or plane over a passivation layer.
Figure 10A:
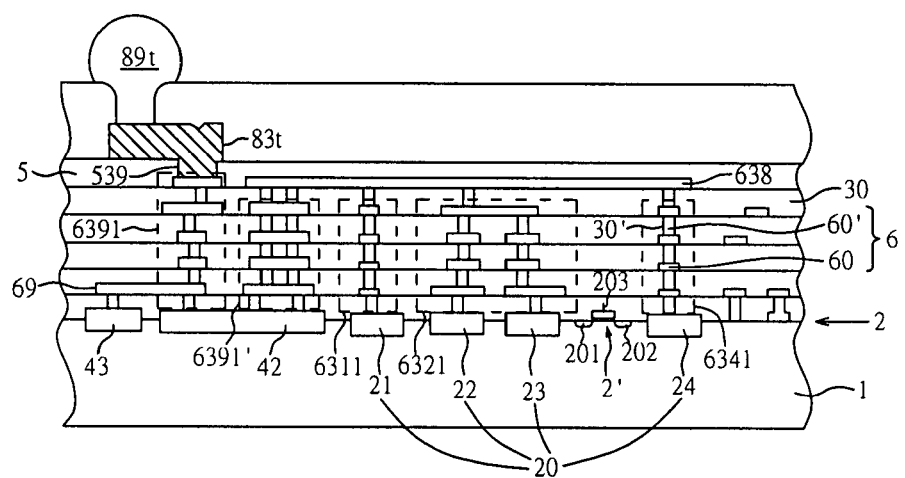
FIG. 10A is a cross-sectional representation of a conventional distribution of signals from internal circuits to the external circuits through off-chip circuits using fine-line scheme.
Figure 10B:
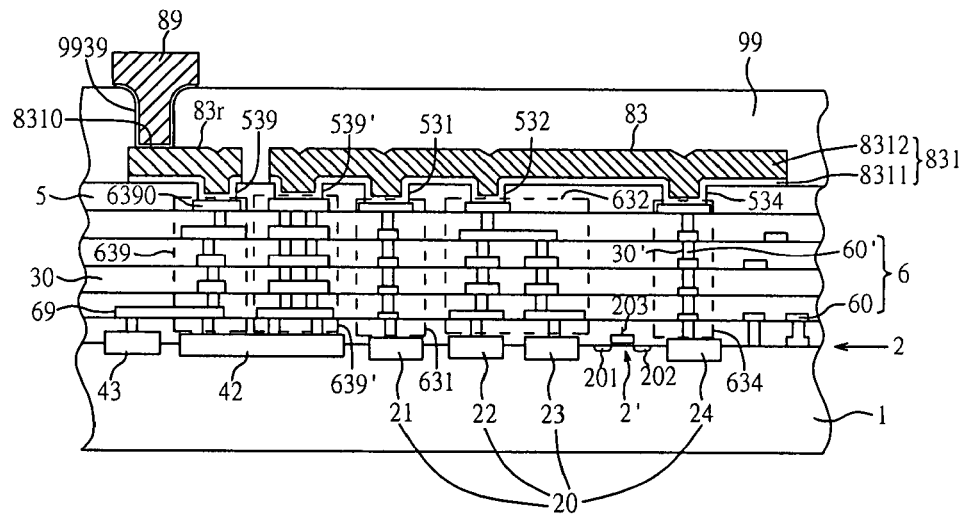
FIGS. 10B-10E and 10G-10I are cross-sectional representations of multiple internal circuits connected to an off-chip circuit through a thick and wide metal trace, bus or plane over a passivation layer according to a third preferred embodiment of the present invention.

FIGS. 8B, 9B and 10B depict a schematic architecture according to a third preferred embodiment of the present invention. FIG. 8B shows a circuit diagram according to a third preferred embodiment of the present invention. FIG. 9B shows a top view realizing the circuit diagram of FIG. 8B. FIG. 10B shows a cross-sectional view realizing the circuit diagram of FIG. 8B.

Referring to FIGS. 8B, 9B and 10B, the off-chip I/O circuit 42 is connected to the output node of the internal circuit 21 and to the input nodes of the internal circuits 22, 23 and 24. A metal bump 89 for being connected to an external circuit may be formed on a redistributed pad 8310. The redistributed metal trace 83r over the passivation layer 5 connects the redistributed pad 8310 to the original pad 6390 exposed by an opening 539 in the passivation layer 5, wherein the position of the redistributed pad 8310 from a top perspective view is different from that of the original pad 6390. The original pad 6390 is connected to the I/O circuit 42 and to the ESD circuit 43. A signal may be transmitted from the internal circuit 21 to an external circuitry through the thick metal bus, trace or plane 83, then through the off-chip I/O circuit 42, and then through the thick metal bus, trace or plane 83r; a signal may be transmitted from an external circuit to the internal circuits 22, 23 and/or 24 through the thick metal traces, buses or plane 83r, through the off-chip I/O circuit 42 and then through the thick metal bus, trace or plane 83; a signal may be transmitted from the internal circuit 21 to the internal circuits 22, 23 and/or 24 through the thick metal bus, trace or plane 83.

The shape of the openings 531, 532, 534 and 539' from a top perspective view may be round, square, rectangular or polygon. If the openings 531, 532, 534 and 539' are round, the openings 531, 532 and 534 may have a diameter of between 0.1 and 200 microns, between 1 and 100 microns, or, preferably, between 0.1 and 30 microns. If the openings 531, 532 and 534 are square, the openings 531, 532 and 534 may have a width of between 0.1 and 200 microns, between 1 and 100 microns, or, preferably, between 0.1 and 30 microns. If the openings 531, 532 and 534 are rectangular, the openings 531, 532 and 534 may have a width of between 0.1 and 200 microns, between 1 and 100 microns, or, preferably, between 0.1 and 30 microns, and a length of between 1 micron and 1 centimeter. If the openings 531, 532 and 534 are polygon having more than five sides, the openings 531, 532 and 534 have a greatest diagonal length of between 0.1 and 200 microns, between 1 and 100 microns, or, preferably, between 0.1 and 30 microns. Alternatively, the openings 531, 532 and 534 have a greatest transverse dimension of between 0.1 and 200 microns, between 1 and 100 microns, or, preferably, between 0.1 and 30 microns. In a case, the openings 531, 532 and 534 have a width of between 0.1 and 30 microns, with the lower portion of the openings 9531, 9532 and 9514 in the polymer layer 95 having a width of between 20 and 100 microns.

Figure 8C:
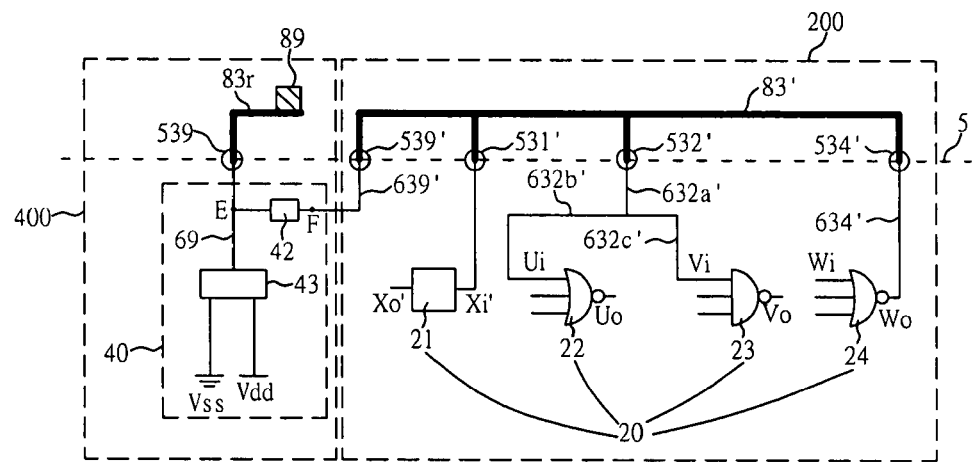
FIG. 8C is a schematic representation of a signal transmitted from an external circuit to an internal circuit through over-passivation metals and fine-line metals in a third preferred embodiment of the present invention, and through off-chip circuits.

Alternatively, referring to FIG. 8C, the element 42 may be an off-chip receiver. The off-chip receiver 42 is connected to the input nodes of the internal circuits 21, 22, 23 and 24 through the thick metal bus, trace or plane 83.

Alternatively, referring to FIG. 8G, the element 42 may be an off-chip driver. The off-chip driver 42 is connected only to the output nodes of the internal circuits 21, 22, 23 and 24 through the thick metal bus, trace or plane 83.

FIGS. 8B and 8C show a simplified circuitry diagram where a thick metal trace 83 over a passivation layer 5 connects an off-chip I/O circuit 42, such as external driver or external receiver, and internal circuits 21, 22, 23 and 24. FIG. 9B shows a top view of a semiconductor chip realizing the circuitry shown in FIGS. 8B and 8C, wherein coarse traces 83 and 83r shown in FIG. 9B mean the traces formed over the passivation layer 5, and fine traces 69, 632a, 632b and 632c shown in FIG. 9B mean the traces formed under the passivation layer 5. FIG. 10B shows a cross-sectional view of a semiconductor chip realizing the circuitry shown in FIGS. 8B and 8C. FIG. 9B shows a top view of the semiconductor chip shown in FIG. 10B. FIGS. 8B, 9B, 10B, 10C, 10D and 10E show the circuitry architecture of the invention using the two hierarchies of the fine-line IC metal structures 639, 639', 631, 632, 634 and 69 under the passivation layer 5 and the coarse metal traces 83, 831, 832 and 83r over the passivation layer 5, with the consideration of whole chip design of the internal and external circuit connection.

Referring to FIGS. 8B, 9B and 10B, the internal circuit 21 may output a signal to other internal circuits 22, 23 and 24 through the thick metal bus, trace or plane 83 over the passivation layer 5, as described in FIGS. 5B-5J and 5S-5T, and, besides, the internal circuit 21 may output a signal to an external circuit through, in sequence, the fine-line metal trace 631 under the passivation layer 5, the thick metal trace 83 over the passivation layer 5, the fine-line metal trace 639' under the passivation layer 5, the I/O circuit 42, such as external driver, the fine-line metal trace 69 under the passivation layer 5, the redistributed trace 83r over the passivation layer 5 and the metal bump 89 on the redistributed trace 83r.

Referring to FIGS. 8C, 9B and 10B, a signal output from the internal circuit 24 may be transmitted to the internal circuit 21 through the thick metal bus, trace or plane 83' over the passivation layer 5, as described in FIGS. 5K-5R, and, besides, a signal output from an external circuit may be transmitted to the internal circuit 21 through the metal bump 89, the redistributed trace 83r, the fine-line metal trace 69 under the passivation layer 5, the I/O circuit 42, such as external receiver, the fine-line metal trace 639' under the passivation layer 5, the thick metal bus, trace or plane 83' over the passivation layer 5 and the fine-line metal trace 631' under the passivation layer 5. A signal output from the internal circuit 24 may be transmitted to the internal circuit 22 through the thick metal bus, trace or plane 83' over the passivation layer 5, as described in FIGS. 5K-5R, and, besides, a signal output from an external circuit may be transmitted to the internal circuit 22 through the metal bump 89, the redistributed trace 83*r*, the fine-line metal trace 69 under the passivation layer 5, the I/O circuit 42, such as external receiver, the fine-line metal trace 639' under the passivation layer 5, the thick metal bus, trace or plane 83' over the passivation layer 5, the fine-line metal trace 632*a*' and 632*b*'under the passivation layer 5. A signal output from the internal circuit 24 may be transmitted to the internal circuit 23 through the thick metal bus, trace or plane 83' over the passivation layer 5, as described in FIGS. 5K-5R, and, besides, a signal output from an external circuit may be transmitted to the internal circuit 23 through the metal bump 89, the redistributed trace 83*r*, the fine-line metal trace 69 under the passivation layer 5, the I/O circuit 42, such as external receiver, the fine-line metal trace 639' under the passivation layer 5, the thick metal bus, trace or plane 83' over the passivation layer 5, the fine-line metal trace 632*a*' and 632*c*'under the passivation layer 5.

In this embodiment, referring to FIGS. 8B and 8C, a signal transmitted through the thick metal bus, trace or plane 83 or 83' over the passivation layer 5 in the internal scheme 200 can be transmitted to or from the external circuit (not shown) through an off-chip scheme 40 including an I/O circuit 42, such external driver or receiver 42, and an ESD (electro static discharge) circuit 43. The ESD circuit 43 is connected in parallel with the I/O circuit 42 through the trace 69 under the passivation layer 5. The redistributed metal trace 83*r* can be used for redistribution of the IC fine-line metal (I/O) pads 6390 in FIG. 10B, relocated to a different location, for example an over-passivation metal pads 8310 in FIG. 10B, resulting in readily being connected to an external circuit, such as another semiconductor chip, ball-grid-array (BGA) substrate or ceramic substrate through the metal bump 89 or through a wirebonded wire bonded onto the pad 8310, to a flexible substrate through the meal bump 89 preferably including a gold layer having a thickness of between 7 and 25 micrometers using a gold-to-gold bonding technology or using a gold-to-tin bonding technology, or to a glass substrate through the meal bump 89 preferably including a gold layer having a thickness of between 7 and 25 micrometers via an anisotropic conductive film (ACF) or anisotropic conductive paste ACP. The redistributed metal line, trace or plane 83*r* can be formed during forming the over-passivation interconnection scheme 83.

Figure 11A:
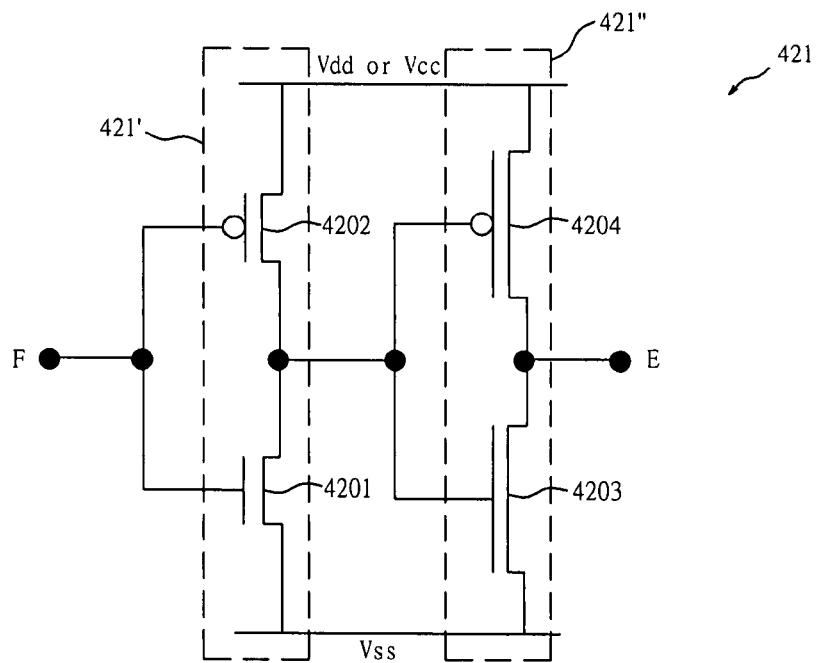
FIG. 11A is a schematic representation of an example of an off-chip driver circuit, which can be applied to the I/O circuit 42 shown in FIG. 8B, in the third preferred embodiment of the present invention.
Figure 11B:
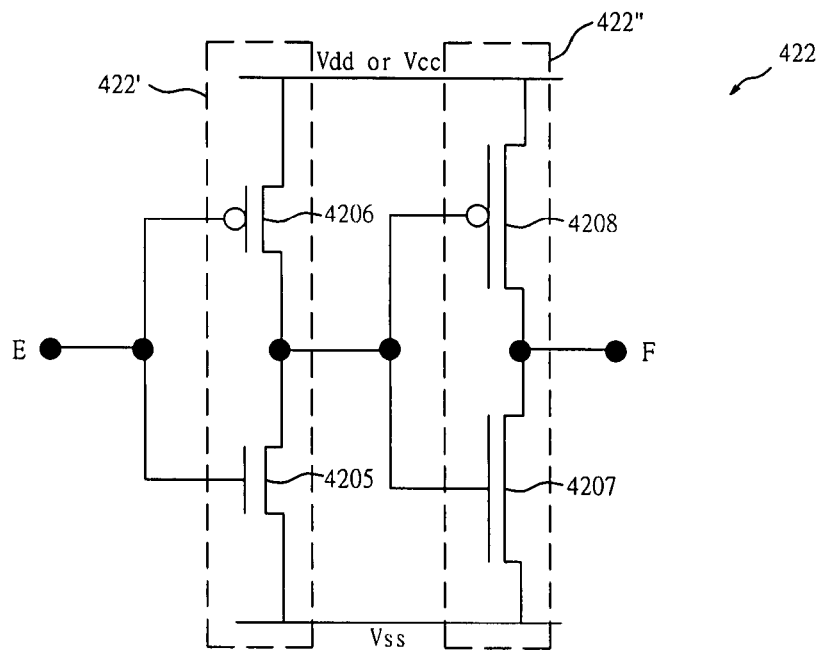
FIG. 11B is a schematic representation of an example of an off-chip receiver circuit, which can be applied to the I/O circuit 42 shown in FIG. 8C, in the third preferred embodiment of the present invention.
Figure 11C:
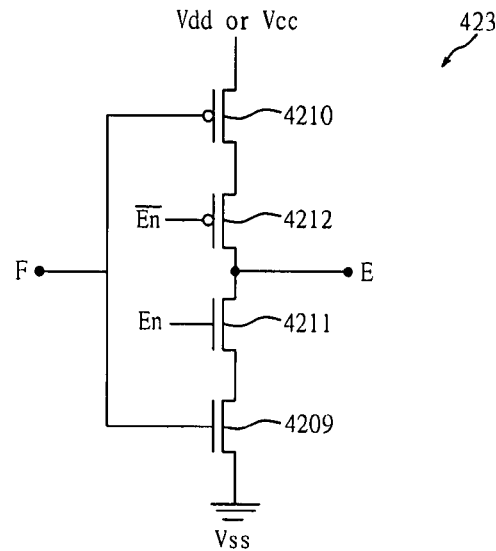
FIG. 11C is a schematic representation of an example of an off-chip tri-state buffer, which can be applied to the I/O circuit 42 shown in FIG. 8B, in the third preferred embodiment of the present invention.
Figure 11D:
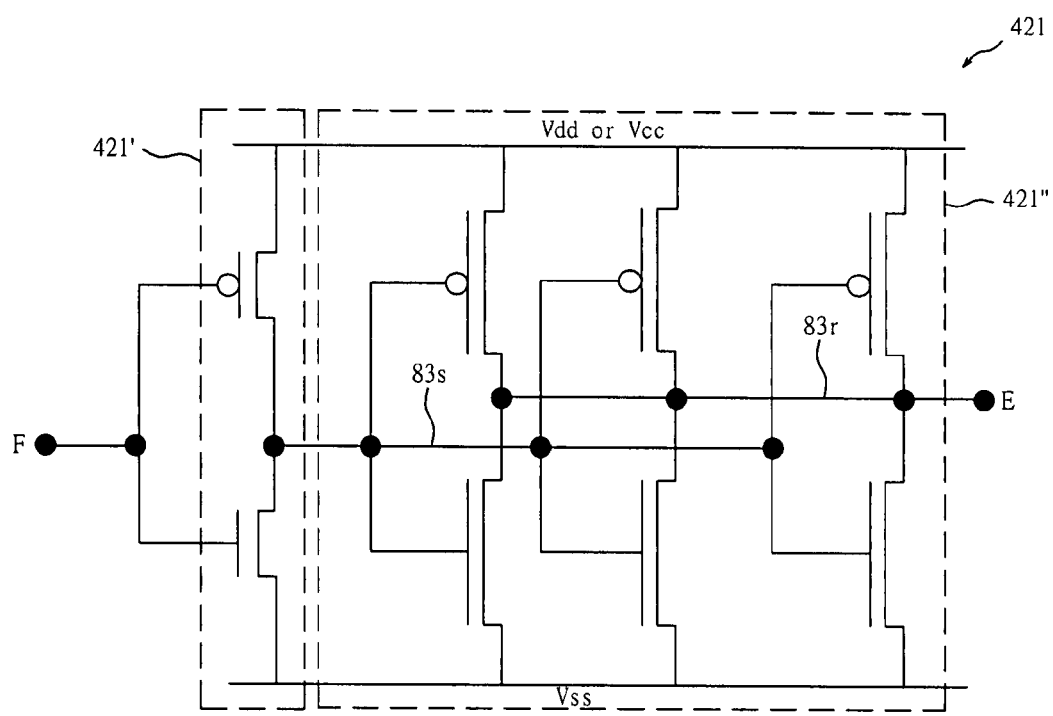
FIG. 11D is a schematic representation of an example of an off-chip driver circuit, which can be applied to the I/O circuit 42 shown in FIG. 8E, in the third preferred embodiment of the present invention.
Figure 11E:
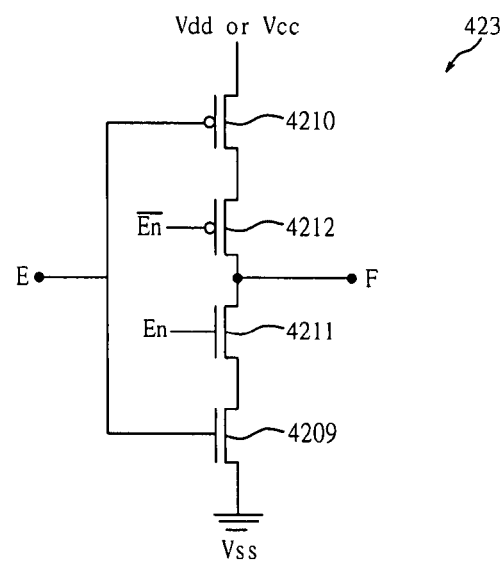
FIG. 11E is a schematic representation of an example of an off-chip tri-state buffer, which can be applied to the I/O circuit 42 shown in FIG. 8C, in the third preferred embodiment of the present invention.
Figure 11F:
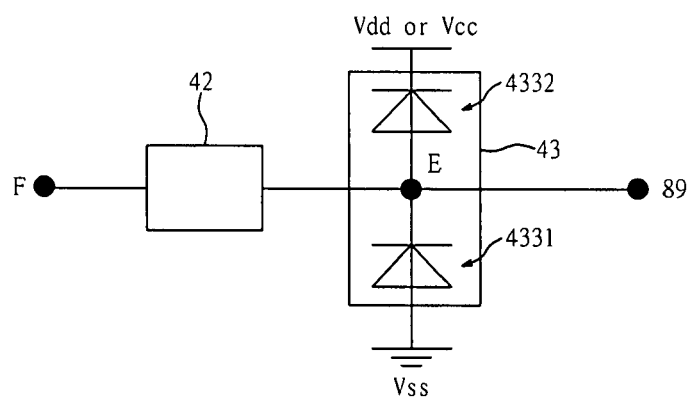
FIG. 11F is a schematic representation of an example of an ESD connection, which can be applied to the ESD circuit 43 shown in FIGS. 8B, 8C, 8E and 8F, in the third preferred embodiment of the present invention.

Referring to FIG. 11F, the off-chip circuitry 40, in FIGS. 8B and 8C, for being connected to the external circuitry may include an ESD circuit 43, composed of two diodes 4331 and 4332, and an I/O circuit 42.

In a first aspect, the I/O circuit 42 may be an off-chip driver 421, as shown in FIG. 11A, in application to the circuit architecture shown in FIG. 8B, having an input node F connected to the internal circuits 20 through the thick and wide circuit trace 83, and an output node E connected, in parallel with the ESD circuit 43, to the metal bump 89. FIG. 11A shows an example of a two-stage cascade off-chip driver 421, CMOS cascade driver. The cascade driver may comprise several stages of inverters. The off-chip driver 421 may include two inverters 421' and 421'', wherein the inverter 421' is composed of an NMOS device 4201 and a PMOS device 4202, and the inverter 421'' is composed of an NMOS device 4203 and a PMOS device 4204. The gates of the PMOS device 4202 and the NMOS device 4201 serve as the input node F, and 4 the drains of the PMOS device 4204 and the NMOS device 4203 serve as the output node E. The drains of the PMOS device 4202 and the NMOS device 4201 are connected to the gates of the PMOS device 4204 and the NMOS device 4203.

Referring to FIG. 11A, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the sources of the PMOS devices 4202 and 4204. The above-mentioned power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the sources of the NMOS devices 4201 and 4203. The above-mentioned ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the above-mentioned ground plane, bus or trace 82.

The first stage 421' of the off-chip driver in FIG. 11A is an inverter with the NMOS device 4201 having a ratio of a physical channel width thereof to a physical channel length thereof greater than those of all NMOS devices in the internal circuits 20 connected to the input node F of the off-chip driver 421, and with the PMOS device 4202 having a ratio of a physical channel width thereof to a physical channel length thereof greater than those of all PMOS devices in the internal circuits 20 connected to the input node F of the off-chip driver 421. The NMOS transistor 4203 may have a ratio of a physical channel width thereof to a physical channel length thereof ranging from 20 to 20,000, and preferably ranging from 30 to 300. The PMOS transistor 4204 may have a ratio of a physical channel width thereof to a physical channel length thereof ranging from 40 to 40,000, and preferably ranging from 60 to 600. The output current of an off-chip driver 421 is proportional to the number of stages and the size (W/L, MOS transistor's channel width to length ratio, more precisely, the MOS effective channel width to effective channel length ratio) of transistors used in each stage of the off-chip driver. The off-chip driver 421 may output a driving current of between 5 mA and 5 A and, preferably, between 10 mA and 100 mA.

Provided that the off-chip driver 421 shown in FIG. 11A is applied to the circuit architecture shown in FIG. 8B for a power management chip, the NMOS transistor 4203 of the off-chip driver 421 may have a ratio of a physical channel width thereof to a physical channel length thereof ranging from 2,000 to 200,000, and preferably ranging from 2,000 to 20,000. The PMOS transistor 4204 may have a ratio of a physical channel width thereof to a physical channel length thereof ranging from 4,000 to 400,000, and preferably ranging from 4,000 to 40,000. The off-chip driver 421 may output a driving current of between 500 mA and 50 A and, preferably, between 500 mA and 5 A.

In a second aspect, the I/O circuit 42 may be an off-chip receiver 422, as shown in FIG. 11B, in application to the circuit architecture shown in FIG. 8C, having an output node F connected to the internal circuits 21, 22 and 23 through the thick and wide circuit trace 83, and an input node E connected, in parallel with the ESD circuit 43, to the metal bump

89. FIG. 11B shows an example of a two-stage cascade off-chip receiver 422, CMOS cascade receiver. The off-chip receiver 422 may receive a signal from an external circuitry through the metal bump 89 and output an amplified signal to the internal circuits 21, 22 and 23 through the thick and wide trace or bus 83'. The first stage 422', close to the external circuitry, of the off-chip receiver 422 is an inverter having an NMOS device 4205 and a PMOS device 4206 with a size designed to detect a noisy external signal. The first stage receives a noisy signal at point E from the external circuits or components, such as signal from another chip. The second stage 422" of the off-chip receiver 422 is also an inverter except that it is formed by a larger size of NMOS device 4207 and PMOS device 4208. The second stage of the inverter is used to restore the integrity of the noisy external signal for the internal circuit. The gates of the PMOS device 4205 and the NMOS device 4206 serve as the input node E, and the drains of the PMOS device 4208 and the NMOS device 4207 serve as the output node F. The drains of the PMOS device 4206 and the NMOS device 4205 are connected to the gates of the PMOS device 4208 and the NMOS device 4207.

Referring to FIG. 11B, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the sources of the PMOS devices 4206 and 4208. The above-mentioned power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the sources of the NMOS devices 4205 and 4207. The above-mentioned ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the above-mentioned ground plane, bus or trace 82.

The first stage 422' of the off-chip receiver in FIG. 11B is an inverter with the NMOS device 4205 having a ratio of a physical channel width thereof to a physical channel length thereof greater than those of all NMOS devices in the internal circuits 20 connected to the output node F of the off-chip receiver 422, and with the PMOS device 4206 having a ratio of a physical channel width thereof to a physical channel length thereof greater than those of all PMOS devices in the internal circuits 20 connected to the output node F of the off-chip receiver 422. The NMOS transistor 4207 may have a ratio of a physical channel width thereof to a physical channel length thereof ranging from 10 to 20,000, and preferably ranging from 10 to 300. The PMOS transistor 4208 may have a ratio of a physical channel width thereof to a physical channel length thereof ranging from 20 to 40,000, and preferably ranging from 20 to 600. The off-chip receiver 422 may output a driving current of between 2 mA and 5 A and, preferably, between 3 mA and 100 mA.

Provided that the off-chip receiver 422 shown in FIG. 11B is applied to the circuit architecture shown in FIG. 8C for a power management chip, the NMOS transistor 4207 of the off-chip receiver 422 may have a ratio of a physical channel width thereof to a physical channel length thereof ranging from 10 to 20,000, and preferably ranging from 10 to 300. The PMOS transistor 4208 may have a ratio of a physical channel width thereof to a physical channel length thereof ranging from 20 to 40,000, and preferably ranging from 20 to 600. The off-chip receiver 422 may output a driving current of between 150 mA and 50 A and, preferably, between 150 mA and 5 A.

In a third aspect, the I/O circuit 42 may be a tri-state buffer 423, as shown in FIG. 11C, in application to the circuit architecture shown in FIG. 8B, having an input node F connected to the internal circuits 20 through the thick and wide circuit trace 83, and an output node E, in parallel with the ESD circuit 43, connected to the metal bump 89. FIG. 11C shows an example of an off-chip tri-state buffer 423; as an off-chip driver, a common design in IC chips to allow multiple logic gates to drive the same output, such as a bus. The tri-state buffer 423, serving as an off-chip driver, may include two PMOS devices 4210 and 4212 and two NMOS devices 4209 and 4211. The gates of the PMOS device 4210 and the NMOS device 4209 serve as the input node F, and the drains of the PMOS device 4212 and the NMOS device 4211 serve as the output node E. The drain of the PMOS device 4210 is connected to the source of the PMOS device 4212. The drain of the NMOS device 4209 is connected to the source of the NMOS device 4211. The tri-state buffer 423 may have a switch function controlled by an Enable signal transmitted to the gate of the NMOS device 4211 and an Enable(bar) signal transmitted to the gate of the PMOS device 4212. The off-chip tri-state buffer in FIG. 11C can be viewed as a gated inverter. When the enabling signal En is high ($\overline{En}$ is low), the off-chip tri-state buffer outputs a signal to an external circuit. When the signal En is set at low ($\overline{En}$ is high), no signal will be output to an external circuit. The off-chip tri-state buffer 423 is set to drive the external data bus.

Referring to FIG. 11C, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the source of the PMOS device 4210. The above-mentioned power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the source of the NMOS device 4209. The above-mentioned ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the above-mentioned ground plane, bus or trace 82.

The NMOS transistors 4209 and 4211 may have a ratio of a physical channel width thereof to a physical channel length thereof ranging from 20 to 20,000, and preferably ranging from 30 to 300. The PMOS transistors 4210 and 4212 may have a ratio of a physical channel width thereof to a physical channel length thereof ranging from 40 to 40,000, and preferably ranging from 60 to 600. The tri-state buffer 423 may output a driving current of between 5 mA and 5 A and, preferably, between 10 mA and 100 mA.

Provided that the tri-state buffer 423 shown in FIG. 11A is applied to the circuit architecture shown in FIG. 8B for a power management chip, the NMOS transistors 4209 and 4211 of the tri-state buffer 423 may have a ratio of a physical channel width thereof to a physical channel length thereof ranging from 2,000 to 200,000, and preferably ranging from 2,000 to 20,000. The PMOS transistors 4210 and 4212 may have a ratio of a physical channel width thereof to a physical channel length thereof ranging from 4,000 to 400,000, and preferably ranging from 4,000 to 40,000. The tri-state buffer 423 may output a driving current of between 500 mA and 50 A and, preferably, between 500 mA and 5 A.

In a fourth aspect, the I/O circuit 42 may be a tri-state buffer 423, as shown in FIG. 11E, in application to the circuit architecture shown in FIG. 8C, having an output node F connected to the internal circuits 21, 22 and 23 through the thick and wide circuit trace 83', and an input node E, in parallel with the ESD circuit 43, connected to the metal bump 89. FIG. 11E shows an example of an off-chip tri-state buffer 423, as an off-chip receiver. The tri-state buffer 423, serving as an off-chip receiver, may include two PMOS devices 4210 and 4212 and two NMOS devices 4209 and 4211. The gates of the PMOS device 4210 and the NMOS device 4209 serve as the input node E, and the drains of the PMOS device 4212 and the NMOS device 4211 serve as the output node F. The drain of the PMOS device 4210 is connected to the source of the PMOS device 4212. The drain of the NMOS device 4209 is connected to the source of the NMOS device 4211. The tri-state buffer 423 may have a switch function controlled by an Enable signal transmitted to the gate of the NMOS device 4211 and an Enable(bar) signal transmitted to the gate of the PMOS device 4212. When the enabling signal En is high ($\overline{En}$ is low), the off-chip tri-state buffer outputs a signal to the internal circuits 20. When the signal En is set at low ($\overline{En}$ is high), no signal will be output to the internal circuits 20.

Referring to FIG. 11E, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 and the source of the PMOS device 4210. The above-mentioned power plane, bus or trace 81, 811 or 812 may contain a patterned circuit layer over the patterned circuit layers 831 and/or 832 of the thick and wide signal trace, bus or plane 83 as shown in FIGS. 10B-10D and 10G. Alternatively, the thick and wide signal trace, bus or plane 83 as shown in FIGS. 10B-10D and 10G may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41 and the source of the NMOS device 4209. The above-mentioned ground plane, bus or trace 82 or 821 may contain a patterned circuit layer over the patterned circuit layers 831 and/or 832 of the thick and wide signal trace, bus or plane 83 as shown in FIGS. 10B-10E and 10G. Alternatively, the thick and wide signal trace, bus or plane 83 as shown in FIGS. 10B-10E and 10G may contain a patterned circuit layer over that of the above-mentioned ground plane, bus or trace 82.

The NMOS transistors 4209 and 4211 may have a ratio of a physical channel width thereof to a physical channel length thereof ranging from 20 to 20,000, and preferably ranging from 30 to 300. The PMOS transistors 4210 and 4212 may have a ratio of a physical channel width thereof to a physical channel length thereof ranging from 40 to 40,000, and preferably ranging from 60 to 600. The tri-state buffer 423 may output a driving current of between 5 mA and 5 A and, preferably, between 10 mA and 100 mA.

Provided that the tri-state buffer 423 shown in FIG. 11E is applied to the circuit architecture shown in FIG. 8C for a power management chip, the NMOS transistors 4209 and 4211 of the tri-state buffer 423 may have a ratio of a physical channel width thereof to a physical channel length thereof ranging from 2,000 to 200,000, and preferably ranging from 2,000 to 20,000. The PMOS transistors 4210 and 4212 may have a ratio of a physical channel width thereof to a physical channel length thereof ranging from 4,000 to 400,000, and preferably ranging from 4,000 to 40,000. The tri-state buffer 423 may output a driving current of between 500 mA and 50 A and, preferably, between 500 mA and 5 A.

There may be various off-chip input and output buffers. The above examples are for the CMOS level signals. If the external signal is a transistor-transistor logic (TTL) level, a CMOS/TTL buffer is required. If the external signal is an emitter coupled logic (ECL) level, a CMOS/ECL interface buffer is required. One or more stages of inverters can be added between the internal circuits 20 and the off-chip tri-state buffer 423 serving as an off-chip driver as shown in FIG. 11C or as an off-chip receiver as shown in FIG. 11E.

Figure 8D:
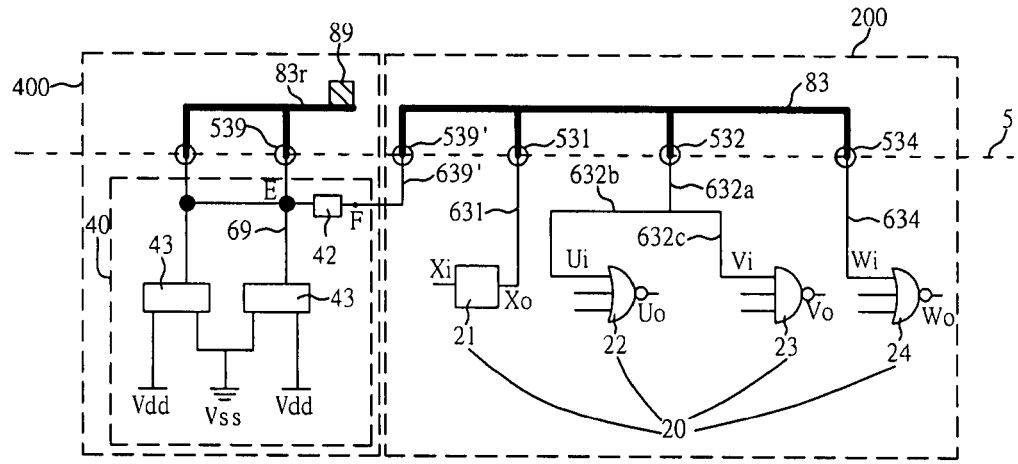
Figure 8E:
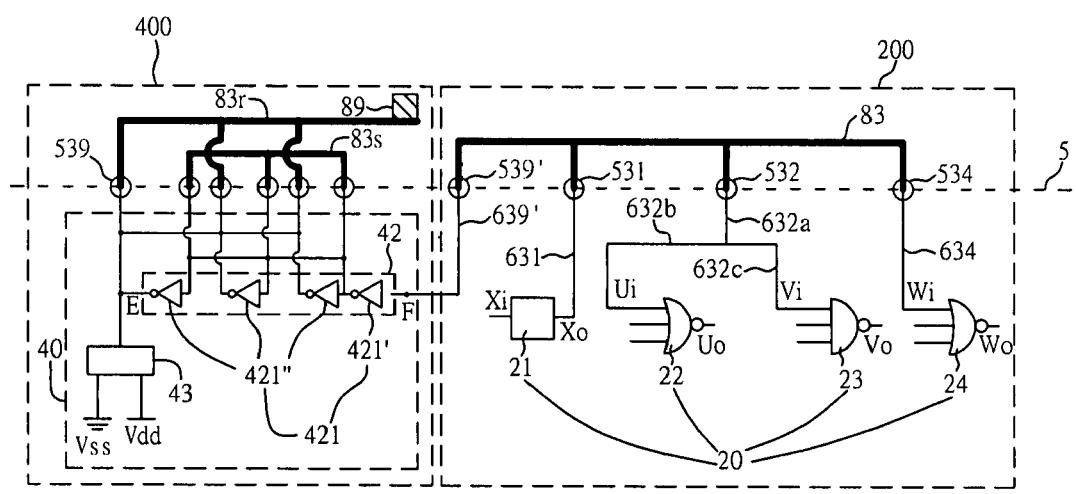
Figure 9C:
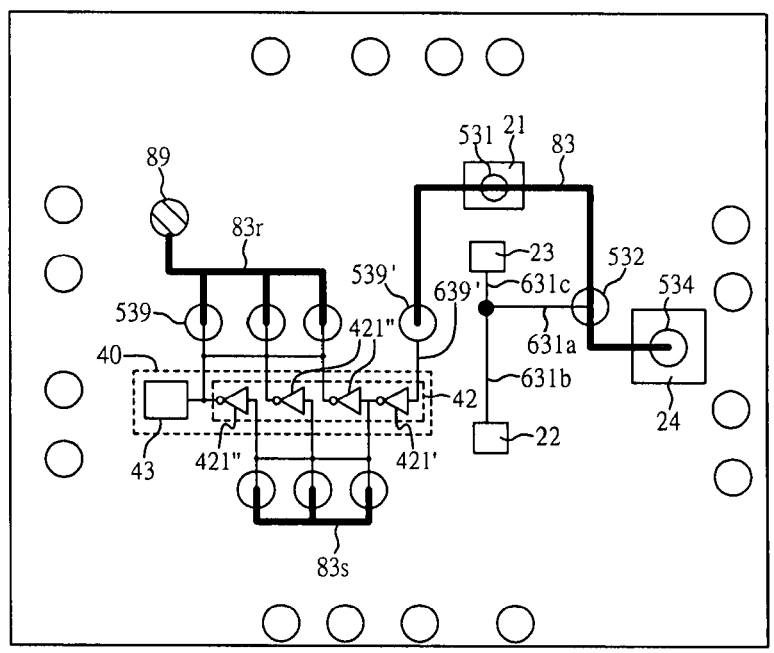
FIG. 9C is a top view layout of multiple internal circuits connected to an off-chip circuit through a thick and wide metal trace, bus or plane over a passivation layer, wherein the off-chip circuit includes two-stage cascade off-chip driver 421.

In a fifth aspect, the off-chip I/O circuit 42 may be an off-chip driver 421 composed of a first level of inverter 421' and a second level of inverters 421'', as shown in FIG. 11D, in application to the circuit architecture shown in FIG. 8B, wherein the first level of inverter 421' is connected in series to the second level of inverters 421'', and the second level of inverters 421'' are connected in parallel with one another to the first level of inverter 421'. FIG. 8E shows a circuitry diagram with the off-driver 421 of FIG. 11D applied to the circuit architecture shown in FIG. 8C. FIG. 9C shows a top perspective view realizing the circuit diagram of FIG. 8E. FIG. 10H shows a chip structure realizing the circuit diagram of FIG. 8E. The off-chip driver 421 has an input node F connected to the internal circuits 20 through the thick and wide circuit trace 83, and an output node E connected, in parallel with the ESD circuit 43, to the metal bump 89. The gates of the PMOS device and the NMOS device in the first level of inverter 421' serve as the input node F, and the drains of the PMOS devices and the NMOS devices in the second level of inverters 421'' serve as the output node E. The drains of the PMOS device and the NMOS device in the first level of inverter 421' are connected to the gates of the PMOS devices and the NMOS devices in the second level of inverters 421'' through a thick and wide metal trace or bus 83s over the passivation layer 5. The drains of the PMOS devices and the NMOS devices in the second level of inverters 421'' are connected to the metal bump 89 through a thick and wide metal trace or bus 83r over the passivation layer 5. A patterned circuit layer 831 formed on the polymer layer 95, such as polyimide, having a thickness of between 2 and 30 micrometers may be composed of the thick and wide metal traces or buses 83r, 83s and 83, that is, the thick and wide metal traces or buses 83r, 83s and 83 may be formed at the same time, as shown in FIG. 10H.

Alternatively, multiple patterned circuit layers and multiple polymer layers may be formed over the passivation layer 5, one of the polymer layers is between neighboring two of the patterned circuit layers. The thick and wide metal traces or buses 83s may be formed in the lower one of the patterned circuit layers, and the thick and wide metal traces or buses 83s may be formed in the upper one of the patterned circuit layers and over the thick and wide metal traces or buses 83s. The thick and wide metal traces or buses 83 may have a portion in the lower one of the patterned circuit layers and another portion in the upper one of the patterned circuit layers.

Referring to FIG. 11D, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 to the source of the PMOS device in the first level of inverter 421' and to the sources of the PMOS devices in the second level of inverter 421". The above-mentioned power plane, bus or trace 81, 811 or 812 may contain a patterned circuit layer over the patterned circuit layer 831 of the thick and wide signal trace, bus or plane 83 as shown in FIG. 10H. Alternatively, the thick and wide signal trace, bus or plane 83 as shown in FIG. 10H may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41, the source of the NMOS device in the first level of inverter 421', and the sources of the NMOS devices in the second level of inverters 421". The above-mentioned ground plane, bus or trace 82 or 821 may contain a patterned circuit layer over the patterned circuit layer 831 of the thick and wide signal trace, bus or plane 83 as shown in FIG. 10H. Alternatively, the thick and wide signal trace, bus or plane 83 as shown in FIG. 10H may contain a patterned circuit layer over that of the above-mentioned ground plane, bus or trace 82.

Each of the NMOS transistors in the second level of inverters 421" may have a ratio of a physical channel width thereof to a physical channel length thereof ranging from 20 to 20,000, and preferably ranging from 30 to 300, greater than that of NMOS transistor in the first level inverter 421' by between 1.5 times and 5 times, and preferably by natural exponential times. Each of the PMOS transistors in the second level of inverters 421" may have a ratio of a physical channel width thereof to a physical channel length thereof ranging from 40 to 40,000, and preferably ranging from 60 to 600, greater than that of PMOS transistor in the first level inverter 421' by between 1.5 times and 5 times, and preferably by natural exponential times. The off-chip driver 421 may output a driving current of between 5 mA and 5 A and, preferably, between 10 mA and 100 mA to an external circuit through the metal bump 89.

Provided that the off-chip driver 421 shown in FIG. 11D is applied to the circuit architecture shown in FIG. 8B for a power management chip, each of the NMOS transistors in the second level of inverters 421" may have a ratio of a physical channel width thereof to a physical channel length thereof ranging from 2,000 to 200,000, and preferably ranging from 2,000 to 20,000. Each of the PMOS transistors in the second level of inverters 421" may have a ratio of a physical channel width thereof to a physical channel length thereof ranging from 4,000 to 400,000, and preferably ranging from 4,000 to 40,000. The off-chip driver 421 may output a driving current of between 500 mA and 50 A and, preferably, between 500 mA and 5 A to an external circuit through the metal bump 89.

Figure 8F:
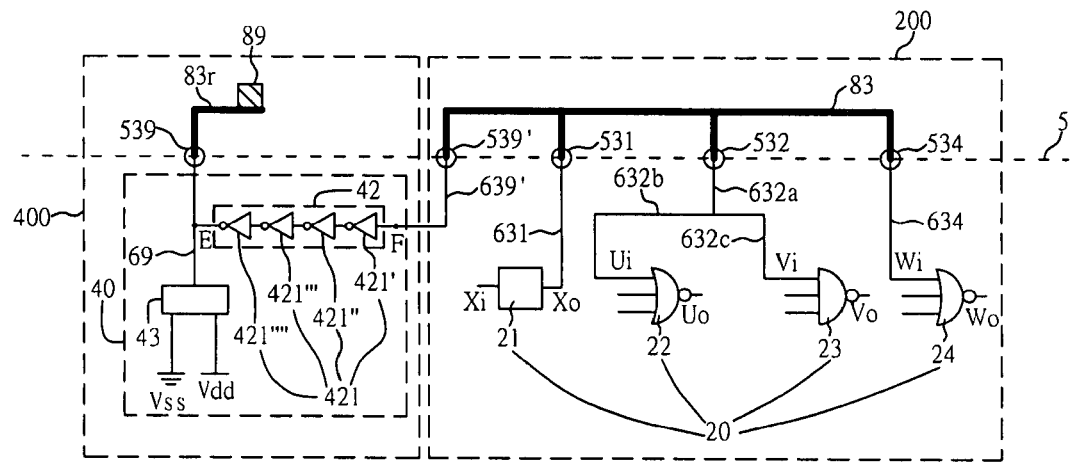
Figure 9D:
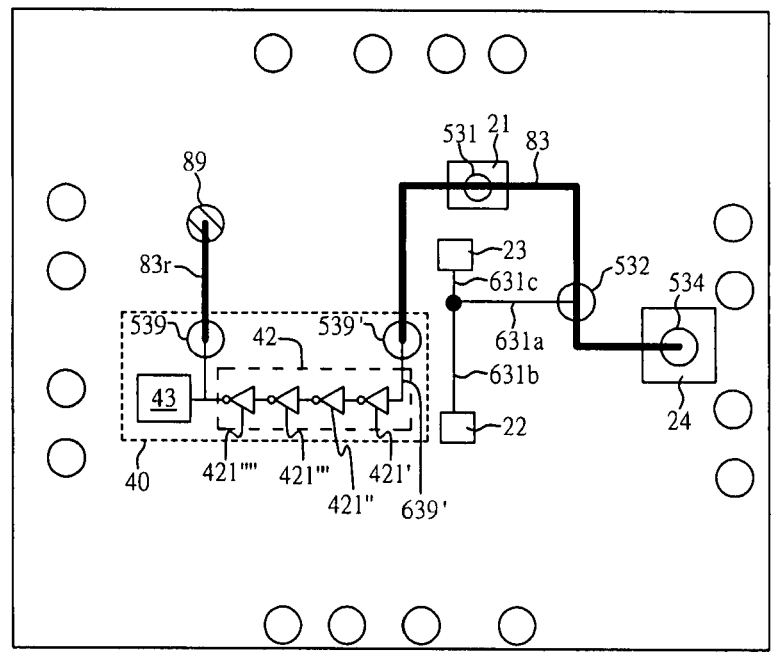
FIG. 9D is a top view layout of multiple internal circuits connected to an off-chip circuit through a thick and wide metal trace, bus or plane over a passivation layer, wherein the off-chip circuit includes four-stage cascade off-chip driver 42.
Figure 10I:
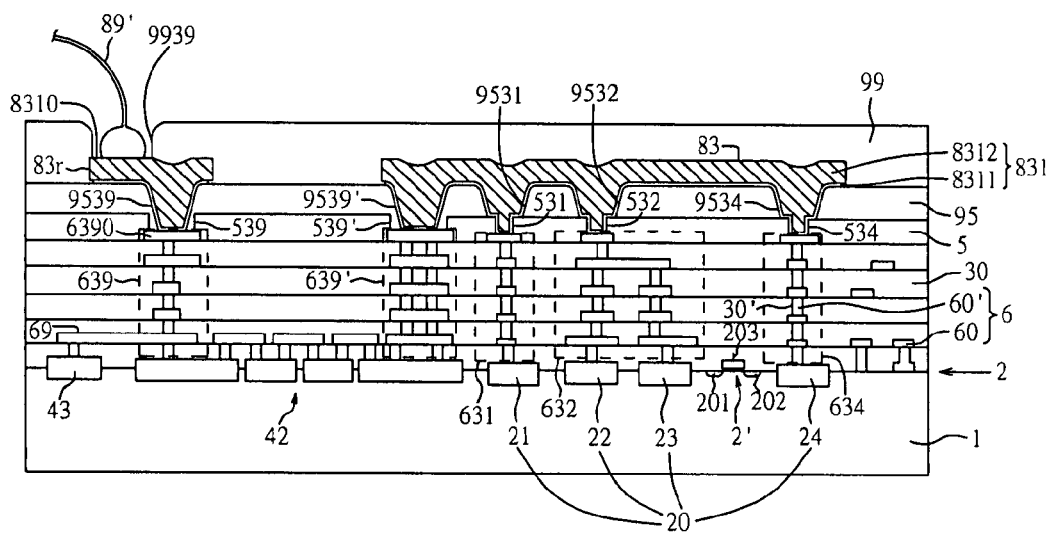
Figure 11G:
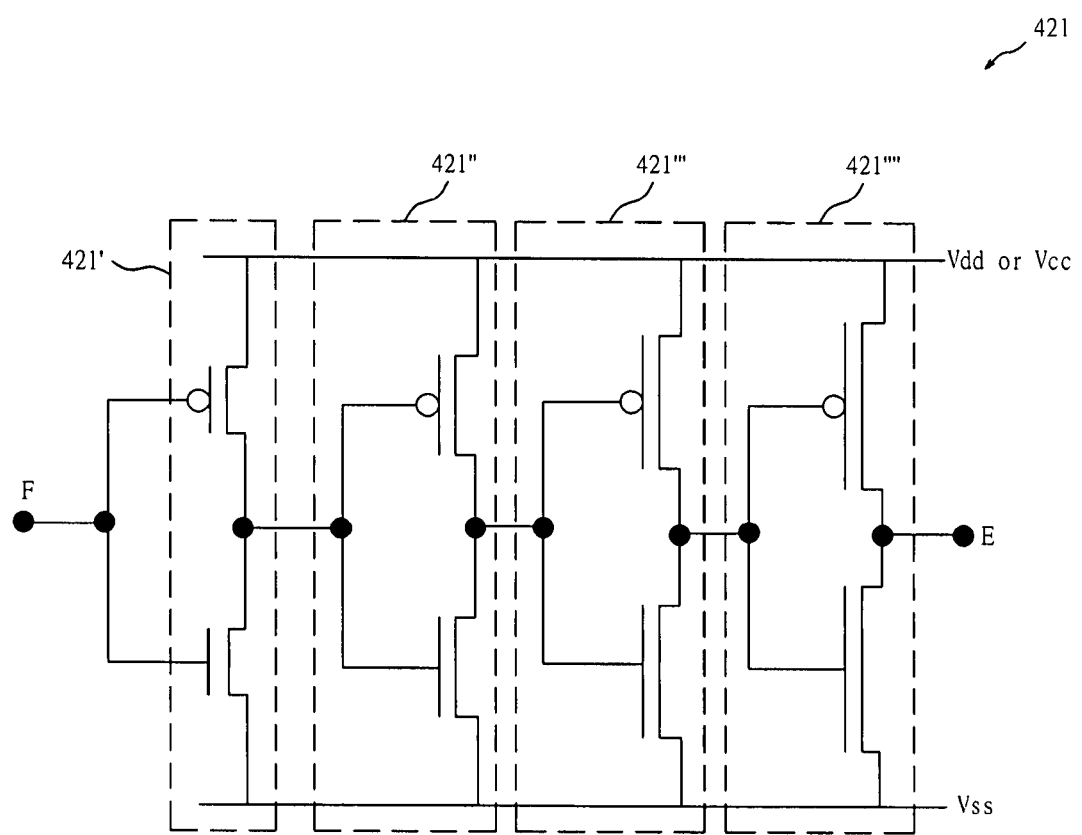
FIG. 11G is a schematic representation of an example of a four-stage cascade off-chip driver circuit, which can be applied to the I/O circuit 42 shown in FIG. 8F, in the third preferred embodiment of the present invention.

In a sixth aspect, the off-chip I/O circuit 42 may be an off-chip driver 421 composed of a first level of inverter 421', a second level of inverters 421", a third level of inverter 421''' and a fourth level of inverter 421'''', as shown in FIG. 11G, in application to the circuit architecture shown in FIG. 8B, wherein the first level of inverter 421' is connected in series to the second level of inverters 421", the second level of inverter 421" is connected in series to the third level of inverters 421''', and the third level of inverter 421' is connected in series to the fourth level of inverters 421''''. FIG. 8F shows a circuitry diagram with the off-driver 421 of FIG. 11G applied to the circuit architecture shown in FIG. 8C. FIG. 9D shows a top perspective view realizing the circuit diagram of FIG. 8F. FIG. 10I shows a chip structure realizing the circuit diagram of FIG. 8F. The off-chip driver 421 has an input node F connected to the internal circuits 20 through the thick and wide circuit trace 83, and an output node E connected, in parallel with the ESD circuit 43, to the metal bump 89. The gates of the PMOS device and the NMOS device in the first level of inverter 421' serve as the input node F, and the drains of the PMOS device and the NMOS device in the fourth level of inverter 421'''' serve as the output node E. The drains of the PMOS device and the NMOS device in the first level of inverter 421' are connected to the gates of the PMOS device and the NMOS device in the second level of inverter 421" through a fine-line metal trace or bus under the passivation layer 5. The drains of the PMOS device and the NMOS device in the second level of inverter 421" are connected to the gates of the PMOS device and the NMOS device in the third level of inverter 421''' through a fine-line metal trace or bus under the passivation layer 5. The drains of the PMOS device and the NMOS device in the third level of inverter 421''' are connected to the gates of the PMOS device and the NMOS device in the fourth level of inverter 421'''' through a fine-line metal trace or bus under the passivation layer 5. The drains of the PMOS device and the NMOS device in the fourth level of inverters 421'''' are connected to the metal bump 89 through the thick and wide metal trace or bus 83r over the passivation layer 5. A patterned circuit layer 831 formed on the polymer layer 95, such as polyimide, having a thickness of between 2 and 30 micrometers may be composed of the thick and wide metal traces or buses 83r and 83, that is, the thick and wide metal traces or buses 83r and 83 may be formed at the same time, as shown in FIG. 10I.

Referring to FIG. 11G, the above-mentioned power plane, bus or trace 81, 811 or 812, as shown in FIGS. 1B, 1C, 2B, 2C, 3B, 3C and 3D, over the passivation layer 5 can connect the node P of the regulator or converter 41 to the source of the PMOS device in the first level of inverter 421', to the source of the PMOS device in the second level of inverter 421", to the source of the PMOS device in the third level of inverter 421''' and to the source of the PMOS device in the fourth level of inverter 421''''. The above-mentioned power plane, bus or trace 81, 811 or 812 may contain a patterned circuit layer over the patterned circuit layer 831 of the thick and wide signal trace, bus or plane 83 as shown in FIG. 10I. Alternatively, the thick and wide signal trace, bus or plane 83 as shown in FIG. 10I may contain a patterned circuit layer over that of the above-mentioned power plane, bus or trace 81. The above-mentioned ground plane, bus or trace 82 or 821, as shown in FIGS. 1C, 2C and 3C, over the passivation layer 5 can connect the node Rs of the regulator or converter 41, the source of the NMOS device in the first level of inverter 421', the source of the NMOS device in the second level of inverter 421", the source of the NMOS device in the third level of inverter 421''', and the source of the NMOS device in the fourth level of inverter 421''''. The above-mentioned ground plane, bus or trace 82 or 821 may contain a patterned circuit layer over the patterned circuit layer 831 of the thick and wide signal trace, bus or plane 83 as shown in FIG. 10I. Alternatively, the thick and wide signal trace, bus or plane 83 as shown in FIG. 10I may contain a patterned circuit layer over that of the above-mentioned ground plane, bus or trace 82.

The NMOS transistor in the fourth level of inverter 421'''' may have a ratio of a physical channel width thereof to a physical channel length thereof greater than that of the NMOS transistor in the third level of inverter 421''' by between 1.5 and 5 times, and preferably by natural exponential times, that is greater than that of the NMOS transistor in the second level of inverter 421" by between 1.5 and 5 times, and preferably by natural exponential times, that is greater than that of the NMOS transistor in the first level of inverter 421' by between 1.5 and 5 times, and preferably by natural exponential times. The PMOS transistor in the fourth level of inverter 421'''' may have a ratio of a physical channel width thereof to a physical channel length thereof greater than that of the PMOS transistor in the third level of inverter 421''' by between 1.5 and 5 times, and preferably by natural exponential times, that is greater than that of the PMOS transistor in the second level of inverter 421'' by between 1.5 and 5 times, and preferably by natural exponential times, that is greater than that of the PMOS transistor in the first level of inverter 421' by between 1.5 and 5 times, and preferably by natural exponential times. The off-chip driver 421 may output a driving current of between 5 mA and 5 A and, preferably, between 10 mA and 100 mA to an external circuit through the metal bump 89.

The NMOS transistor in the fourth level of inverter 421'''' may have a ratio of a physical channel width thereof to a physical channel length thereof ranging from 20 to 20,000, and preferably ranging from 30 to 300. The PMOS transistor in the fourth level of inverter 421'''' may have a ratio of a physical channel width thereof to a physical channel length thereof ranging from 40 to 40,000, and preferably ranging from 60 to 600. The NMOS transistor in the third level of inverter 421''' may have a ratio of a physical channel width thereof to a physical channel length thereof ranging from 7 to 7,000, and preferably ranging from 10 to 100. The PMOS transistor in the third level of inverter 421''' may have a ratio of a physical channel width thereof to a physical channel length thereof ranging from 13 to 13,000, and preferably ranging from 20 to 200. The NMOS transistor in the second level of inverter 421'' may have a ratio of a physical channel width thereof to a physical channel length thereof ranging from 2 to 2,000, and preferably ranging from 3 to 30. The PMOS transistor in the second level of inverter 421'' may have a ratio of a physical channel width thereof to a physical channel length thereof ranging from 4 to 4,000, and preferably ranging from 6 to 70.

Provided that the off-chip driver 421 shown in FIG. 11D is applied to the circuit architecture shown in FIG. 8B for a power management chip, the NMOS transistor in the fourth level of inverter 421'''' may have a ratio of a physical channel width thereof to a physical channel length thereof ranging from 2,000 to 200,000, and preferably ranging from 2,000 to 20,000. The PMOS transistor in the fourth level of inverter 421'''' may have a ratio of a physical channel width thereof to a physical channel length thereof ranging from 4,000 to 400,000, and preferably ranging from 4,000 to 40,000. The NMOS transistor in the third level of inverter 421''' may have a ratio of a physical channel width thereof to a physical channel length thereof ranging from 700 to 70,000, and preferably ranging from 700 to 7,000. The PMOS transistor in the third level of inverter 421''' may have a ratio of a physical channel width thereof to a physical channel length thereof ranging from 1,300 to 130,000, and preferably ranging from 1,300 to 13,000. The NMOS transistor in the second level of inverter 421'' may have a ratio of a physical channel width thereof to a physical channel length thereof ranging from 230 to 23,000, and preferably ranging from 230 to 2,300. The PMOS transistor in the second level of inverter 421'' may have a ratio of a physical channel width thereof to a physical channel length thereof ranging from 400 to 40,000, and preferably ranging from 400 to 4,000. The off-chip driver 421 may output a driving current of between 500 mA and 50 A and, preferably, between 500 mA and 5 A to an external circuit through the metal bump 89.

Referring to FIGS. 8B, 8C, 8E and 8F, the off-chip I/O circuit 42 is connected, in parallel with the ESD circuit 43, to the metal bump 89. The detail of the ESD circuit 43 may be referred to as FIG. 11F. The ESD circuit 43 is composed of two reverse-biased diodes 4331 and 4332, wherein the node E is connected to the anode of the diode 4332, to the cathode of the diode 4331, to the off-chip I/O circuit 42, such as off-chip driver 421 of FIG. 11A, 11D or 11G, off-chip receiver 422 of FIG. 11B, or tri-state buffer 423 of FIG. 11C or 11E, and to the metal bump 89. The diode 4331 is reverse-biased between an external voltage and the ground voltage Vss, and the diode 4332 is reverse-biased between the external voltage and the power voltage Vdd or Vcc.

Referring to FIG. 11F, an external power voltage Vdd can be provided to the cathode of the diode 4332 through a power bus or plane over the passivation layer 5. The above-mentioned ground plane, bus or trace 82 or 821, as shown in FIGS. 1C, 2C and 3C, over the passivation layer 5 can connect the node Rs of the regulator or converter 41 and the cathode of the diode 4331.

Thereby, the voltage at the node E can be clamped between the power voltage Vdd input from an external circuit and the ground voltage Vss or between the power voltage Vdd and the ground voltage Vss. When the voltage at the node E suddenly exceeds the power voltage Vdd, a current will discharge from the node E to the external circuit through the diode 4332. When the voltage at the node E dramatically drop under the ground voltage Vss, a current will flow from the external circuit to the node E through the diode 4331.

Figure 11H:
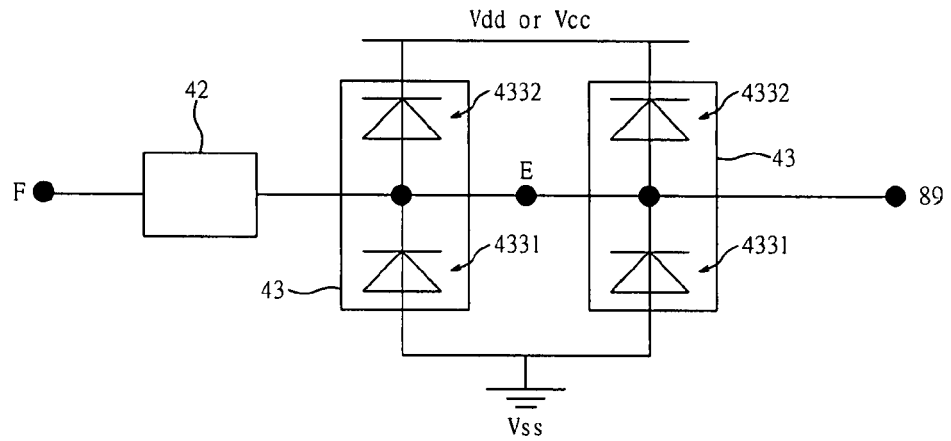
FIG. 11H is a schematic representation of an example of two ESD connections, which can be applied to the ESD protection circuit 43 shown in FIG. 8D, in the third preferred embodiment of the present invention.

Alternatively, the node E in the circuitry diagrams in FIGS. 8B, 8C, 8E and 8F can be protected by multiple ESD circuits 43, which can be referred to as FIG. 11H. For example, referring to FIG. 8D, the node E connecting the off-chip driver 42 to the metal bump 89 may be protected by multiple ESD circuits 43. Each of the ESD circuits 43 is composed of two reverse-biased diodes 4331 and 4332, wherein the node E is connected to the anodes of the diodes 4332, to the cathodes of the diodes 4331, to the off-chip I/O circuit 42, such as off-chip driver 421 of FIG. 11A, 11D or 11G, off-chip receiver 422 of FIG. 11B, or tri-state buffer 423 of FIG. 11C or 11E, and to the metal bump 89. The diodes 4331 are reverse-biased between an external voltage and the ground voltage Vss, and the diodes 4332 are reverse-biased between the external voltage and the power voltage Vdd or Vcc.

Referring to FIG. 11H, an external power voltage Vdd can be provided to the cathodes of the diodes 4332 through a power bus or plane over the passivation layer 5. The above-mentioned ground plane, bus or trace 82 or 821, as shown in FIGS. 1C, 2C and 3C, over the passivation layer 5 can connect the node Rs of the regulator or converter 41 and the cathodes of the diodes 4331.

Thereby, the voltage at the node E can be clamped between the power voltage Vdd input from an external circuit and the ground voltage Vss. When the voltage at the node E suddenly exceeds the power voltage Vdd, a current will discharge from the node E to the external circuit through the diodes 4332. When the voltage at the node E dramatically drop under the ground voltage Vss, a current will flow from the external circuit to the node E through the diodes 4331.

In FIGS. 10B, 10D, 10G, 10H and 10I, there is only one patterned circuit layer 831, including a portion serving as the above-mentioned thick and wide metal trace 83 and another portion serving as the above-mentioned thick and wide metal trace 83r, over the passivation layer 5. The patterned circuit layer 831 may contain an adhesion/barrier layer, a seed layer on the adhesion/barrier layer, and an electroplated metal layer 8312 on the seed layer, the adhesion/barrier layer and the seed layer composing the bottom layer 8311.

Referring to FIG. 10B, regards to the process for forming the patterned circuit layer 831, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6390, principally made of aluminum or copper, exposed by multiple openings 539, 539', 531, 532 and 534 in the passivation layer 5. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8312 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8312 is removed using a wet-etching process or using a dry-etching process. Thereafter, the adhesion/barrier layer not under the metal layer 8312 is removed using a wet-etching process or using a dry-etching process.

After the patterned circuit layer 831 is formed, a polymer layer 99 can be formed by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9939 may be formed in the polymer layer 99, exposing a contact pad 8310 of the patterned circuit layer 831.

Referring to FIG. 10B, for forming the metal bump 89 over the contact pad 8310, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8310 exposed by the opening 9939. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump 89 may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump 89 is removed using a wet-etching process or using a dry-etching process. Thereafter, the adhesion/barrier layer not under the metal bump 89 is removed using a wet-etching process or using a dry-etching process. Thereafter, the metal bump 89 can be reflowed to be shaped like a ball for a flip-chip assembly. The metal bump 89 can be connected to a printed circuit board, ceramic substrate or another semiconductor chip.

Referring to FIG. 10B, for forming another kind of metal bump 89 over the contact pad 8310, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8310 exposed by the opening 9939. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump 89 may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump 89 is removed using a wet-etching process or using a dry-etching process. Thereafter, the adhesion/barrier layer not under the metal bump 89 is removed using a wet-etching process or using a dry-etching process. The metal bump 89 can be connected to a flexible substrate by a tape-automated bonding (TAB) process, or a glass substrate via anisotropic conductive film or paste (ACF or ACP).

Alternatively, referring to FIG. 10B, a nickel layer having a thickness between 0.05 and 2 micrometers can be electroless plated on the contact pad 8310 exposed by the opening 9939, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire can be bonded onto the electroless plated gold layer in the opening 9939 in the polymer layer 99 using a wirebonding process.

Alternatively, referring to FIG. 10B, a gold wire can be bonded onto a gold layer, platinum layer, palladium layer or ruthenium layer of the patterned circuit layer 831, exposed by the openings 9939 in the polymer layer 99 using a wirebonding process.

Figure 10C:
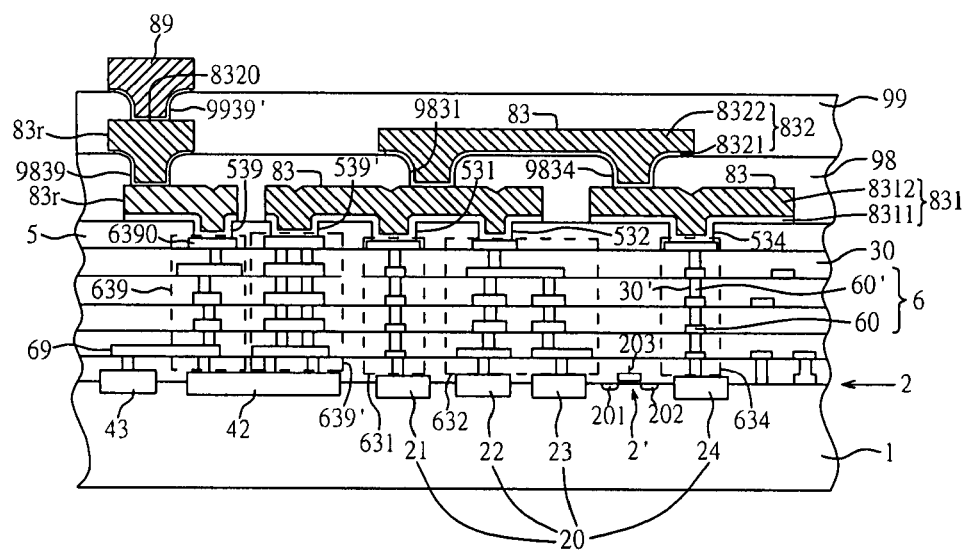

Alternatively, referring to FIG. 10C, there may be multiple patterned circuit layers 831 and 832, including a portion serving as the above-mentioned thick and wide metal trace 83 and another portion serving as the above-mentioned thick and wide metal trace 83r, over the passivation layer 5. The process for forming the patterned circuit layer 831 shown in FIG. 10C can be referred to as the process for forming the patterned circuit layer 831 shown in FIG. 10B. The patterned circuit layer 832 may contain an adhesion/barrier layer, a seed layer on the adhesion/barrier layer, and an electroplated metal layer 8322 on the seed layer, the adhesion/barrier layer and the seed layer composing the bottom layer 8321.

Referring to FIG. 10C, after the patterned circuit layer 831 is formed, a polymer layer 98 can be formed by spin-on coating a negative photosensitive polyimide layer, such as ester type, on the patterned circuit layer 831 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9831, 9834 and 9839 may be formed in the polymer layer 98, exposing multiple contact pads of the patterned circuit layer 831.

Referring to FIG. 10C, regards to the process for forming the patterned circuit layer 832, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pads of the patterned circuit layer 831 exposed by multiple openings 9839, 9831 and 9834 in the polymer layer 98. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8322 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8322 is removed using a wet-etching process or using a dry-etching process. Thereafter, the adhesion/barrier layer not under the metal layer 8322 is removed using a wet-etching process or using a dry-etching process.

After the patterned circuit layer 832 is formed, a polymer layer 99 can be formed by spin-on coating a negative photosensitive polyimide layer, such as ester type, on the patterned circuit layer 832 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9939' may be formed in the polymer layer 99, exposing a contact pad 8320 of the patterned circuit layer 832.

Referring to FIG. 10C, for forming the metal bump 89 over the contact pad 8320, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8320 exposed by the opening 9939'. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump 89 may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump 89 is removed using a wet-etching process or using a dry-etching process. Thereafter, the adhesion/barrier layer not under the metal bump 89 is removed using a wet-etching process or using a dry-etching process. Thereafter, the metal bump 89 can be reflowed to be shaped like a ball. The metal bump 89 can be connected to a printed circuit board, ceramic substrate or another semiconductor chip.

Referring to FIG. 10C, for forming another kind of metal bump 89 over the contact pad 8320, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8320 exposed by the opening 9939'. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump 89 may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump 89 is removed using a wet-etching process or using a dry-etching process. Thereafter, the adhesion/barrier layer not under the metal bump 89 is removed using a wet-etching process or using a dry-etching process. The metal bump 89 can be connected to a flexible substrate by a tape-automated bonding (TAB) process, or a glass substrate via anisotropic conductive film or paste (ACF or ACP).

Alternatively, referring to FIG. 10C, a nickel layer having a thickness between 0.05 and 2 micrometers can be electroless plated on the contact pad 8320 exposed by the opening 9939' in layer polymer layer 99, and a gold layer, platinum layer, palladium layer or ruthenium layer having a thickness between 0.05 and 2 micrometers can be electroless plated on the electroless plated nickel layer in the opening 9939' in the polymer layer 99. Thereafter, a gold wire can be bonded onto the electroless plated gold layer in the opening 9939' in the polymer layer 99 using a wirebonding process.

Alternatively, referring to FIG. 10C, a gold wire can be bonded onto a gold layer, platinum layer, palladium layer or ruthenium layer of the patterned circuit layer 832, exposed by the openings 9939' in the polymer layer 99 using a wirebonding process.

Figure 10D:
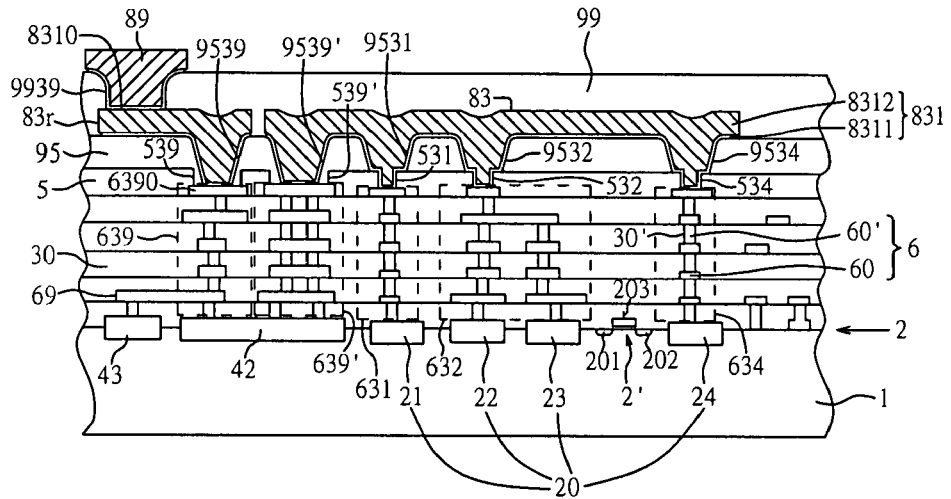
Figure 10E:
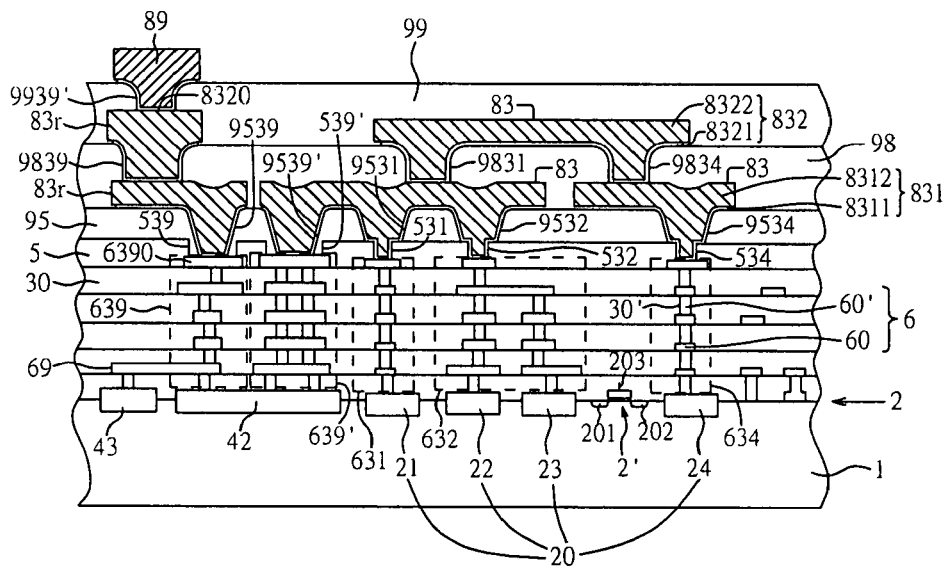

Referring to FIGS. 10D and 10E, before the patterned circuit layer 831 is formed, a polymer layer 95 can be optionally formed by spin-on coating a negative photosensitive polyimide layer, such as ester type, on the nitride layer of the passivation layer 5 and on the contact pads 6390, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9539, 9539', 9531, 9532 and 9534 may be formed in the polymer layer 95, exposing multiple contact pads 6390 exposed by the openings 539, 539', 531, 532 and 533 in the passivation layer 5. After the polymer layer 95 is formed, the patterned circuit layer 831 can be formed on the polymer layer 95 and on the contact pads 6390 exposed by the openings 539, 539', 531, 532 and 533. The adhesion/barrier layer of any above-mentioned material may be sputtered on the polymer layer 95 and on the contact pads 6390 exposed by the openings 9539, 9539', 9531, 9532 and 9534 in the polymer layer 95.

Figure 10F:
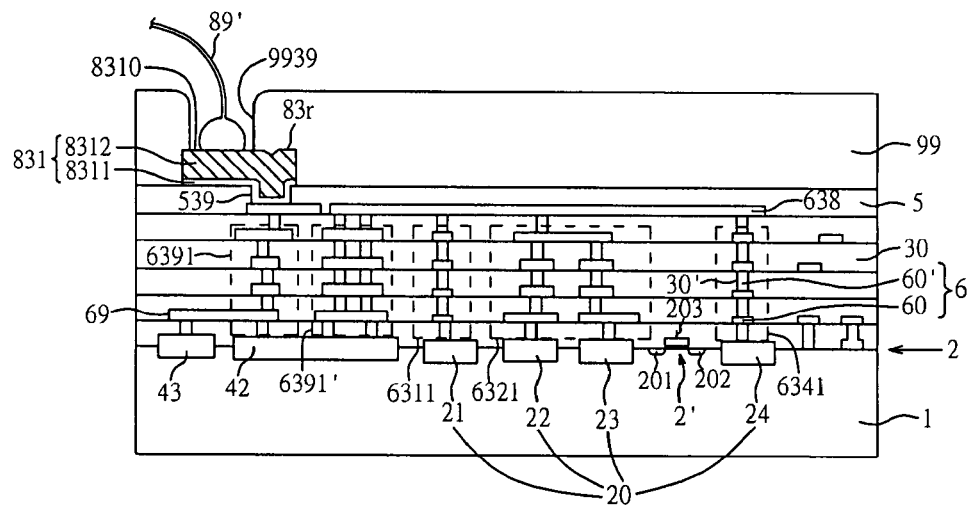
FIG. 10F is a cross-sectional representation of multiple internal circuits connected to an off-chip circuit through a metal trace, bus or plane under a passivation layer, with a wire wirebonded to a relocated pad on a passivation layer, according to a third preferred embodiment of the present invention.

Alternatively, referring to FIG. 10F, the off-chip I/O circuit 42, such as off-chip driver of FIG. 11A, 11D or 11E, off-chip receiver of FIG. 11B or tri-state buffer of FIG. 11C or 11E, can be connected to the internal circuits 20 through the fine-line metal trace 638 under the passivation layer 5 but not through any trace or bus over the passivation layer 5. There may be only one patterned circuit layer 831 including a portion serving as the above-mentioned thick and wide metal trace 83r, over the passivation layer 5. The position of a redistributed pad 8310 of the above-mentioned thick and wide metal trace 83r for being wirebonded thereto from a top perspective view is different from that of the contact pad exposed by the opening 539 in the passivation layer 5. The process for forming the patterned circuit layer 831 can be referred to as that for forming the patterned circuit layer 831 shown in FIG. 10B. The process for forming the polymer layer 99 can be referred to as that for forming the polymer layer 99 shown in FIG. 10B.

Referring to FIG. 10F, a gold wire can be bonded onto a gold layer, platinum layer, palladium layer or ruthenium layer of the patterned circuit layer 831, exposed by the openings 9939 in the polymer layer 99 using a wirebonding process.

As an alternate, referring to FIG. 10F, a nickel layer having a thickness between 0.05 and 2 micrometers can be electroless plated on the contact pad 8310 exposed by the opening 9939 in the polymer layer 99, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire can be bonded onto the electroless plated gold layer in the opening 9939 in the polymer layer 99 using a wirebonding process.

Figure 10G:
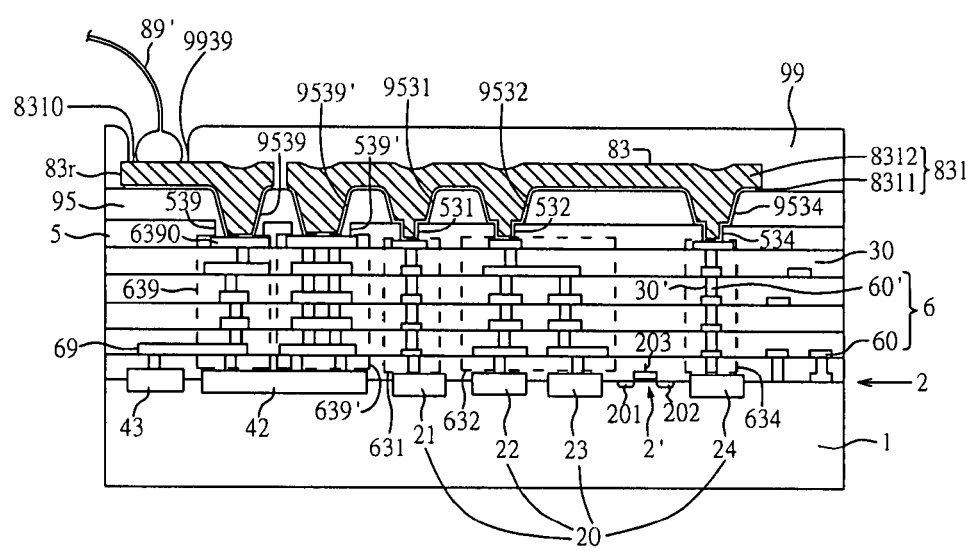
Figure 10H:
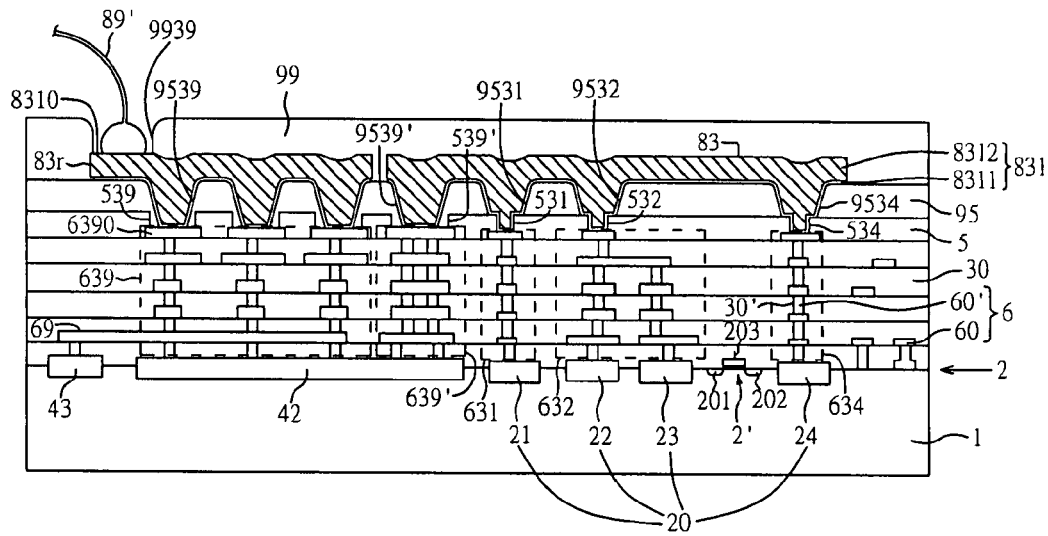

Referring to FIGS. 10G-10I, a gold wire can be bonded onto a gold layer, platinum layer, palladium layer or ruthenium layer of the patterned circuit layer 831, exposed by the openings 9939 in the polymer layer 99 using a wirebonding process.

As an alternate, referring to FIGS. 10G-10I, a nickel layer having a thickness between 0.05 and 2 micrometers can be electroless plated on the contact pad 8310 exposed by the opening 9939 in the polymer layer 99, and a gold layer, platinum layer, palladium layer or ruthenium layer having a thickness between 0.05 and 2 micrometers can be electroless plated on the electroless plated nickel layer in the opening 9939 in the polymer layer 99. Thereafter, a gold wire can be bonded onto the electroless plated gold layer in the opening 9939 in the polymer layer 99 using a wirebonding process.

The circuitry shown in FIGS. 8B-8F, 9B-9B and 10B-10I can be used in a flash memory chip, in a DRAM memory chip or in a SRAM memory chip. The I/O pad relocation using the redistribution layer 83r is particularly useful for the stacked packaging with flash, DRAM or SRAM memory chips. The I/O pads of a DRAM chip are usually designed roughly along the centerline of the chip, and cannot be used for stacked packages. The redistribution layer 83r relocates the center pad to the peripheral of the chip for the wirebonding in the stacked package. FIGS. 10F and 10G show specific examples, with a wire bonded on the relocated pad 8310 connected to the original pad 6390 exposed by the opening 539 in the passivation layer 5 via the thick and wide metal trace of bus 83r. In FIGS. 8B, 9B, 10B-10G, in an application to a memory chip, an SRAM cell, or a flash memory cell, or a DRAM cell is connected to the input node Xi of the internal circuit 21, such as sense amplifier, internal tri-state buffer 213 of FIG. 5F, pass circuit 216 of FIG. 5G, latch circuit 217 of FIG. 5H, circuit of pass circuit 216 and internal driver 212 shown in FIG. 5I, or circuit of latch circuit 217 and internal driver 212 shown in FIG. 5J. The various detailed internal circuit 21 and methods connecting a memory cell to the internal circuit 21 can be referred to as shown in FIGS. 5F-5J. Referring to FIGS. 8B, 8D-8F, 9B-9D and 10B-10I, an SRAM cell, or a flash cell or a DRAM cell is connected to external circuit (1) through sense amplifier 214 of FIGS. 5F-5J; (2) through an internal tri-state buffer 213 of FIG. 5F, a pass circuit 216 of FIG. 5G a latch circuit 217 of FIG. 5H, a circuit of a pass circuit 216 and an internal driver 212 as shown in FIG. 5I, or a circuit of a latch circuit 217 and an in-+ternal driver 212 as shown in FIG. 5J; (3) through a first fine-line structure formed by stacked vias and metals 631; (4) up through a first passivation opening 531; (5) for 10G, also through a first polymer opening 9531; (6) through a fine-line metal 638 under the passivation layer 5 for FIG. 10F; while through an over-passivation metal lines, traces or planes 83 in one or more metal layers over the passivation layer 5 for FIG. 10G; (7) for FIG. 10G, down through a second polymer opening 9539'; (8) through a second passivation opening 539'; (9) through a fine-line metal structure formed by stacked vias and metal pads 639', connected to the input of an off-chip I/O circuit 42, (10) through the output of the off-chip I/O circuit 42 connected to an ESD circuit 42, and to a stacked fine-line metal vias and metal pads 639, (11) through an passivation opening 539, (12) for 10G, also through a third polymer opening 9539; and (13) through an over-passivation redistribution metal lines or traces or planes 83r, (14) through over-passivation metal pad 8310 exposed by a polymer opening 9939; (15) through a bonding wire 89' on the contact pad 8310 or a metal bump 89.

Note that as in FIG. 10G, there may be a polymer layer under or over the redistribution metal layer 83r. The redistribution metal lines, traces or planes 83r can be formed by a (electroplated or electroless plated) gold layer with thickness within a range between 1.5 μm and 30 μm, preferred 2 μm and 10 μm; or by a (electroplated) copper layer with thickness within a range between 2 μm and 100 μm, preferred 3 μm and 20 μm, a Ni cap layer (thickness between 0.5 μm and 5 μm) on the copper layer and an assembly metal layer of Au or Pd, or Ru (thickness between 0.05 μm and 5 μm) on the Ni cap layer. A wirebonding is performed on the surface of the gold, palladium, platinum or ruthenium layer of the over-passivation metal pad 8310.

Referring to FIGS. 8B-8F, 9B-9D, 10B-10E and 10G-10I, the shape of the openings 531, 532, 534 and 539' in the passivation layer 5 from a top perspective view may be round, square, rectangular or polygon. If the openings 531, 532, 534, 539 and 539' are round, the openings 531, 532, 534, 539 and 539' may have a diameter of between 0.1 and 200 microns, between 1 and 100 microns, or, preferably, between 0.1 and 30 microns. If the openings 531, 532, 534, 539 and 539' are square, the openings 531, 532, 534, 539 and 539' may have a width of between 0.1 and 200 microns, between 1 and 100 microns, or, preferably, between 0.1 and 30 microns. If the openings 531, 532, 534, 539 and 539' are rectangular, the openings 531, 532, 534, 539 and 539' may have a width of between 0.1 and 200 microns, between 1 and 100 microns, or, preferably, between 0.1 and 30 microns, and a length of between 1 micron and 1 centimeter. If the openings 531, 532, 534, 539 and 539' are polygon having more than five sides, the openings 531, 532, 534, 539 and 539' have a greatest diagonal length of between 0.1 and 200 microns, between 1 and 100 microns, or, preferably, between 0.1 and 30 microns. Alternatively, the openings 531, 532, 534, 539 and 539' have a greatest transverse dimension of between 0.1 and 200 microns, between 1 and 100 microns, or, preferably, between 0.1 and 30 microns. In a case shown in FIGS. 10C-10E, 10G, 10H and 10I, the openings 531, 532, 534, 539 and 539' have a width of between 0.1 and 30 microns, with the lower portion of the openings 9531, 9532, 9534, 9539 and 9539' in the polymer layer 95 having a width of between 20 and 100 microns. The openings 9531, 9532 and 9534 in the polymer layer 95 have lower portions having widths or transverse dimensions greater than those of the openings 531, 532 and 534 in the passivation layer 5 aligned with the openings 9531, 9532 and 9534, respectively. The openings 9531, 9532 and 9534 in the polymer layer 95 further expose the passivation layer 5 close to the openings 531, 532 and 534. The polymer layer 95 covers the peripheral region of the contact pad exposed by the openings 539 and 539' in the passivation layer 5, but the openings 9539 and 9539' in the polymer layer 95 exposes the center region of the contact pad exposed by the openings 539 and 539' in the passivation layer 5. The widths or transverse dimensions of the openings 539 and 539' in the passivation layer 5 are greater than those of the openings 9539 and 9539', respectively.

Fourth Embodiment: Power/Ground Buses Design Architecture

Figure 1D:
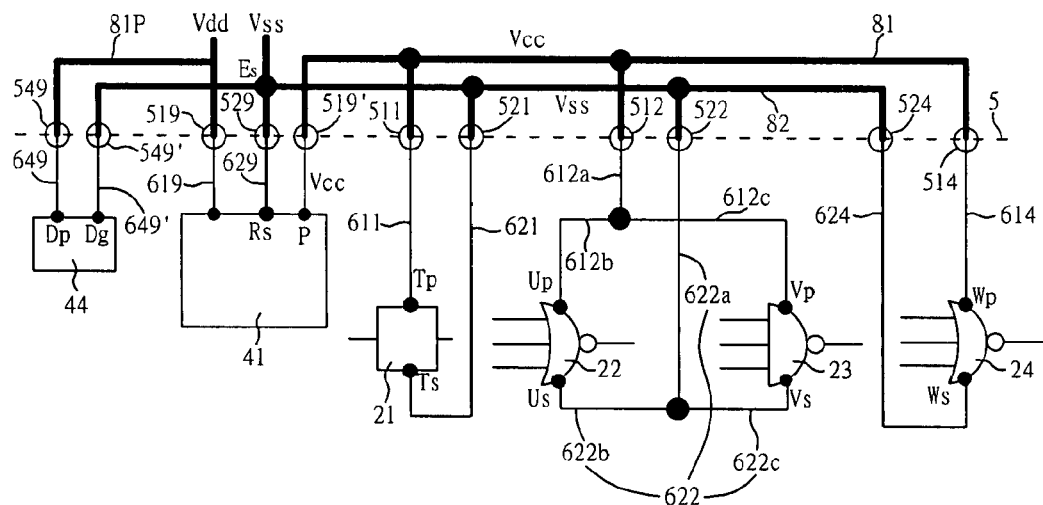

In the first embodiment of present invention, an external power supply Vdd is provided to a voltage regulator or a voltage converter 41, and the voltage regulator or a voltage converter 41 output a power supply Vcc to the internal circuits 20. Alternatively, the external power supply Vdd can be input from an external circuit to the internal circuits 20, comprising 21, 22, 23 and 24 with an ESD protection circuit 44 required to prevent the voltage or current surge from damaging the internal circuits 20. The ESD circuit 44 is connected in parallel with the internal circuits 21, 22, 23 and 24. In the first embodiment in FIGS. 1B, 1C, 2B, 2C, 3B, 3C and 3D, an ESD circuit can be also added and connected in parallel with the voltage regulator or voltage converter 41, and with the internal circuits 21, 22, 23 and 24. For example, the circuit shown in FIG. 1D contains the circuit of FIG. 1C in addition with an ESD circuit 44. The ESD circuit 44 includes a power node Dp connected to a thick and wide power bus or plane 81P, delivering an external power voltage Vdd, and a ground node Dg connected to a thick and wide ground bus or plane 82. The thick and wide power bus or plane 81P connects the power node Dp of the ESD circuit 44 and the power node of the voltage regulator or converter 41. The thick and wide ground bus or plane 82 connects the ground node Dg of the ESD circuit 44 and the ground node Rs of the voltage regulator or converter 41. The ESD circuit 44 in the circuitry of FIG. 1D may be a reverse biased diode 4333, as shown in FIG. 12E, having an anode connected to the thick and wide ground bus or plane 82 and a cathode connected to the thick and wide power bus or plane 81P. An element in FIG. 1D can be referred to as the element in FIG. 1C indicated by a reference number identical to the element in FIG. 1D.

Figure 12A:
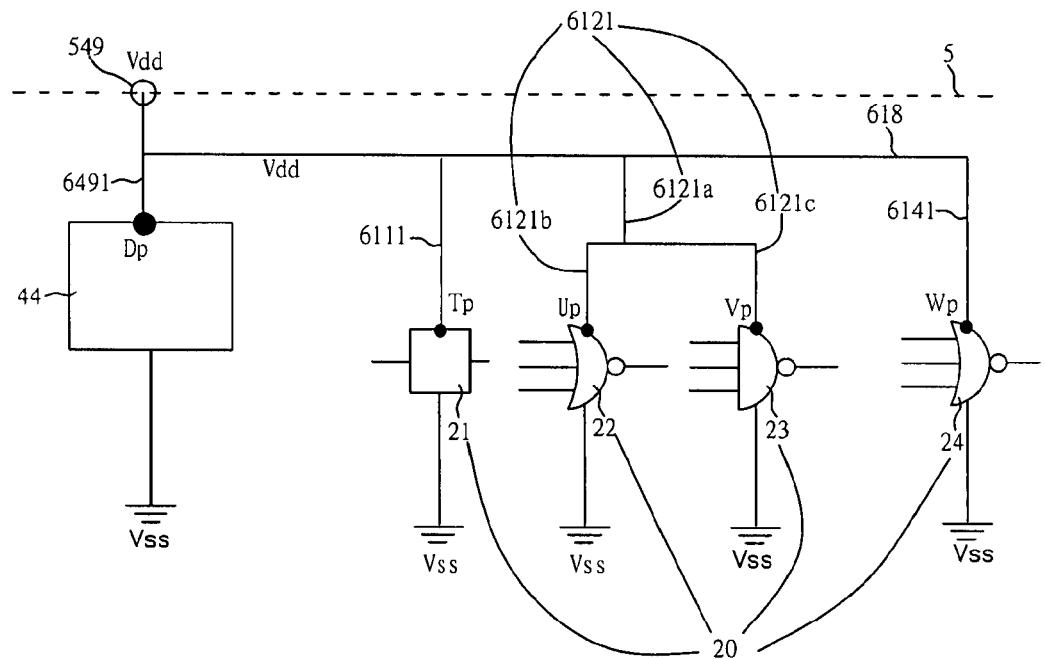
FIG. 12A is a schematic representation of a conventional distribution of external power supply to internal circuits.
Figure 12B:
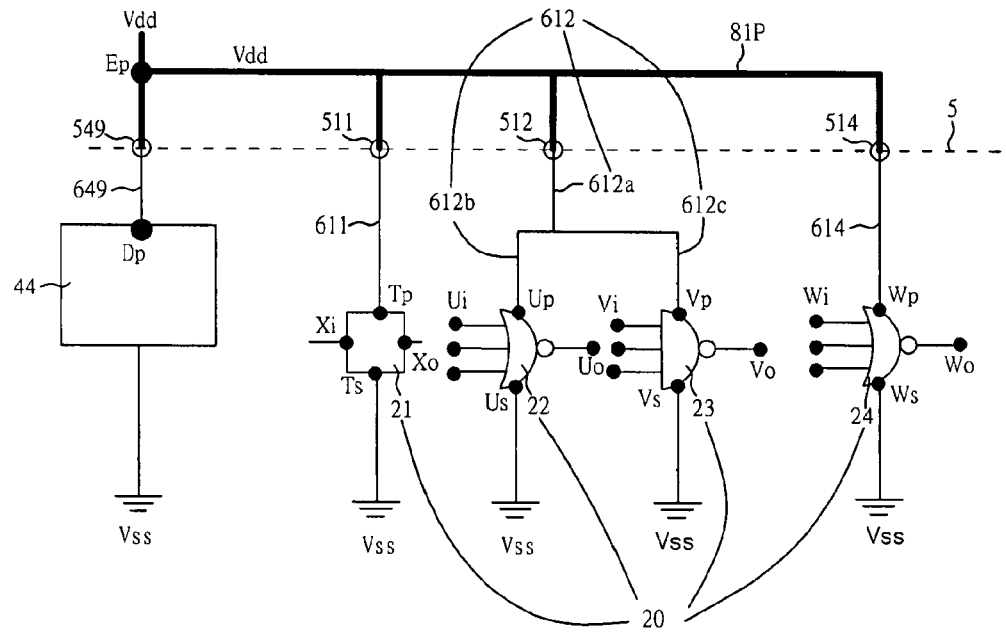
FIG. 12B is a schematic representation of distribution of external power supply to internal circuits through over-passivation metals in a fourth preferred embodiment of the present invention. An ESD protection circuit is connected to the over-passivation metals.
Figure 12E:
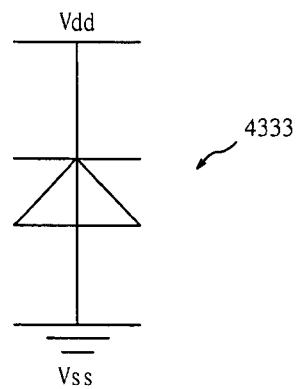
FIG. 12E is a schematic representation of an example of an ESD protection circuit, which can be applied to the ESD circuit 44 or 45 shown in FIGS. 12B-12D, in the fourth preferred embodiment of the present invention.
Figure 13A:
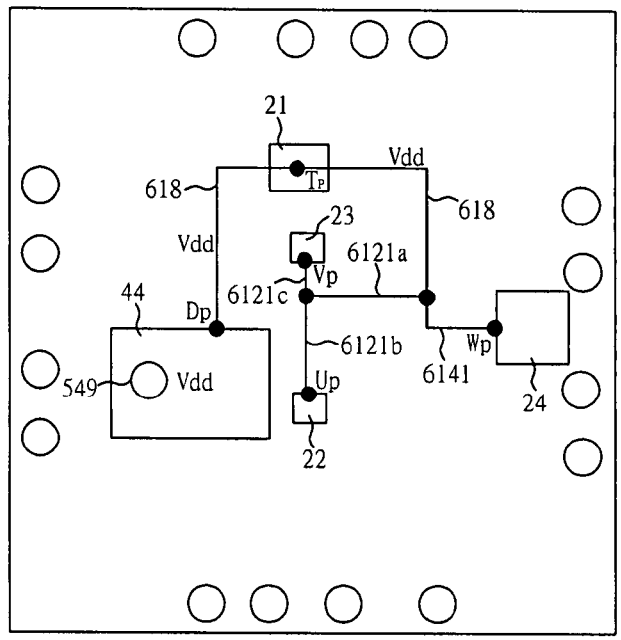
FIG. 13A is a top view layout of a conventional distribution of external power supply to internal circuits.
Figure 13B:
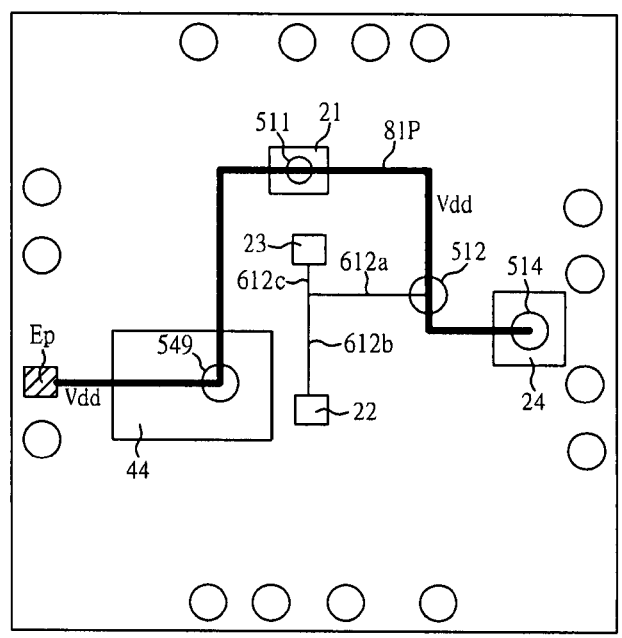
FIG. 13B is a top view layout of distribution of external power supply to internal circuits through over-passivation metals in a fourth preferred embodiment of the present invention. An ESD protection circuit is connected to the over-passivation metals.
Figure 14A:
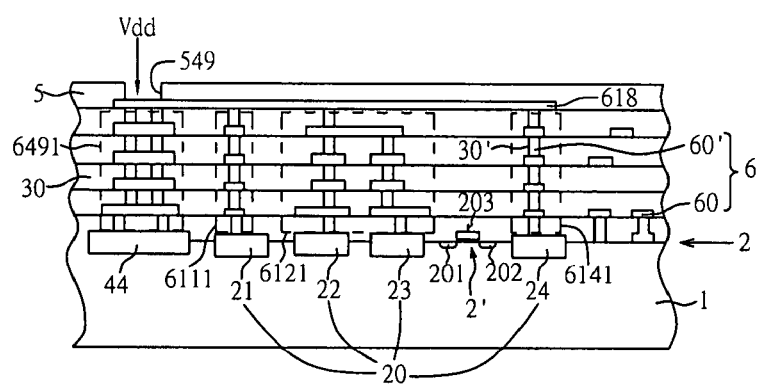
FIG. 14A is a cross-sectional representation of a conventional distribution of external power supply to internal circuits.
Figure 14B:
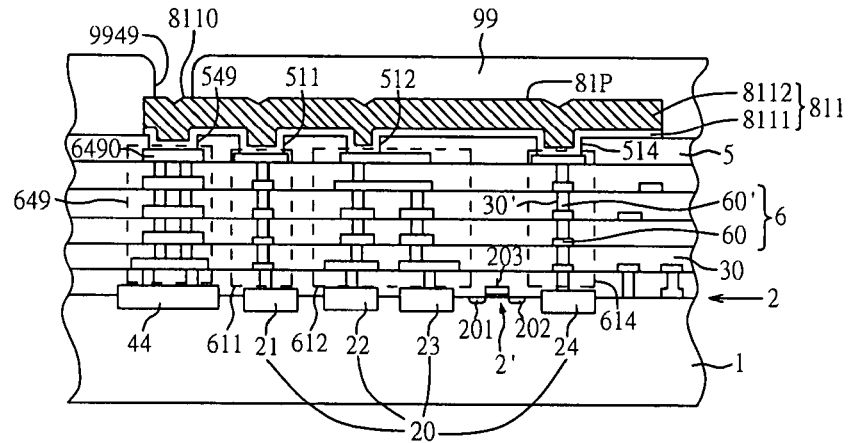
FIG. 14B is a cross-sectional representation of distribution of external power supply to internal circuits through over-passivation metals in a fourth preferred embodiment of the present invention. An ESD protection circuit is connected to the over-passivation metals.

FIG. 12B shows a circuitry diagram including a thick and wide power bus or plane 81P over the passivation layer 5, connecting an ESD circuit 44 and internal circuits 20. FIG. 13B shows a top view realizing the circuit diagram of FIG. 12B, wherein the bold lines shown in FIG. 13B means a thick and wide metal trace or bus over a passivation layer, and the fine lines shown in FIG. 13B means a fine metal trace under a passivation layer. FIG. 14B shows a cross-sectional view realizing the circuit diagram of FIG. 12B. In FIG. 12B, an external power supply voltage Vdd is input at a node Ep and distributed to the Vdd nodes, power nodes, Tp, Up, Vp and Wp of the internal circuits 21, 22, 23 and 24 through a thick and wide power bus or plane 81P over the passivation layer 5, through passivation openings 511, 512 and 514, and through power fine-line metal traces 611, 612 and 614 under the passivation layer 5. A power node Dp of an ESD circuit 44 is connected to a thick and wide metal trace, bus or plane 81P, power bus, through a fine-line metal trace or bus 649, and through an opening 549 in the passivation layer 5. The thick and wide power bus 81P can be connected to the power nodes Tp, Up, Vp and Wp of the internal circuits 21, 22, 23 and 24 that may include a NOR gate, NAND gate, AND gate, OR gate, operational amplifier, adder, multiplexer, diplexer, multiplier, A/D converter, D/A converter, CMOS device, bi-polar CMOS device, bipolar circuit, SRAM cell, DRAM cell, non-volatile memory cell, flash memory cell, EPROM cell, ROM cell, magnetic RAM (MRAM) or sense amplifier. The above mentioned power bus 81P shown in FIG. 12B, over the passivation layer 5, can be connected to the power nodes of the internal circuits 20 or other circuits in the above-mentioned four embodiments provided with access to a power voltage Vdd. The ESD circuit 44 in the circuitry of FIG. 12B may be a reverse biased diode 4333, as shown in FIG. 12E, having an anode connected to ground and a cathode connected to the thick and wide power bus or plane 81P.

In FIG. 14B, there is only one patterned circuit layer 811, including a portion serving as the above-mentioned thick and wide metal trace 81P, power bus or plane, over the passivation layer 5. The patterned circuit layer 811 may contain an adhesion/barrier layer, a seed layer on the adhesion/barrier layer, and an electroplated metal layer 8112 on the seed layer, the adhesion/barrier layer and the seed layer composing the bottom layer 8111.

Referring to FIG. 14B, regards to the process for forming the patterned circuit layer 811, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on a silicon-nitride layer of the passivation layer 5 and on contact pads 6490, principally made of aluminum or copper, exposed by multiple openings 549, 511, 512 and 514 in the passivation layer 5. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8112 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8112 is removed using a wet-etching process or using a dry-etching process. Thereafter, the adhesion/barrier layer not under the metal layer 8112 is removed using a wet-etching process or using a dry-etching process.

After the patterned circuit layer 811 is formed, a polymer layer 99 can be formed by spin-on coating a negative photosensitive polyimide layer, such as ester type, on the patterned circuit layer 811 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9949 may be formed in the polymer layer 99, exposing a contact pad 8110 of the patterned circuit layer 811.

Referring to FIG. 14B, for forming a metal bump over the contact pad 8110, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9949. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball for a flip-chip assembly. The metal bump can be connected to a printed circuit board, ceramic substrate or another semiconductor chip.

Referring to FIG. 14B, for forming another kind of metal bump over the contact pad 8110, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8110 exposed by the opening 9949. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 14B, a nickel layer having a thickness between 0.05 and 2 micrometers can be electroless plated on the contact pad 8110 exposed by the opening 9949, and a gold layer, platinum layer, palladium layer or ruthenium layer having a thickness between 0.05 and 2 micrometers can be electroless plated on the electroless plated nickel layer in the opening 9949 in the polymer layer 99. Thereafter, a gold wire can be bonded onto the electroless plated gold layer in the opening 9949 in the polymer layer 99 using a wirebonding process.

Alternatively, referring to FIG. 14B, a gold wire can be bonded onto a gold layer, platinum layer, palladium layer or ruthenium layer of the patterned circuit layer 811, exposed by the openings 9949 in the polymer layer 99 using a wirebonding process.

Figure 14C:
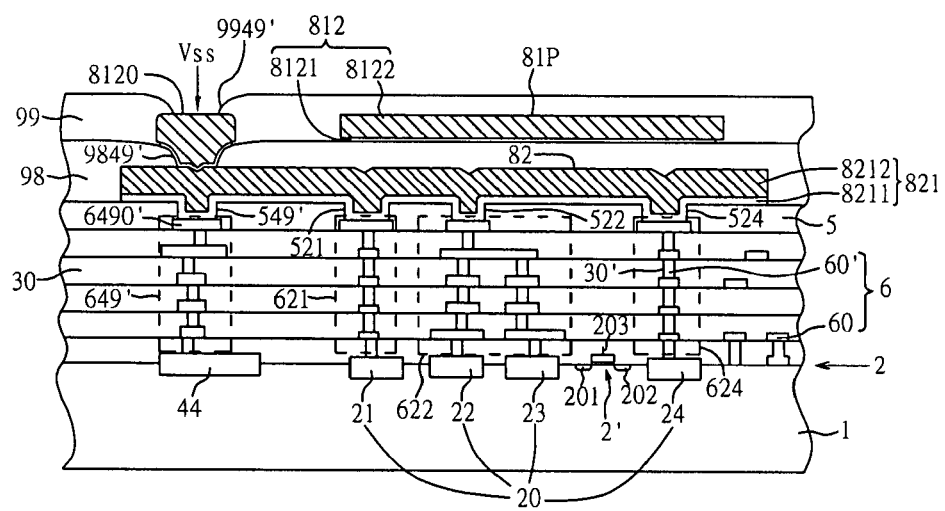
FIG. 14C is a cross-sectional representation of distribution of external power supply and external ground to internal circuits through over-passivation metals in a fourth preferred embodiment of the present invention. Both power and ground nodes of internal circuits are connected to the over-passivation metals. The power lines, traces or planes are in the second over-passivation metal layer, while the ground lines, traces or planes are in the first over-passivation metal layer under the second over-passivation metal layer. An ESD protection circuit is connected to the over-passivation metals.
Figure 14D:
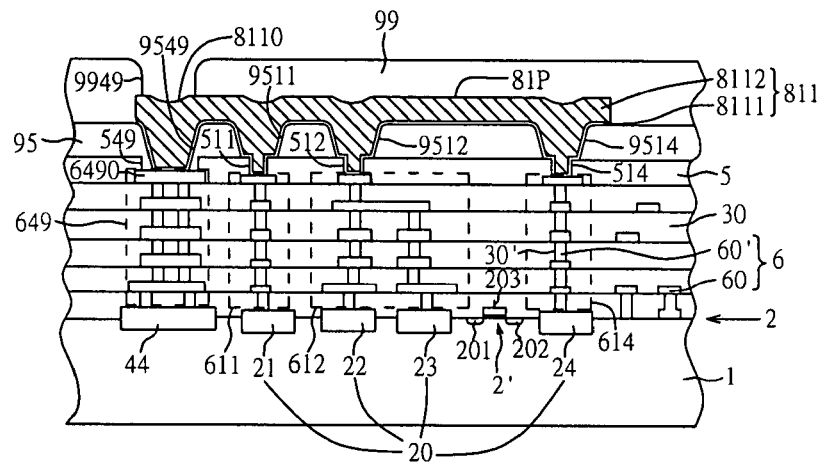
FIG. 14D is a cross-sectional representation of distribution of external power supply to internal circuits through over-passivation metals in a fourth preferred embodiment of the present invention. An ESD protection circuit is connected to the over-passivation metals. This figure is similar to FIG. 14B except that an additional polymer layer is formed between the bottom-most over-passivation metal layer and the passivation layer.

Referring to FIG. 14D, before the patterned circuit layer 811 is formed, a polymer layer 95 can be optionally formed by spin-on coating a negative photosensitive polyimide layer, such as ester type, on the nitride layer of the passivation layer 5 and on the contact pads 6490, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings 9549, 9511, 9512 and 9514 may be formed in the polymer layer 95, exposing multiple contact pads 6490 exposed by the openings 549, 511, 512 and 514 in the passivation layer 5. After the polymer layer 95 is formed, the patterned circuit layer 811 can be formed on the polymer layer 95 and on the contact pads 6490 exposed by the openings 549, 511, 512 and 514. The adhesion/barrier layer of any above-mentioned material may be sputtered on the polymer layer 95 and on the contact pads 6490 exposed by the openings 9549, 9511, 9512 and 9514 in the polymer layer 95.

Figure 12C:
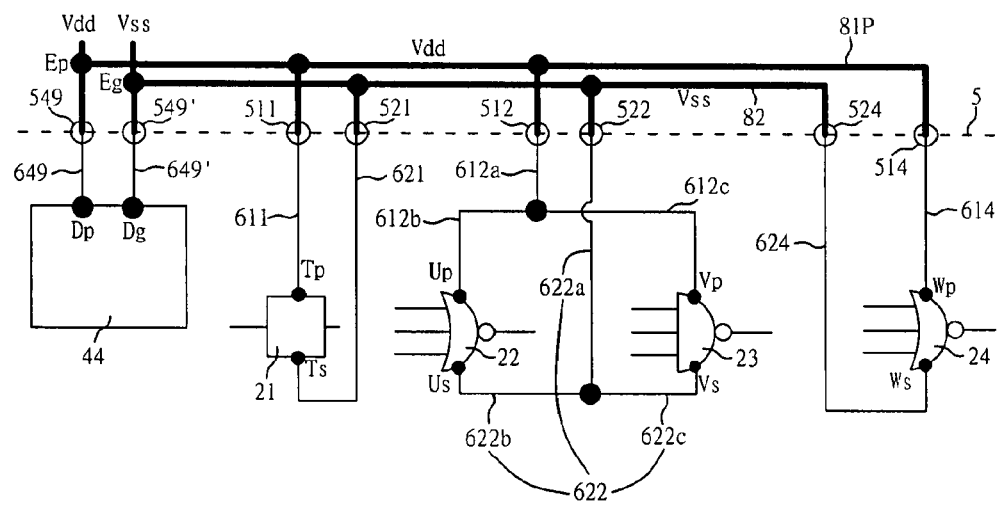
FIG. 12C is a schematic representation of distribution of external power supply and external ground to internal circuits through over-passivation metals in a fourth preferred embodiment of the present invention. Both power and ground nodes of internal circuits are connected to the over-passivation metals. An ESD protection circuit is connected to the over-passivation metals.
Figure 13C:
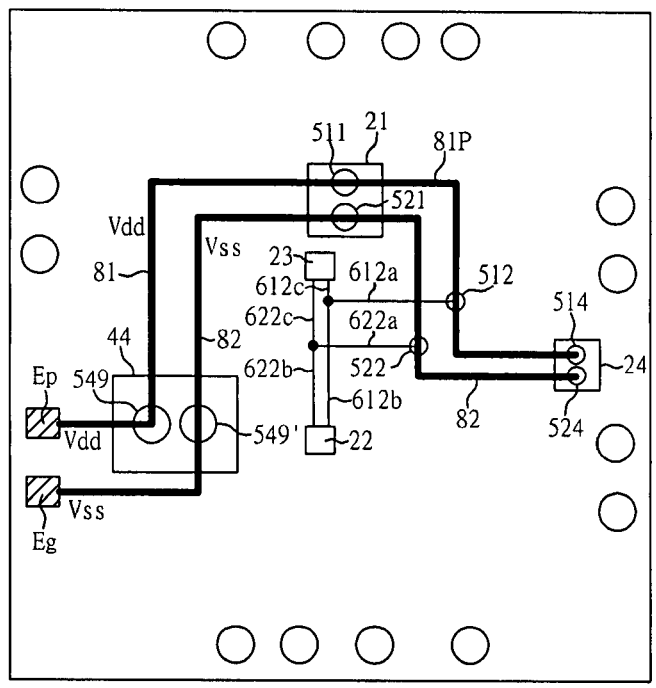
FIG. 13C is a top view layout of distribution of external power supply and external ground to internal circuits through over-passivation metals in a fourth preferred embodiment of the present invention. Both power and ground nodes of internal circuits are connected to the over-passivation metals. An ESD protection circuit is connected to the over-passivation power and ground traces, buses or planes.

FIG. 12C shows, in addition to the power Vdd connection in FIG. 12B, a ground Vss connection. FIG. 13C shows a top view realizing the circuit diagram of FIG. 12C, wherein the bold lines shown in FIG. 13C means a thick and wide metal trace or bus over a passivation layer, and the fine lines shown in FIG. 13C means a fine metal trace under a passivation layer. FIG. 14C shows a cross-sectional view realizing the circuit diagram of FIG. 12C. In FIG. 12C, the external ground Vss is input at a node Eg and provided to the Vss nodes Ts, Us, Vs and Ws of the internal circuits 21, 22, 23 and 24 through a thick and wide metal trace, bus or plane 82, ground bus or plane, over the passivation layer 5, through openings 521, 522 and 524 in the passivation layer 5, and through fine-line metal traces 621, 622 and 624 under the passivation layer 5. The thick and wide ground bus or plane 82 is connected to a Vss node Dg of the ESD circuit 44 through an opening 549' in the passivation layer 5 and through a fine-line ground metal bus 649' under the passivation layer 5. The above mentioned power bus 81P shown in FIG. 12C, over the passivation layer 5, can be connected to the power nodes of the internal circuits 20 or other circuits in the above-mentioned four embodiments provided with access to a power voltage Vdd. The above mentioned ground bus 82 shown in FIG. 12C, over the passivation layer 5, can be connected to the ground nodes of the internal circuits 20 or other circuits in the above-mentioned four embodiments provided with access to a ground voltage Vss. The ESD circuit 44 in the circuitry of FIG. 12C may be a reverse biased diode 4333, as shown in FIG. 12E, having an anode connected to the thick and wide ground bus or plane 82 and a cathode connected to the thick and wide power bus or plane 81P.

Referring to FIG. 14C, there may be multiple patterned circuit layers 821 and 812, including the above-mentioned ground bus or plane 82 and the above-mentioned power bus or plane 81P over the ground bus or plane 82, over the passivation layer 5. The process for forming the patterned circuit layer 821 on the passivation layer 5 and on the contact pads 6490' exposed by the openings 549', 521, 522 and 524 can be referred to as the process for forming the patterned circuit layer 811 shown in FIG. 14B on the passivation layer 5 and on the contact pads 6490 exposed by the openings 549, 511, 512 and 514. The patterned circuit layer 821 may contain an adhesion/barrier layer, a seed layer on the adhesion/barrier layer, and an electroplated metal layer 8212 on the seed layer, the adhesion/barrier layer and the seed layer composing the bottom layer 8211. The patterned circuit layer 812 may contain an adhesion/barrier layer, a seed layer on the adhesion/barrier layer, and an electroplated metal layer 8122 on the seed layer, the adhesion/barrier layer and the seed layer composing the bottom layer 8121.

Referring to FIG. 14C, after the patterned circuit layer 821 is formed, a polymer layer 98 can be formed by spin-on coating a negative photosensitive polyimide layer, such as ester type, on the patterned circuit layer 821 and on the nitride layer of the passivation layer 5, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9849' may be formed in the polymer layer 98, exposing a contact pad of the patterned circuit layer 821.

Referring to FIG. 14C, regards to the process for forming the patterned circuit layer 812, the adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 98 and on the contact pad of the patterned circuit layer 821 exposed by the opening 9849' in the polymer layer 98. Thereafter, the seed layer may be formed by sputtering a copper layer having a thickness between 200 and 3000 angstroms on the adhesion/barrier layer of any above-mentioned material or by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal layer 8122 may be formed by electroplating a copper layer having a thickness between 2 and 30 micrometers on the copper layer serving as the seed layer, exposed by the openings in the photoresist layer, by electroplating a copper layer having a thickness between 2 and 30 micrometers on the copper layer serving as the seed layer, exposed by the openings in the photoresist layer and then electroplating a nickel layer having a thickness between 0.5 and 10 micrometers on the electroplated copper layer in the openings in the photoresist layer, by electroplating a copper layer having a thickness between 2 and 30 micrometers on the copper layer serving as the seed layer, exposed by the openings in the photoresist layer, electroplating a nickel layer having a thickness between 0.5 and 10 micrometers on the electroplated copper layer in the openings in the photoresist layer and then electroplating a gold layer, platinum layer, palladium layer or ruthenium layer having a thickness between 0.05 and 2 micrometers on the electroplated nickel layer in the openings in the photoresist layer, or by electroplating a gold layer having a thickness between 2 and 30 micrometers on the gold layer serving as the seed layer, exposed by the openings in the photoresist layer. Thereafter, the photoresist layer may be removed. Thereafter, the seed layer not under the metal layer 8122 is removed using a wet-etching process or using a dry-etching process. Thereafter, the adhesion/barrier layer not under the metal layer 8122 is removed using a wet-etching process or using a dry-etching process.

After the patterned circuit layer 812 is formed, a polymer layer 99 can be formed by spin-on coating a negative photosensitive polyimide layer, such as ester type, on the patterned circuit layer 812 and on the polymer layer 98, exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, an opening 9949' may be formed in the polymer layer 99, exposing a contact pad 8120 of the patterned circuit layer 812.

Referring to FIG. 14C, for forming a metal bump over the contact pad 8120, an adhesion/barrier layer may be formed by sputtering a titanium-containing layer, such as titanium layer or a titanium-tungsten-alloy layer, having a thickness between 1000 and 6000 angstroms, sputtering a chromium-containing layer, such as chromium layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9949'. Thereafter, the seed layer may be formed by sputtering a copper layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a copper layer having a thickness between 0.5 and 10 micrometers on the copper layer serving as the seed layer, exposed by the openings in the photoresist layer, electroplating a nickel layer having a thickness between 0.5 and 10 micrometers on the electroplated copper layer in the openings in the photoresist layer, and then electroplating a tin-containing layer, such as a tin-lead alloy, a tin-silver alloy or a tin-silver-copper alloy, having a thickness between 60 and 200 micrometers on the electroplated nickel layer in the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. Thereafter, the metal bump can be reflowed to be shaped like a ball. The metal bump can be connected to a printed circuit board, ceramic substrate or another semiconductor chip.

Referring to FIG. 14C, for forming another kind of metal bump over the contact pad 8120, an adhesion/barrier layer may be formed by sputtering a titanium-containing layer, such as titanium layer or a titanium-tungsten-alloy layer, having a thickness between 1000 and 6000 angstroms, or sputtering a tantalum-containing layer, such as tantalum layer or tantalum-nitride layer, having a thickness between 1000 and 6000 angstroms, on the polymer layer 99 and on the contact pad 8120 exposed by the opening 9949'. Thereafter, the seed layer may be formed by sputtering a gold layer having a thickness between 200 and 3000 angstroms on the adhesion/barrier layer of any above-mentioned material. Thereafter, a photoresist layer may be formed on the seed layer, multiple openings in the photoresist layer exposing the seed layer. Thereafter, the metal bump may be formed by electroplating a gold layer having a thickness between 6 and 25 micrometers on the gold layer serving as the seed layer, exposed by the openings in the photoresist layer. Thereafter, the photoresist layer may be removed. Thereafter, the seed layer not under the metal bump is removed using a wet-etching process or using a dry-etching process. Thereafter, the adhesion/barrier layer not under the metal bump is removed using a wet-etching process or using a dry-etching process. The metal bump can be connected to a flexible substrate by a tape-automated bonding (TAB) process, or a glass substrate via anisotropic conductive film or paste (ACF or ACP).

Alternatively, referring to FIG. 14C, a nickel layer having a thickness between 0.05 and 2 micrometers can be electroless plated on the contact pad 8120 exposed by the opening 9949' in layer polymer layer 99, and a gold layer, platinum layer, palladium layer or ruthenium layer having a thickness between 0.05 and 2 micrometers can be electroless plated on the electroless plated nickel layer in the opening 9949' in the polymer layer 99. Thereafter, a gold wire can be bonded onto the electroless plated gold layer in the opening 9949' in the polymer layer 99 using a wirebonding process.

Alternatively, referring to FIG. 14C, a gold wire can be bonded onto a gold layer, platinum layer, palladium layer or ruthenium layer of the patterned circuit layer 812, exposed by the openings 9949' in the polymer layer 99 using a wirebonding process.

Alternatively, before the patterned circuit layer 821 is formed, a polymer layer can be optionally formed by spin-on coating a negative photosensitive polyimide layer, such as ester type, on the nitride layer of the passivation layer 5 and on the contact pads 6490', exposing the spin-on coated photosensitive polyimide layer, developing the exposed polyimide layer and then curing the developed polyimide layer at the temperature between 265 and 285° C. for a time between 30 and 240 minutes in a nitrogen or oxygen-free ambient. Thereby, multiple openings may be formed in the polymer layer, exposing multiple contact pads 6490' exposed by the openings 549', 521, 522 and 524 in the passivation layer 5. After the polymer layer is formed, the patterned circuit layer 821 can be formed on the polymer layer and on the contact pads 6490' exposed by the openings 549', 521, 522 and 524. The adhesion/barrier layer of any above-mentioned material may be sputtered on the polymer layer and on the contact pads 6490' exposed by the openings in the polymer layer.

Figure 12D:
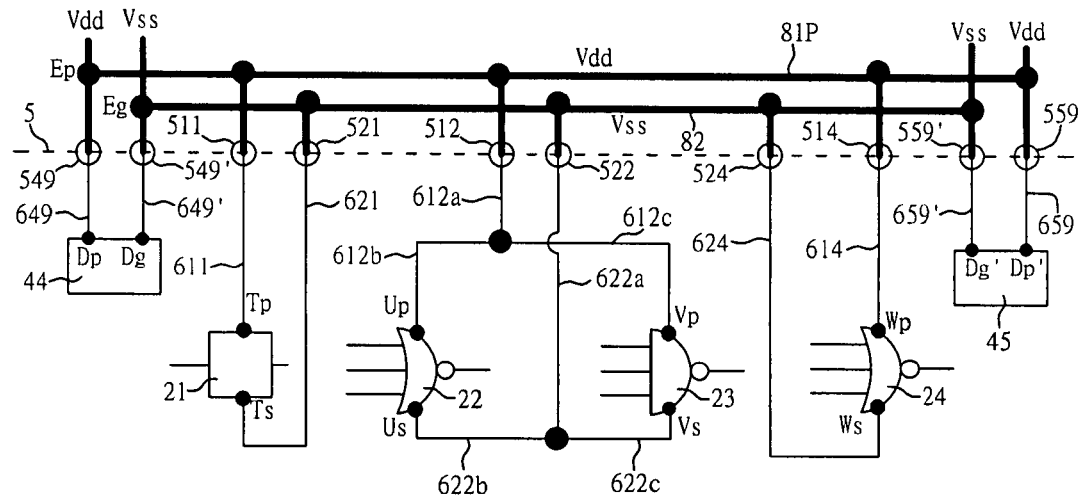
FIG. 12D is a schematic representation of distribution of external power supply and external ground to internal circuits through over-passivation metals in a fourth preferred embodiment of the present invention. More than one ESD protection circuits are connected to the over-passivation metals.

Alternatively, the above-mentioned power bus or plane 81P and the above-mentioned ground bus or plane 82 can be connected to two ESD circuits 44 and 45, as shown in FIG. 12D. The above-mentioned power bus or plane 81P may connect the power nodes Tp, Up, Vp and Wp of the internal circuits 21, 22, 23 and 24 and the power nodes Dp and Dp' of the ESD circuits 44 and 45. The above-mentioned ground bus or plane 82 may connect the ground nodes Ts, Us, Vs and Ws of the internal circuits 21, 22, 23 and 24 and the ground nodes Dg and Dg' of the ESD circuits 44 and 45. The above mentioned power bus 81P shown in FIG. 12D, over the passivation layer 5, can be connected to the power nodes of the internal circuits 20 or other circuits in the above-mentioned four embodiments provided with access to a power voltage Vdd. The above mentioned ground bus 82 shown in FIG. 12D, over the passivation layer 5, can be connected to the ground nodes of the internal circuits 20 or other circuits in the above-mentioned four embodiments provided with access to a ground voltage Vss. Each of the ESD circuit 44 and 45 in the circuitry of FIG. 12D may be a reverse biased diode 4333, as shown in FIG. 12E, having an anode connected to the thick and wide ground bus or plane 82 and a cathode connected to the thick and wide power bus or plane 81P.

Referring to FIGS. 12B-12D, 13B, 13C and 14B-14D, the shape of the openings 511, 512, 514, 521, 522, 524, 549 and 549' in the passivation layer 5 from a top perspective view may be round, square, rectangular or polygon. If the openings 511, 512, 514, 521, 522, 524, 549 and 549' are round, the openings 511, 512, 514, 521, 522, 524, 549 and 549' may have a diameter of between 0.1 and 200 microns, between 1 and 100 microns, or, preferably, between 0.1 and 30 microns. If the openings 511, 512, 514, 521, 522, 524, 549 and 549' are square, the openings 511, 512, 514, 521, 522, 524, 549 and 549' may have a width of between 0.1 and 200 microns, between 1 and 100 microns, or, preferably, between 0.1 and 30 microns. If the openings 511, 512, 514, 521, 522, 524, 549 and 549' are rectangular, the openings 511, 512, 514, 521, 522, 524, 549 and 549' may have a width of between 0.1 and 200 microns, between 1 and 100 microns, or, preferably, between 0.1 and 30 microns, and a length of between 1 micron and 1 centimeter. If the openings 511, 512, 514, 521, 522, 524, 549 and 549' are polygon having more than five sides, the openings 511, 512, 514, 521, 522, 524, 549 and 549' have a greatest diagonal length of between 0.1 and 200 microns, between 1 and 100 microns, or, preferably, between 0.1 and 30 microns. Alternatively, the openings 511, 512, 514, 521, 522, 524, 549 and 549' have a greatest transverse dimension of between 0.1 and 200 microns, between 1 and 100 microns, or, preferably, between 0.1 and 30 microns. In a case shown in FIG. 14D, the openings 511, 512, 514 and 549 have a width of between 0.1 and 30 microns, with the lower portion of the openings 9511, 9512, 9514 and 9549 in the polymer layer 95 having a width of between 20 and 100 microns. The openings 9511, 9512 and 9514 in the polymer layer 95 have lower portions having widths or transverse dimensions greater than those of the openings 511, 512 and 514 in the passivation layer 5 aligned with the openings 9511, 9512 and 9514, respectively. The openings 9511, 9512 and 9514 in the polymer layer 95 further expose the passivation layer 5 close to the openings 511, 512 and 514. The polymer layer 95 covers the peripheral region of the contact pad exposed by the opening 549 in the passivation layer 5, but the opening 9549 in the polymer layer 95 exposes the center region of the contact pad exposed by the openings 549 in the passivation layer 5. The width or transverse dimension of the opening 549 in the passivation layer 5 is greater than that of the opening 9549.

Methods and Specification of Forming the Over-Passivation Scheme

The main characteristics of the over-passivation schemes in all (the first, second, third and fourth embodiment) embodiments of this invention are: thick metal layers each having a thickness of between 2 and 200 micrometers, and preferably of between 2 and 30 micrometers, and thick dielectric layers each having a thickness of between 2 and 300 micrometers, and preferably of between 2 and 30 micrometers. FIGS. 15C-15K show an embossing process to fabricate one or more patterned circuit layers 801 and/or 802 over the passivation layer 5 described in all embodiments in this invention. FIGS. 15C-15G and FIGS. 16A-16L show a double embossing process to fabricate one or more patterned circuit layers 801 and 802 over the passivation layer 5 described in all embodiments in this invention. In the embossing as shown in FIGS. 15C-15K, a polymer layer 95, 98 or 99 may be provided under the patterned circuit layer 801, between the patterned circuit layers 801 and 802 or over the patterned circuit layer 802. In the double embossing as shown in FIGS. 15C-15G and FIGS. 16A-16L, a polymer layer 95, 98 or 99 may be provided under the patterned circuit layer 801, between the patterned circuit layers 801 and 802 or over the patterned circuit layer 802. FIGS. 15A-15L and FIGS. 16A-16L are based on the structure of FIG. 10E in the third embodiment, and are used as examples to illustrate methods for forming the over-passivation scheme for all embodiments in this invention. In other words, the methods described and the specification specified in the following paragraphs can be applied to all thick and wide metal traces, buses or planes 81, 81P, 82, 83, 83' or 85 in the above-mentioned embodiments of this invention.

Figure 15A:
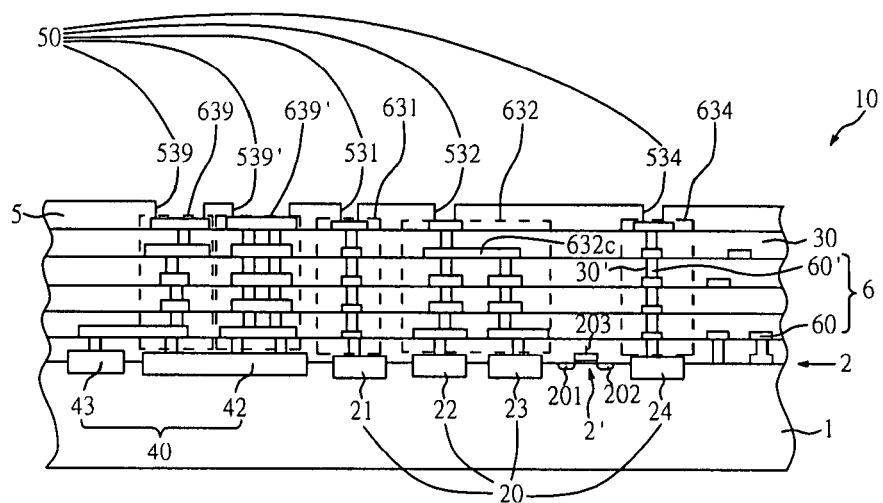
FIG. 15A and FIG. 15B are starting materials for all embodiments of present invention. The starting materials are conventional IC chips of silicon wafers (before dicing apart) fabricated by the conventional IC process technologies. An over-passivation scheme of present invention is to be built over the conventional IC chip.

The over-passivation process begins when the conventional IC wafer process ends. FIG. 15A shows a starting material for the over-passivation process. The over-passivation process starts on a chip 10 in a finished conventional IC wafer fabricated in a conventional IC fab.

The conventional finished IC chip 10 comprises elements, as follows:

Reference number of 1 indicates a substrate, usually a silicon substrate. The silicon substrate can be an intrinsic, a p-type, or an n-type silicon substrate. For a high performance chip, a SiGe or Silicon-On-Insulator (SOI) substrate can be used. A SiGe substrate comprises an epitaxial layer on the surface of a silicon substrate. An SOI substrate comprises an insulating layer (preferred silicon oxide) on a silicon substrate, and a Si or SiGe epitaxial layer formed over the insulating layer.

Reference number of 2 indicates a device layer, usually a semiconductor device, in and/or on the substrate 1. The semiconductor device comprises an MOS transistor 2', either an n-MOS or a p-MOS transistor. The MOS transistor comprises a gate (usually a poly-silicon, a tungsten polycide, a tungsten silicide, titanium silicide, cobalt silicide, or a salicide gate), a source, and a drain. Other devices are bipolar transistors, DMOS (Diffused MOS), LDMOS (Lateral Diffused MOS), CCD (Charged-Coupled Device), CMOS sensors, photo-sensitive diodes, resistors (formed by the polysilicon layer or the diffusion area in the silicon substrate). The devices form various circuits, such as CMOS circuits, NMOS circuits, PMOS circuits, BiCMOS circuits, CMOS sensor circuits, DMOS power circuits, LDMOS circuits. The layer comprises the internal circuits 20 (comprising 21, 22, 23 and 24) in all embodiments; the regulator or voltage converter 41 in the first embodiment; the off-chip circuits 40 (comprising 42 and 43) in the third embodiment, and the ESD circuit 44 in the fourth embodiment.

Reference number of 6 indicates a fine-line scheme, comprising fine-line metal layers 60 and fine-line via plugs 60' in vias 30' of fine-line dielectric layers 30. The fine-line scheme 6 comprises fine line metals in all embodiments of this invention: (1) 611, 612, 614, 619, 619', 621, 622, 624 and 629 of the first embodiment; (2) 631, 632 and 634 of the second embodiment; (3) 631, 632, 634, 639, 639', 6391, 6391', 6311, 6321 and 6341 of the third embodiment; (4) 611, 612, 614, 649, 621, 622, 624 and 649' of the fourth embodiment. The fine-line metal layers 60 can be aluminum or copper layers, or more specifically, sputtered aluminum layers or damascene copper layers. The fine-line metal scheme 6 can be (1) all fine-line metal layers 60 are aluminum layers, (2) all fine-line metal layers 60 are copper layers, (3) the bottom layers are aluminum layers and the top layers are copper layer, (4) the bottom layers are copper layers and the top layers are aluminum layers. Each of the fine-line metal layers 60 has thickness between 0.05 and 2 micrometers, preferred between 0.2 and 1 μm, with horizontal design rules (the width) of lines or traces between 20 nanometers and 15 micrometers, preferred 20 nanometers and 2 micrometers. The aluminum layer is usually formed by a physical vapor deposition (PVD) method, such as the sputtering method, and then patterned by depositing a photoresist layer with thickness between 0.1 and 4 µm, preferred 0.3 and 2 µm, followed by a wet or dry etching, preferred dry plasma etch (usually containing fluorine plasma). As an option, an adhesion/barrier (Ti, TiW, TiN or a composite layer of above metals) may be added under the aluminum layer, and/or an anti-reflection layer (TiN) may be also added over the aluminum layer. The vias 30' are optionally filled with blanketed CVD tungsten deposition, followed by a chemical mechanical polishing (CMP) of the tungsten metal layer to form via plugs 60'. The copper layer is usually formed by electroplating method and damascene process as follows: (1) depositing a copper diffusion barrier layer (such as oxynitride or nitride layer of thickness between 0.05 and 0.25 µm); (2) depositing a dielectric layer 30 of a thickness between 0.1 and 2.5 µm, preferred between 0.3 and 1.5 µm by PECVD, spin-on coating, and/or High-Density Plasma (HDP) CVD methods; (3) patterning the dielectric layer 30 by depositing a photoresist layer with a thickness of between 0.1 and 4 µm, and preferably of between 0.3 and 2 µm, then exposing and developing the photoresist layer to form openings and/or trenches, and then stripping the photoresist layer; (4) depositing an adhesion/barrier layer and an electroplating seed layer by sputtering and/or CVD methods. The adhesion/barrier layer comprises Ta, TaN, TiN, Ti or TiW or a composite layer formed by above materials. The electroplating seed layer, formed on the adhesion/barrier layer, is usually a copper layer formed by sputtering Cu or CVD copper or a CVD Cu followed by a sputtering Cu; (5) electroplating a copper layer over the electroplating seed layer to a thickness between 0.05 and 2 µm, preferred between 0.2 and 1 µm; (6) removing the electroplated copper layer, the electroplating seed layer and the adhesion/barrier layer not in the openings or trenches of the dielectric layer 30 by polishing (preferred chemical mechanical polishing, CMP) the wafer until the dielectric layer underlying the adhesion/barrier layer exposed. Only the metals in the openings or trenches remain after CMP; and the remained metals are used as metal conductors (lines, traces and/or planes) or via plugs 60' connecting two adjacent metal layers 60. As another alternative, a double-damascene process is used to form metal via plugs and metal traces, lines, or planes simultaneously with one electroplating process, one CMP process. Two photolithography processes, and two dielectric depositing processes are applied in the double-damascene process. The double-damascene process adds more process steps of deposing and patterning another layer of dielectrics between step (3) of patterning a dielectric layer and step (4) of depositing the metal layer in the above single damascene process. The dielectric layer 30 is formed by CVD (Chemical Vapor Deposition), PECVD (Plasma-Enhanced CVD), High-Density-Plasma (HDP) CVD, or a spin-on method. The materials of dielctric layers 30 comprise layers of silicon oxide, silicon nitride, silicon oxynitride, PECVD TEOS, Spin-On Glass (SOG, silicate-based or siloxane-based), Fluorinated Silicate Glass (FSG), or a low-K dielectric material such as Black Diamond (generated by machines of Applied Materials, Inc.), or ULK CORAL (generated by machines of Novellus Inc.), or SiLK (of IBM Corp.) low k dielectrics. The PECVD silicon oxide or PECVD TEOS or HDP oxide has a dielectric constant K between 3.5 and 4.5; the PECVD FSG or HDP FSG has a K value between 3.0 and 3.5, and the low K dielectric material has a K value between 1.5 and 3.0. The low K dielectric material, such as Black Diamond, is porous, and comprises hydrogen and carbon in addition to silicon and oxygen, the formula is $H_w C_x Si_y O_z$.

The fine-line dielectric layers 30 usually comprise inorganic materials, which is to achieve a thicker than 2 µm layer. Each of the dielectric layers 30 has a thickness between 0.05 and 2 µm. The vias 30' in the dielectric layer 30 is formed by wet and/or dry etching with photoresist patterning, preferred dry etching. The dry etch species comprise fluorine plasma.

Reference number of 5 indicates a passivation layer. The passivation layer 5 plays a very important role in this invention. The passivation layer 5 has been a major element in the IC industry. As described in "Silicon Processing in the VLSI era" Volume 2, by S. Wolf, published by Lattice Press, 1990, the passivation layer 5 is used to be defined as the final layer in the conventional IC process, and is deposited over the entire top surface of the wafer. The passivation layer 5 is an insulating, protective layer that prevents mechanical and chemical damage during assembly and packaging. In addition to preventing mechanical scratch, it prevents the penetration of mobile ions, such as sodium, and transition metal, such as gold, copper, into the underlying IC devices. It also protects the underlying devices and interconnection (metals and dielectrics) from moisture penetration or other containments. The passivation layer 5 usually comprises a silicon-nitride layer with a thickness of between 0.2 and 1.5 µm, and preferably of between 0.3 and 1.0 µm, and/or a silicon-oxynitride layer with a thickness of between 0.2 and 1.5 µm, and preferably of between 0.3 and 1.0 µm. Other materials used in the passivation layer 5 are PECVD silicon oxide, PETEOS oxide, phosphosilicate glass (PSG), borophosphos silicate glass (BPSG), high-density plasma (HDP) oxide.

For example, the passivation layer 5 may be formed by depositing an oxide layer with a thickness of between 0.1 and 1 µm, and preferably of between 0.3 and 0.7 µm, and then depositing a nitride layer with a thickness of between 0.25 and 1.2 µm, and preferably of between 0.35 and 1 µm, on the oxide layer, wherein the oxide layer can be PECVD silicon oxide, PETEOS oxide or high-density plasma (HDP) oxide. This type of the passivation layer 5 is usually used for the case when the metal interconnection under the passivation layer 5 is formed by a process including an aluminum sputtering process and an aluminum etching process.

Alternatively, the passivation layer 5 may be formed by depositing an oxynitride layer with a thickness of between 0.05 and 0.35 µm, and preferably of between 0.1 and 0.2 µm, next depositing a first oxide layer with a thickness of 0.2 and 1.2 µm, and preferably of between 0.3 and 0.6 µm, on the oxynitride layer, next depositing a nitride layer with a thickness of between 0.2 and 1.2 µm, and preferably of between 0.3 and 0.5 µm, on the first oxide layer, and then depositing a second oxide layer with a thickness of between 0.2 and 1.2 µm, and preferably of between 0.3 and 0.6 µm, on the nitride layer, wherein the first and second oxide layers can be PECVD silicon oxide, PETEOS oxide or high-density plasma (HDP) oxide. This type of passivation layer 5 is usually used for the case when the metal interconnection under the passivation layer 5 is formed by a process including a copper electroplating process, a chemical mechanical polishing (CMP) process, and a copper damascene process.

The above description and specification for the substrate 1, the device layer 2, the fine-line metal scheme 6, the dielectric layer 30 and the passivation layer 5 can be applied to the first, second, third and fourth embodiments of this invention.

Openings 50 are formed in the passivation layer 5 by wet and/or dry etching, preferred dry etching. The specification of the openings 50 and the process of forming the same can be applied to (1) openings 511, 512, 514, 519, 519', 521, 522, 524 and 529 in the first embodiment; (2) openings 531, 532, 534, 531', 532' and 534' in the second embodiment; (3) openings 531, 532, 534, 539 and 539' in the third embodiment; (4) openings 511, 512, 514, 549, 549', 521, 522, 524, 559 and 559' in the fourth embodiment. The width of the passivation opening 50 can be between 0.1 and 200 micrometers, between 1 and 100 μm or between 0.5 and 30 μm. The shape of the opening 50 from a top view may be a circle, and the diameter of the circle-shaped opening 50 may be between 0.1 and 30 μm or between 30 and 200 μm. Alternatively, the shape of the opening 50 from a top view may be a square, and the width of the square-shaped opening 50 may be between 0.1 and 30 μm or between 30 and 200 μm. Alternatively, the shape of the opening 50 from a top view may be a polygon, such as hexagon or octagon, and the polygon-shaped opening 50 may have a width of between 0.1 and 30 μm or between 30 and 200 μm. Alternatively, the shape of the opening 50 from a top view may be a rectangle, and the rectangle-shaped opening 50 may have a shorter width of between 0.1 and 30 μm or between 30 and 200 μm. The width of the openings 531, 532, 534, 531', 532', 534', 511, 512 and 514 in the passivation layer 5 for the internal circuits 20 (comprising 21, 22, 23 and 24) is between 0.1 and 100 μm, preferred between 0.1 and 30 μm. The passivation openings 519, 519' and 529 for the voltage regulator or voltage converter 41, the passivation openings 539 and 539' for the off-chip circuits 42 and 43, or the passivation openings 549, 549', 559 and 559' for the ESD circuit 44 may have a width greater than those of the openings 531, 532, 534, 511, 512 and 514, in a range between 1 and 150 μm, preferred between 5 and 100 μm. Alternatively, the passivation openings 519, 519' and 529 for the voltage regulator or voltage converter 41, the passivation openings 539 and 539' for the off-chip circuits 42 and 43, or the passivation openings 549, 549', 559 and 559' for the ESD circuit 44 may have a width greater than those of the openings 531, 532 and 534, in a range between 0.1 and 30 μm. The passivation openings 50 expose metal pads of the top-most layer of fine-line metal layers 60 for electrical contacts of the over-passivation metals.

The finished conventional chip 10 on a silicon wafer is fabricated using different generations of IC process technologies, such as 1 μm, 0.8 μm, 0.6 μm, 0.5 μm, 0.35 μm, 0.25 μm, 0.18 μm, 0.25 μm, 0.13 μm, 90 nm, 65 nm, 45 nm, 35 nm, 25 nm technologies, defined by the gate length or effective channel length of the MOS transistors 2'. The IC chip 10 on the silicon wafer is processed using photolithography process. The photolithography process comprises coating, exposing and developing the photoresist. The photoresist used to process the chip 10 has a thickness of between 0.1 and 4 μm. A 5× stepper or a scanner exposes the phoresist. The 5× means that the dimension on a photo mask (usual made of quartz) is reduced on the wafer when light beam is projected from the photo mask onto the wafer, and the dimension of a feature on the photo mask is 5 times of the dimension on the wafer. The scanner is used in advanced generations of IC process technologies, and is usually with 4× dimension reduction to improve the resolution. The wavelength of the light beam used in the stepper or the scanner is 436 nm (g-line), 365 nm (i-line), 248 nm (Deep Ultraviolet, DUV), 193 nm (DUV), or 157 nm (DUV), or 13.5 nm (Extreme UV, EUV). The high-index immersion photolithography is also used to achieve fine-line features in the IC chip 10.

The conventional IC chip 10 in the silicon wafer is processed in a clean room with Class 10 or better, for example Class 1. A Class 10 clean room allows maximum number of particles per cubic foot: 1 larger than 1 μm, 10 larger than 0.5 μm, 30 larger than 0.3 μm, 75 larger than 0.2 μm, 350 larger than 0.1 μm, while a Class 1 clean room allows maximum number of particles per cubic foot: 1 larger than 0.5 μm, 3 larger than 0.3 μm, 7 larger than 0.2 μm, 35 larger than 0.1 μm.

Figure 15B:
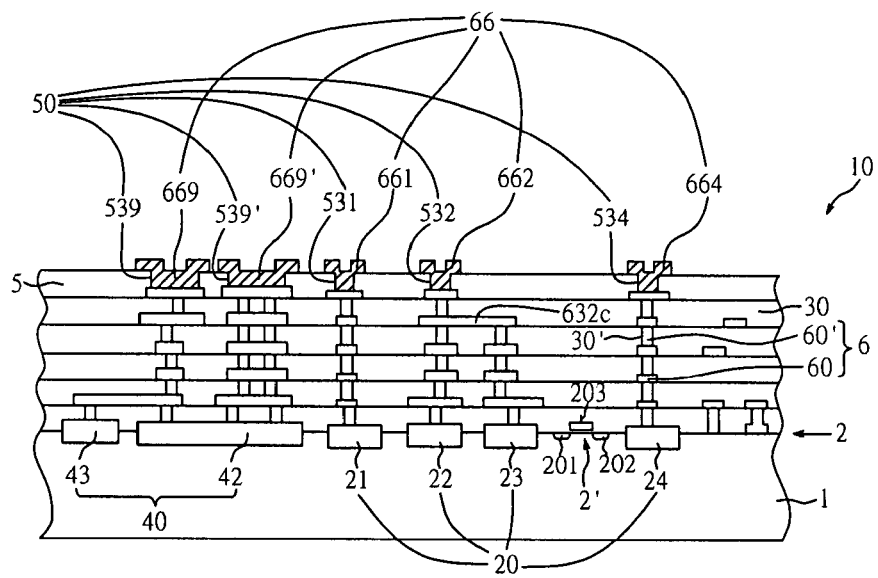

When copper is used as the fine-line metal layers 60, and exposed by the openings 50 in the passivation layer 5, a metal cap 66, comprising 661, 662, 664, 669 and 669', is used to protect the exposed copper pad from corrosion, and also can be used for wirebonding in the conventional IC chip 10, as shown in FIG. 15B. The metal cap 66 having a thickness of between 0.4 and 3 μm comprises an aluminum-containing layer (such as aluminum layer, aluminum-copper alloy layer or Al—Si—Cu alloy layer), a gold layer, a Ti layer, a TiW layer, a Ta layer, a TaN layer, or a Ni layer. If the metal cap 66 is an aluminum-containing layer (such as aluminum layer, aluminum-copper alloy layer or Al—Si—Cu alloy layer), a barrier layer having a thickness of between 0.01 and 0.7 μm is formed between the copper pad and the aluminum cap 66, and the barrier layer comprises Ti, TiW, TiN, Ta, TaN, Cr or Ni. For example, a barrier layer having a thickness of between 0.01 and 0.7 μm can be formed on the copper pad exposed by the opening 50, and an aluminum-containing layer having a thickness of between 0.4 and 3 μm is formed on the barrier layer, wherein the barrier layer may be made of titanium, a titanium-tungsten alloy, titanium nitride, tantalum, tantalum nitride, chromium or alloy of refractory metal, and the aluminum-containing layer may be an aluminum layer, an aluminum-copper alloy layer or an Al—Si—Cu alloy layer. The IC chip 10 with metal caps 66 can be used as options in all embodiments in this invention.

FIGS. 15C-15K show process steps of fabricating an over-passivation scheme 8 over the conventional IC chip 10 shown in FIG. 15A or FIG. 15B. The process steps shown in FIGS. 15C-15K are used to form the structure shown in FIG. 10E, for example, with two layers of over-passivation metals, and with a complete design architecture for interconnecting the internal circuits 20 and off-chip circuits 40. This example shows two over-passivation metal layers, while one metal layer, three metal layers, four metal layers or more metal layers over the passivation layer 5 can be formed using the same or similar methods, and the same or similar specification described in FIGS. 15C-15K. In other words, the following description and specification apply to all embodiments in this invention.

Figure 15C:
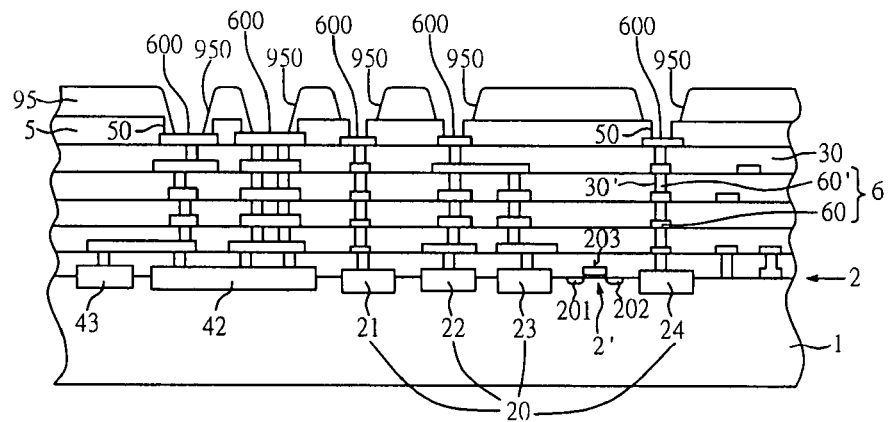
FIG. 15C to FIG. 15L show process steps of forming an over-passivation scheme with two metal layers. Each metal layer is formed by the embossing process.
Figure 15D:
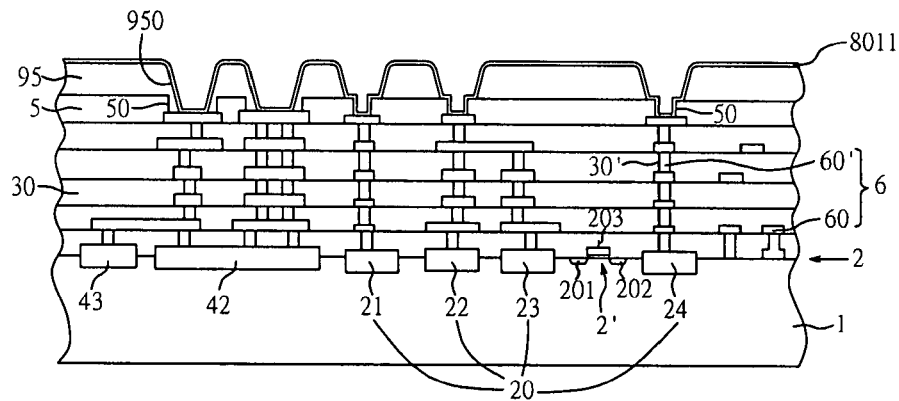
Figure 15E:
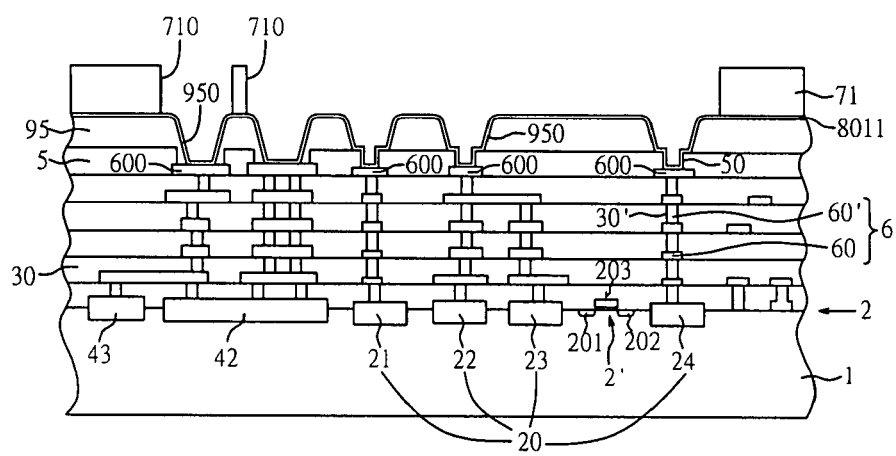
Figure 15F:
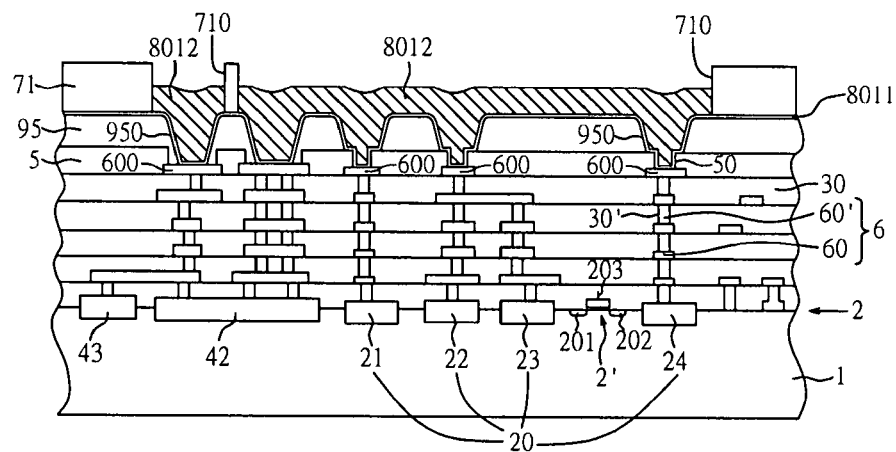
Figure 15G:
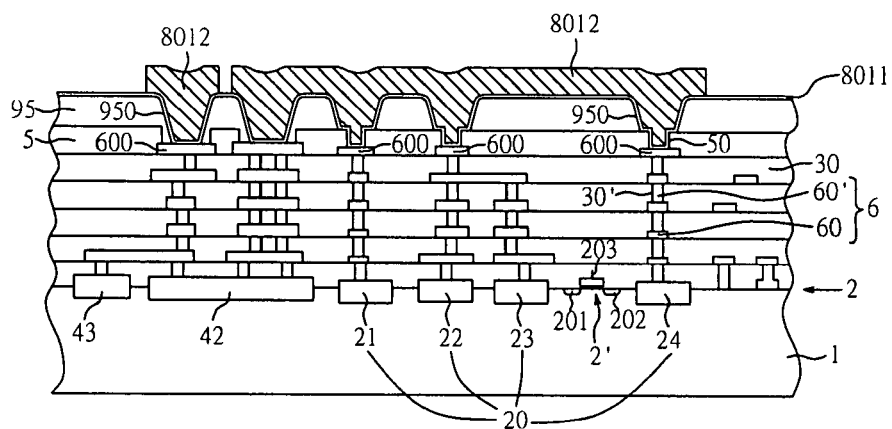
Figure 15H:
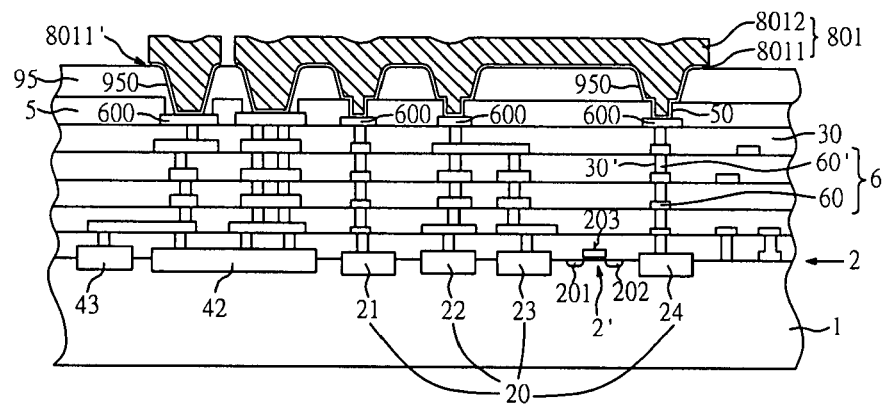
Figure 15I:
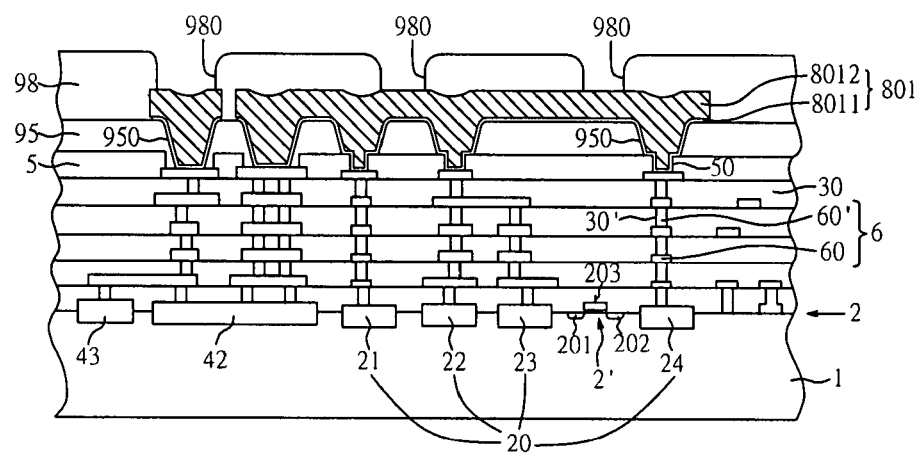
Figure 15J:
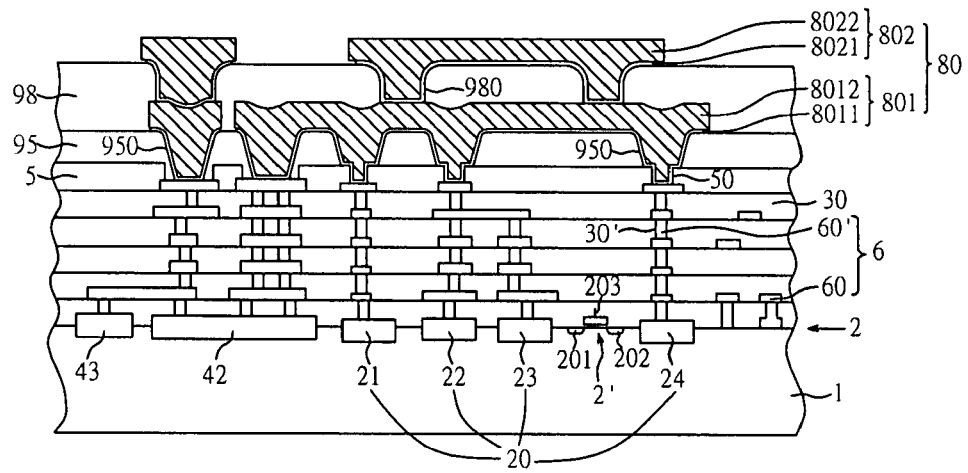
Figure 15K:
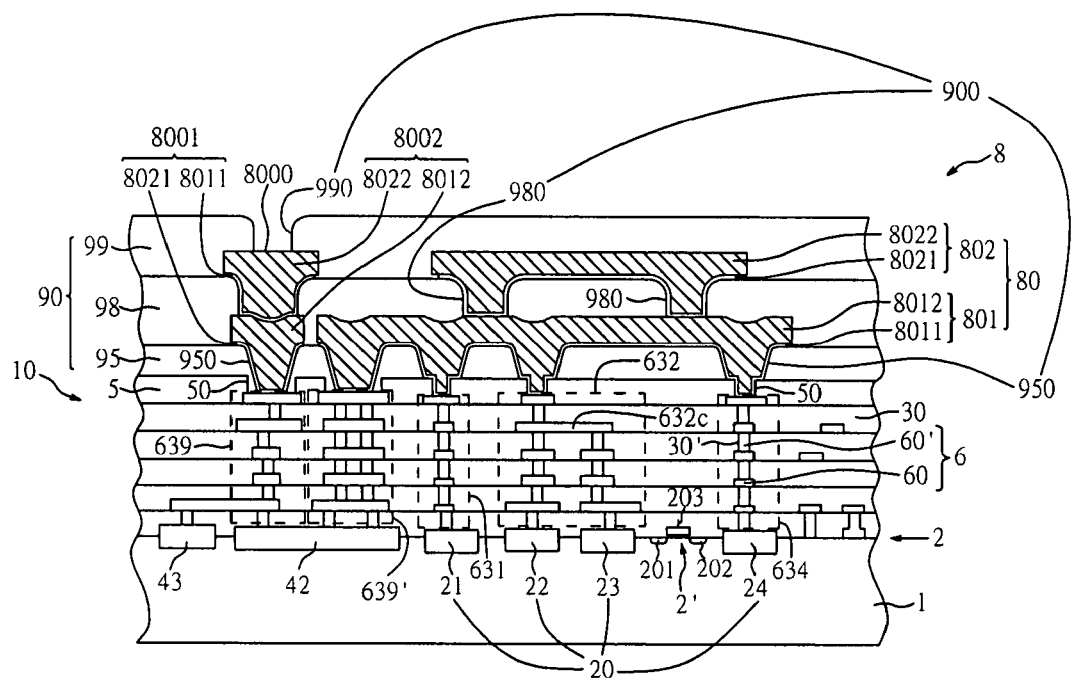

Refer to FIG. 15K now, an over-passivation scheme 8 is formed over a starting material, which is a chip 10 (described in FIG. 15A or FIG. 15B) fabricated in a conventional IC fab. The over-passivation scheme 8 comprises over-passivation metals 80 and over-passivation polymers or insulators 90. The over-passivation metals 80 comprise one, two, three, four or more metal layers. In the example of comprising two metal layers, the over-passivation metals 80 comprise a first metal layer 801 and a second metal layer 802. The specification of the first metal layer 801 and the process of forming the same can be applied to (1) 811 and 821 in the first embodiment; (2) 831 in the second embodiment; (3) 831 in the third embodiment; (4) 811 and 821 in the fourth embodiment. The specification of the second metal layer 802 and the process of forming the same can be applied to (1) 812 in the first embodiment; (2) 832 in the second embodiment; (3) 832 in the third embodiment; (4) 812 in the fourth embodiment.

The metals used in the over-passivation metal layers 80 are mainly copper, gold, silver, palladium, rhodium, platinum, ruthenium, and nickel. The metal line, trace, or plane in the over-passivation metal scheme 80 usually comprises composite layers of metals in a stack. The cross-section in FIG. 15K show two composite layers 8001 and 8002 in each of the over-passivation metal layers 80, which can be applied to as the two composite layers 8111 and 8112 of the patterned circuit layer 811, respectively, in FIGS. 3B, 14B and 14D, as the two composite layers 8211 and 8212 of the patterned circuit layer 821, respectively, in FIGS. 3C and 14C, as the two composite layers 8121 and 8122 of the patterned circuit layer 812, respectively, in FIGS. 3C and 14C, as the two composite layers 8311 and 8312 of the patterned circuit layer 831, respectively, in FIGS. 7B, 7C, 7D, 10B, 10C, 10D, 10E, 10F, 10G, 10H and 10I, and as the two composite layers 8321 and 8322 of the patterned circuit layer 832, respectively, in FIGS. 7C, 10C and 10E. The bottom layer of each over-passivation metal layers 80 is an adhesion/barrier/seed layer 8001 (comprising 8011 and 8021), comprising an adhesion/barrier layer (not shown) and a seed layer (not shown) on the adhesion/barrier layer. The specification of the adhesion/barrier/seed layers 8001 (comprising 8011 and 8021) and the process of forming the same can be applied to (1) adhesion/barrier/seed layers 8111, 8121 and 8211 in the first embodiment; (2) adhesion/barrier/seed layers 8311 and 8321 in the second embodiment; (3) adhesion/barrier/seed layers 8311 and 8321 in the third embodiment; (4) adhesion/barrier/seed layers 8111, 8211 and 8121 in the fourth embodiment. The top layer of each over-passivation metal layers 80 is a conduction bulk metal layer 8002, comprising 8012 and 8022. The specification of the conduction bulk metal layers 8002 (comprising 8012 and 8022) and the process of forming the same can be applied to (1) conduction bulk metal layers 8112, 8122 and 8212 in the first embodiment; (2) conduction bulk metal layers 8312 and 8322 in the second embodiment; (3) conduction bulk metal layers 8312 and 8322 in the third embodiment; (4) conduction bulk metal layers 8112, 8212 and 8122 in the fourth embodiment.

The material of the adhesion/barrier layer at the bottom of the adhesion/barrier/seed layer 8001 can be Ti (titanium), W, Co, Ni, TiN (titanium nitride), TiW (titanium-tungsten alloy), V, Cr (chromium), Cu, CrCu, Ta (tantalum), TaN (tantalum nitride), or alloy or composite layer of above materials. The adhesion/barrier layer can be formed by electroplating, electroless plating, chemical vapor deposition (CVD), or PVD (such as sputtering or evaporation), preferred deposited by PVD (physical vapour deposition) such as metal sputtering process. The thickness of the adhesion/barrier layer is between 0.02 and 0.8 µm, preferred between 0.05 and 0.5 µm.

For example, the adhesion/barrier layer at the bottom of the adhesion/barrier/seed layer 8011 may be formed by sputtering a titanium layer with a thickness of between 0.02 and 0.8 µm, and preferably of between 0.05 and 0.5 µm, on a polymer layer 95 and on pads, principally made of aluminum, exposed by openings 950 in the polymer layer 95. Alternatively, the adhesion/barrier layer at the bottom of the adhesion/barrier/seed layer 8011 may be formed by sputtering a titanium-tungsten-alloy layer with a thickness of between 0.02 and 0.8 µm, and preferably of between 0.05 and 0.5 µm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by sputtering a titanium-nitride layer with a thickness of between 0.02 and 0.8 µm, and preferably of between 0.05 and 0.5 µm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by sputtering a chromium layer with a thickness of between 0.02 and 0.8 µm, and preferably of between 0.05 and 0.5 µm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by sputtering a tantalum-nitride layer with a thickness of between 0.02 and 0.8 µm, and preferably of between 0.05 and 0.5 µm, on the polymer layer 95 and on the pads, principally made of aluminum, exposed by the openings 950 in the polymer layer 95. Alternatively, the adhesion/barrier layer at the bottom of the adhesion/barrier/seed layer 8011 may be formed by sputtering a tantalum layer with a thickness of between 0.02 and 0.8 µm, and preferably of between 0.05 and 0.5 µm, on the polymer layer 95 and on the pads, principally made of aluminum, exposed by the openings 950 in the polymer layer 95.

For example, the adhesion/barrier layer at the bottom of the adhesion/barrier/seed layer 8011 may be formed by sputtering a titanium layer with a thickness of between 0.02 and 0.8 µm, and preferably of between 0.05 and 0.5 µm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by sputtering a titanium-tungsten-alloy layer with a thickness of between 0.02 and 0.8 µm, and preferably of between 0.05 and 0.5 µm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by sputtering a titanium-nitride layer with a thickness of between 0.02 and 0.8 µm, and preferably of between 0.05 and 0.5 µm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by sputtering a chromium layer with a thickness of between 0.02 and 0.8 µm, and preferably of between 0.05 and 0.5 µm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by sputtering a tantalum-nitride layer with a thickness of between 0.02 and 0.8 µm, and preferably of between 0.05 and 0.5 µm, on the polymer layer 95 and on the pads, principally made of copper, exposed by the openings 950 in the polymer layer 95. Alternatively, the adhesion/barrier layer at the bottom of the adhesion/barrier/seed layer 8011 may be formed by sputtering a tantalum layer with a thickness of between 0.02 and 0.8 µm, and preferably of between 0.05 and 0.5 µm, on the polymer layer 95 and on the pads, principally made of copper, exposed by the openings 950 in the polymer layer 95.

For example, the adhesion/barrier layer at the bottom of the adhesion/barrier/seed layer 8011 may be formed by sputtering a titanium layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by sputtering a titanium-tungsten-alloy layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads. Alternatively, the adhesion/barrier layer at the bottom of the adhesion/barrier/seed layer 8011 may be formed by sputtering a titanium-nitride layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by sputtering a chromium layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads. Alternatively, the adhesion/barrier layer at the bottom of the adhesion/barrier/seed layer 8011 may be formed by sputtering a tantalum-nitride layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer), exposed by the openings 950 in the polymer layer 95, of the metal caps 66 over the copper pads. Alternatively, the adhesion/barrier layer at the bottom of the adhesion/barrier/seed layer 8011 may be formed by sputtering a tantalum layer with a thickness of between 0.02 and 0.8 µm, and preferably of between 0.05 and 0.5 µm, on the polymer layer 95 and on the aluminum-containing layer (such as aluminum layer, aluminum-copper alloy layer or Al—Si—Cu alloy layer) of the metal caps 66, exposed by the openings 950 in the polymer layer 95, over the copper pads.

For example, the adhesion/barrier layer at the bottom of the adhesion/barrier/seed layer 8021 may be formed by sputtering a titanium layer with a thickness of between 0.02 and 0.8 µm, and preferably of between 0.05 and 0.5 µm, on a polymer layer 98 and on a gold layer of the conduction bulk layer 8012 exposed by openings 980 in the polymer layer 98. Alternatively, the adhesion/barrier layer at the bottom of the adhesion/barrier/seed layer 8021 may be formed by sputtering a titanium-tungsten-alloy layer with a thickness of between 0.02 and 0.8 µm, and preferably of between 0.05 and 0.5 µm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by sputtering a titanium-nitride layer with a thickness of between 0.02 and 0.8 µm, and preferably of between 0.05 and 0.5 µm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by sputtering a chromium layer with a thickness of between 0.02 and 0.8 µm, and preferably of between 0.05 and 0.5 µm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by sputtering a tantalum-nitride layer with a thickness of between 0.02 and 0.8 µm, and preferably of between 0.05 and 0.5 µm, on the polymer layer 98 and on the gold layer of the conduction bulk layer 8012 exposed by the openings 980 in the polymer layer 98. Alternatively, the adhesion/barrier layer at the bottom of the adhesion/barrier/seed layer 8021 may be formed by sputtering a tantalum layer with a thickness of between 0.02 and 0.8 µm, and preferably of between 0.05 and 0.5 µm, on the polymer layer 98 and on the gold layer of the conduction bulk layer 8012 exposed by the openings 980 in the polymer layer 98.

For example, the adhesion/barrier layer at the bottom of the adhesion/barrier/seed layer 8021 may be formed by sputtering a titanium layer with a thickness of between 0.02 and 0.8 µm, and preferably of between 0.05 and 0.5 µm, on a polymer layer 98 and on a copper layer of the conduction bulk layer 8012 exposed by multiple openings 980 in the polymer layer 98. Alternatively, the adhesion/barrier layer at the bottom of the adhesion/barrier/seed layer 8021 may be formed by sputtering a titanium-tungsten-alloy layer with a thickness of between 0.02 and 0.8 µm, and preferably of between 0.05 and 0.5 µm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by sputtering a titanium-nitride layer with a thickness of between 0.02 and 0.8 µm, and preferably of between 0.05 and 0.5 µm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by sputtering a chromium layer with a thickness of between 0.02 and 0.8 µm, and preferably of between 0.05 and 0.5 µm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by sputtering a tantalum-nitride layer with a thickness of between 0.02 and 0.8 µm, and preferably of between 0.05 and 0.5 µm, on the polymer layer 98 and on the copper layer of the conduction bulk layer 8012 exposed by the openings 980 in the polymer layer 98. Alternatively, the adhesion/barrier layer at the bottom of the adhesion/barrier/seed layer 8021 may be formed by sputtering a tantalum layer with a thickness of between 0.02 and 0.8 µm, and preferably of between 0.05 and 0.5 µm, on the polymer layer 98 and on the copper layer of the conduction bulk layer 8012 exposed by the openings 980 in the polymer layer 98.

The seed layer at the top of the adhesion/barrier/seed layer 8001, for the subsequent electroplating process, usually formed by electroplating, electroless, CVD, or PVD (such as sputtering), preferred deposited by PVD such as metal sputtering process. The material used for the seed layer, usually made of the same metal material as the conduction bulk metal formed in the subsequent electroplating process, can be Au, Cu, Ag, Ni, Pd, Rh, Pt or Ru. The material of the seed layer varies with the material of the electroplated metal layer formed on the seed layer. When a gold layer is to be electroplated on the seed layer, gold is a preferable material to the seed layer. When a copper layer is to be electroplated on the seed layer, copper is a preferable material to the seed layer. The thickness of the electroplating seed layer is between 0.05 and 1.2 µm, preferred between 0.05 and 0.8 µm.

For example, when the adhesion/barrier layer at the bottom of the adhesion/barrier/seed layer 8001 is formed by sputtering a titanium layer with a thickness of between 0.02 and 0.8 µm, and preferably of between 0.05 and 0.5 µm, the seed layer at the top of the adhesion/barrier/seed layer 8001 can be formed by sputtering a gold layer with a thickness of between 0.05 and 1.2 µm, and preferably of between 0.05 and 0.8 µm, on the titanium layer. When the adhesion/barrier layer at the bottom of the adhesion/barrier/seed layer 8001 is formed by sputtering a titanium-tungsten-alloy layer with a thickness of between 0.02 and 0.8 µm, and preferably of between 0.05 and 0.5 µm, the seed layer at the top of the adhesion/barrier/seed layer 8001 can be formed by sputtering a gold layer with a thickness of between 0.05 and 1.2 µm, and preferably of between 0.05 and 0.8 µm, on the titanium-tungsten-alloy layer. When the adhesion/barrier layer at the bottom of the adhesion/barrier/seed layer 8001 is formed by sputtering a titanium-nitride layer with a thickness of between 0.02 and 0.8 µm, and preferably of between 0.05 and 0.5 µm, the seed layer at the top of the adhesion/barrier/seed layer 8001 can be formed by sputtering a gold layer with a thickness of between 0.05 and 1.2 μm, and preferably of between 0.05 and 0.8 μm, on the titanium-nitride layer. When the adhesion/barrier layer at the bottom of the adhesion/barrier/seed layer 8001 is formed by sputtering a chromium layer with a thickness of between 0.02 and 0.8 μm, and preferably of between 0.05 and 0.5 μm, the seed layer at the top of the adhesion/barrier/seed layer 8001 can be formed by sputtering a gold layer with a thickness of between 0.05 and 1.2 μm, and preferably of between 0.05 and 0.8 μm, on the chromium layer. When the adhesion/barrier layer at the bottom of the adhesion/barrier/seed layer 8001 is formed by sputtering a tantalum-nitride layer with a thickness of between 0.02 and 0.8 μm, and preferably of between 0.05 and 0.5 μm, the seed layer at the top of the adhesion/barrier/seed layer 8001 can be formed by sputtering a gold layer with a thickness of between 0.05 and 1.2 μm, and preferably of between 0.05 and 0.8 μm, on the tantalum-nitride layer. When the adhesion/barrier layer at the bottom of the adhesion/barrier/seed layer 8001 is formed by sputtering a tantalum layer with a thickness of between 0.02 and 0.8 μm, and preferably of between 0.05 and 0.5 μm, the seed layer at the top of the adhesion/barrier/seed layer 8001 can be formed by sputtering a gold layer with a thickness of between 0.05 and 1.2 μm, and preferably of between 0.05 and 0.8 μm, on the tantalum layer.

For example, when the adhesion/barrier layer at the bottom of the adhesion/barrier/seed layer 8001 is formed by sputtering a titanium layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the titanium layer. When the adhesion/barrier layer at the bottom of the adhesion/barrier/seed layer 8001 is formed by sputtering a titanium-tungsten-alloy layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the titanium-tungsten-alloy layer. When the adhesion/barrier layer at the bottom of the adhesion/barrier/seed layer 8001 is formed by sputtering a titanium-nitride layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the titanium-nitride layer. When the adhesion/barrier layer at the bottom of the adhesion/barrier/seed layer 8001 is formed by sputtering a chromium layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the chromium layer. When the adhesion/barrier layer at the bottom of the adhesion/barrier/seed layer 8001 is formed by sputtering a tantalum-nitride layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the tantalum-nitride layer. When the adhesion/barrier layer at the bottom of the adhesion/barrier/seed layer 8001 is formed by sputtering a tantalum layer with a thickness of between 0.02 and 0.8 μm, and preferably of between 0.05 and 0.5 μm, the seed layer at the top of the adhesion/barrier/seed layer 8001 can be formed by sputtering a copper layer with a thickness of between 0.05 and 1.2 μm, and preferably of between 0.05 and 0.8 μm, on the tantalum layer.

The conduction bulk layer 8002 is formed for the low resistance conduction, usually formed by electroplating, with a thickness between 2 and 100 μm, preferred between 3 and 20 μm. The metal material of the conduction bulk layer 8002, formed by a process including an electroplating process or an electroless plating process, comprises Au, Cu, Ag, Ni, Pd, Rh, Pt or Ru.

For example, the conduction bulk layer 8002 may be formed by electroplating a gold layer with a thickness of between 2 and 100 μm, and preferably of between 3 and 20 μm, on the seed layer, made of gold, at the top of the adhesion/barrier/seed layer 8001. Alternatively, the conduction bulk layer 8002 may be formed by electroplating a copper layer with a thickness of between 2 and 100 μm, and preferably of between 3 and 20 μm, on the seed layer, made of copper, at the top of the adhesion/barrier/seed layer 8001. Alternatively, the conduction bulk layer 8002 may be formed by electroplating a copper layer with a thickness of between 1.5 and 90 μm, and preferably of between 2.5 and 10 μm, on the seed layer, made of copper, at the top of the adhesion/barrier/seed layer 8001, and then electroplating a gold layer with a thickness of between 0.5 and 10 μm on the copper layer, wherein the thickness of the copper layer and the gold layer is between 2 and 100 μm, and preferably of between 3 and 20 μm. Alternatively, the conduction bulk layer 8002 may be formed by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroplating a gold layer with a thickness of between 0.03 and 0.5 μm, and preferably of between 0.05 and 0.1 μm, on the nickel layer. Alternatively, the conduction bulk layer 8002 may be formed by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroless plating a gold layer with a thickness of between 0.03 and 0.5 μm, and preferably of between 0.05 and 0.1 μm, on the nickel layer. Alternatively, the conduction bulk layer 8002 may be formed by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroplating a palladium layer with a thickness of between 0.03 and 0.5 μm, and preferably of between 0.05 and 0.1 μm, on the nickel layer. Alternatively, the conduction bulk layer 8002 may be formed by electroplating a copper layer with a thickness of between 3 and 20 μm, and preferably of between 3 and 15 μm, on the seed layer, made of copper, at the top of the adhesion/barrier/seed layer 8001, then electroplating a nickel layer with a thickness of between 0.5 and 5 μm, and preferably of between 1 and 3 μm, on the copper layer, and then electroless plating a palladium layer with a thickness of between 0.03 and 0.5 μm, and preferably of between 0.05 and 0.1 μm, on the nickel layer.

As an option, a cap/barrier metal layer (not shown) for protection or diffusion barrier purpose is added. The cap/ barrier layer can be formed by electroplating, electroless plating, CVD or PVD sputtered metal, preferred deposited by electroplating. The thickness of the cap/barrier layer is of a range between 0.05 and 5 µm, preferred 0.5 and 3 µm. The cap/barrier layer can be a Ni, Co or V layer. As another option, an assembly-contact layer (not shown) over the conduction bulk metal layer 8002 and the cap/barrier layer (not shown) for assembly or packaging purpose, especially for the topmost metal layer of the over-passivation metals 80 (in one or more metal layers with polymer dielectric between two adjacent metal layers).

Openings 990 (comprising 9919 and 9929 in the first embodiment, 9939 and 9939' in the third embodiment, 9949 and 9949' in the fourth embodiment) in the topmost polymer layer 99 expose the surface of pads 8000 (comprising 8110 and 8120 in the first embodiment, 8310 and 8320 in the third embodiment, 8110 and 8120 in the fourth embodiment) of the topmost over-passivation metal layer. The assembly-contact metal layer is wirebodable and/or solder wettable used for wireboding, gold connection, solder ball mounting, and/or solder connection. The assembly-contact metal layer can be Au, Ag, Pt, Pd, Rh or Ru. Joining to the assembly-contact metal layer exposed by the polymer openings 900 can be a bonding wire, a solder ball (solder ball mounting), a metal ball (metal ball mounting), a metal bumps on the other substrate or chip, a gold bump on the other substrate or chip, a metal post on the other substrate or chip, a copper post on the other substrate or chip.

For the conventional IC contact pads made of sputtered aluminum or electroplated Cu (formed by CMP damascene process), the over-passivation metal lines, traces or planes can be, as some examples, one of the following stacks, from bottom to top: (1) TiW/sputtered seed Au/electroplated Au, (2) Ti/sputtered seed Au/electroplated Au, (3) Ta/sputtered seed Au/electroplated Au, (4) Cr/sputtered seed Cu/electroplated Cu, (5) TiW/sputtered seed Cu/electroplated Cu, (6) Ta/sputtered seed Cu/electroplated Cu, (7) Ti/sputtered seed Cu/electroplated Cu, (8) Cr, TiW, Ti or Ta/sputtered seed Cu/electroplated Cu/electroplated Ni, (9) Cr, TiW, Ti or Ta/sputtered seed Cu/electroplated Cu/electroplated Ni/electroplated Au, Ag, Pt, Pd, Rh or Ru, (10) Cr, TiW, Ti or Ta/sputtered seed Cu/electroplated Cu/electroplated Ni/electroless Au, Ag, Pt, Pd, Rh or Ru. Each of over-passivation metal layers 80 has thickness between 2 and 150 µm, preferred between 3 and 20 µm, with horizontal design rules (the width) of over-passivation metal lines or traces between 1 and 200 µm, preferred 2 and 50 µm. An over-passivation metal plane is also preferred, particularly for power, or ground plane, with a width greater than 200 µm. The minimum space between two adjacent metal lines, traces and/or planes is between 1 and 500 µm, preferred 2 and 150 µm.

In some application of this invention, the metal lines, traces or planes can only comprise sputtered aluminum with thickness between 2 and 6 µm, preferred between 3 and 5 µm, with an optional adhesio/barrier layer (comprising Ti, TiW, TiN, Ta or TaN layer) under the aluminum layer.

Figure 15L:
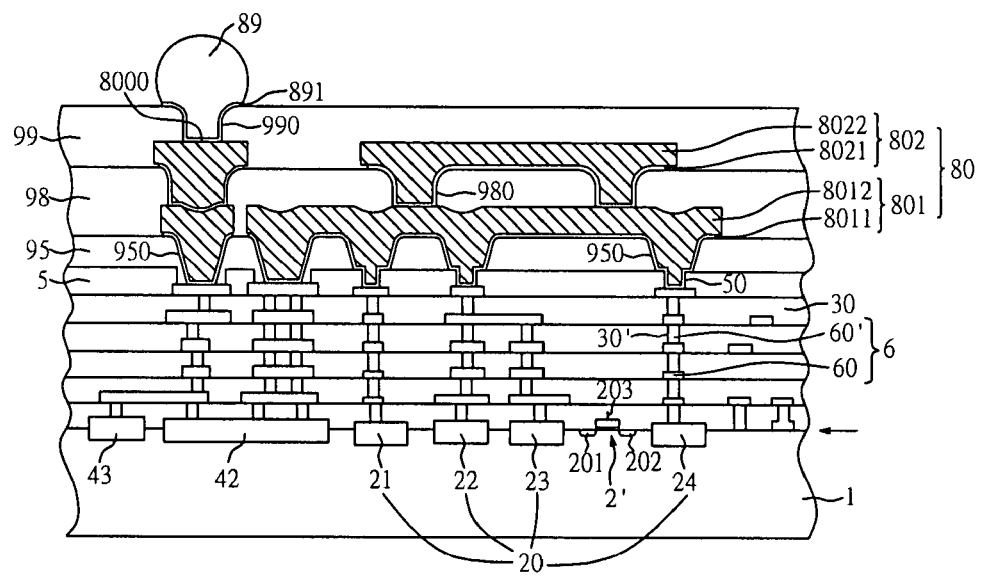

Referring to FIG. 15L, as an option, a contact structure 89 is formed over the pad 8000, exposed by the opening 990, of the over-passivation metal scheme 80. The contact structure 89 can be a metal bump, a solder bump, a solder ball, a gold bump, a copper bump, a metal pad, a solder pad, a gold pad, a metal post, a solder post, a gold post or a copper post. Under the contact structure 89 is an adhesion/barrier layer 891. The adhesion/barrier layer 891 comprises Au, Ti, TiW, TiN, Cr, Cu, CrCu, Ta, TaN, Ni, NiV, V or Co layer, or composite layers of the above materials. The preferred stacks of the contact structure 89 (including adhesion/barrier layer 891), from the bottom to the top are (1) Ti/Au pad (Au layer thickness 1-10 µm), (2) TiW/Au pad (Au layer thickness 1-10 µm), (3) Ni/Au pad (Ni layer thickness 0.5-10 µm, Au layer thickness 0.2-10 µm), (4) Ti/Au bump (Au layer thickness 7-40 µm), (5) TiW/Au bump (Au layer thickness 7-40 µm), (6) Ni/Au bump (Ni layer thickness 0.5-10 µm, Au layer thickness 7-40 µm), (7) Ti, TiW or Cr/Cu/Ni/Au pad, (copper layer thickness 0.1-10 µm, Au layer thickness 0.2-10 µm), (8) Ti, TiW, Cr, CrCu or NiV/Cu/Ni/Au bump, (copper layer thickness 0.1-10 µm, Au layer thickness 7-40 µm), (9) Ti, TiW, Cr, CrCu or NiV/Cu/Ni/solder pad, (copper layer thickness 0.1-10 µm, solder layer thickness 0.2-30 µm), (10) Ti, TiW, Cr, CrCu or NiV/Cu/Ni/solder bump or solder ball, (copper layer thickness 0.1-10 µm, solder layer thickness 10-500 µm), (11) Ti, TiW, Cr, CrCu or NiV/Cu post, (copper layer thickness 10-300 µm), (11) Ti, TiW, Cr, CrCu or NiV/Cu post/Ni, (copper layer thickness 10-300 µm), (12) Ti, TiW, Cr, CrCu or NiV/Cu post/Ni/Solder (copper layer thickness 10-300 µm, solder layer thickness 1-20 µm), (13) Ti, TiW, Cr, CrCu or NiV/Cu post/Ni/Solder (copper layer thickness 10-300 µm, solder layer thickness 20-100 µm). The assembly methods can be wirebonding, TAB bonding, chip-on-glass (COG), chip-on-board (COB), flip chip on BGA substrate, chip-on-film (COF), chip-on-chip stack interconnection, chip-on-Si-substrate stack interconnection and etc.

For example, the adhesion/barrier layer 891 and the contact structure 89 may be formed by sputtering a titanium-containing layer, such as titanium layer or titanium-tungsten-alloy layer, with a thickness of between 0.02 and 0.8 µm, and preferably of between 0.05 and 0.5 µm, on the polymer layer 99 and on the copper layer, nickel layer or gold layer of the pad 8000 exposed by the opening 990, then sputtering a seed layer, made of gold, with a thickness of between 0.05 and 1.2 µm, and preferably of between 0.05 and 0.8 µm, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a gold layer with a thickness of between 1 and 10 µm on the seed layer exposed by the opening in the photoresist layer, then removing the developed photoresist layer using an organic solution with amide, then removing the residual polymeric material or other contaminants from the seed layer and from the gold layer with an $O_2$ plasma or a plasma containing fluorine of below 200 PPM and oxygen, then removing the seed layer not under the gold layer with a dry etching method or a wet etching method, and then removing the titanium-containing layer not under the gold layer with a dry etching method or a wet etching method. As to the wet etching method, the seed layer of gold can be etched with an iodine-containing solution, such as solution containing potassium iodide. When the titanium-containing layer is titanium layer, the titanium layer can be wet etched with a solution containing hydrogen fluoride. When the titanium-containing layer is titanium-tungsten-alloy layer, the titanium-tungsten-alloy layer can be wet etched with a solution containing hydrogen peroxide. As to the dry etching method, the seed layer of gold can be removed with an ion milling process or with an Ar sputtering etching process, and the titanium-containing layer can be etched with a chlorine-containing plasma etching process or with an RIE process. Thereby, the adhesion/barrier metal layer 891 can be formed of the titanium-containing layer and the seed layer, made of gold, on the titanium-containing layer, and the contact structure 89 can be formed of gold that is on the seed layer of the adhesion/seed layer 891.

For example, the adhesion/barrier layer 891 and the contact structure 89 may be formed by sputtering a titanium-containing layer, such as titanium layer or titanium-tungsten-alloy layer, with a thickness of between 0.02 and 0.8 µm, and preferably of between 0.05 and 0.5 µm, on the polymer layer 99 and on the copper layer, nickel layer or gold layer of the pad 8000 exposed by the opening 990, then sputtering a seed layer, made of copper, with a thickness of between 0.05 and 1.2 µm, and preferably of between 0.05 and 0.8 µm, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a copper layer with a thickness of between 1 and 10 µm, and preferably of between 1 and 5 µm, on the seed layer exposed by the opening in the photoresist layer, then electroplating a nickel layer with a thickness of between 0.5 and 5 µm, and preferably of between 0.5 and 1 µm, on the copper layer in the opening, then electroplating a tin-containing layer, such as a tin-lead alloy, a tin-silver alloy or a tin-silver-copper alloy, with a thickness of between 50 and 150 µm, and preferably of between 80 and 130 µm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the titanium-containing layer not under the copper layer with a dry etching method or a wet etching method, and then reflowing the tin-containing layer. As to the wet etching method, the seed layer of copper can be etched with a solution containing $NH_4OH$. When the titanium-containing layer is titanium layer, the titanium layer can be wet etched with a solution containing hydrogen fluoride. When the titanium-containing layer is titanium-tungsten-alloy layer, the titanium-tungsten-alloy layer can be wet etched with a solution containing hydrogen peroxide. As to the dry etching method, the seed layer of copper can be removed with an Ar sputtering etching process, and the titanium-containing layer can be etched with a chlorine-containing plasma etching process or with an RIE process. Thereby, the adhesion/barrier layer 891 can be formed of the titanium-containing layer and the seed layer, made of copper, on the titanium-containing layer, and the contact structure 89 can be formed of the copper layer on the seed layer, the nickel layer on the copper layer, and the tin-containing layer on the nickel layer. [0024] For example, the adhesion/barrier layer 891 and the contact structure 89 may be formed by sputtering a chromium layer with a thickness of between 0.02 and 0.8 µm, and preferably of between 0.05 and 0.5 µm, on the polymer layer 99 and on the copper layer, nickel layer or gold layer of the pad 8000 exposed by the opening 990, then sputtering a seed layer, made of copper, with a thickness of between 0.05 and 1.2 µm, and preferably of between 0.05 and 0.8 µm, on the chromium layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and Mine having a wavelength ranging from 363 to 367 nm, illuminating the photoresist layer, that is, G-line and H-line, G-line and Mine, H-line and I-line, or G-line, H-line and Mine illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a copper layer with a thickness of between 1 and 10 µm, and preferably of between 1 and 5 µm, on the seed layer exposed by the opening in the photoresist layer, then electroplating a nickel layer with a thickness of between 0.5 and 5 µm, and preferably of between 0.5 and 1 µm, on the copper layer in the opening, then electroplating a tin-containing layer, such as a tin-lead alloy, a tin-silver alloy or a tin-silver-copper alloy, with a thickness of between 50 and 150 µm, and preferably of between 80 and 130 µm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the chromium layer not under the copper layer with a dry etching method or a wet etching method, and then reflowing the tin-containing layer. As to the wet etching method, the seed layer of copper can be etched with a solution containing $NH_4OH$, and the chromium layer can be etched with a solution containing potassium ferricyanide. As to the dry etching method, the seed layer of copper can be removed with an Ar sputtering etching process. Thereby, the adhesion/barrier layer 891 can be formed of the chromium layer and the seed layer, made of copper, on the chromium layer, and the contact structure 89 can be formed of the copper layer on the seed layer, the nickel layer on the copper layer, and the tin-containing layer on the nickel layer.

For example, the adhesion/barrier layer 891 and the contact structure 89 may be formed by sputtering a tantalum-containing layer, such as tantalum layer or tantalum-nitride layer, with a thickness of between 0.02 and 0.8 µm, and preferably of between 0.05 and 0.5 µm, on the polymer layer 99 and on the copper layer, nickel layer or gold layer of the pad 8000 exposed by the opening 990, then sputtering a seed layer, made of copper, with a thickness of between 0.05 and 1.2 µm, and preferably of between 0.05 and 0.8 µm, on the tantalum-containing layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a copper layer with a thickness of between 1 and 10 μm, and preferably of between 1 and 5 μm, on the seed layer exposed by the opening in the photoresist layer, then electroplating a nickel layer with a thickness of between 0.5 and 5 μm, and preferably of between 0.5 and 1 μm, on the copper layer in the opening, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the tantalum-containing layer not under the copper layer with a dry etching method or a wet etching method, and then reflowing the tin-containing layer. As to the wet etching method, the seed layer of copper can be etched with a solution containing $NH_4OH$. As to the dry etching method, the seed layer of copper can be removed with an Ar sputtering etching process. Thereby, the adhesion/seed metal layer 891 can be formed of the tantalum-containing layer and the seed layer, made of copper, on the tantalum-containing layer, and the contact structure 89 can be formed of the copper layer on the seed layer, the nickel layer on the copper layer, and the tin-containing layer on the nickel layer.

For example, the adhesion/barrier layer 891 and the contact structure 89 may be formed by sputtering a titanium-containing layer, such as titanium layer or titanium-tungsten-alloy layer, with a thickness of between 0.02 and 0.8 μm, and preferably of between 0.05 and 0.5 μm, on the polymer layer 99 and on the copper layer, nickel layer or gold layer of the pad 8000 exposed by the opening 990, then sputtering a seed layer, made of copper, with a thickness of between 0.05 and 1.2 μm, and preferably of between 0.05 and 0.8 μm, on the titanium-containing layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer over the pad 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the titanium-containing layer not under the copper layer with a dry etching method or a wet etching method, and then reflowing the tin-containing layer. As to the wet etching method, the seed layer of copper can be etched with a solution containing $NH_4OH$. When the titanium-containing layer is titanium layer, the titanium layer can be wet etched with a solution containing hydrogen fluoride. When the titanium-containing layer is titanium-tungsten-alloy layer, the titanium-tungsten-alloy layer can be etched with a solution containing hydrogen peroxide. As to the dry etching method, the seed layer of copper can be removed with an Ar sputtering etching process, and the titanium-containing layer can be etched with a chlorine-containing plasma etching process or with an RIE process. Thereby, the adhesion/barrier layer 891 can be formed of the titanium-containing layer and the seed layer, made of copper, on the titanium-containing layer, and the contact structure 89 can be formed of the nickel layer on the seed layer and the tin-containing layer on the nickel layer.

For example, the adhesion/barrier layer 891 and the contact structure 89 may be formed by sputtering a chromium layer with a thickness of between 0.02 and 0.8 μm, and preferably of between 0.05 and 0.5 μm, on the polymer layer 99 and on the copper layer, nickel layer or gold layer of the pad 8000 exposed by the opening 990, then sputtering a seed layer, made of copper, with a thickness of between 0.05 and 1.2 μm, and preferably of between 0.05 and 0.8 μm, on the chromium layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the chromium layer not under the copper layer with a dry etching method or a wet etching method, and then reflowing the tin-containing layer. As to the wet etching method, the seed layer of copper can be etched with a solution containing $NH_4OH$, and the chromium layer can be etched with a solution containing potassium ferricyanide. As to the dry etching method, the seed layer of copper can be removed with an Ar sputtering etching process. Thereby, the adhesion/barrier layer 891 can be formed of the chromium layer and the seed layer, made of copper, on the chromium layer, and the contact structure 89 can be formed of the nickel layer on the seed layer and the tin-containing layer on the nickel layer.

For example, the adhesion/barrier layer 891 and the contact structure 89 may be formed by sputtering a tantalum-containing layer, such as tantalum layer or tantalum-nitride layer, with a thickness of between 0.02 and 0.8 μm, and preferably of between 0.05 and 0 μm, on the polymer layer 99 and on the copper layer, nickel layer or gold layer of the pad 8000 exposed by the opening 990, then sputtering a seed layer, made of copper, with a thickness of between 0.05 and 1.2 μm, and preferably of between 0.05 and 0.8 μm, on the tantalum-containing layer, then spin-on coating a photoresist layer, such as positive-type photoresist layer, on the seed layer, then exposing the photoresist layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photoresist layer, that is, G-line and H-line, G-line and I-line, H-line and I-line, or G-line, H-line and I-line illuminate the photoresist layer, then developing the exposed photoresist layer, an opening in the developed photoresist layer exposing the seed layer over the pad 8000, then removing the residual polymeric material or other contaminants from the seed layer with an $O_2$ plasma or a plasma containing fluorine of below 200 PPM and oxygen, then electroplating a nickel layer with a thickness of between 0.5 and 5 μm, and preferably of between 0.5 and 1 μm, on the seed layer exposed by the opening in the photoresist layer, then electroplating a tin-containing layer, such as a tin-lead alloy, a tin-silver alloy or a tin-silver-copper alloy, with a thickness of between 50 and 150 μm, and preferably of between 80 and 130 μm, on the nickel layer in the opening, then removing the developed photoresist layer using an organic solution with amide, then removing the residual polymeric material or other contaminants from the seed layer and from the tin-containing layer with an $O_2$ plasma or a plasma containing fluorine of below 200 PPM and oxygen, then removing the seed layer not under the copper layer with a dry etching method or a wet etching method, then removing the tantalum-containing layer not under the copper layer with a dry etching method or a wet etching method, and then reflowing the tin-containing layer. As to the wet etching method, the seed layer of copper can be etched with a solution containing $NH_4OH$. As to the dry etching method, the seed layer of copper can be removed with an Ar sputtering etching process. Thereby, the adhesion/barrier layer 891 can be formed of the tantalum-containing layer and the seed layer, made of copper, on the tantalum-containing layer, and the contact structure 89 can be formed of the nickel layer on the seed layer and the tin-containing layer on the nickel layer.

There is another important feature of the over-passivation scheme 8: using polymer material as the dielectric or insulating layer 90, over, under or between the over-passivation metal layers 80. Referring to FIG. 15K, use of polymer layers 90 (comprising 95, 98 and 99 in all embodiments of this invention) provides the possibility of fabricating thicker than 2 μm dielectric layer. The thickness of the polymer layer 90 can be between 2 and 100 μm, and preferably of between 3 and 30 μm. The polymer layers 90 used in the over-passivation scheme 8 can be polyimide (P1), benzocyclobutene (BCB), elastomer (such as silicone), parylene, epoxy-based material (such as photoepoxy SU-8 supplied by Sotec Microsystems, Renens, Switzerland). A solder mask material used in the printing circuit board industry can be used as the cap layer 99 (the topmost polymer layer over all the over-passivation metal layers 80). A photosensitive polyimide can be used as the polymer layers 90 (comprising 95, 98 and 99 in all embodiments of this invention). Furthermore, the polymer layers 90 (comprising 95, 98 and 99 in all embodiments of this invention) can be a non-ionic polymide, such as an ether-based polyimide, PIMEL™, supplied by Asahi Chemical, Japan. Copper does not diffuse or penetrate through the non-ionic polyimide, therefore, it is allowed to have a direct contact between copper and polyimide. With the non-ionic polyimide, spacing between copper lines or traces or planes in the over-passivation metal scheme 80 can be as close as 1 μm, i.e. the spacing between two metal traces or planes can be greater 1 μm. Furthermore, no protection cap, such as a Ni cap layer, over the copper layer is required for copper lines, or traces, or planes.

Referring to FIG. 15K now, openings 900 in the polymer layers 90 are formed for interconnection between different over-passivation metal layers 80, or for connection to the underlying fine-line metal layers 60, or for connection to an external circuits. The polymer openings 900 (including 950, 980 and 990) comprises (1) 9919, 9929, 9829, 9519, 9519', 9511, 9512 and 9514 in the first embodiment; (2) 9831, 9834, 9531, 9532 and 9534 in the second embodiment; (3) 9939, 9939', 9839, 9831, 9834, 9539, 9539', 9531, 9532 and 9534 in the third embodiment; and (4) 9949, 9949', 9849', 9511, 9512, 9514 and 9549 in the fourth embodiment. The material of the polymer layers 90 can be a photo-sensitive or non-photo-sensitive. For the photo-sensitive polymer layers 90, the polymer openings 900 are defined and patterned by light exposure and developing. While for the non-photo-sensitive polymer layer 90, the openings 900 are defined by first coating a photoresist layer over the polymer layer, exposing and developing the photoresist to create openings in the photoresist, wet or dry etching the polymer layer exposed by the photoresist openings, creating openings 900 in the polymer layer 90, and then stripping the photoresist. The width of the polymer openings 900 is between 2 and 1,000 μm, preferred between 5 and 200 μm. In some designs, the polymer layer 90 may be removed in a large with dimension larger than 1,000 μm. The openings 900 are designed in circles, corner-rounded squares, rectangles, or polygons.

The polymer layer 95 is between the passivation layer 5 and the bottom-most over-passivation metal layer 801. Through openings 950 in the polymer layer 95, the signal, power (Vdd or Vcc) and/or ground (Vss) passes between the fine-line metal scheme 6 and the over-passivation metal scheme 80. The process for forming the openings 950 in the polymer layer 95 can be applied to the process for (1) forming the openings 9519, 9519', 9511, 9512 and 9514 in FIG. 3D in the polymer layer 95; (2) forming the openings 9531, 9532 and 9534 in FIG. 7D in the polymer layer 95; (3) forming the openings 9539, 9539', 9531, 9532 and 9534 in FIGS. 10D, 10E, 10G, 10H and 10I in the polymer layer 95; or (4) forming the opening 9549, 9511, 9512 and 9514 in FIG. 14D in the polymer layer 95. The width of the polymer openings 9531, 9532, 9534, 9511, 9512 and 9514, aligned with the passivation openings 531, 532, 534, 511, 512 and 514, respectively, for the internal circuits 20 (including 21, 22, 23 and 24) is between 1 and 300 μm, preferred between 3 and 100 μm. The width of the openings 9519 and 9519', aligned with the openings 519 and 519', respectively, for the voltage regulator or voltage converter 41, the width of the openings 9539 and 9539', aligned with the openings 539 and 539', respectively, for the off-chip circuits 40 (including 42 and 43), or the width of the opening 9549, aligned with the opening 549, respectively, for the ESD circuit 44 may be greater than those of the openings 9531, 9532, 9534, 9511, 9512 and 9514, in a range between 5 and 1,000 μm, preferred 10 and 200 μm. Note that two types of a polymer opening 950 over a passivation opening 50. In a first type of stacked vias, the polymer openings, for example the opening 9531 shown in FIG. 10E, has a width larger than that of the underlying passivation opening 531 shown in FIG. 10E. The opening 9531 exposes a top surface of the passivation layer 5 adjacent to the contact pad 6390 exposed by the opening 531, in addition to exposing the contact pad 6390. In this case, a smaller passivation opening 531 can be formed; hence a smaller contact pad of the top-most fine-line metal layer 60 can be formed. This type of stacked vias allows higher routing density of the top-most fine-line metal layer 60. In a second type of stacked vias, the polymer openings, for example the opening 9539 shown in FIG. 10E, is smaller than the underlying passivation opening 539 shown in FIG. 10E. The polymer layer 95 covers a peripheral region of the contact pad 6390 exposed by the opening 539 and the passivation layer 5, an opening 9531 in the polymer layer 95 exposing a center region of the contact pad 6390 exposed by the opening 539. In this type, the polymer layer 95 covers the sidewall of the passivation openings. The sidewall of the polymer openings provides a gentle, better slope than the slope of the passivation opening sidewall, and resulting in a better step coverage for the subsequent metal sputtering for the adhesion/barrier/seed layer 8011. A better adhesion/barrier metal step coverage is important for the reliability of the chip, since it prevent the inter-metallic compound (IMC) from happening.

The openings 980 in the polymer layer 98 are between two over-passivation metal layers 801 and 802. The process for forming the openings 980 in the polymer layer 98 can be applied to the process for (1) forming the opening 9829 in FIG. 3C in the polymer layer 98; (2) forming the openings 9831 and 9834 in FIG. 7C in the polymer layer 98; (3) forming the openings 9831, 9834 and 9839 in FIGS. 10C and 10E in the polymer layer 98; or (4) forming the opening 9849' in FIG. 14C in the polymer layer 98. The width of the polymer openings 9831 and 9834 for the internal circuits 20 (comprising 21, 22, 23 and 24) is between 1 and 300 nm, preferred between 3 and 100 μm. The width of the polymer opening 9829 for the voltage regulator or voltage converter 41, the width of the polymer opening 9839 for the off-chip circuits 40 (including 42 and 43), or the width of the polymer opening 9849' for the ESD circuit 44 may be greater than those of the openings 9831 and 9834, in a range between 5 and 1,000 μm, preferred 10 and 200 μm.

The opening 990 in the cap polymer layer 99 exposes the pad 8000 of the top-most metal layer 802 for connecting to the external circuits or for the probe contacting in chip testing. The process for forming the openings 990 in the polymer layer 99 can be applied to the process for (1) forming the opening 9919 in FIGS. 3B and 3D in the polymer layer 99; (2) forming the opening 9929 in FIG. 3C in the polymer layer 99; (3) forming the opening 9939 in FIGS. 10B, 10D, 10F, 10G, 10H and 10I in the polymer layer 99; (4) forming the opening 9939' in FIGS. 10C and 10E in the polymer layer 99; (5) forming the opening 9949 in FIGS. 14B and 14D in the polymer layer 99; or (6) forming the opening 9949' in FIG. 14C in the polymer layer 99. There are no openings in the cap polymer layer 99 for the internal circuits 20 (comprising 21, 22, 23 and 24) being connected to an external circuit. The width of the polymer openings 9919 and 9929 for the voltage regulator or voltage converter 41, the width of the polymer openings 9939 and 9939' for the off-chip circuits 40 (comprising 42 and 43), or the width of the polymer openings 9949 and 9949' for the ESD circuit 44, can be in a range between 5 and 1,000 μm, preferred 10 and 200 μm.

The signal, power or ground stimuli in the over-passivation metal layers 80 of the over-passivation scheme 8 is delivered to the internal circuits 20, the voltage regulators or voltage converters 41, the off-chip circuits 40 or the ESD circuits 44 through the fine-line scheme 6. The fine-line metals 631, 632, 634, 639 and 639' shown in FIG. 15A can be composed of stacked via plugs 60', wherein preferably, the upper one may be directly over the lower one. Alternative, the fine-line metal 632 may comprise a local fine-line metal layer 632c shown in FIG. 15A, and as well as in all embodiments of this invention.

The photolithography used to fabricate the over-passivation scheme 8 is significantly different from that of convention IC process. Similarly, the over-passivation photolithography process comprises coating, exposing and developing the photoresist. Two types of photoresist are used to form the over-passivation scheme 8: (1) liquid photoresist, formed by one or multiple spin-on coating, or printing. The liquid photoresist has a thickness between 3 and 60 μm, preferred between 5 and 40 μm; (2) dry-film photoresist, formed by a laminating method. The dry-film photoresist has a thickness between 30 and 300 μm, preferred between 50 and 150 μm. The photoresist can be positive-type or negative-type, preferred positive-type thick photoresist for better resolution. If the polymer is photo-sensitive, the same photolithography process for the photoresist can be applied to pattern the polymer. An aligner or 1× stepper exposes the phoresist. The 1× means that the dimension on a photo mask (usual made of quartz or glass) is reduced on the wafer when light beam is projected from the photo mask onto the wafer, and the dimension of a feature on the photo mask is the same of the dimension on the wafer. The wavelength of the light beam used in the aligner or 1× stepper is 436 nm (g-line), 397 nm (h-line), 365 nm (i-line), g/h-line (combination of g-line and h-line), or g/h/i-line (combination of g-line, h-line and i-line). The g/h-line or g/h/i-line 1x stepper (or 1× aligner) provides strong light intensity for thick photoresist or thick photo-sensitive polymer exposure.

Sine the passivation layer 5 protects underlying MOS transistors and fine-line scheme 6 from the penetration of moisture, sodium or other mobile ions, gold, copper or other transition metals, the over-passivation scheme 8 on conventional IC chip of an IC wafer can be processed in a clean room with Class 10 or less stringent environment, for example Class 100. A Class 100 clean room allows maximum number of particles per cubic foot: 1 larger than 5 μm, 10 larger than 1 μm, 100 larger than 0.5 μm, 300 larger than 0.3 μm, 750 larger than 0.2 μm, 3500 larger than 0.1 μm.

The device layer 2 comprises the internal circuits 20 (comprising 21, 22, 23 and 24) in all embodiments, the regulator or voltage converter 41 in the first embodiment, the off-chip circuits 40 (comprising 42 and 43) in the third embodiment, and the ESD circuit 44 in the fourth embodiment.

An internal circuit or an internal circuit unit 20, comprising 21, 22, 23 and 24, in all embodiments of this invention, is defined as a circuit whose signal nodes are not connected to the external (outside the chip) circuits. If a signal of an internal circuit or internal circuit unit 20 needs to connect to an external circuit, it must go through an off-chip circuit first, for example, ESD circuits, off-chip drivers or off-chip receivers and/or other off-chip I/O circuits, before connecting to the external circuit. In other definition, the internal circuits or the internal circuit units 20 do not comprise off-chip circuits. The internal circuits or internal circuit units 20, comprising 21, 22, 23 and 24, in this invention may in addition to a NOR gate and a NAND gate, be an inverter, an AND gate, an OR gate, an SRAM cell, a DRAM cell, a non-volatile memory cell, a flash memory cell, a EPROM cell, a ROM cell, a magnetic RAM (MRAM) cell, a sense amplifier, an operational amplifier, an adder, a multiplexer, a diplexer, a multiplier, an A/D converter, a D/A converter, or other CMOS, BiCMOS, and/or bipolar circuit, analog circuit, a CMOS sensor cell, or a photo-sensitive diode.

Moreover, an internal circuit or an internal circuit unit 20 can be defined by its peak input or output current, or it can be defined as its MOS transistor size, as discussed in the third embodiment. The off-chip circuits 40, comprising 42, 43, can also be defined by its peak input or output current, or defined as its MOS transistor size, also as discussed in the third embodiment. The definition of the internal circuit 20 and the off-chip circuit 40 apply to all other embodiments in this invention.

In a case, a gate of a MOS device may be connected to another gate of another MOS device through the above mentioned thick and wide metal trace, bus or plane 81, 81P, 82, 83, 83' or 85 over the passivation layer 5. In another case, a gate of a MOS device may be connected to a source of another MOS device through the above mentioned thick and wide metal trace, bus or plane 81, 81P, 82, 83, 83' or 85 over the passivation layer 5. In another case, a gate of a MOS device may be connected to a drain of another MOS device through the above mentioned thick and wide metal trace, bus or plane 81, 81P, 82, 83, 83' or 85 over the passivation layer 5. In another case, a source of a MOS device may be connected to another source of another MOS device through the above mentioned thick and wide metal trace, bus or plane 81, 81P, 82, 83, 83' or 85 over the passivation layer 5. In another case, a source of a MOS device may be connected to a drain of another MOS device through the above mentioned thick and wide metal trace, bus or plane 81, 81P, 82, 83, 83' or 85 over the passivation layer 5. In another case, a drain of a MOS device may be connected to another drain of another MOS device through the above mentioned thick and wide metal trace, bus or plane 81, 81P, 82, 83, 83' or 85 over the passivation layer 5.

In following paragraphs, the dimension of features and electrical characteristics are described and compared between metal lines or metal traces 80, 60 in the over-passivation scheme 8 and in the fine-line scheme 6 for all embodiments in this invention:

(1). Thickness of metal lines, metal traces: Each of the over-passivation metal layers 80 has thickness between 2 and 150 µm, preferred between 3 and 20 µm, while each of the fin-line metal layers 60 has thickness between 0.05 and 2 µm, preferred between 0.2 and 1 µm. For an IC chip designed with embodiments in this invention, the thickness of an over-passivation metal line or metal trace is thicker than the thickness of any fine-line metal lines or metal traces, with the thickness ratio in a range between 2 and 250, preferred between 4 and 20.

(2). Thickness of dielectric layers: Each of the over-passivation dielectric (usually an organic material, such as polymer) layers 90 has thickness between 2 and 150 µm, preferred between 3 and 30 µm, while each of the fine-line dielectric (usually inorganic material, such as oxide or nitride) layers 30 has thickness between 0.05 and 2 µm, preferred between 0.2 and 1 µm. For an IC chip designed with embodiments in this invention, the thickness of an over-passivation dielectric layer 90 (separated by two neighboring metal layers) is thicker than the thickness of any fine-line dielectric layer 30 (separated by two neighboring metal layers), with the thickness ratio in a range between 2 and 250, preferred between 4 and 20.

(3). Sheet resistance and resistance of metal lines or metal traces: Sheet resistance of a metal line or metal trace is computed by dividing metal resistivity by metal thickness. The sheet resistance of a copper (5 µm thick) over-passivation metal line or trace is about 4 mili-ohms per square, while for a gold (4 µm thick) over-passivation metal line or trace is about 5.5 mili-ohms per square. The sheet resistance of an over-passivation metal line, or trace, or plane is in a range between 0.1 and 10 mili-ohms per square, preferred between 1 and 7 mili-ohms per square. The sheet resistance of a sputtered aluminum (0.8 µm thick) fine-line metal line or trace is about 35 mili-ohms per square, while for a damascene copper (0.9 µm thick) fine-line metal line or trace is about 20 mili-ohms per square. The sheet resistance of a fine-line metal line, or trace, or plane is in a range between 10 and 400 mili-ohms per square, preferred between 15 and 100 mili-ohms per square. The resistance per unit length of a metal line or trace is calculated by dividing the sheet resistance by its width. The horizontal design rules (the width) of over-passivation metal lines or traces between 1 and 200 µm, preferred 2 and 50 µm, while the horizontal design rules (the width) of lines or traces between 20 nano-meter and 15 µm, preferred 20 nano-meter and 2 µm. The resistance per mm of an over-passivation metal line or trace is between 2 mili-ohms per mm length and 5 ohms per mm length, preferred between 50 mili-ohms per mm length and 2.5 ohms per mm length. The resistance per mm of a fine-line metal line or trace is between 1 ohm per mm length and 3,000 ohms per mm length, preferred between 500 mili-ohms per mm length and 500 ohms per mm length. For an IC chip designed with embodiments in this invention, the resistance per unit length of an over-passivation metal line or metal trace is smaller than that of any fine-line metal lines or metal traces, with the ratio of resistance per unit length (fine-line to over-passivation) in a range between 3 and 250, preferred between 10 and 30.

Figure 20:
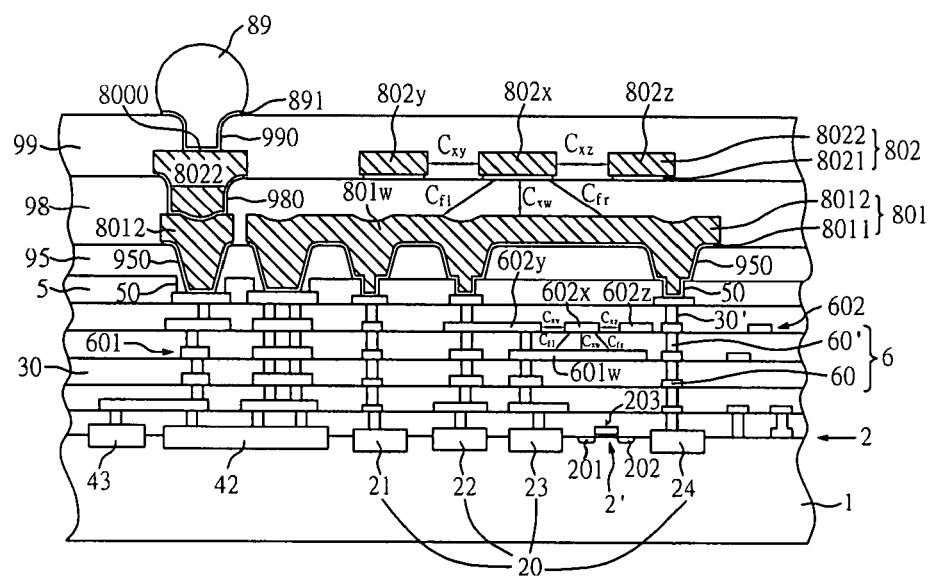
FIG. 20 illustrates models for calculating capacitance per unit length for metal lines or traces in the over-passivation scheme and the fine-line scheme.

(4). Capacitance per unit length of metal lines or metal traces: Capacitance per unit length is related to dielectric types, thickness, and metal line width, spacing, and thickness, and the surrounding metals in horizontal and vertical directions. The dielectric constant of polyimide is about 3.3; the dielectric constant of BCB is about 2.5. FIG. 20 shows an example of a typical over-passivation metal line or trace 802x with two neighboring metal lines or traces 802y and 802z on both sides on the same metal layer 802, and a metal line or trace 801w on a metal layer 801 under the metal layer 802, separating by a polymer layer 98. Similarly, FIG. 20 shows an example of a typical fine-line metal line or trace 602x with two neighboring metal lines or traces 602y and 602z on both sides on the same metal layer 602, and a metal line or trace 601w on a metal layer 601 under the metal layer 602, separating by a dielectric layer 30. The typical capacitance per unit length of the typical metal lines or traces 802x, 602x comprise three components: 1) plate capacitance, Cxw (pF/mm) which is a function of the metal width to dielectric thickness aspect ratio, 2) coupling capacitance, Ccx (=Cxy+Cxz), which is a function of the metal thickness to line spacing aspect ratio, and 3) fringing capacitance, Cfx (=Cfl+Cfr), which is a function of metal thickness, spacing, and dielectric thickness. The capacitance per mm of an over-passivation metal line or trace is between 0.1 pF (pico Farads) per mm length and 2 pF per mm length, preferred between 0.3 pF per mm length and 1.5 pF per mm length. The capacitance per mm of a fine-line metal line or trace is between 0.2 pF per mm length and 4 pF per mm length, preferred between 0.4 pF per mm length and 2 pF per mm length. For an IC chip designed with embodiments in this invention, the capacitance per unit length of an over-passivation metal line or metal trace is smaller than that of any fine-line metal lines or metal traces, with the ratio of capacitance per unit length (fine-line to over-passivation) in a range between 1.5 and 20, preferred between 2 and 10.

(5). RC constant of metal lines or metal traces: The signal propagation time on a metal line or metal trace is computed by the RC delay. Based on the description of previous two paragraphs (3) and (4), the RC delay in an over-passivation metal line or trace is in a range between 0.003 and 10 ps (pico second) per mm length, preferred between 0.25 and 2 ps (pico second) per mm length; while the RC delay in a fine-line metal line or trace is in a range between 10 and 2,000 ps (pico second) per mm length, preferred between 40 and 500 ps (pico second) per mm length. For an IC chip designed with embodiments in this invention, the RC propagation time per unit length of an over-passivation metal line or metal trace is smaller than that of any fine-line metal lines or metal traces, with the ratio of RC propagation delay time per unit length (fine-line to over-passivation) in a range between 5 and 500, preferred between 10 and 30.

FIGS. 15C-15K show the process steps to form the over-passivation scheme 8 on the conventional finished IC chip 10 shown in FIG. 15A or FIG. 15B. Each of the over-passivation metal layers 80 is formed by an embossing process (as contrast to the damascene copper process under the passivation layer 5).

Referring to FIG. 15C, a polymer layer 95 is deposited on the passivation layer 5 and on the metal pads 600 exposed by the passivation openings 50 of the conventional finished IC chip 10. If the polymer layer 95 is in liquid form, it can be deposited by spin-on coating or printing. If the polymer layer 95 is a dry film, the dry film is formed by a laminating method. For a photo-sensitive polymer, the polymer layer 95 is exposed by light of an aligner or a 1× stepper through a photo mask. The polymer layer 95 is developed to form openings 950 in the polymer layer 95. If the polymer is non-photo-sensitive, a conventional photolithography process using a photoresist is required to pattern the openings 950. A hard mask (such as a silicon oxide layer, not shown), with a slow differentiating etch rate during the polymer opening etch, may optionally be deposited on the polymer layer 95 before coating the phoresist. As an alternative, the patterned polymer layer 95 (that is a polymer layer with openings 950) can also be formed by screening printing methods using a metal screen with patterned holes. No exposure and developing are required in the screen-printing method. If the polymer layer 95 is a dry film, as another alternative, holes can be formed in a sheet of dry film before laminated on the wafer. No exposure and developing are required in this alternative.

For example, the polymer layer 95 can be formed by spin-on coating a negative-type photosensitive polyimide layer, containing ester-typer precursor, having a thickness of between 6 and 50 µm on the passivation layer 5 and on the metal pads 600 exposed by the passivation openings 50, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form polyimide openings in the exposed polyimide layer exposing the pads 600, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 µm, and then removing the residual polymeric material or other contaminants from the upper surface of the pads 600 exposed by the polyimide opening with an $O_2$ plasma or a plasma containing fluorine of below 200 PPM and oxygen, such that the polymer layer 95 can be patterned with openings 950 in the polymer layer 95 exposing the pads 600. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

The polymer layer 95 between the bottom-most over-passivation metal layer 801 and the passivation layer 5 planarizes the surface of the passivation layer 5, and decouples the over-passivation metal scheme 80 from the underlying fine-line metal scheme 6, resulting in high electrical performance. In some applications, the polymer layer 95 may be omitted to for cost saving. Note that openings 950 are aligned with the passivation openings 50. Note also that the polymer openings 950 can be either larger or smaller than the passivation openings 50. As an alternative, regards to the starting material of the conventional finished IC chip 10 in FIG. 15A, there are no openings in the passivation layer 5, next the polymer layer 95 is spin coated on the passivation layer 5, followed by forming the openings 950 in the polymer layer 95 exposing the passivation layer 5, and then forming the openings 50 in the passivation layer 5 under the openings 950, exposing the contact pads of the fine-line metal scheme 6. In this option, the polymer openings 950 are about the same size as the openings 50 in the passivation layer 5.

FIGS. 15D-15H show an embossing process to form the first over-passivation metal layer 801 shown in FIG. 15K. Referring to FIG. 15D, an adhesio/barrier/seed layer 8011 is deposited, preferred by sputtering, on the polymer layer 95 and on the metal pads 600 exposed by the openings 950. For the gold metal system, the adhesion/barrier/seed layer 8011 can be formed by sputtering a titanium layer, acting as an adhesion/barrier layer, having a thickness of between 0.02 and 0.8 µm, and preferably of 3,000 Å, on the polymer layer 95 and on the metal pads 600, such as aluminum pads or copper pads, exposed by the openings 950, followed by sputtering a seed layer, made of gold, having a thickness of between 0.005 and 0.7 µm, and preferably of 1,000 Å, on the titanium layer. Alternatively, for the gold metal system, the adhesion/barrier/seed layer 8011 can be formed by sputtering a titanium-tungsten-alloy layer layer, acting as an adhesion/barrier layer, having a thickness of between 0.02 and 0.8 µm, and preferably of 3,000 Å, on the polymer layer 95 and on the metal pads 600, such as aluminum pads or copper pads, exposed by the openings 950, followed by sputtering a seed layer, made of gold, having a thickness of between 0.005 and 0.7 µm, and preferably of 1,000 Å, on the titanium-tungsten-alloy layer. For the copper metal system, the adhesion/barrier/seed layer 8011 can be formed by sputtering a chromium layer, acting as an adhesion/barrier layer, having a thickness of between 0.02 and 0.8 µm, and preferably of 500 Å, on the polymer layer 95 and on the metal pads 600, such as aluminum pads or copper pads, exposed by the openings 950, followed by sputtering a seed layer, made of copper, having a thickness of between 0.005 and 0.7 µm, and preferably of 5,000 Å, on the chromium layer. Alternatively, for the copper metal system, the adhesion/barrier/seed layer 8011 can be formed by sputtering a titanium layer, acting as an adhesion/barrier layer, having a thickness of between 0.02 and preferably of 1,000 Å, on the polymer layer 95 and on the metal pads 600, such as aluminum pads or copper pads, exposed by the openings 950, followed by sputtering a seed layer, made of copper, having a thickness of between 0.005 and 0.7 µm, and preferably of 5,000 Å, on the titanium layer. Alternatively, for the copper metal system, the adhesion/barrier/seed layer 8011 can be formed by sputtering a titanium-tungsten-alloy layer, acting as an adhesion/barrier layer, having a thickness of between 0.02 and 0.8 µm, and preferably of 3,000 Å, on the polymer layer 95 and on the metal pads 600, such as aluminum pads or copper pads, exposed by the openings 950, followed by sputtering a seed layer, made of copper, having a thickness of between 0.005 and 0.7 µm, and preferably of 5,000 Å, on the titanium-tungsten-alloy layer.

FIG. 15E shows a photoresist layer 71 is deposited and patterned on the seed layer of the adhesion/barrier/seed layer 8011. The photoresist layer 71 is spin-on coated, exposed by an aligner or a 1× stepper, and developed to form openings 710 in the photoresist layer 71. The openings 710 defined the metal lines, traces or planes to be formed in the subsequent process, and contacts in the polymer openings 950 and the passivation openings 50. The contacts are over and connected to the exposed fine-line metal pads 600.

For example, the photoresist layer 71 can be formed by spin-on coating a positive-type photosensitive polymer layer on the seed layer of the adhesion/barrier/seed layer 8011, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer with an $O_2$ plasma or a plasma containing fluorine of below 200 PPM and oxygen, such that the photoresist layer 71 can be patterned with openings 710 exposing the seed layer of the adhesion/barrier/seed layer 8011.

Referring to FIG. 15F, a bulk conduction metal layer 8012 can be electroplated and/or electroless plated over the seed layer, exposed by the openings 710 in the photoresist layer 71, of the adhesion/barrier/seed layer 8011. The bulk conduction metal layer 8012 may be a single layer of gold, copper, silver, palladium, platinum, rhodium, ruthenium, rhenium or nickel, or a composite layer made of the abovementioned metals. For example, the bulk conduction metal layer 8012 can be a gold layer with a thickness between 2 and 50 µm, preferred between 2 and 30 µm. Alternatively, the bulk conduction metal layer 8012 can be a copper layer with a thickness between 2 and 200 µm, preferred between 2 and 30 µm.

For example, the bulk conduction metal layer 8012 may be formed by electroplating a gold layer with a thickness of between 2 and 50 µm, and preferably of between 2 and 30 µm, on the seed layer, made of gold, exposed by the openings 710. Alternatively, the bulk conduction metal layer 8012 may be formed by electroplating a copper layer with a thickness of between 2 and 200 µm, and preferably of between 2 and 30 µm, on the seed layer, made of copper, exposed by the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, and then electroplating a gold layer with a thickness of between 0.5 and 10 µm on the copper layer in the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, then electroplating a nickel layer with a thickness of between 0.5 and 5 µm, and preferably of between 1 and 3 µm, on the copper layer in the openings 710, and then electroplating a gold layer with a thickness of between 0.03 and 0.5 µm, and preferably of between 0.05 and 0.1 µm, on the nickel layer in the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, then electroplating a nickel layer with a thickness of between 0.5 and 5 µm, and preferably of between 1 and 3 µm, on the copper layer in the openings 710, and then electroless plating a gold layer with a thickness of between 0.03 and 0.5 µm, and preferably of between 0.05 and 0.1 µm, on the nickel layer in the openings 710. Alternatively, the bulk conduction metal layer 8012 may be formed by electroplating a copper layer with a thickness of between 2 and 30 µm, and preferably of between 3 and 1 µm, on the seed layer, made of copper, exposed by the openings 710, then electroplating a nickel layer with a thickness of between 0.5 and 5 µm, and preferably of between 1 and 3 µm, on the copper layer in the openings 710, and then electroplating a palladium layer with a thickness of between 0.03 and 0.5 µm, and preferably of between 0.05 and 0.1 µm, on the nickel layer in the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, then electroplating a nickel layer with a thickness of between 0.5 and 5 µm, and preferably of between 1 and 3 µm, on the copper layer in the openings 710, and then electroless plating a palladium layer with a thickness of between 0.03 and 0.5 µm, and preferably of between 0.05 and 0.1 µm, on the nickel layer in the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, then electroplating a nickel layer with a thickness of between 0.5 and 5 µm, and preferably of between 1 and 3 µm, on the copper layer in the openings 710, and then electroplating a platinum layer with a thickness of between 0.03 and 0.5 µm, and preferably of between 0.05 and 0.1 µm, on the nickel layer in the openings 710. Alternatively, the bulk conduction metal layer 8012 may be formed by electroplating a copper layer with a thickness of between 2 and 30 µm, and preferably of between 3 and 15 µm, on the seed layer, made of copper, exposed by the openings 710, then electroplating a nickel layer with a thickness of between 0.5 and 5 µm, and preferably of between 1 and 3 µm, on the copper layer in the openings 710, and then electroless plating a platinum layer with a thickness of between 0.03 and 0.5 µm, and preferably of between 0.05 and 0.1 µm, on the nickel layer in the openings 710.

A cap/barrier layer (not shown) can be optionally formed by electroplating or electroless plating over the bulk conduction metal layer 8012. An assembly/contact layer (not shown) can also be further formed, as an option also, over the bulk conduction metal layer 8012 and the cap/barrier layer by electroplating or electroless plating. The assembly/contact layer can be a Au, Pd or Ru layer with thickness between 0.01 and 5 μm.

Referring to FIG. 15G, the phoresist layer 71 is then stripped using an organic solution with amide. However, some residuals from the photoresist layer 71 could remain on the bulk conduction metal layer 8012 and on the seed layer of the adhesion/barrier/seed layer 8011. Thereafter, the residuals can be removed from the bulk conduction metal layer 8012 and from the seed layer of the adhesion/barrier/seed layer 8011 with a plasma, such as $O_2$ plasma or plasma containing fluorine of below 200 PPM and oxygen.

Referring to FIG. 15H, the adhesion/barrier/seed layer 8011 not under the bulk conduction metal layer 8012 is then removed by self-aligned wet and/or dry etching. In the case of wet etching to remove the bottom metal layer 8011 not under the electroplated metal layer 8012, an undercut 8011' with a sidewall of the bottom metal layer 8011 recessed from a sidewall of the elect plated metal layer 8012 is formed. No undercut 8011' exists when an anisotropies dry etching is used to remove the bottom metal layer 8011 not under the electroplated metal layer 8012.

For example, when the seed layer of the adhesion/barrier/seed layer 8011 is a gold layer, it can be etched with an iodine-containing solution, such as solution containing potassium iodide, with an ion milling process or with an Ar sputtering etching process. Alternatively, when the seed layer of the adhesion/barrier/seed layer 8011 is a copper layer, it can be etched with a solution containing $NH_4OH$ or with an Ar sputtering etching process.

For example, when the adhesion/barrier layer of the adhesion/barrier/seed layer 8011 is a titanium-tungsten-alloy layer, it can be etched with a solution containing hydrogen peroxide, with a chlorine-containing plasma etching process or with an RIE process. Alternatively, when the adhesion/barrier layer of the adhesion/barrier/seed layer 8011 is a titanium layer, it can be etched with a solution containing hydrogen fluoride, with a chlorine-containing plasma etching process or with an RIE process. Alternatively, when the adhesion/barrier layer of the adhesion/barrier/seed layer 8011 is a chromium layer, it can be etched with a solution containing potassium ferricyanide.

FIGS. 15I and 15J show repeated process of FIGS. 15C-15H to form the second polymer layer 98 and the second metal layer 802, that is, a polymer layer 98 is formed on the polymer layer 95 and on the first metal layer 801, openings 980 in the polymer layer 98 exposing the bulk conduction metal layer 8012 of the first metal layer 801, followed by forming an adhesion/barrier layer of an adhesion/barrier/seed layer 8021 on the polymer layer 98 and on the bulk conduction metal layer 8012 exposed by the polymer openings 980, followed by forming a seed layer of the adhesion/barrier/seed layer 8021 on the adhesion/barrier layer, followed by forming a photoresist layer on the seed layer, openings in the photoresist layer exposing the seed layer, followed by forming a bulk conduction metal layer 8022 on the seed layer exposed by the openings in the photoresist layer, followed by removing the photoresist layer, followed by removing the adhesion/barrier/seed layer 8021 not under the bulk conduction metal layer 8022. The specification of the polymer layer 98, the adhesion/barrier/seed layer 8021 and the bulk conduction metal layer 8022 shown in FIGS. 15I-15L can be referred to as the specification of the polymer layer 95, the adhesion/barrier/seed layer 8011 and the bulk conduction metal layer 8012 illustrated in FIGS. 15C-15H, respectively. The process of forming the polymer layer 98 shown in FIGS. 15I-15J can be referred to as the process of forming the polymer layer 95 illustrated in FIGS. 15C-15H. The process of forming the adhesion/barrier/seed layer 8021 shown in FIGS. 15I-15J can be referred to as the process of forming the adhesion/barrier/seed layer 8011 illustrated in FIGS. 15C-15H. The process of forming the bulk conduction metal layer 8022 shown in FIGS. 15I-15J can be referred to as the process of forming the bulk conduction metal layer 8012 illustrated in FIGS. 15C-15H.

Processes in FIGS. 15I and 15J can be repeated for the third, fourth, and/or more metal layers. Referring to FIG. 15K, if the over-passivation scheme 8 comprises two metal layers 801 and 802, a cap polymer layer 99 is deposited on the second (now the top-most) over-passivation metal layer 802 and on the second polymer layer 98 not covered by the metal layer 802. Openings 990 are formed in the cap polymer layer 99 to expose over-passivation contact pads 8000 for connecting to external circuits. In some applications, for example, in the Au over-passivation metal system used for the topmost patterned circuit layer 802, the cap polymer layer 99 may optionally be omitted. FIG. 15K shows an IC chip with both the fine-line metal system 6 and the over-passivation metal system 8, with the contact pads 8000 exposed by the openings 990 in the cap polymer layer 99.

The wafer is sawed (diced) into separated chips. The contact pads 8000 of the separated chips can be used for connecting to the external circuits by (1) wires (such as gold wires, aluminum wires or copper wires) of a wirebonding process; (2) bumps (such as gold bumps, copper bumps, solder bumps or other metal bumps) on the other substrates (such as silicon chips, silicon substrates, ceramic substrates, organic substrates, BGA substrates, flexible substrates, flexible tapes or glass substrates). The bumps on the substrates have a height between 1 and 30 μm, preferred between 5 and 20 μm; (3) posts (such as gold posts, copper posts, solder posts or other metal posts) on the other substrates (such as silicon chips, silicon substrates, ceramic substrates, organic substrates, BGA substrates, flexible substrates, flexible tapes or glass substrates). The posts on the substrates have a height between 10 and 200 μm, preferred between 30 and 120 μm; (4) bumps (such as gold bumps, copper bumps, solder bumps or other metal bumps) on the terminals of metal leads of a lead-frames or a flexible tape. The bumps on the metal leads have a height between 1 and 30 μm, preferred between 5 and 20 μm.

In some other applications, a contact structure 89 is formed over the contact pad 8000 for connection to external circuits, as shown in FIG. 15L. An adhesion/barrier layer 891 is formed under the contact structure 89 for adhesion and diffusion barrier purposes. The contact structure 89 can be (1) solder pads (with a thickness between 0.1 μm and 30 μm, preferred between 1 μm and 10 μm), or solder bumps (with a height between 10 μm and 200 μm, preferred between 30 μm and 120 μm) formed by electroplating, or screen printing. A solder reflow process is required to form a ball-shaped solder ball. Solder pads or bumps comprise high lead solder (PbSn, with Pb composition greater than 85% weight percentage), eutectic solder (PbSn, with ~37% Pb weight percentage, and ~63% Sn weight percentage), or lead-free solder comprising SnAg, or SnCuAg. The adhesion/barrier layer 891 under the solder pads or solder bumps 89 comprise a composite layer of Ti/Ni, Ti/Cu/Ni, TiW/Ni, TiW/Cu/Ni, Ti/Ni/Au, Ti/Cu/Ni/Au, TiW/Ni/Au, TiW/Cu/Ni/Au, Ti/Cu/Ni/Pd, TiW/Cu/Ni/Pd, Cr/CrCu, NiV/Cu, NiV/Cu, NiV/Au, Ni/Au, Ni/Pd, all layers are from bottom to top; (2) gold pads (with a thickness between 0.1 μm and 10 μm, preferred between 1 μm and 5 μm), or gold bumps (with a height between 5 μm and 40 μm, preferred between 10 μm and 20 μm) formed by electroplating. An adhesion/barrier layer 891 under the gold pads or gold bumps 89 comprises a composite layer of Ti, TiW, Ta, TaN, Ti/Cu/Ni, TiW/Cu/Ni, all layers are from bottom to top; (3) metal balls formed by ball mounting. The metal ball can be a solder ball, a copper ball with surface coating of a Ni layer, or a copper ball with surface coating of a Ni layer and a solder layer, or a copper ball with surface coating of a Ni layer and a gold layer. A diameter of the metal ball is between 10 μm and 500 μm, preferred between 50 μm and 300 μm. A metal ball can be mounted directly on the surface of the metal pad 8000 exposed by the polymer opening 990, or on the UBM (Under Bump Metal) layer 891. The UBM layer 891 formed for the metal ball mounting comprises a composite layer of Ti/Ni, Ti/Cu/Ni, TiW/Ni, TiW/Cu/Ni, Ti/Ni/Au, Ti/Cu/Ni/Au, TiW/Ni/Au, TiW/Cu/Ni/Au, Ti/Cu/Ni/Pd, TiW/Cu/Ni/Pd, Cr/CrCu, NiV/Cu, NiV/Cu, NiV/Au, Ni/Au, Ni/Pd, all layers are from bottom to top. After the metal ball mounting, a solder reflow process is usually required. After forming the contact structure 89, the chips on the wafer are separated by sawing or dicing for packaging or assembly to connect to external circuits. The assembly methods can be wirebonding (to pads on external organic, ceramic, glass, or silicon substrates, or to leads of a leadframe or a flexible tape), TAB bonding, tape-chip-carrier packaging (TCP), chip-on-glass (COG), chip-on-board (COB), chip-on-film (COF), flip chip on a BGA substrate, chip-on-flex, chip-on-chip stack interconnection or chip-on-Si-substrate stack interconnection.

The emboss process shown in FIGS. 15C to 15K describes a metal layer is formed by only one photoresist patterning process for electroplating a metal layer in an opening in the only one photoresist layer. This type of process is a single-emboss process that means the process comprises one and only one photolithography process before removing the adhesion/barrier/seed layer not under the electroplated metal layer. A double-emboss process can be implemented to form a metal trace and a via plug on the metal trace by electroplating metal layers with different patterns using only one adhesion/barrier/seed layer, while performing two photolithography processes, before removing the adhesion/barrier/seed layer not under an electroplated metal layer. The first photolithography process is performed for defining the pattern of the metal trace, while the second photolithography process is performed for defining the pattern of the via plug. FIGS. 15C-15G and FIGS. 16A-16D show the double-embossing process to form the over-passivation scheme 8 over the conventional IC chip 10 shown in FIG. 15A or FIG. 15B. The double-embossing process has front steps same as the steps shown in FIGS. 15C-15G The steps of FIGS. 16A-16D follow the steps of FIGS. 15C-15G for a double embossing process. In FIG. 15G, the photoresist layer 71 is stripped, leaving the adhesion/barrier/seed layer 8011 not under the bulk conduction metal layer 8012 exposed to the ambient. FIGS. 16A-16L show an example to form an over-passivation scheme 8 for all embodiments in this invention by using a double-embossing process to form the first metal layer 801 and via plugs 898, and using a single embossing to form the top-most metal layer 802.

Figure 16A:
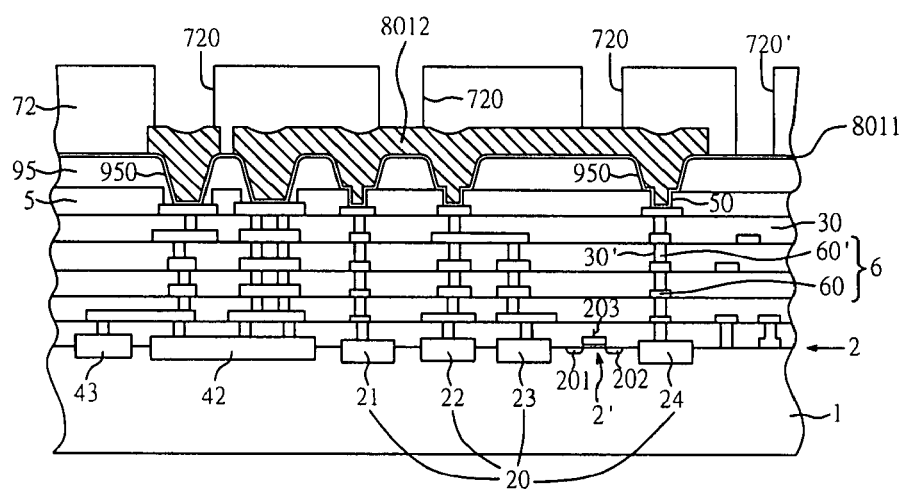
FIG. 16A to FIG. 16L show process steps of forming an over-passivation scheme with two metal layers. The first over-passivation metal layer is formed by a double-embossing process, while the second over-passivation metal layer is formed by a single-embossing (an embossing) process.

FIGS. 15D-15G, a first photolithography and electroplating process is performed to form the first metal layer 801. Starting with the structure in FIG. 15G a second photoresist layer 72 is deposited and patterned on the seed layer of the adhesion/barrier/seed layer 8011 and on the electroplated bulk conduction metal layer 8012, as shown in FIG. 16A. It is noted that openings 720 in the photoresist layer 72 expose the bulk conduction metal layer 8012; openings 720' in the photoresist layer 72 expose the seed layer of the adhesion/barrier/seed layer 8011.

For example, the photoresist layer 72 can be formed by spin-on coating a positive-type photosensitive polymer layer on the seed layer of the adhesion/barrier/seed layer 8011 and on the electroplated bulk conduction metal layer 8012, then exposing the photosensitive polymer layer using a 1× stepper or 1× contact aligner with at least two of G-line having a wavelength ranging from 434 to 438 nm, H-line having a wavelength ranging from 403 to 407 nm, and Mine having a wavelength ranging from 363 to 367 nm, illuminating the photosensitive polymer layer, that is, G-line and H-line, G-line and I-line, H-line and Mine, or G-line, H-line and Mine illuminate the photosensitive polymer layer, then developing the exposed polymer layer, and then removing the residual polymeric material or other contaminants from the seed layer and form the bulk conduction metal layer 8012 with an $O_2$ plasma or a plasma containing fluorine of below 200 PPM and oxygen, such that the photoresist layer 72 can be patterned with the openings 720 and 720' exposing the bulk conduction metal layer 8012 and the seed layer of the adhesion/barrier/seed layer 8011, respectively.

Figure 16B:
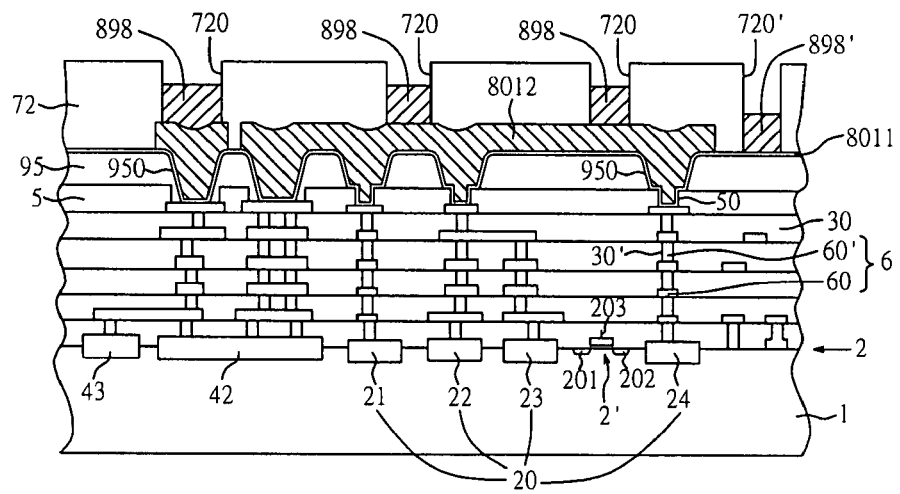

Referring to FIG. 16B, since the seed layer of the adhesion/barrier/seed layer 8011 is not removed, a second electroplating process can be performed to form via plugs 898. Note that a metal piece 898' on the seed layer of the adhesion/barrier/seed layer 8011 is also formed at a horizontal level lower than via plugs 898. The metal piece 898' can be used for packaging purposes. The metal piece 898' may be thinner or thicker than the bulk conduction metal layer 8012. It can be used for higher density interconnection (in case of thinner) or used for lower resistance interconnection (in case of thicker).

The material of the via plug 898 and metal piece 898' may be gold or copper. For example, the via plug 898 and metal piece 898' may be formed by electroplating a gold layer with a thickness of between 1 and 100 μm, and preferably of between 2 and 30 μm, on the gold layer, exposed by the openings 720, of the bulk conduction metal layer 8012, and on the seed layer, made of gold, of the adhesion/barrier/seed layer 8011 exposed by the openings 720'. Alternatively, the via plug 898 and metal piece 898' may be formed by electroplating a copper layer with a thickness of between 1 and 100 μm, and preferably of between 2 and 30 μm, on the copper layer, exposed by the openings 720, of the bulk conduction metal layer 8012, and on the seed layer, made of copper, of the adhesion/barrier/seed layer 8011 exposed by the openings 720'.

Figure 16C:
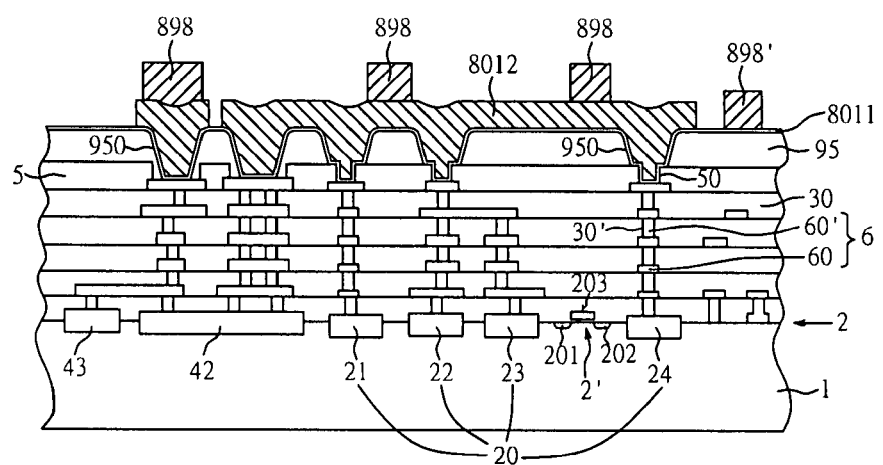

Referring to FIG. 16C, the second photoresist 72 is then removed using an organic solution with amide, exposing the via plugs 898, the bulk conduction metal layer 8012 not under the via plugs 898, the seed layer of the adhesion/barrier/seed layer 8011 not under the bulk conduction metal layer 8012, and the metal piece 898'. However, some residuals from the photoresist layer 72 could remain on the bulk conduction metal layer 8012 and on the seed layer of the adhesion/barrier/seed layer 8011. Thereafter, the residuals can be removed from the seed layer of the adhesion/barrier/seed layer 8011 and from the bulk conduction metal layer 8012 with a plasma, such as $O_2$ plasma or plasma containing fluorine of below 200 PPM and oxygen.

Figure 16D:
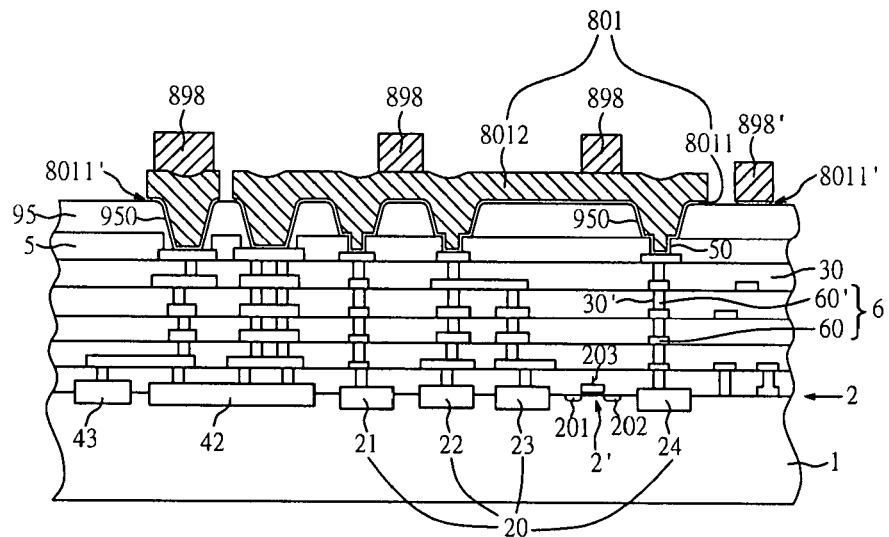

Referring to FIG. 16D, the adhesion/barrier/seed layer 8011 not under the bulk conduction metal layer 8012 and not under the metal piece 898' is removed by wet and/or dry etching. In the case of wet etching to remove the bottom metal layer 8011 not under the electroplated metal layer 8012 and not under the electroplated metal layer 898, an undercut 8011' with a sidewall of the bottom metal layer 8011 recessed from a sidewall of the electroplated metal layer 8012 and with a sidewall of the bottom metal layer 8011 recessed from a sidewall of the electroplated metal layer 898' is formed. No undercut 8011' exists when an anisotropies dry etching is used to remove the bottom metal layer 8011 not under the electroplated metal layer 8012 and not under the electroplated metal layer 898'.

For example, when the seed layer of the adhesion/barrier/seed layer 8011 is a gold layer, it can be etched with an iodine-containing solution, such as solution containing potassium iodide, with an ion milling process or with an Ar sputtering etching process. Alternatively, when the seed layer of the adhesion/barrier/seed layer 8011 is a copper layer, it can be etched with a solution containing $NH_4OH$ or with an Ar sputtering etching process.

For example, when the adhesion/barrier layer of the adhesion/barrier/seed layer 8011 is a titanium-tungsten-alloy layer, it can be etched with a solution containing hydrogen peroxide, with a chlorine-containing plasma etching process or with an RIE process. Alternatively, when the adhesion/barrier layer of the adhesion/barrier/seed layer 8011 is a titanium layer, it can be etched with a solution containing hydrogen fluoride, with a chlorine-containing plasma etching process or with an RIE process. Alternatively, when the adhesion/barrier layer of the adhesion/barrier/seed layer 8011 is a chromium layer, it can be etched with a solution containing potassium ferricyanide.

Figure 16E:
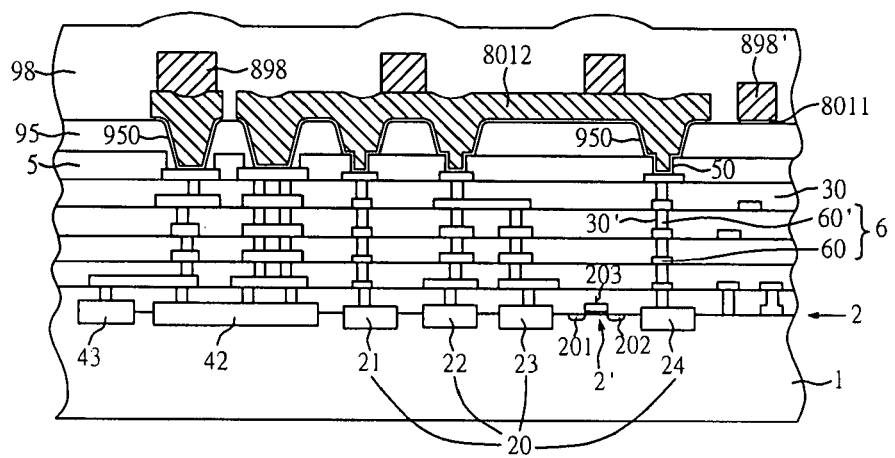

Referring to FIG. 16E, a second polymer layer 98 is deposited on the via plugs 898, on the metal pieces 898', on the metal layer 801 and on the exposed first polymer layer 95. The second polymer layer 98 can be formed by a spin-on coating process, a lamination process or a screen-printing process.

For example, the polymer layer 98 can be formed by spin-on coating a negative-type photosensitive polyimide layer, containing ester-typer precursor, having a thickness of between 6 and 50 μm on the via plugs 898, on the metal pieces 898', on the bulk conduction metal layer 8012 and on the exposed polymer layer 95, then baking the spin-on coated polyimide layer, and then curing or heating the baked polyimide layer at a peak temperature of between 290 and 400° C. for a time of between 20 and 150 minutes in a nitrogen ambient or in an oxygen-free ambient, the cured polyimide layer having a thickness of between 3 and 25 μm. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 16F:
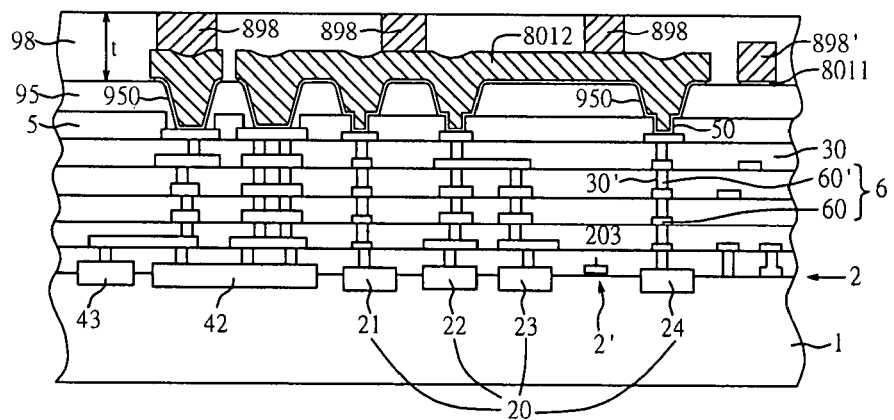
Figure 16G:
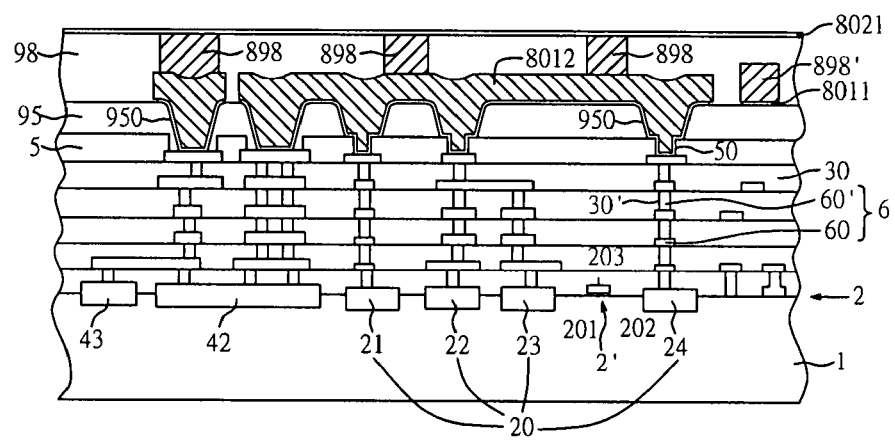
Figure 16H:
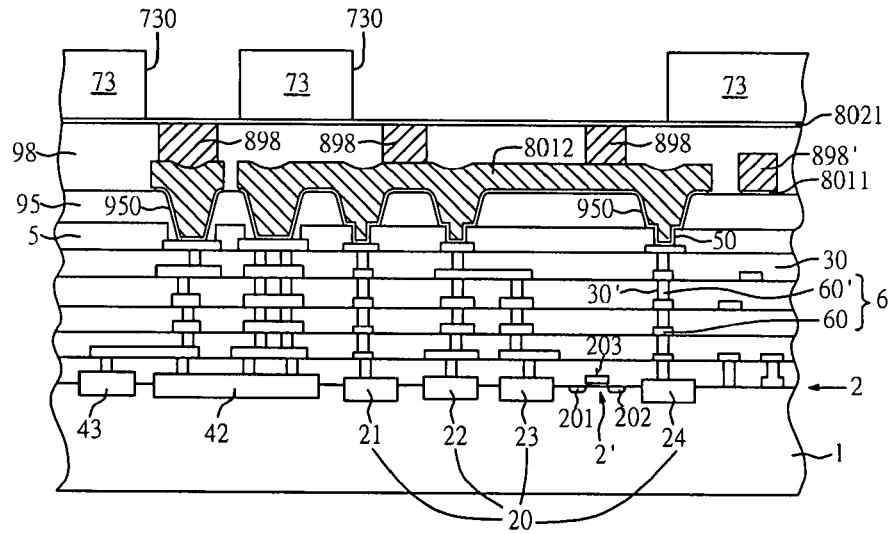

Referring to FIG. 16F, a polishing or mechanical polishing process, and preferably a chemical-mechanical polishing (CMP) process, is used to planarize the surface of the second polymer layer 98, exposing the via plugs 898. The polymer layer 98, after being planarized, may have a thickness t between 5 and 50 micrometers.

FIGS. 16G-16K show process steps to form a second over-passivation metal layer 802 using a single-embossing process same as described in FIGS. 15D-15H, that is, an adhesion/barrier/seed layer 8021 is deposited, preferred by sputtering, on the second polymer layer 98 and on the exposed via plugs 898, followed by forming a photoresist layer 73 on the adhesion/barrier/seed layer 8021, openings 730 in the photoresist layer 73 exposing the seed layer of the adhesion/barrier/seed layer 8021, followed by forming a bulk conduction metal layer 8022 on the seed layer exposed by the openings 730, followed by removing the photoresist layer 73, followed by removing the adhesion/barrier/seed layer 8021 not under the bulk conduction metal layer 8022. The specification of the adhesion/barrier/seed layer 8021 and the bulk conduction metal layer 8022 shown in FIGS. 16G-16K can be referred to as the specification of the adhesion/barrier/seed layer 8011 and the bulk conduction metal layer 8012 illustrated in FIGS. 15D-15K, respectively. The process of forming the adhesion/barrier/seed layer 8021 shown in FIGS. 16G-16K can be referred to as the process of forming the adhesion/barrier/seed layer 8011 illustrated in FIGS. 15D-15K. The process of forming the bulk conduction metal layer 8022 shown in FIGS. 16G-16K can be referred to as the process of forming the bulk conduction metal layer 8012 illustrated in FIGS. 15D-15K.

Figure 16I:
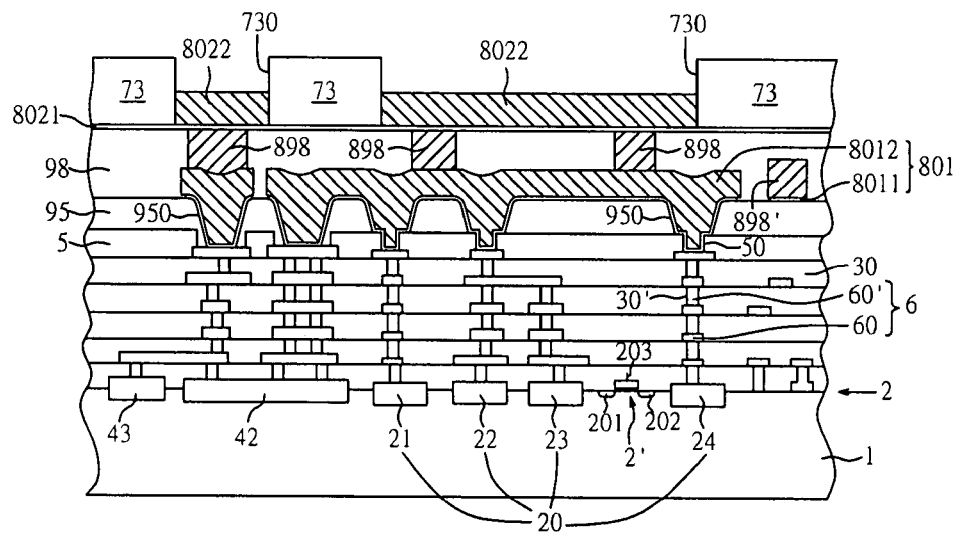
Figure 16J:
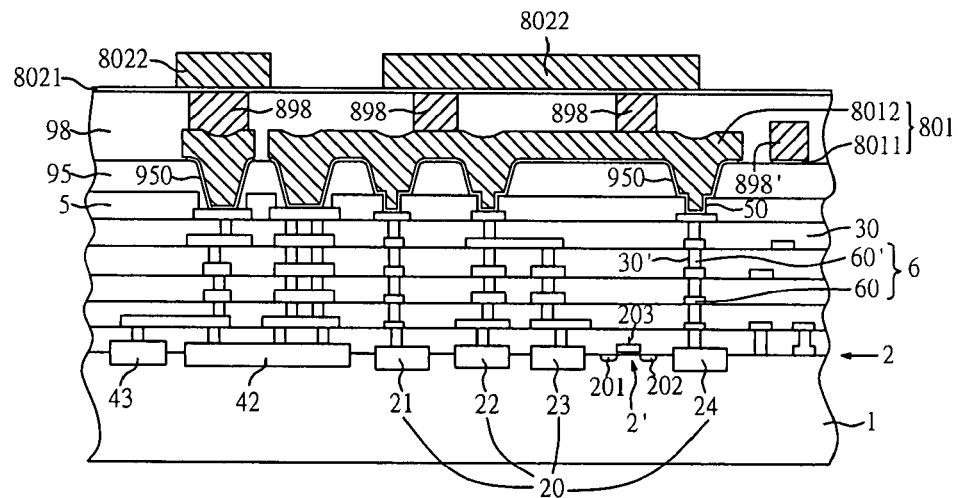
Figure 16K:
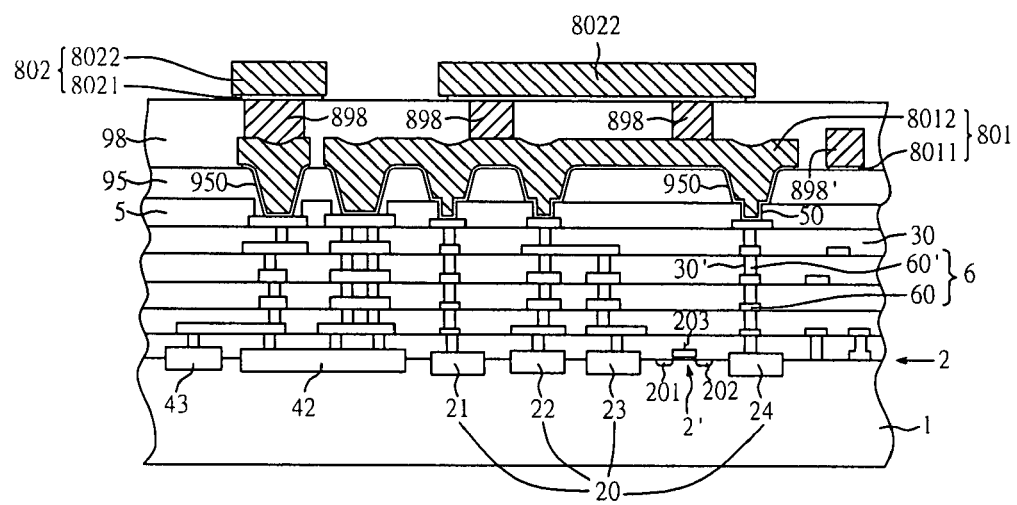
Figure 16L:
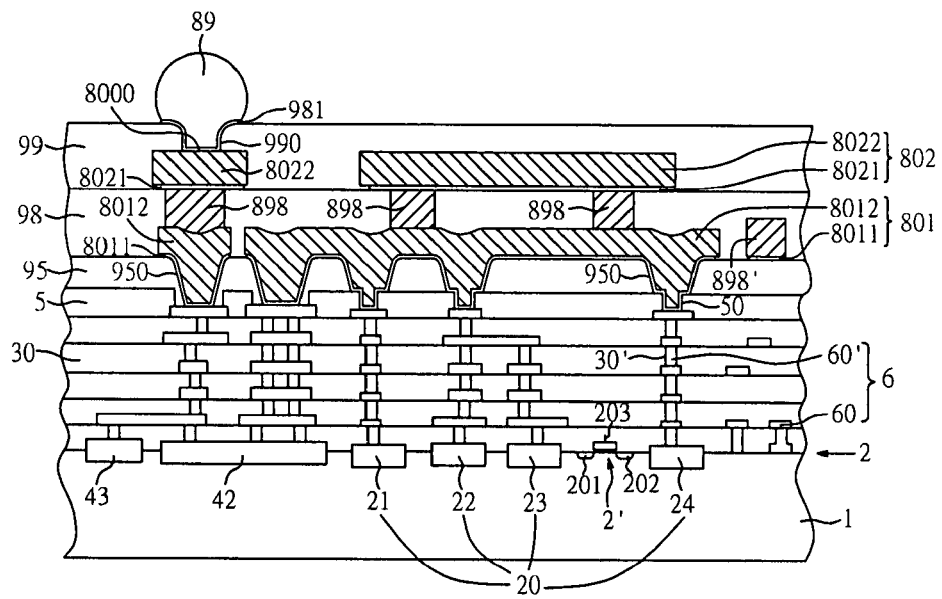

Referring to FIG. 16L, a cap layer 99 is then deposited and patterned to complete a two-metal-layer over-passivation scheme 8. A contact structure 89 illustrated in FIG. 15L can be formed on the exposed metal pad 8000 shown in FIG. 16L for assembly and/or packaging purposes. The specification of the contact structure 89 shown in FIG. 16L can be referred to as the specification of the contact structure 89 illustrated in FIG. 15L. The process of forming the contact structure 89 shown in FIG. 16L can be referred to as the process of forming the contact structure 89 illustrated in FIG. 15L. As an alternative, the double-emboss process steps in FIGS. 15D-15G and 16A-16D for forming the first metal layer 801 and the first via plug 898 can be repeated to form additional metal layer (not shown) on the polymer layer 98 and on the via plugs 898, and to form additional via plug (not shown) on the additional metal layer. In this alternative, the additional via plug can be joined with a wirebonded wire using a wirebonding process, with a solder bump using a ball-mounting process or with a flexible substrate using a TAB process. The description and specification in FIGS. 16A-16L can be applied to forming the thick and wide power metal trace, bus or plane 81 over the passivation layer 5 in the first embodiment, to forming the thick and wide ground metal trace, bus or plane 82 over the passivation layer 5 in the first and fourth embodiments, to forming the thick and wide power metal trace, bus or plane 81P over the passivation layer 5 in the first and fourth embodiments, and to forming the thick and wide signal metal trace, bus or plane 83, 83' or 85 over the passivation layer 5 in the second and third embodiments.

Figure 17A:
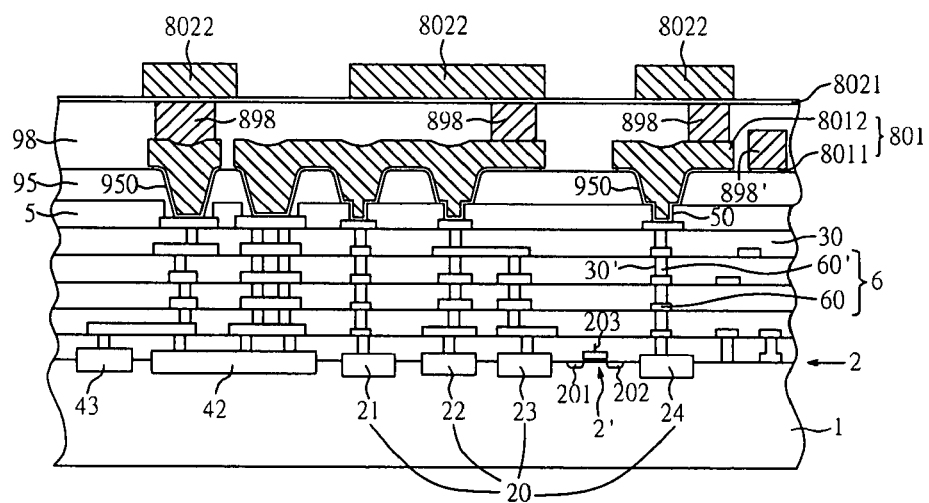
FIG. 17A to FIG. 17J show process steps of forming an over-passivation scheme with three metal layers. The first and second over-passivation metal layers are formed by a double-embossing process, while the third (top-most) over-passivation metal layer is formed by a single-embossing (an embossing) process.

FIGS. 17A to 17J show process steps to form an over-passivation scheme 8 with three metal layers 801, 802 and 803. Metal layers 801 and 802 are formed by a double-emboss process, while the metal layer 803 is formed by a single-emboss process. A first double-embossing process is used to form the first metal layer 801 and the first via plug 898 as described in FIGS. 15D-15G and 16A-16D. A first inter-metal polymer layer 98 is formed and planarized to expose the first via plugs 898, shown in process steps of FIGS. 16E-16F. FIG. 17A is at the same step as FIG. 16J when the first metal layer 801, the first via plugs 898 and the metal piece 898' are formed by a double-emboss metal process, and the inter-metal dielectric polymer layer 98 is formed with the first via plugs 898 being exposed. The design of the first metal layer 801 and the first via plugs 898 in FIG. 17A is slightly different from that in FIG. 16J to accommodate an additional metal layer. The process for forming the bottom metal layer 8021 in FIG. 17A can be referred to as the process for forming the bottom metal layer 8011 in FIG. 15D or the bottom metal layer 8021 in FIG. 16G; the process for forming the metal layer 8022 in FIG. 17A can be referred to as the process for forming the metal layer 8012 in FIG. 15E or the metal layer 8022 in FIGS. 16H-16J. The specification of the adhesion/barrier/seed layer 8021 and the bulk conduction metal layer 8022 shown in FIGS. 17A-17J can be referred to as the specification of the adhesion/barrier/seed layer 8011 and the bulk conduction metal layer 8012 illustrated in FIGS. 15D-

Figure 17B:
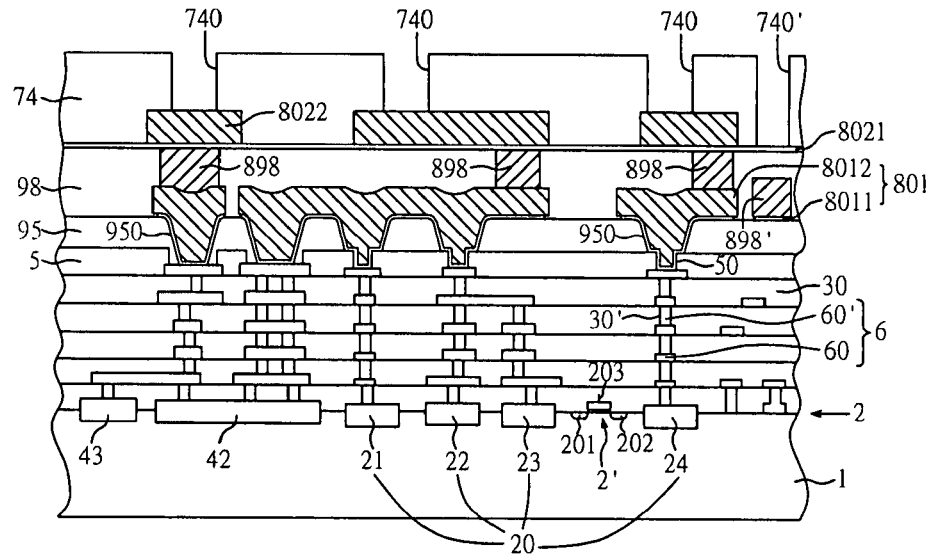

15K, respectively. [0051] Referring to FIG. 17B now, a second photoresist layer 74 is then deposited and patterned to form openings 740 over the bulk conduction metal layer 8022 and/or to optionally form openings 740' directly on the seed layer of the second adhesion/barrier/seed layer 8021.

For example, the photoresist layer 74 can be formed by spin-on coating a positive-type photosensitive polymer layer on the seed layer of the adhesion/barrier/seed layer 8021 and on the bulk conduction metal layer 8022, then exposing the photosensitive polymer layer using a 1× stepper or 1× contact aligner with at least two of G-line having a wavelength ranging from 434 to 438 nm, H-line having a wavelength ranging from 403 to 407 nm, and Mine having a wavelength ranging from 363 to 367 nm, illuminating the photosensitive polymer layer, that is, G-line and H-line, G-line and Mine, H-line and Mine, or G-line, H-line and I-line illuminate the photosensitive polymer layer, then developing the exposed polymer layer, and then removing the residual polymeric material or other contaminants from the seed layer and form the bulk conduction metal layer 8022 with an $O_2$ plasma or a plasma containing fluorine of below 200 PPM and oxygen, such that the photoresist layer 74 can be patterned with the openings 740 and 740' exposing the bulk conduction metal layer 8022 and the seed layer of the adhesion/barrier/seed layer 8021, respectively.

Figure 17C:
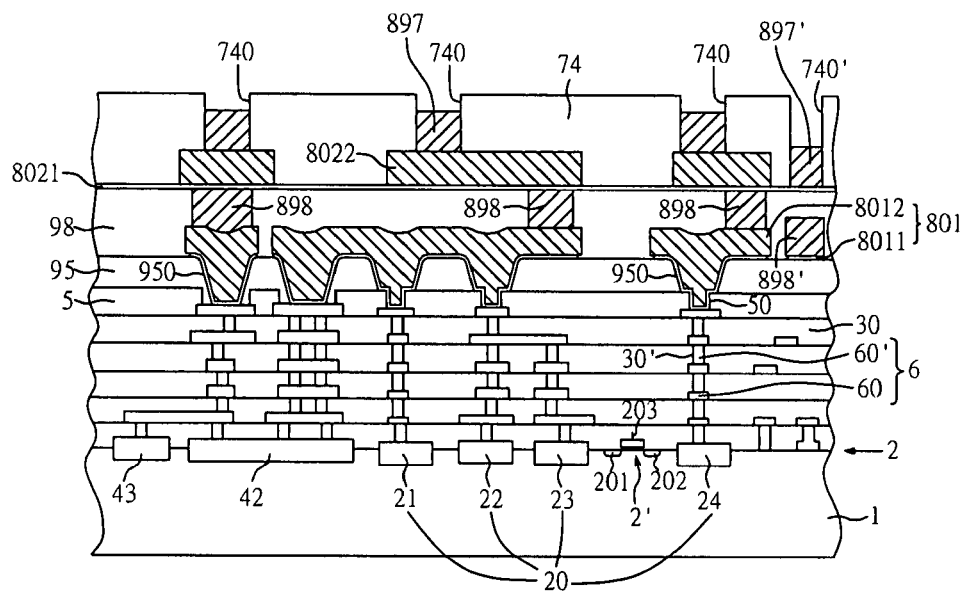

Referring to FIG. 17C, a second via plug layer is electroplated in the photoresist openings 740 and 740' to form the second via plugs 897 and the second metal piece 897'. The second metal piece 897' can be used as described for the first metal piece 989'. The material of the via plug 897 and metal piece 897' may be gold or copper. For example, the via plug 897 and metal piece 897' may be formed by electroplating a gold layer with a thickness of between 1 and 100 µm, and preferably of between 2 and 30 µm, on the gold layer, exposed by the openings 740, of the bulk conduction metal layer 8022, and on the seed layer, made of gold, of the adhesion/barrier/seed layer 8021 exposed by the openings 740'. Alternatively, the via plug 897 and metal piece 897' may be formed by electroplating a copper layer with a thickness of between 1 and 100 µm, and preferably of between 2 and 30 µm, on the copper layer, exposed by the openings 740, of the bulk conduction metal layer 8022, and on the seed layer, made of copper, of the adhesion/barrier/seed layer 8021 exposed by the openings 740'.

Figure 17D:
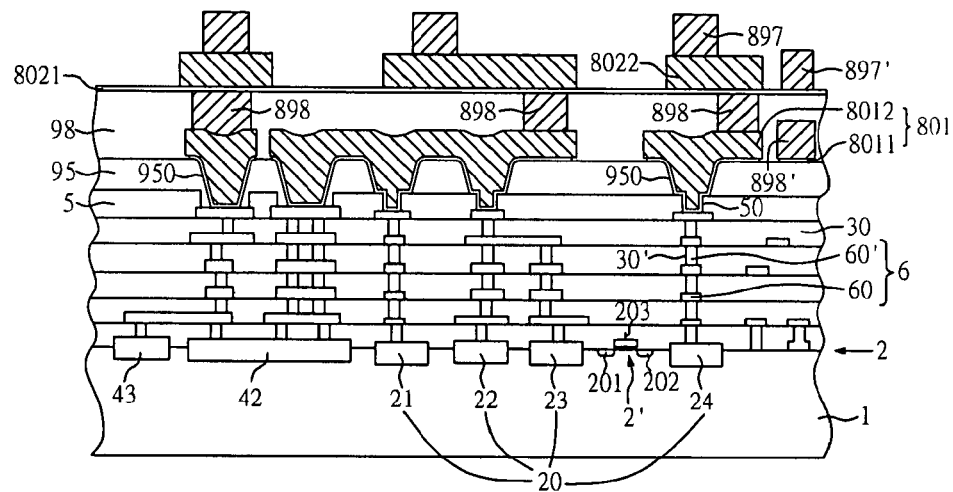

Referring to FIG. 17D, the second photoresist layer 74 is then stripped using an organic solution with amide. However, some residuals from the photoresist layer 74 could remain on the bulk conduction metal layer 8022 and on the seed layer of the adhesion/barrier/seed layer 8021. Thereafter, the residuals can be removed from the bulk conduction metal layer 8022 and from the seed layer with a plasma, such as $O_2$ plasma or plasma containing fluorine of below 200 PPM and oxygen.

Figure 17E:
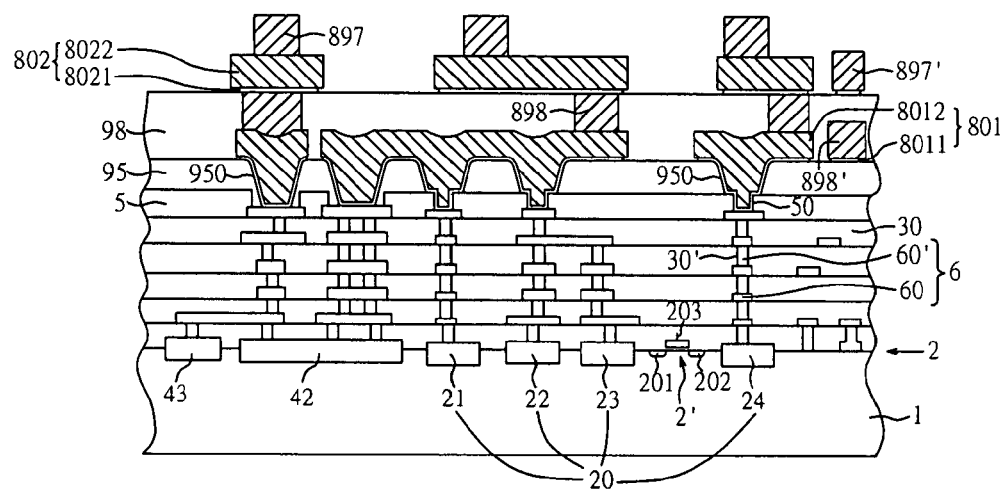

Alternatively, after the bulk conduction metal layer 8022 is formed on the seed layer of the adhesion/barrier/seed layer 8021 exposed by the openings 730 illustrated in FIG. 16I, without removing the photoresist layer 73, the photoresist layer 74 shown in FIG. 17B can be formed on the photoresist layer 73 and on the bulk conduction metal layer 8022. The openings 740 in the photoresist layer 74 expose the bulk conduction metal layer 8022, respectively, for defining the pattern of the via plugs 897. The process for forming the via plugs 897 can be referred to as the above disclosure Finally, the photoresist layers 73 and 74 are removed using an organic solution with amide. However, some residuals from the photoresist layers 73 and 74 could remain on the bulk conduction metal layer 8022, on the via plugs 897 and on the seed layer of the adhesion/barrier/seed layer 8021. Thereafter, the residuals can be removed from the seed layer of the adhesion/barrier/seed layer 8021, from the via plugs 897 and from the bulk conduction metal layer 8022 with a plasma, such as $O_2$ plasma or plasma containing fluorine of below 200 PPM and oxygen. Next, the adhesion/barrier/seed layer 8021 not under the bulk conduction metal layer 8022 can be removed, as mentioned in the above description. [0051] Referring to FIG. 17E, the second adhesion/barrier/seed layer 8021 not under the second bulk conduction metal layer 8022 and not under the second metal piece 987' is removed. The process of removing the second adhesion/barrier/seed layer 8021 not under the second bulk conduction metal layer 8022 and not under the second metal piece 897', as shown in FIG. 17E, can be referred to as the process of removing the first adhesion/barrier/seed layer 8011 not under the first bulk conduction metal layer 8012 and not under the metal piece 898', as illustrated in FIG. 16D.

Figure 17F:
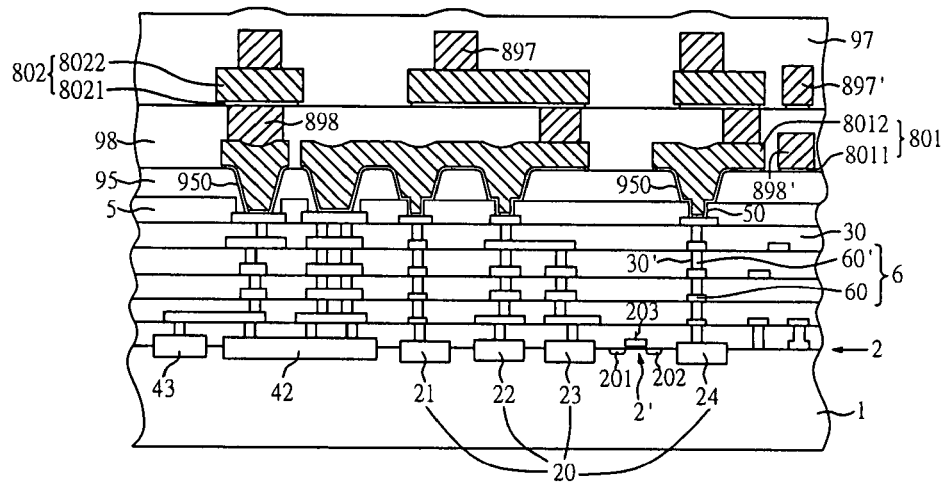
Figure 17G:
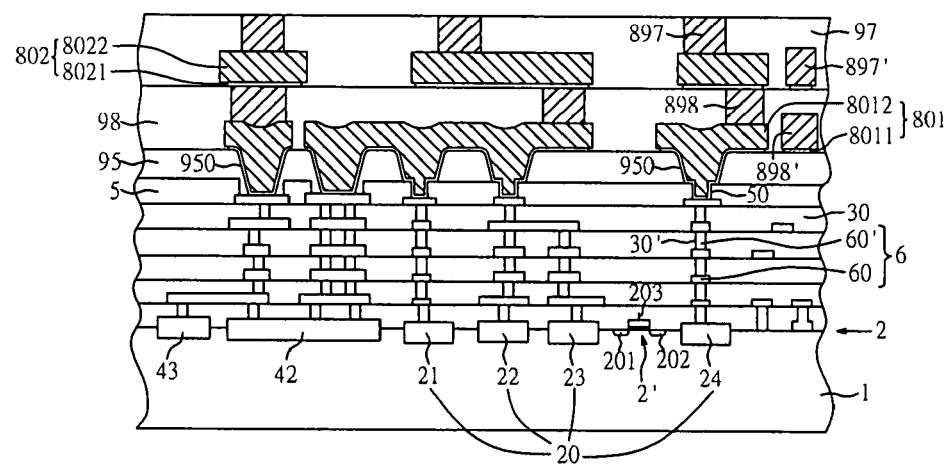

Referring to FIGS. 17F-17G, a second inter-metal dielectric polymer layer 97 is then deposited and planarized to expose the second via plugs 897. The material of the polymer layer 97 may be polyimide (P1), benzocyclobutane (BCB), polyurethane, epoxy resin, a parylene-based polymer, a solder-mask material, an elastomer, silicone or a porous dielectric material. The process for forming the polymer layer 97 in FIG. 17F can be as referred to as the process for forming the polymer layer 98 in FIG. 16E; the process for planarizing the polymer layer 97 in FIG. 17G can be as referred to as the process for planarizing the polymer layer 98 in FIG. 16F.

For example, the polymer layer 97 can be formed by spin-on coating a negative-type photosensitive polyimide layer, containing ester-typer precursor, having a thickness of between 10 and 120 µm on the exposed bulk conduction metal layer 8022, on the via plugs 897, on the metal piece 897' and on the exposed polymer layer 98, then baking the spin-on coated polyimide layer, then curing or heating the baked polyimide layer at a peak temperature of between 290 and 400° C. for a time of between 20 and 150 minutes in a nitrogen ambient or in an oxygen-free ambient, the cured polyimide layer having a thickness of between 5 and 60 µm, and then polishing or mechanical polishing, preferred chemical-mechanical polishing, an upper surface of the polymer layer 97 to uncover the via plugs 897 and to planarize the upper surface thereof. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 17H:
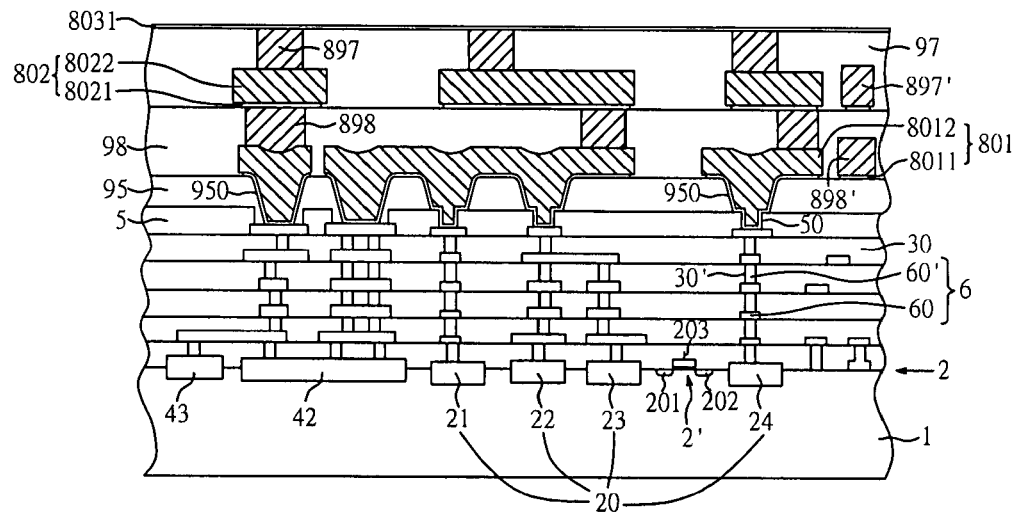
Figure 17I:
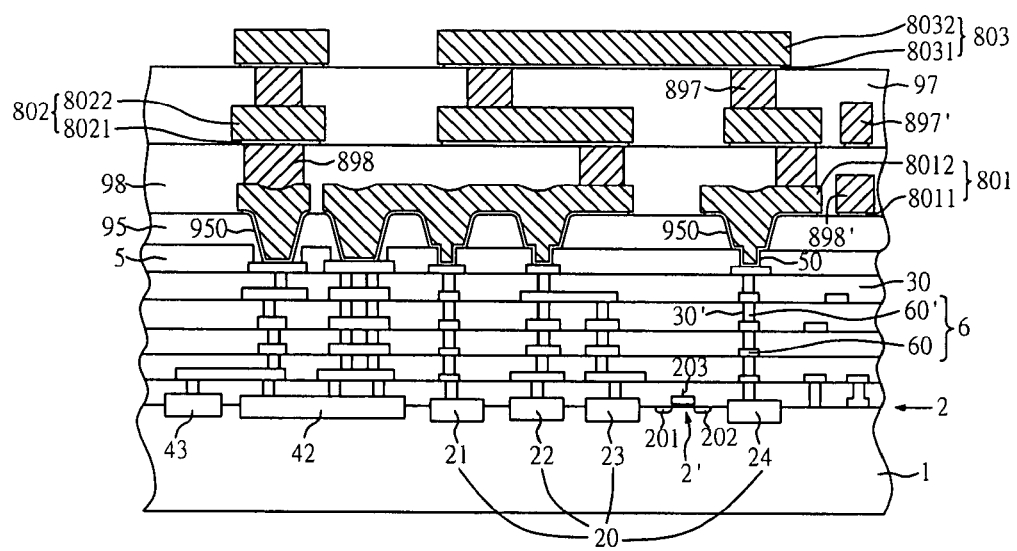

FIGS. 17H and 17I show a single-embossing process is used to form a third metal layer 803 by first depositing an adhesion/barrier/seed layer 8031, depositing and patterning a photoresist layer, electroplating a bulk conduction metal layer 8032, stripping the photoresist layer and self-aligned etch the adhesion/barrier/seed layer 8031. The specification of the adhesion/barrier/seed layer 8031 and the bulk conduction metal layer 8032 shown in FIGS. 17H-17I can be referred to as the specification of the adhesion/barrier/seed layer 8011 and the bulk conduction metal layer 8012 illustrated in FIGS. 15D-15H, respectively. The process of forming the adhesion/barrier/seed layer 8031 shown in FIGS. 17H-17I can be referred to as the process of forming the adhesion/barrier/seed layer 8011 illustrated in FIGS. 15D-15H. The process of forming the bulk conduction metal layer 8032 shown in FIGS. 17H-17I can be referred to as the process of forming the bulk conduction metal layer 8012 illustrated in FIGS. 15D-15H.

Figure 17J:
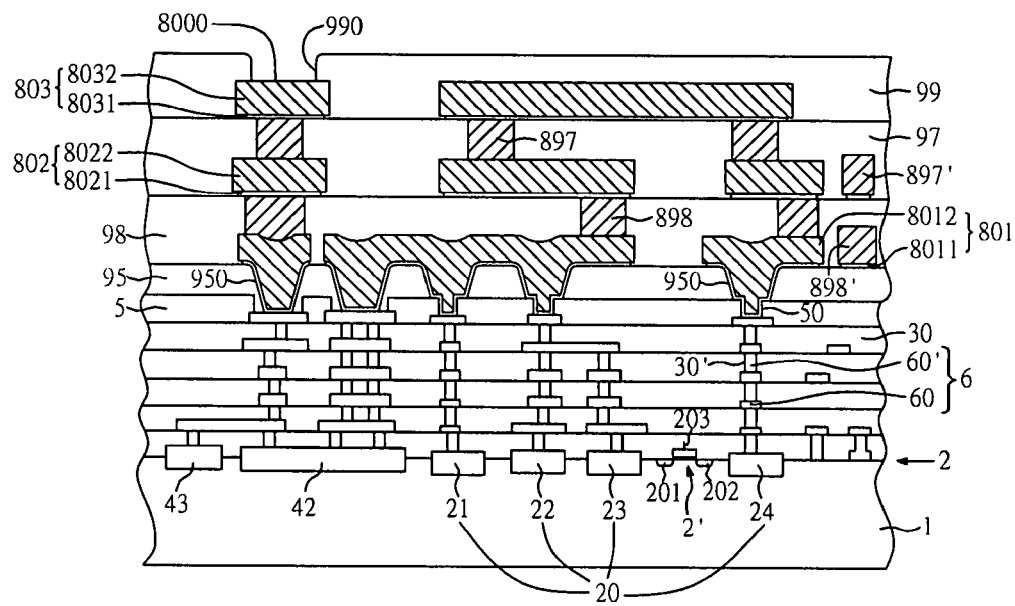

FIG. 17J shows a completed structure by depositing and pattern a cap polymer layer 99 on the exposed polymer layer 97 and on the third metal layer 803, an opening 990 in the cap polymer layer 99 exposing a contact pad 8000 for interconnection to an external circuit.

The polymer layer 99 may be formed by a spin-on coating process, a lamination process or a screen-printing process. The material of the polymer layer 99 may be polyimide (PI), benzocyclobutane (BCB), polyurethane, epoxy resin, a parylene-based polymer, a solder-mask material, an elastomer, silicone or a porous dielectric material.

For example, the polymer layer 99 can be formed by spin-on coating a negative-type photosensitive polyimide layer, containing ester-typer precursor, having a thickness of between 6 and 50 μm on the exposed polymer layer 97 and on the bulk conduction metal layer 8032, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form a polyimide opening in the exposed polyimide layer exposing the pad 8000, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the pad 8000 exposed by the polyimide opening with an $O_2$ plasma or a plasma containing fluorine of below 200 PPM and oxygen, such that the polymer layer 99 can be patterned with an opening 990 in the polymer layer 99 exposing the pad 8000. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

The pad 8000 can be used to be connected to the external circuit via a wirebonding process, a solder bonding process or a tape-automated-bonding (TAB) process, wherein the external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

After the polymer layer 99 and the opening 990 are formed, a semiconductor wafer formed with the over-passivation scheme 8 can be diced into a plurality of individual semiconductor chips.

FIGS. 18A to 18I show another alternative of process steps to form an over-passivation scheme 8 with three metal layers 801, 802 and 803. Metal layers 801 and 803 are formed by a single-emboss process, while the metal layer 802 is formed by a double-emboss process.

Figure 18A:
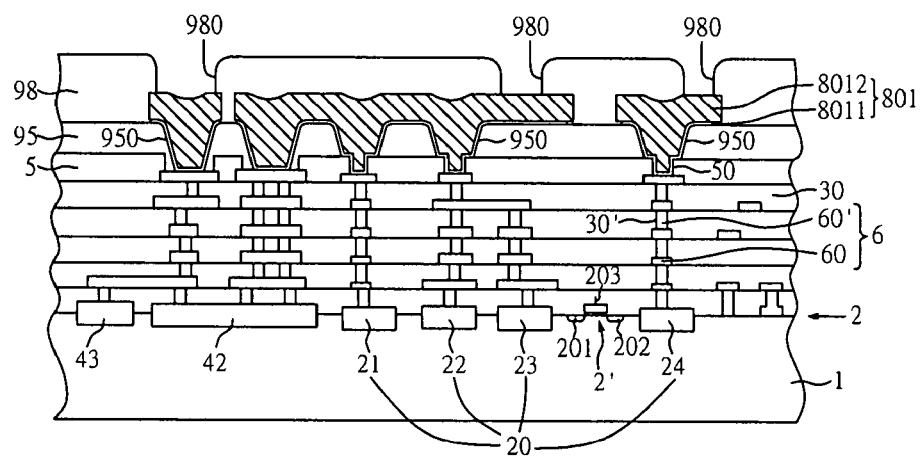
FIG. 18A to FIG. 18I show process steps of forming an over-passivation scheme with three metal layers. The first and third over-passivation metal layers are formed by a single-embossing (an embossing) process, while the second over-passivation metal layer is formed by a double-embossing process.

Referring to FIG. 18A, a first single-embossing process is used to form the first metal layer 801 as described in FIGS. 15D-15H. Next, a first inter-metal polymer layer 98 is deposited and patterned with openings 980 to expose the first metal layer 801, as shown in process step of FIG. 15I. FIG. 18A is at the same process step as FIG. 15I when the first metal layer 801 and the first inter-metal dielectric polymer layer 98 are formed by a single-emboss metal process, and the inter-metal dielectric polymer layer 98 is deposited and patterned with openings 980 exposing the first metal layer 801. The design of the first metal layer 801 and the first inter-metal polymer openings 980 in FIG. 18A is slightly different from that in FIG. 15I to accommodate an additional metal layer. The process steps in FIGS. 18B-18G show a double-embossing process to form a second metal layer 802 and via plugs 897. The specification of the polymer layer 95, the metal layer 801 and the polymer layer 98 shown in FIGS. 18A-18I can be referred to as the specification of the polymer layer 95, the metal layer 801 and the polymer layer 98 illustrated in FIGS. 15C-15K, respectively. The process of forming the polymer layer 95 shown in FIG. 18A can be referred to as the polymer layer 95 illustrated in FIGS. 15C-15K. The process of forming the metal layer 801 shown in FIG. 18A can be referred to as the metal layer 801 illustrated in FIGS. 15C-15K. The process of forming the polymer layer 98 shown in FIG. 18A can be referred to as the polymer layer 98 illustrated in FIGS. 15C-15K.

Figure 18B:
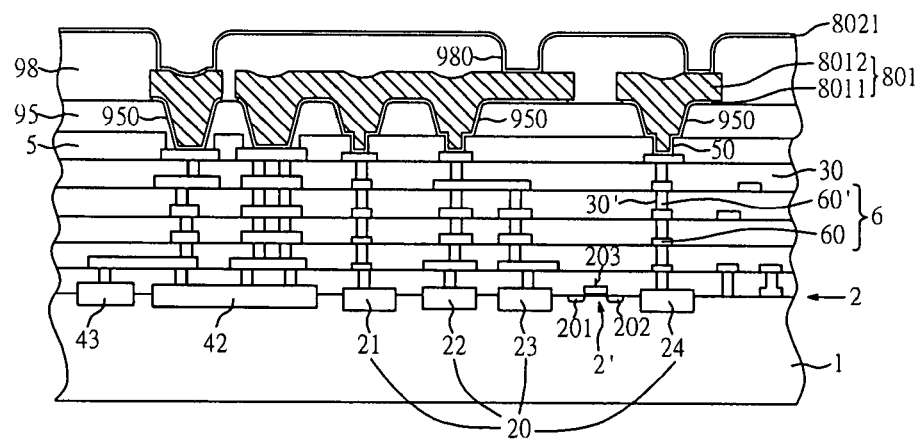

Referring to FIG. 18B, a second adhesion/barrier/seed layer 8021 is deposited on the polymer layer 98 and on the first metal layer 801 exposed by the openings 980. The specification of the second adhesion/barrier/seed layer 8021 shown in FIGS. 18B-18I can be referred to as the specification of the second adhesion/barrier/seed layer 8021 illustrated in FIGS. 15J-15K. The process of forming the second adhesion/barrier/seed layer 8021 shown in FIG. 18B can be referred to as the process of forming the second adhesion/barrier/seed layer 8021 illustrated in FIGS. 15J-15K.

Figure 18C:
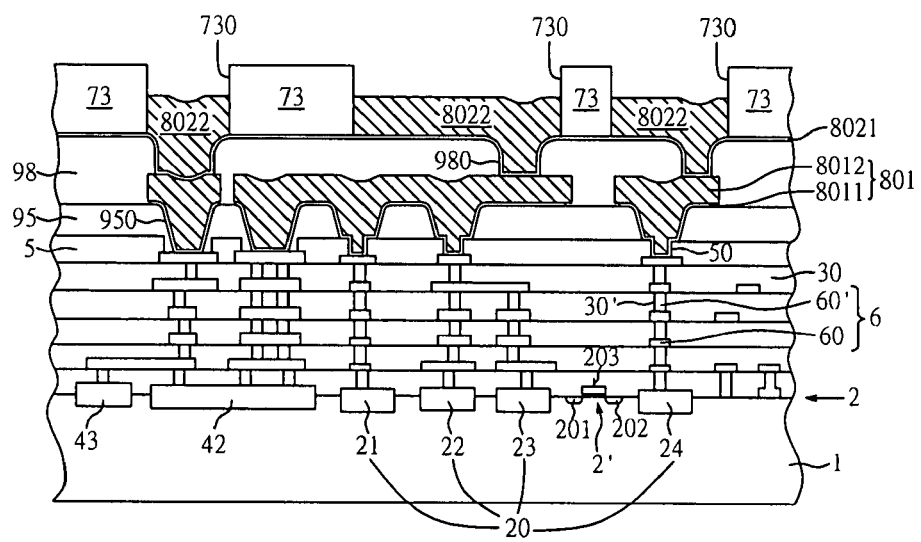

Referring to FIG. 18C, a photoresist layer 73, such as positive-type photoresist layer, is deposited on the seed layer of the second adhesion/barrier/seed layer 8021. Next, the photoresist layer 73 is patterned with exposure and development processes to form openings 730 in the photoresist layer 73 exposing the seed layer of the second adhesion/barrier/seed layer 8021. A 1× stepper or 1× contact aligner can be used to expose the photoresist layer 73 during the process of exposure.

For example, the photoresist layer 73 can be formed by spin-on coating a positive-type photosensitive polymer layer on the seed layer of the second adhesion/barrier/seed layer 8021, then exposing the photosensitive polymer layer using a 1× stepper or 1X contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and I-line, or G-line, H-line and I-line illuminate the photosensitive polymer layer, then developing the exposed polymer layer, and then removing the residual polymeric material or other contaminants from the seed layer with an $O_2$ plasma or a plasma containing fluorine of below 200 PPM and oxygen, such that the photoresist layer 73 can be patterned with openings 730 in the photoresist layer 73 exposing the seed layer.

Next, a bulk conduction layer 8022 can be electroplated and/or electroless plated over the seed layer exposed by the openings 730. The bulk conduction layer 8022 may be a single layer of gold, copper, silver, palladium, platinum, rhodium, ruthenium, rhenium or nickel, or a composite layer made of the abovementioned metals. The specification of the bulk conduction metal layer 8022 shown in FIGS. 18C-18I can be referred to as the specification of the bulk conduction metal layer 8012 illustrated in FIGS. 15F-15K. The process of forming the bulk conduction metal layer 8022 shown in FIGS. 18C-18I can be referred to as the process of forming the bulk conduction metal layer 8012 illustrated in FIGS. 15F-15K.

Figure 18D:
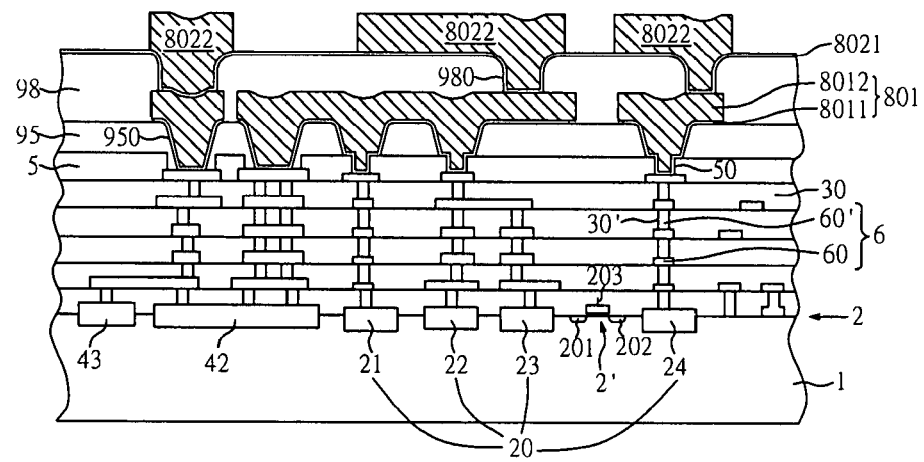

Referring to FIG. 18D, the photoresist layer 73 is then stripped using an organic solution with amide. However, some residuals from the photoresist layer 73 could remain on the bulk conduction metal layer 8022 and on the seed layer of the adhesion/barrier/seed layer 8021. Thereafter, the residuals can be removed from the seed layer of the adhesion/barrier/seed layer 8021 and from the bulk conduction metal layer 8022 with a plasma, such as $O_2$ plasma or plasma containing fluorine of below 200 PPM and oxygen.

Figure 18E:
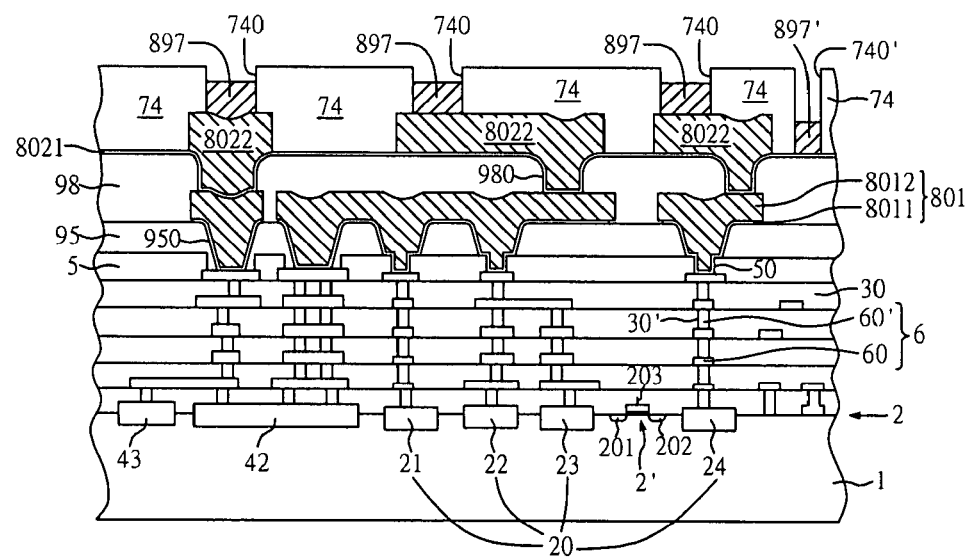

Referring to FIG. 18E, a photoresist layer 74 is then deposited and patterned to form openings 740 over the second bulk conduction metal layer 8022 and/or to optionally form openings 740' directly on the seed layer of the second adhesion/barrier/seed layer 8021. For example, the photoresist layer 74 can be formed by spin-on coating a positive-type photosensitive polymer layer on the seed layer of the adhesion/barrier/seed layer 8021 and on the bulk conduction metal layer 8022, then exposing the photosensitive polymer layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the photosensitive polymer layer, that is, G-line and H-line, G-line and I-line, H-line and Mine, or G-line, H-line and Mine illuminate the photosensitive polymer layer, then developing the exposed polymer layer, and then removing the residual polymeric material or other contaminants from the seed layer and form the bulk conduction metal layer 8022 with an $O_2$ plasma or a plasma containing fluorine of below 200 PPM and oxygen, such that the photoresist layer 74 can be patterned with the openings 740 and 740' exposing the bulk conduction metal layer 8022 and the seed layer of the adhesion/barrier/seed layer 8021, respectively.

Next, a via plug layer is electroplated in the photoresist openings 740 and 740' to form via plugs 897 and metal piece 897'. The metal piece 897' can be used as described for the metal piece 898' in FIG. 16D.

The material of the via plug 897 and metal piece 897' may be gold or copper. For example, the via plug 897 and metal piece 897' may be formed by electroplating a gold layer with a thickness of between 1 and 100 μm, and preferably of between 2 and 30 μm, on the gold layer, exposed by the openings 740, of the bulk conduction metal layer 8022, and on the seed layer, made of gold, of the adhesion/barrier/seed layer 8021 exposed by the openings 740'. Alternatively, the via plug 897 and metal piece 897' may be formed by electroplating a copper layer with a thickness of between 1 and 100 nm, and preferably of between 2 and 30 mm, on the copper layer, exposed by the openings 740, of the bulk conduction metal layer 8022, and on the seed layer, made of copper, of the adhesion/barrier/seed layer 8021 exposed by the openings 740'.

Figure 18F:
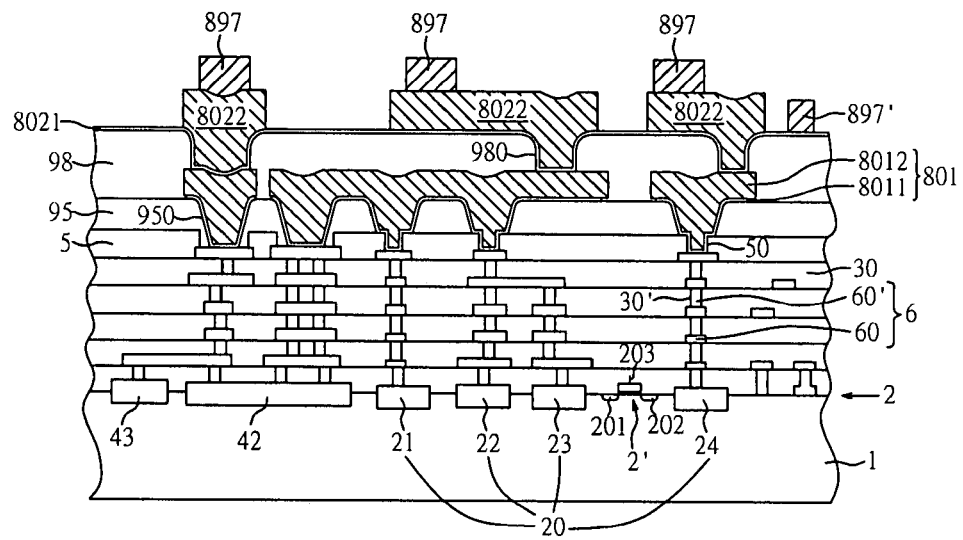

Referring to FIG. 18F, the photoresist layer 74 is then stripped using an organic solution with amide. However, some residuals from the photoresist layer 74 could remain on the exposed bulk conduction metal layer 8022, on the via plugs 897, on the metal piece 897' and on the seed layer of the adhesion/barrier/seed layer 8021. Thereafter, the residuals can be removed from the seed layer, from the via plugs 897, from the metal piece 897' and from the bulk conduction metal layer 8022 with a plasma, such as $O_2$ plasma or plasma containing fluorine of below 200 PPM and oxygen.

Alternatively, after the bulk conduction metal layer 8022 is formed on the seed layer of the adhesion/barrier/seed layer 8021 exposed by the openings 730 illustrated in FIG. 18C, without removing the photoresist layer 73, the photoresist layer 74 shown in FIG. 18E can be formed on the photoresist layer 73 and on the bulk conduction metal layer 8022. The openings 740 in the photoresist layer 74 expose the bulk conduction metal layer 8022, respectively, for defining the pattern of the via plugs 897. The process for forming the via plugs 897 can be referred to as the above disclosure Finally, the photoresist layers 73 and 74 are removed using an organic solution with amide. However, some residuals from the photoresist layers 73 and 74 could remain on the bulk conduction metal layer 8022, on the via plugs 897 and on the seed layer of the adhesion/barrier/seed layer 8021. Thereafter, the residuals can be removed from the seed layer of the adhesion/barrier/seed layer 8021, from the via plugs 897 and from the bulk conduction metal layer 8022 with a plasma, such as $O_2$ plasma or plasma containing fluorine of below 200 PPM and oxygen. Next, the adhesion/barrier/seed layer 8021 not under the bulk conduction metal layer 8022 can be removed, as mentioned in the above description.

Figure 18G:
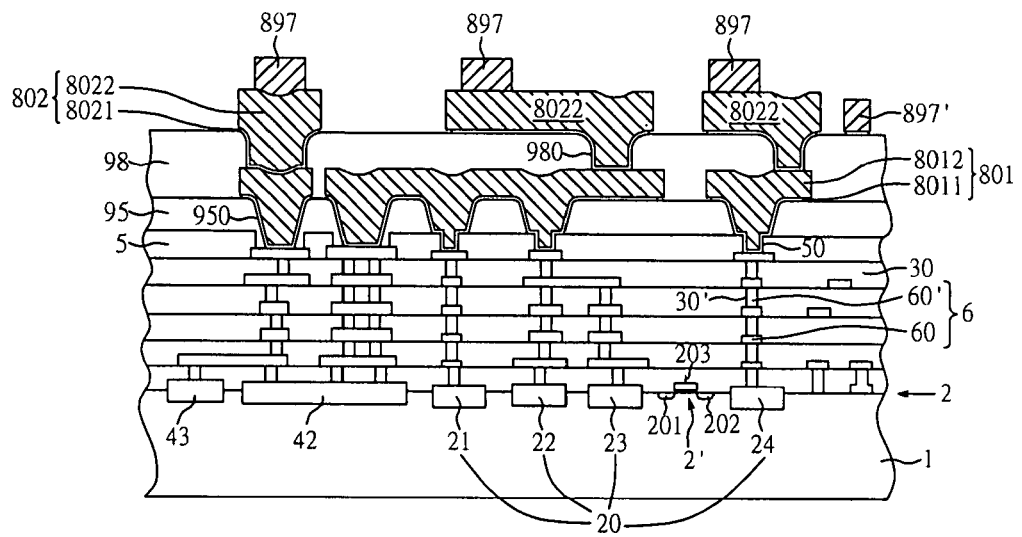

Referring to FIG. 18G, the adhesion/barrier/seed layer 8021 not under the bulk conduction metal layer 8022 and not under the metal piece 897' can be removed. The process of removing the adhesion/barrier/seed layer 8021 not under the bulk conduction metal layer 8022 and not under the second metal piece 897', as shown in FIG. 18G, can be referred to as the process of removing the adhesion/barrier/seed layer 8011 not under the bulk conduction metal layer 8012 and not under the metal piece 898', as illustrated in FIG. 16D.

Figure 18H:
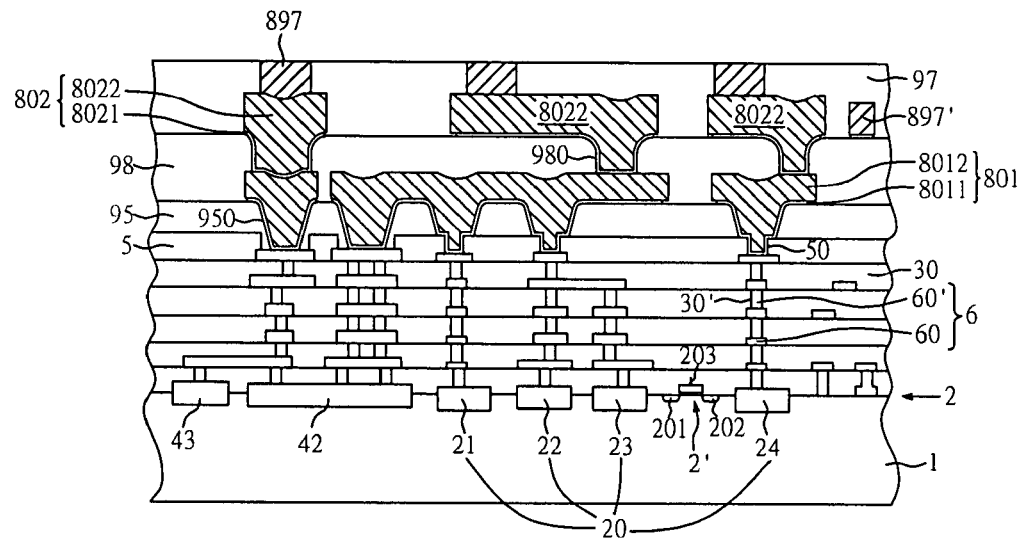

Referring to FIG. 18H, a second inter-metal dielectric polymer layer 97 is then deposited and planarized to expose the second via plugs 897. The material of the polymer layer 97 may be polyimide (PI), benzocyclobutane (BCB), polyurethane, epoxy resin, a parylene-based polymer, a solder-mask material, an elastomer, silicone or a porous dielectric material.

For example, the polymer layer 97 can be formed by spin-on coating a negative-type photosensitive polyimide layer, containing ester-typer precursor, having a thickness of between 10 and 120 μm on the exposed bulk conduction metal layer 8022, on the via plugs 897, on the metal piece 897' and on the exposed polymer layer 98, then baking the spin-on coated polyimide layer, then curing or heating the baked polyimide layer at a peak temperature of between 290 and 400° C. for a time of between 20 and 150 minutes in a nitrogen ambient or in an oxygen-free ambient, the cured polyimide layer having a thickness of between 5 and 60 μm, and then polishing or mechanical polishing, preferred chemical-mechanical polishing, an upper surface of the polymer layer 97 to uncover the via plugs 897 and to planarize the upper surface thereof. Alternatively, the baked polyimide layer can be cured or heated at a temperature between 150 and 290° C., and preferably of between 260 and 280° C., for a time of between 20 and 150 minutes in a nitrogen ambient or in an oxygen-free ambient.

Figure 18I:
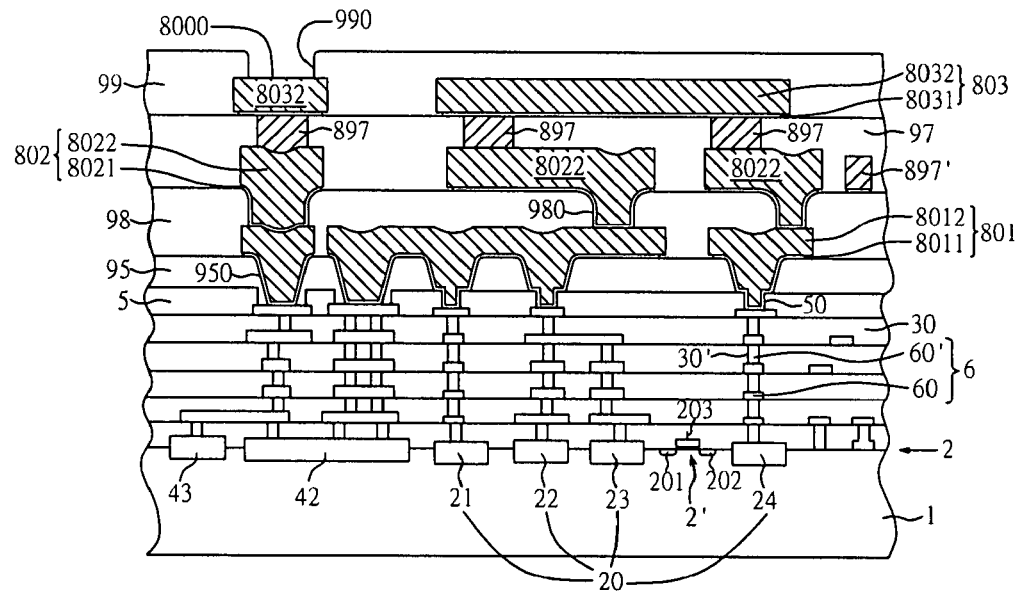

FIG. 18I shows a completed structure by first forming the third metal layer 803 is formed by a single-embossing process as described in FIGS. 17H-17I. Next, a cap polymer layer 99 is spin coated on the patterned circuit layer 803, and an opening 990 is formed in the cap polymer layer 99 to expose a contact pad 8000 for interconnection to an external circuit. The specification of the adhesion/barrier/seed layer 8031 and the bulk conduction metal layer 8032 shown in FIG. 18I can be referred to as the specification of the adhesion/barrier/seed layer 8011 and the bulk conduction metal layer 8012 illustrated in FIGS. 15D-15H, respectively. The process of forming the adhesion/barrier/seed layer 8031 shown in FIG. 18I can be referred to as the process of forming the adhesion/barrier/seed layer 8011 illustrated in FIGS. 15D-15H. The process of forming the bulk conduction metal layer 8032 shown in FIG. 18I can be referred to as the process of forming the bulk conduction metal layer 8012 illustrated in FIGS. 15D-15H. The specification of the polymer layer 99 shown in FIG. 18I can be referred to as the specification of the polymer layer 99 illustrated in FIG. 17J. The process of forming the polymer layer 99 shown in FIG. 18I can be referred to as the process of forming the polymer layer 99 and the opening 990 illustrated in FIG. 17J.

The pad 8000 can be used to be connected to the external circuit via a wirebonding process, a solder bonding process or a tape-automated-bonding (TAB) process, wherein the external circuit may be another semiconductor chip, a flexible substrate comprising a polymer layer (such as polyimide) having a thickness of between 30 and 200 μm and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate.

After the polymer layer 99 and the opening 990 are formed, a semiconductor wafer formed with the over-passivation scheme 8 can be diced into a plurality of individual semiconductor chips. [0431] FIGS. 19A to 19I show another alternative of process steps to form an over-passivation scheme 8 with two metal layers 801 and 802. The metal layer 801 is formed by a double-emboss process, while the metal layer 802 is formed by a single-emboss process.

Figure 19A:
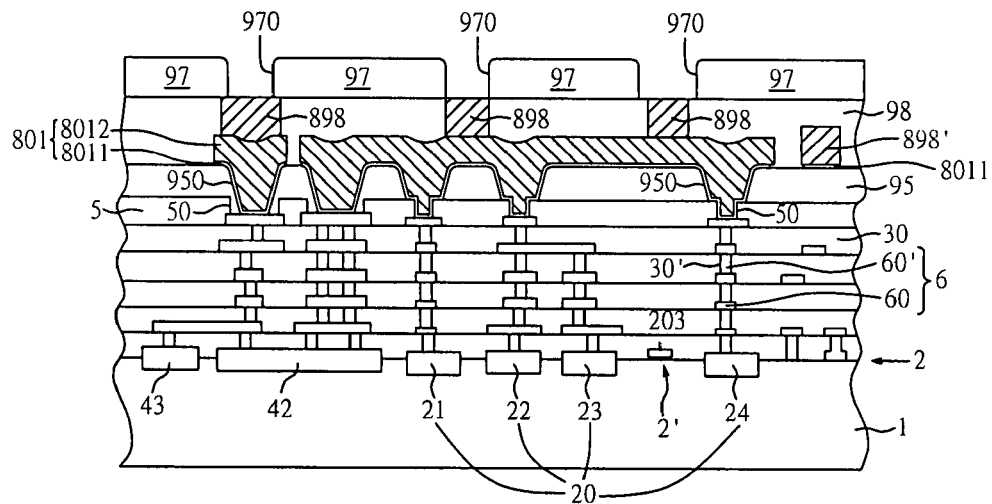
FIG. 19A to FIG. 19I show process steps of forming an over-passivation scheme with two metal layers. The first over-passivation metal layer is formed by a double-embossing process, while the second (top-most) over-passivation metal layer is formed by a single-embossing (an embossing) process.
Figure 19B:
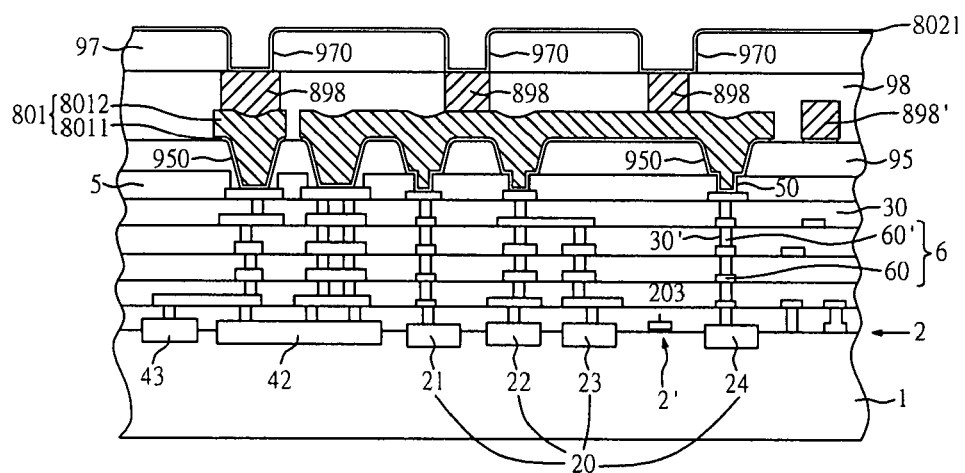

Referring to FIG. 19A, after the process steps of FIGS. 15C-15G and 16A-16F for forming the polymer layer 95, the openings 950, the metal layer 801, the via plugs 898, the metal pieces 898' and the polymer layer 98 are completed, a polymer layer 97 can be formed on the polymer layer 98, multiple openings 970 in the polymer layer 97 exposing the via plugs 898. The material of the polymer layer 97 may be polyimide (P1), benzocyclobutane (BCB), polyurethane, epoxy resin, a parylene-based polymer, a solder-mask material, an elastomer, silicone or a porous dielectric material.

For example, the polymer layer 97 can be formed by spin-on coating a negative-type photosensitive polyimide layer, containing ester-typer precursor, having a thickness of between 6 and 50 μm on the polymer layer 98 and on the exposed via plugs 898, then baking the spin-on coated polyimide layer, then exposing the baked polyimide layer using a 1× stepper or 1× contact aligner with at least two of G-line having a wavelength ranging from 434 to 438 nm, H-line having a wavelength ranging from 403 to 407 nm, and I-line having a wavelength ranging from 363 to 367 nm, illuminating the baked polyimide layer, that is, G-line and H-line, G-line and I-line, H-line and I-line, or G-line, H-line and I-line illuminate the baked polyimide layer, then developing the exposed polyimide layer to form polyimide openings in the exposed polyimide layer exposing the exposed via plugs 898, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the via plugs 898 exposed by the polyimide openings with an $O_2$ plasma or a plasma containing fluorine of below 200 PPM and oxygen, such that the polymer layer 97 can be patterned with openings 970 exposing the via plugs 898. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient. [0051] Referring to FIG. 19B, an adhesion/barrier/seed layer 8021 is deposited, preferred by sputtering, on the polymer layer 97 and on the via plugs 898 exposed by the openings 970. Alternatively, the adhesion/barrier/seed layer 8021 can be formed by a process including a vapor deposition method, an evaporation method, a CVD method, an electroless plating method or a PVD method. The specification of the adhesion/barrier/seed layer 8021 shown in FIGS. 19B-19I can be referred to as the specification of the adhesion/barrier/seed layer 8011 illustrated in FIGS. 15D-15K. The process of forming the adhesion/barrier/seed layer 8021 shown in FIG. 19B can be referred to as the process of forming the adhesion/barrier/seed layer 8011 illustrated in FIGS. 15D-15K.

Figure 19C:
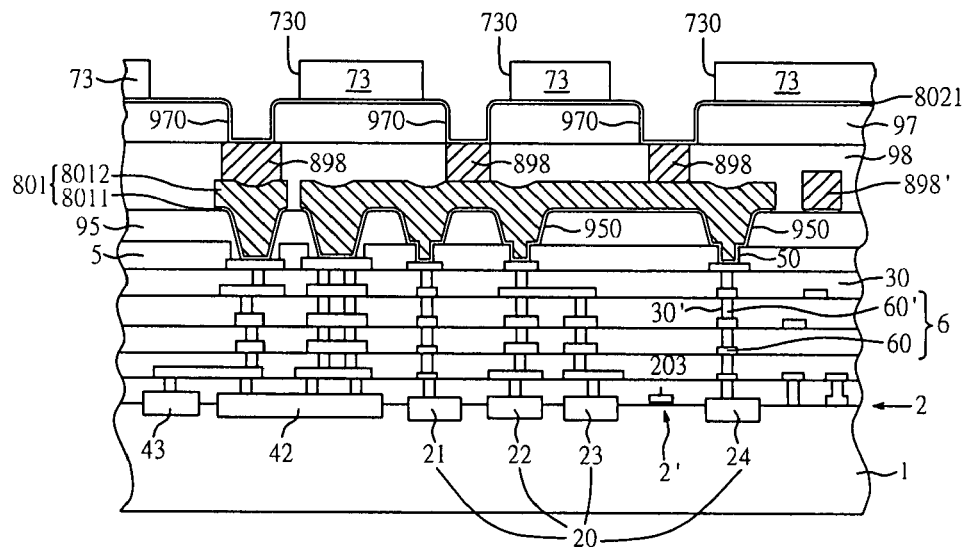

Referring to FIG. 19C, a photoresist layer 73, such as positive-type photoresist layer, is formed on the adhesion/barrier/seed layer 8021. Next, the photoresist layer 73 is patterned with exposure and development processes to form openings 730 in the photoresist layer 73 exposing the adhesion/barrier/seed layer 8021. A 1× stepper or 1× contact aligner can be used to expose the photoresist layer 730 during the process of exposure. The process of forming the photoresist layer 73 and the openings 730 in the photoresist layer 73 shown in FIG. 19C can be referred to as the process of forming the photoresist layer 73 and the openings 730 in the photoresist layer 73 illustrated in FIG. 18C.

Figure 19D:
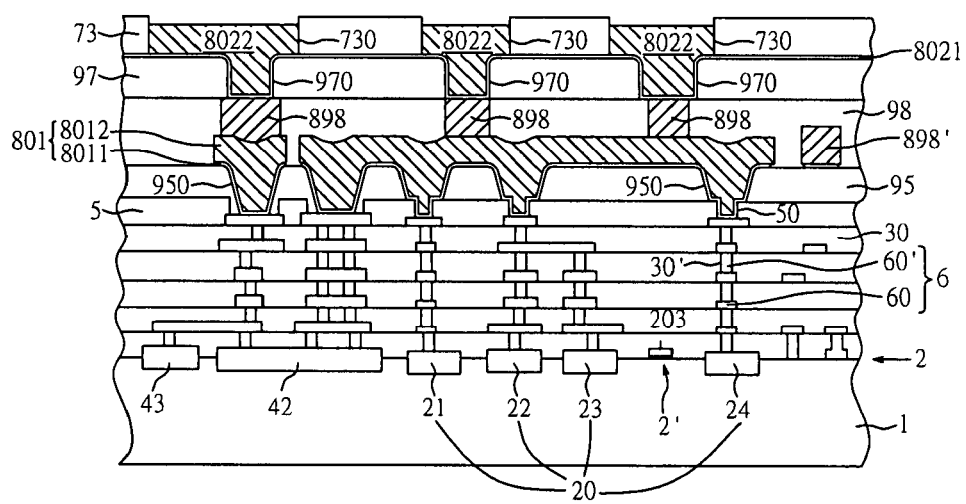

Referring to FIG. 19D, a bulk conduction metal layer 8022 can be electroplated and/or electroless plated over the adhesion/barrier/seed layer 8021 exposed by the openings 730. The bulk conduction layer 8022 may be a single layer of gold, copper, silver, palladium, platinum, rhodium, ruthenium, rhenium or nickel, or a composite layer made of the abovementioned metals. The specification of the bulk conduction metal layer 8022 shown in FIGS. 19D-19I can be referred to as the specification of the bulk conduction metal layer 8012 illustrated in FIGS. 15F-15K. The process of forming the bulk conduction metal layer 8022 shown in FIG. 19D can be referred to as the process of forming the bulk conduction metal layer 8012 illustrated in FIGS. 15F-15K.

Figure 19E:
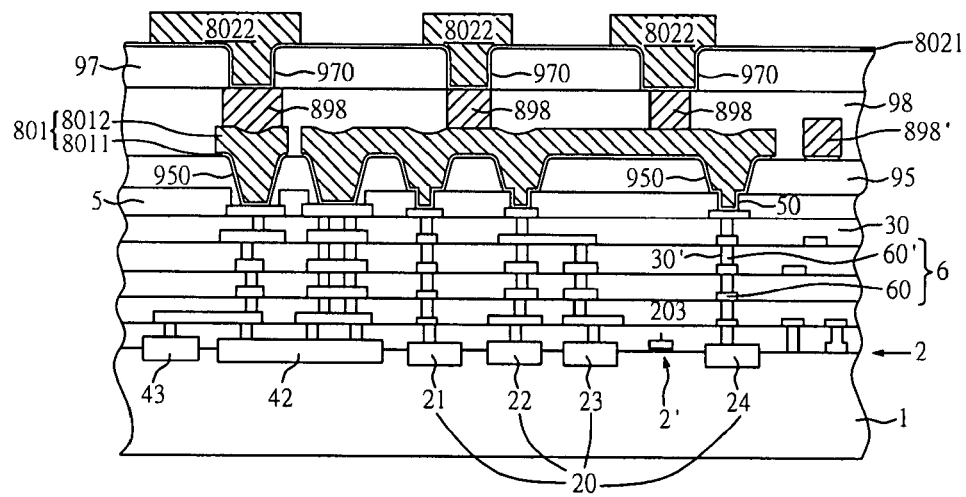

Referring to FIG. 19E, after the bulk conduction metal layer 8022 is formed, most of the photoresist layer 73 can be removed using an organic solution with amide. However, some residuals from the photoresist layer 73 could remain on the bulk conduction metal layer 8022 and on the seed layer of the adhesion/barrier/seed layer 8021. Thereafter, the residuals can be removed from the bulk conduction metal layer 8022 and from the seed layer with a plasma, such as $O_2$ plasma or plasma containing fluorine of below 200 PPM and oxygen.

Figure 19F:
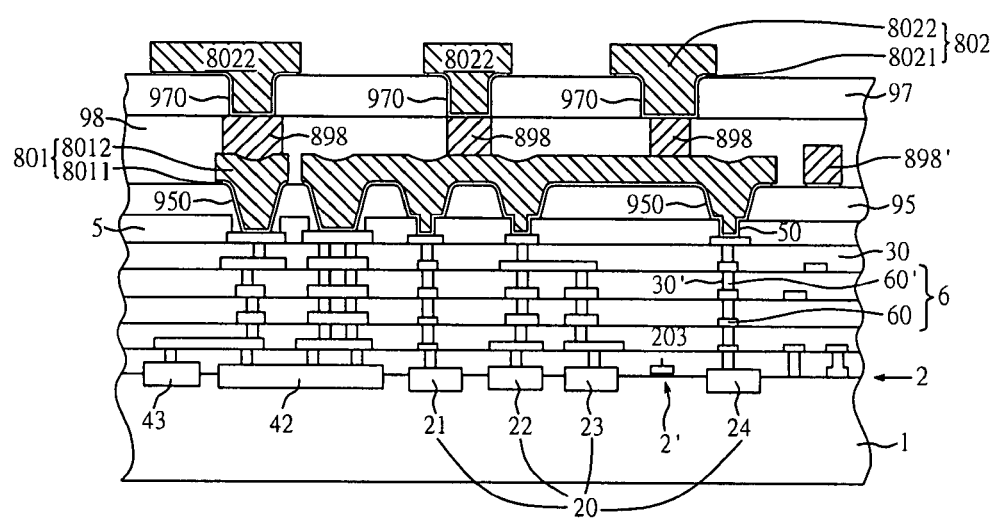

Referring to FIG. 19F, the adhesion/barrier/seed layer 8021 not under the bulk conduction metal layer 8022 is removed with a dry etching method or a wet etching method. As to the wet etching method, when the seed layer of the adhesion/barrier/seed layer 8021 is a gold layer, it can be etched with an iodine-containing solution, such as solution containing potassium iodide; when the seed layer of the adhesion/barrier/seed layer 8021 is a copper layer, it can be etched with a solution containing $NH_4OH$; when the adhesion/barrier layer of the adhesion/barrier/seed layer 8021 is a titanium-tungsten-alloy layer, it can be etched with a solution containing hydrogen peroxide; when the adhesion/barrier layer of the adhesion/barrier/seed layer 8021 is a titanium layer, it can be etched with a solution containing hydrogen fluoride; when the adhesion/barrier layer of the adhesion/barrier/seed layer 8021 is a chromium layer, it can be etched with a solution containing potassium ferricyanide. As to the dry etching method, when the seed layer of the adhesion/barrier/seed layer 8021 is a gold layer, it can be removed with an ion milling process or with an Ar sputtering etching process; when the adhesion/barrier layer of the adhesion/barrier/seed layer 8021 is a titanium layer or a titanium-tungsten-alloy layer, it can be etched with a chlorine-containing plasma etching process or with an RIE process. Generally, the dry etching method to etch the adhesion/barrier/seed layer 8021 not under the bulk conduction metal layer 8022 may include a chemical plasma etching process, a sputtering etching process, such as argon sputter process, or a chemical vapor etching process.

Thereby, a second metal layer 802 can be formed on the polymer layer 97 and on the via plugs 898 exposed by the openings 970, and the second metal layer 802 is formed with the adhesion/barrier/seed layer 8021 and the bulk conduction metal layer 8022 on the adhesion/barrier/seed layer 8021.

Figure 19G:
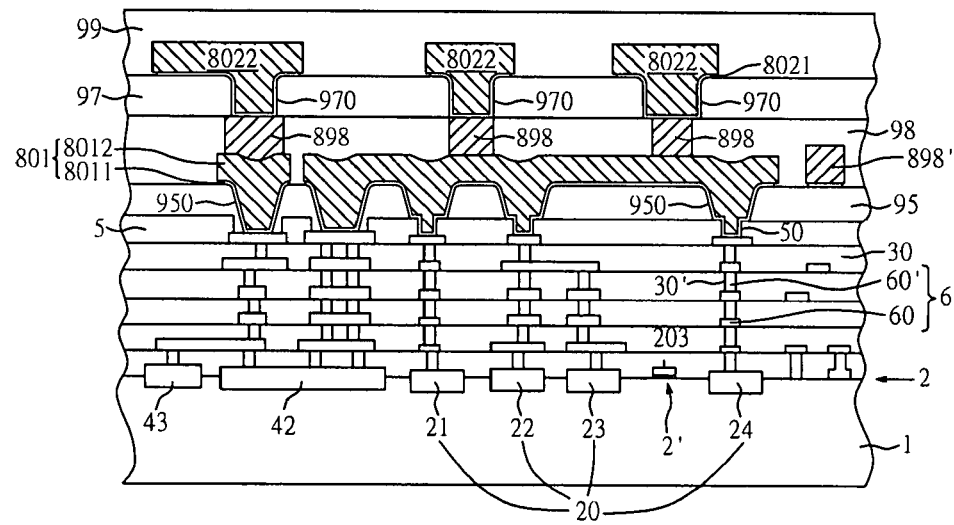
Figure 19H:
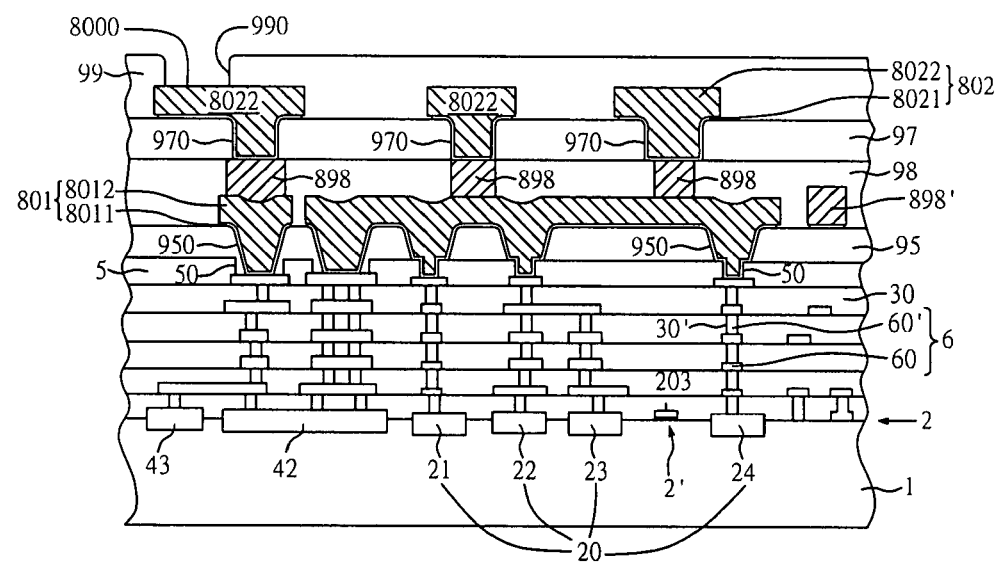
Figure 19I:
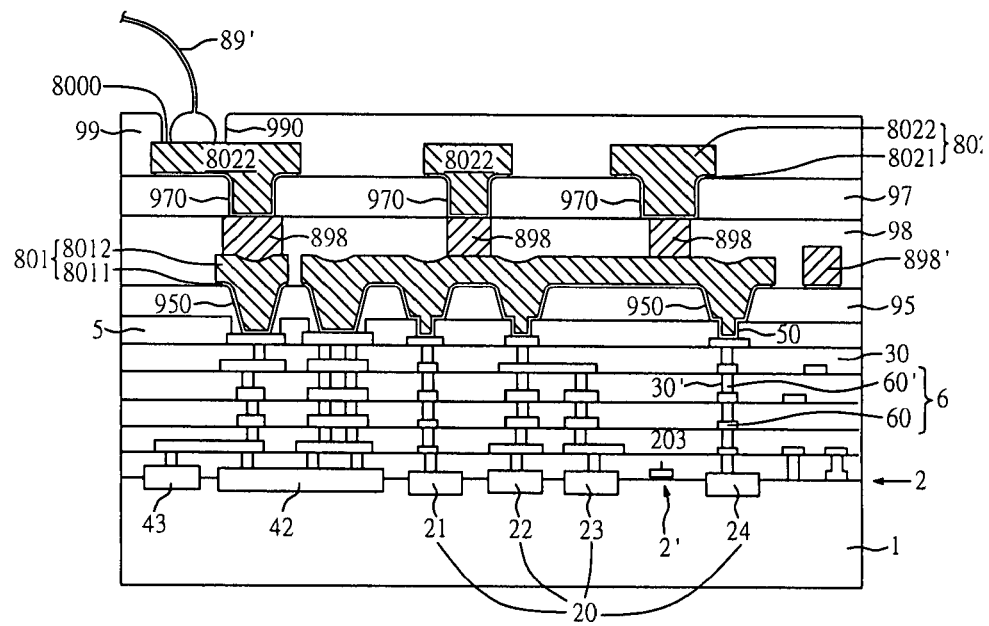

Referring to FIG. 19G, a polymer layer 99 is formed on the exposed polymer layer 97 and on the bulk conduction metal layer 8022 via a spin-on coating process. Referring to FIG. 19H, the polymer layer 99 is patterned with exposure and development processes to form an polymer opening 990 in the polymer layer 99 exposing the pad 8000. Alternatively, the polymer layer 99 may be formed by a lamination process or a screen-printing process. The material of the polymer layer 99 may be polyimide (PI), benzocyclobutane (BCB), polyurethane, epoxy resin, a parylene-based polymer, a solder-mask material, an elastomer, silicone or a porous dielectric material.

For example, the polymer layer 99 can be formed by spin-on coating a negative-type photosensitive polyimide layer, containing ester-typer precursor, having a thickness of between 6 and 50 μm on the exposed polymer layer 97 and on the bulk conduction metal layer 8022, then baking the spin-on coated polyimide layer, then exposing the baked polyimide layer using a 1× stepper or 1X contact aligner with at least two of G-line having a wavelength ranging from 434 to 438 nm, H-line having a wavelength ranging from 403 to 407 nm, and Mine having a wavelength ranging from 363 to 367 nm, illuminating the baked polyimide layer, that is, G-line and H-line, G-line and Mine, H-line and I-line, or G-line, H-line and Mine illuminate the baked polyimide layer, then developing the exposed polyimide layer to form an polyimide opening in the exposed polyimide layer exposing the pad 8000, then curing or heating the developed polyimide layer at a peak temperature of between 290 and 400° C. for a time of between 20 and 150 minutes in a nitrogen ambient or in an oxygen-free ambient, the cured polyimide layer having a thickness of between 3 and 25 μm, and then removing the residual polymeric material or other contaminants from the upper surface of the pad 8000 exposed by the polyimide opening with an $O_2$ plasma or a plasma containing fluorine of below 200 PPM and oxygen, such that the polymer layer 99 can be patterned with an opening 990 in the polymer layer 99 exposing the pad 8000. Alternatively, the developed polyimide layer can be cured or heated at a temperature between 150 and 290° C., and preferably of between 260 and 280° C., for a time of between 20 and 150 minutes in a nitrogen ambient or in an oxygen-free ambient.

After the polymer layer 99 and the opening 990 are formed, a semiconductor wafer formed with the over-passivation scheme 8 can be diced into a plurality of individual semiconductor chips. The method of connecting the contact pad 8000 in FIG. 19I to an external circuit can be referred to as the method of connecting the contact pad 8000 in FIG. 15K to an external circuit. The external circuit may be another semiconductor chip, a flexible substrate comprising a polymer layer (such as polyimide) having a thickness of between 30 and 200 μml and not comprising any polymer layer with glass fiber, a glass substrate, a ceramic substrate comprising a ceramic material as insulating layers between circuit layers, a silicon substrate, an organic substrate, a printed circuit board (PCB) or a ball grid array (BGA) substrate. For example, referring to FIG. 19I, via a wirebonding process, a wire 89', such as gold wire, copper wire or aluminum wire, can be bonded to the pad 8000 of the individual semiconductor chip.

Alternatively, the contact structure 89 illustrated in FIG. 15L can be formed over the pad 8000 exposed by the opening 990. Under the contact structure 89 may be an adhesion/barrier layer 891. After the wafer is formed with the contact structure 89, it can be diced into a plurality of individual semiconductor chips.

Figure 21:
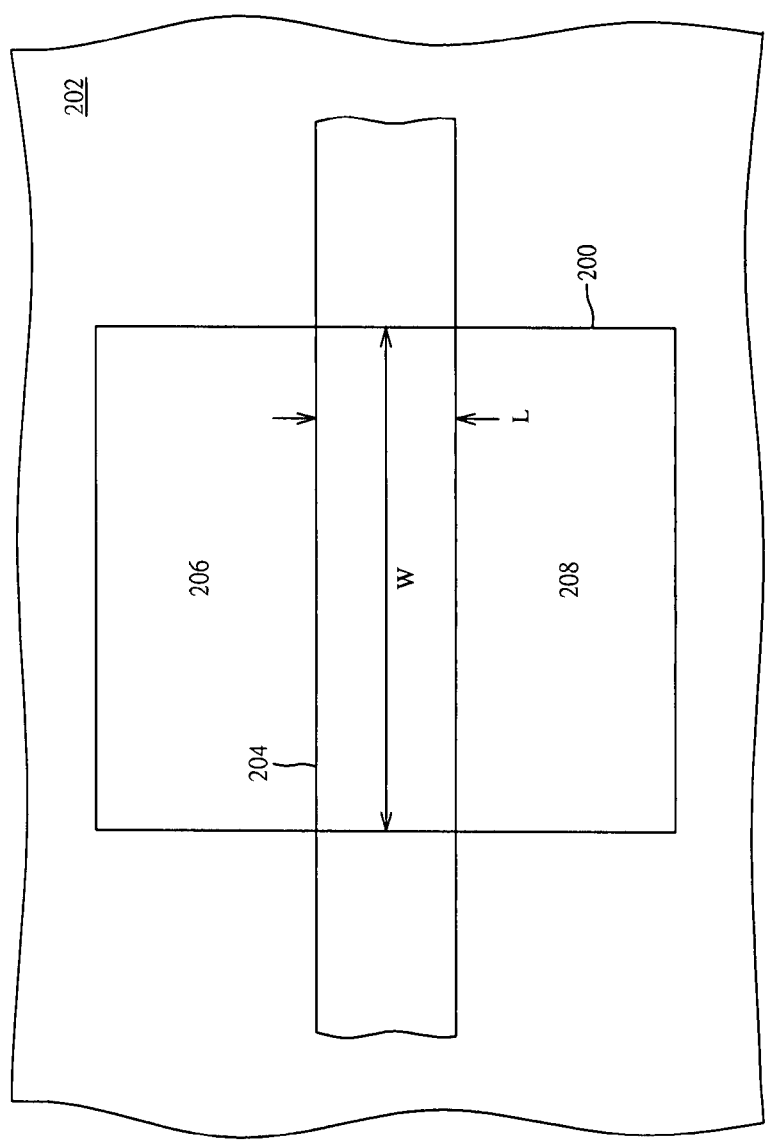
FIGS. 21 and 22 show top views of a MOS transistor that can be a PMOS transistor or an NMOS transistor.
Figure 22:
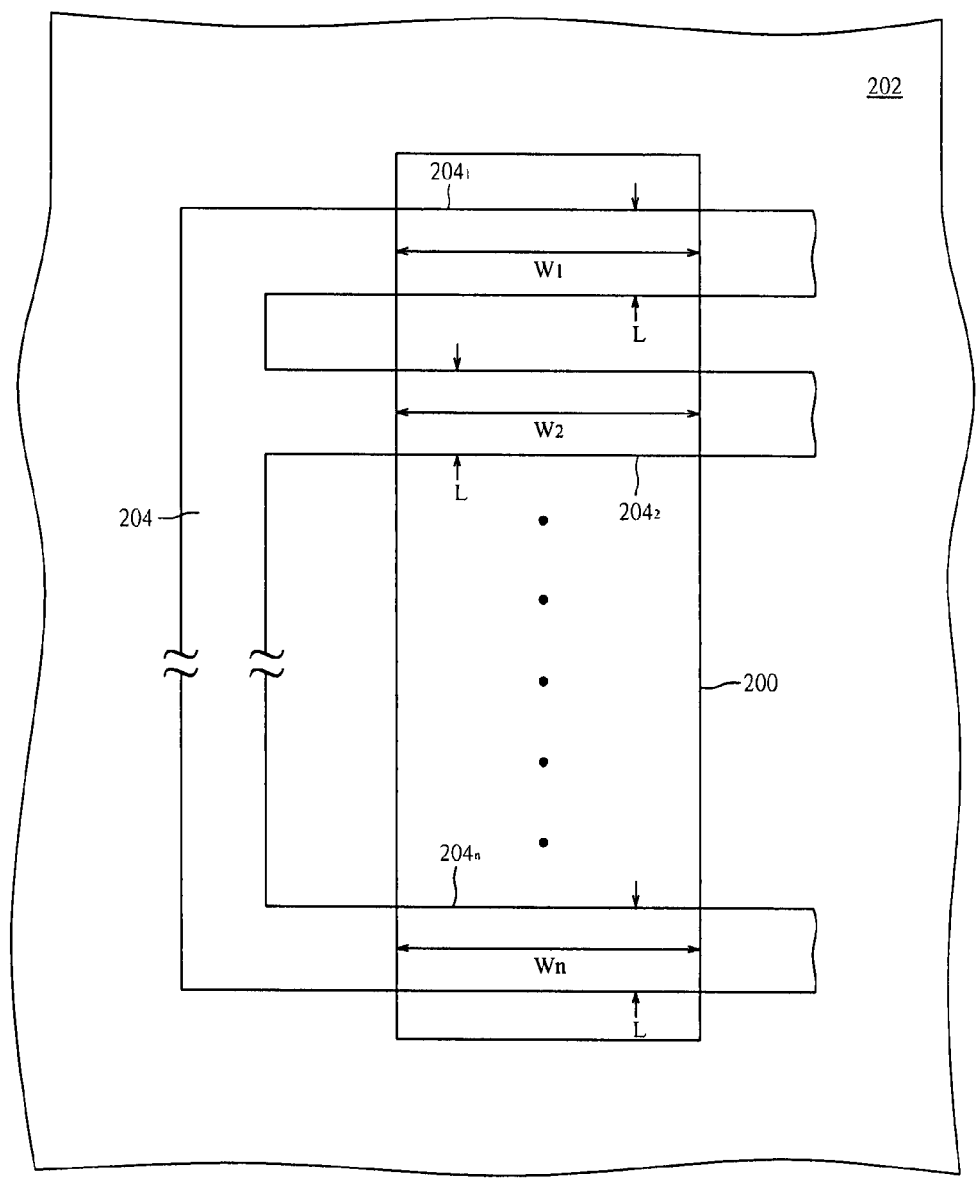

FIGS. 21 and 22 show top views of a MOS transistor that can be a PMOS transistor or an NMOS transistor. Referring to FIG. 21, a transistor comprises an active region 200, diffusion region, in or over the silicon substrate 1, a field oxide region 202 on the silicon substrate 1 and around the active region 200, a gate 204 on the field oxide region 202 and across the active region 200, and a gate oxide (not shown) between the active region 200 and the gate 204. The active region 200 can be defined as a soure 206 at a side of the gate 204, and a drain 208 at the other side of the gate 204. The material of the gate 204 may be poly silicon, metal silicide or composite layer of above materials, wherein the metal silicide may be NiSi, CoS, $TiSi_2$ or WSi. Alternatively, the material of the gate 204 may be a metal, such as W, WN, TiN, Ta, TaN, Mo, or alloy or composite layer of above materials. The material of the gate oxide may be silicon oxide or high k oxide, such as Hf containing oxide. The Hf containing oxide may be $HfO_2$, HfSiON or HfSiO. The above-mentioned physical channel width and physical channel length in all embodiments can be defined in FIG. 21. The reference mark of W is defined as the physical channel width of the transistor, the length of the gate 204 crossing over the diffusion region 200; the reference mark of L is defined as the physical channel length of the transistor, the width of the gate 204 over the diffusion region 200.

Referring to FIG. 22, alternatively, a transistor may include a gate 204 with multiple portions $204_1$-$204_n$ over one or more diffusion regions 200. The reference marks of $W_1$-$W_n$ are defined as the physical channel width of each portion $204_1$-$204_n$ of the gate 204, the length of each portion $204_1$-$204_n$ of the gate 204 crossing over the diffusion region 200; the reference mark of L is defined as the physical channel length of one of the portions $204_1$-$204_n$ of the gate 204, the width of one of the portions $204_1$-$204_n$ of the gate 204 over the diffusion region 200. In this case, the physical channel width W of the transistor is the summation of the physical channel widths $W_1$-$W_n$ of each portions $204_1$-$204_n$ of the gate 204, and the physical channel length L of the transistor is the physical channel length L of one of the portions $204_1$-$204_n$ of the gate 204.

Those described above are the embodiments to exemplify the present invention to enable the person skilled in the art to understand, make and use the present invention. However, it is not intended to limit the scope of the present invention. Any equivalent modification and variation according to the spirit of the present invention is to be also included within the scope of the claims stated below.

What is claimed is:
1. An integrated circuit chip comprising:
   a semiconductor substrate;
   a first analog circuit in said semiconductor substrate, wherein said first analog circuit comprises a first NMOS transistor, wherein a ratio of a physical chan- nel width of said first NMOS transistor to a physical channel length of said first NMOS transistor ranges from 0.1 to 10;

a second analog circuit in said semiconductor substrate, wherein said second analog circuit comprises a second NMOS transistor, wherein a ratio of a physical channel width of said second NMOS transistor to a physical channel length of said second NMOS transistor ranges from 0.1 to 10;

a dielectric structure coupled to said semiconductor substrate;

a first interconnecting structure coupled to said semiconductor substrate and in said dielectric structure, wherein said first interconnecting structure is coupled to a first node of said first analog circuit;

a first pad coupled to semiconductor said semiconductor substrate, wherein said first pad is to said first node of said first analog circuit through said first interconnecting structure;

a second interconnecting structure coupled to said semiconductor substrate and in said dielectric structure, wherein said second interconnecting structure is coupled to a first node of said second analog circuit;

a second pad coupled to said semiconductor substrate, wherein said second pad is coupled to said first node of said second analog circuit through said second interconnecting structure;

a passivation layer coupled to said dielectric structure, wherein a first opening in said passivation layer exposes said first pad, and a second opening in said passivation layer exposes said second pad;

a third interconnecting structure coupled to said passivation layer and said first and second pads, wherein said third interconnecting structure comprises a first patterned circuit layer and a second patterned circuit layer coupled to said first patterned circuit layer, wherein said first patterned circuit layer comprises an adhesion/barrier layer, a seed layer on said adhesion/barrier layer, and an electroplated conductive layer on said seed layer, wherein said electroplated conductive layer has a thickness between 2 and 30 micrometers, and wherein said first node of said first analog circuit is coupled to said first node of said second analog circuit through, in sequence, said first interconnecting structure, said first pad, said third interconnecting structure, said second pad and said second interconnecting structure to provide an analog path; and a polymer layer between said first and second patterned circuit layer.

2. The integrated circuit chip of claim 1 further comprising a voltage converter in or coupled to said semiconductor substrate, a fourth interconnecting structure said semiconductor substrate and in or said dielectric structure, wherein said fourth interconnecting structure is coupled to said voltage converter, a third pad coupled to said semiconductor substrate, wherein said third pad is coupled to said voltage converter through said fourth interconnecting structure and exposed by a third opening in said passivation layer, a fifth interconnecting structure said semiconductor substrate and in or said dielectric structure, wherein said fifth interconnecting structure is coupled to a second node of said first analog circuit, a fourth pad said semiconductor substrate, wherein said fourth pad is coupled to said second node of said first analog circuit through said fifth interconnecting structure and exposed by a fourth opening in said passivation layer, a sixth interconnecting structure coupled to said semiconductor substrate and in or coupled to said dielectric structure, wherein said sixth interconnecting structure is to a second node of said second analog circuit, a fifth pad coupled to said semiconductor substrate, wherein said fifth pad is coupled to said second node of said second analog circuit through said sixth interconnecting structure and exposed by a fifth opening in said passivation layer, and a seventh interconnecting structure said passivation layer and coupled to said third, fourth and fifth pads, wherein said voltage converter is coupled to said second node of said first analog circuit through, in sequence, said fourth interconnecting structure, said third pad, said seventh interconnecting structure, said fourth pad and said fifth interconnecting structure, and wherein said voltage converter is coupled to said second node of said second analog circuit through, in sequence, said fourth interconnecting structure, said third pad, said seventh interconnecting structure, said fifth pad and said sixth interconnecting structure.

3. The integrated circuit chip of claim 2, wherein said seventh interconnecting structure is used to deliver a power voltage output from said voltage converter.

4. The integrated circuit chip of claim 1 further comprising an ESD circuit in or said semiconductor substrate, a fourth interconnecting structure said semiconductor substrate and in or said dielectric structure, wherein said fourth interconnecting structure is coupled to said ESD circuit, a third pad said semiconductor substrate, wherein said third pad is coupled to said ESD circuit through said fourth interconnecting structure and exposed by a third opening in said passivation layer, a fifth interconnecting structure said semiconductor substrate and in or said dielectric structure, wherein said fifth interconnecting structure is coupled to a second node of said first analog circuit, a fourth pad said semiconductor substrate, wherein said fourth pad is coupled to said second node of said first analog circuit through said fifth interconnecting structure and exposed by a fourth opening in said passivation layer, a sixth interconnecting structure coupled to said semiconductor substrate and in or coupled to said dielectric structure, wherein said sixth interconnecting structure is coupled to a second node of said second analog circuit, a fifth pad coupled to said semiconductor substrate, wherein said fifth pad is coupled to said second node of said second analog circuit through said sixth interconnecting structure and exposed by a fifth opening in said passivation layer, and a seventh interconnecting structure said passivation layer and coupled to said third, fourth and fifth pads, wherein said ESD circuit is coupled to said second node of said first analog circuit through, in sequence, said fourth interconnecting structure, said third pad, said seventh interconnecting structure, said fourth pad and said fifth interconnecting structure, and wherein said ESD circuit is coupled to said second node of said second analog circuit through, in sequence, said fourth interconnecting structure, said third pad, said seventh interconnecting structure, said fifth pad and said sixth interconnecting structure.

5. The integrated circuit chip of claim 4, wherein said seventh interconnecting structure is used to deliver a power voltage input from an external circuit.

6. The integrated circuit chip of claim 1, wherein said passivation layer comprises a nitride layer having a thickness between 0.2 and 1.5 micrometers.

7. The integrated circuit chip of claim 1, wherein said first opening has a width between 0.1 and 30 micrometers.

8. The integrated circuit chip of claim 1, wherein said polymer layer has a thickness between 2 and 30 micrometers.

9. The integrated circuit chip of claim 1, wherein said first analog circuit comprises an NOR gate.

10. The integrated circuit chip of claim 1, wherein said first analog circuit comprises an NAND gate.

11. The integrated circuit chip of claim 1, wherein said first analog circuit comprises an inverter.

* * * * *